United States Patent
Lutz et al.

(10) Patent No.: US 7,595,708 B2
(45) Date of Patent: Sep. 29, 2009

(54) MEMS RESONATOR ARRAY STRUCTURE

(75) Inventors: Markus Lutz, Palo Alto, CA (US); Aaron Partridge, Palo Alto, CA (US); Zhiyu Pan, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 210 days.

(21) Appl. No.: 11/809,894

(22) Filed: Jun. 1, 2007

(65) Prior Publication Data
US 2008/0218295 A1 Sep. 11, 2008

Related U.S. Application Data

(63) Continuation of application No. 11/172,143, filed on Jun. 30, 2005, now Pat. No. 7,227,432.

(51) Int. Cl.
*H03H 9/46* (2006.01)
(52) U.S. Cl. .................. 333/186; 333/197; 310/309
(58) Field of Classification Search ............. 333/186, 333/197, 200; 310/309
See application file for complete search history.

(56) References Cited

U.S. PATENT DOCUMENTS

| | | | |
|---|---|---|---|
| 6,249,073 B1 | 6/2001 | Nguyen et al. | |
| 6,369,374 B1 * | 4/2002 | Greywall | 250/201.1 |
| 6,452,465 B1 | 9/2002 | Brown et al. | |
| 6,577,040 B2 | 6/2003 | Nguyen | |
| 6,624,726 B2 | 9/2003 | Niu et al. | |
| 6,628,177 B2 | 9/2003 | Clark et al. | |
| 6,856,217 B1 | 2/2005 | Clark et al. | |
| 6,894,586 B2 | 5/2005 | Bircumshaw et al. | |
| 7,319,372 B2 * | 1/2008 | Pan et al. | 333/197 |
| 7,492,241 B2 * | 2/2009 | Piazza et al. | 333/189 |
| 2002/0041220 A1 | 4/2002 | Nguyen et al. | |
| 2002/0105393 A1 | 8/2002 | Clark et al. | |
| 2004/0085159 A1 | 5/2004 | Kubena et al. | |
| 2004/0095210 A1 | 5/2004 | Nguyen | |
| 2004/0113722 A1 | 6/2004 | Bircumshaw et al. | |
| 2004/0207492 A1 | 10/2004 | Nguyen et al. | |
| 2005/0073078 A1 | 4/2005 | Lutz et al. | |
| 2005/0174197 A1 | 8/2005 | Nguyen et al. | |
| 2005/0206479 A1 | 9/2005 | Nguyen et al. | |

FOREIGN PATENT DOCUMENTS

WO    WO 2004/083781    9/2004

(Continued)

OTHER PUBLICATIONS

Lee et al.; "Mechanically-Coupled Micromechanical Resonator Arrays for Improved Phase Noise"; 2004 IEEE International Proceedings Frequency Control Symposium and Exposition; Aug. 23-27, 2004, pp. 144-150.*

(Continued)

*Primary Examiner*—Barbara Summons
(74) *Attorney, Agent, or Firm*—Kenyon & Kenyon LLP

(57) ABSTRACT

A MEMS array structure includes MEMS resonators that form an array. Each MEMS resonator includes beam sections. At least one of the beam sections of a first one of the MEMS resonators is a shared beam section that is also included in another of the MEMS resonators adjacent to the first MEMS resonator.

19 Claims, 100 Drawing Sheets

FOREIGN PATENT DOCUMENTS

WO   WO 2005/015735   2/2005

OTHER PUBLICATIONS

"A High Aspect-Ratio Polysilicon Vibrating Ring Gyroscope" Ayazi et al., Solid-State Sensor and Actuator Workshop, Hilton Head Island, South Carolina, Jun. 4-8, 2000, pp. 289-292.

"Mechanically Corner-Coupled Square Microresonator Array for Reduced Series Motional Resistance", Demirci et al., Dig. of Tech. Papers, the 12th Int. Conf. on Solid-State sensors & Actuators (Transducers' 03), Boston, Massachusetts, Jun. 8-12, 2003, pp. 955-958.

"High-Q Single Chrystal Silicon HARPSS Capacitive Beam Resonators with Self-Aligned Sub-100 nm Transduction Gaps", Pourkamali et al., Journal of Microelectromechanical Systems, col. 12, No. 4, Aug. 2003, pp. 487-496.

"Low Motional Resistance Ring-Shaped Contour-Mode Aluminum Nitride Piezoelectric Micromechanical Resonators for UHF Applications", Piazza et al. Micro Electro Mechanical Systems, 2005, MEMS 2005, 18th IEEE International Conference in Miami Beach Fla. Jan. 30-Feb. 3, 2005, Piscataway, NJ, USA, IEEE Jan. 30, 2005, pp. 20-23.

"Shape Effect on Mechanical Quality Factor of Micro-Resonator", Kobayashi et al. Micro Electro Mechanical Systems, 1998, MEMS 98, Proceedings, The eleventh annual International Workshop on Heidelberg, Germany Jan. 25-29, 1998, NY, IEEE US, Jan. 25, 1998, pp. 195-200.

"Vibrating RF MEMS for Next Generation Wireless Applications", Nguyen, Custom Integrated Circuits Conference, 2004, Proceedings of the IEEE 2004, Orlando, FL, USA, Oct. 3-6, 2004, Piscataway, NJ, USA, IEEE, Oct. 3, 2004, pp. 257-264.

"UHF Micromechanical extensional Wine-Glass Mode Ring Resonators", Xie et al., International Electron Devices Meeting 2003, IEDM, Technical Digest, Washington, DC, Dec. 8-10, 2003, New York, NY, IEEE US, Dec. 8, 2003, pp. 953-956.

"Integrated HF CMOS-MEMS Square-Frame Resonators with On-Chip Electronics and Electrothermal Narrow Gap Mechanism", Lo et al., Solid-State Sensors, Actuators and Microsystems, 2005, Digest of Technical Papers, Transducers '05, The 13th International Conference on Seoul, Korea, Jun. 5-9, 2005, Piscataway, NJ, USA, IEEE, Jun. 5, 2005, pp. 2074-2077.

"Fully-Differential Poly-SiC Lame-Mode Resonator and Checkerboard Filter", Bhave et al., Micro Electro Mechanical Systems, 205, MEMS 2005, 18th IEEE International Conference on Miami Beach, FL, USA, Jan. 30-Feb. 3, 2005, Piscataway, NJ, USA, IEEE Jan. 30, 2005, pp. 22-226.

"Micromechanical Hollow-Disk Ring Resonators", Li et al., Micro Electro Mechanical Systems, 2004, 17th IEEE International Conference on MEMS, Maastricht, Netherlands Jan. 25-29, 2004, Piscataway, NJ, USA, IEEE, US, Jan. 25, 2004, pp. 821-824.

* cited by examiner

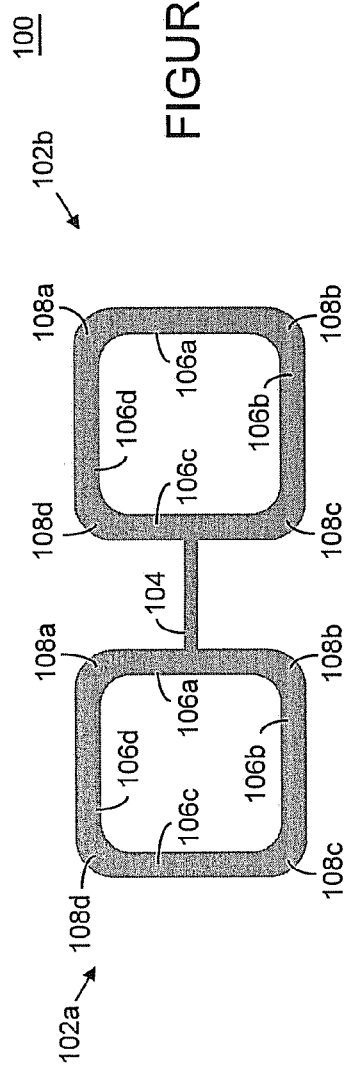
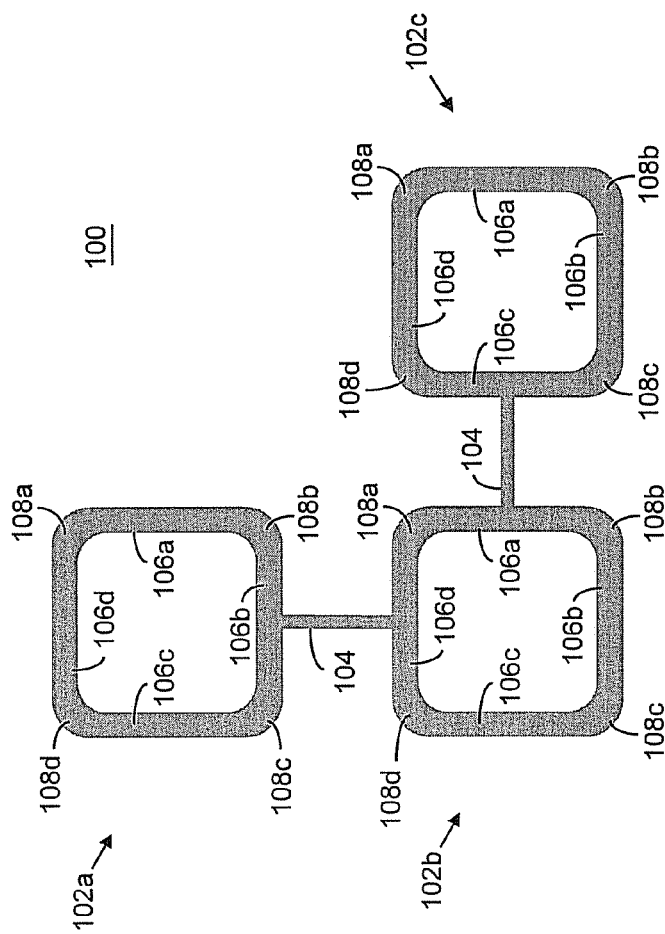

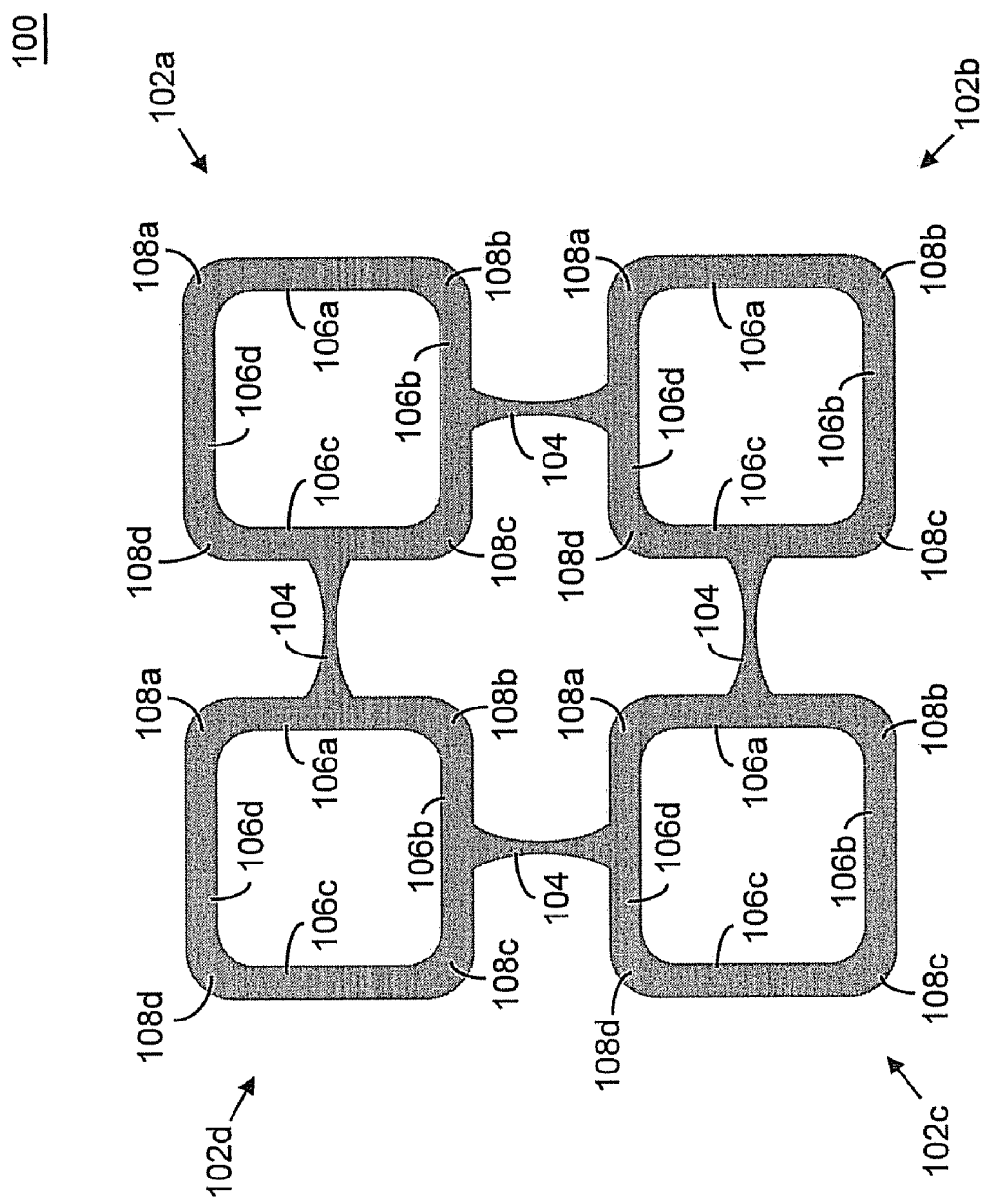

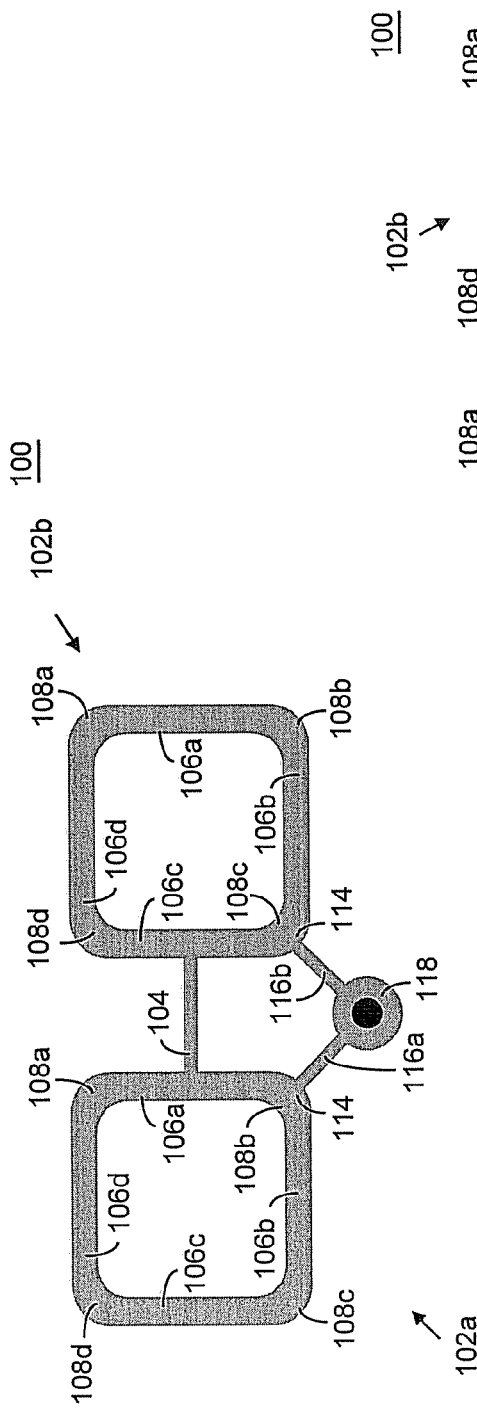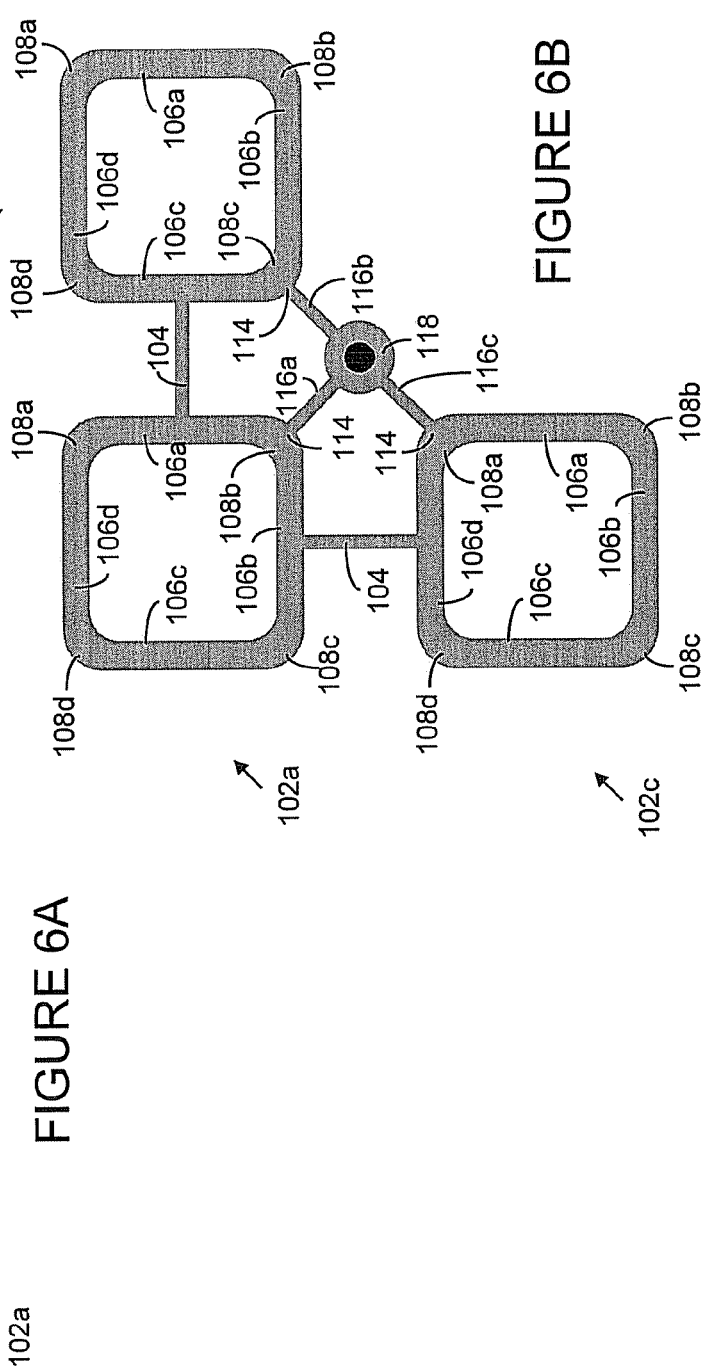

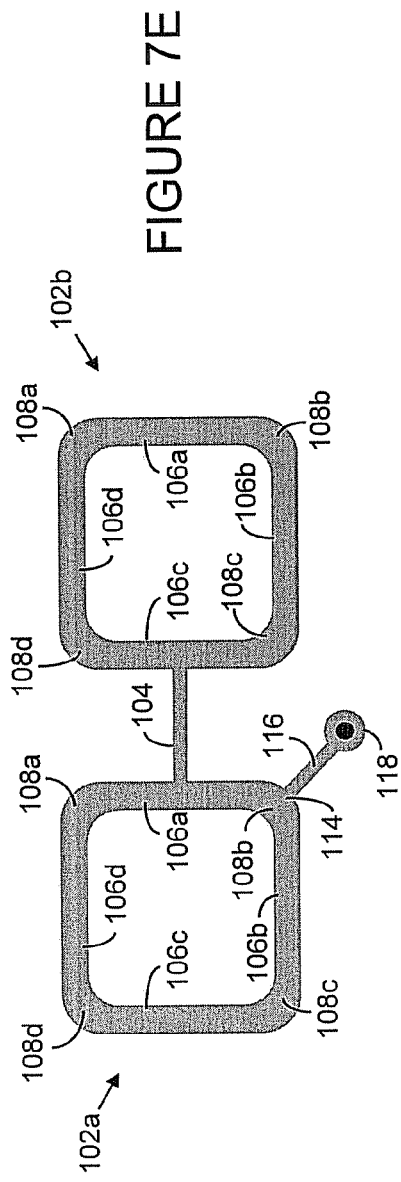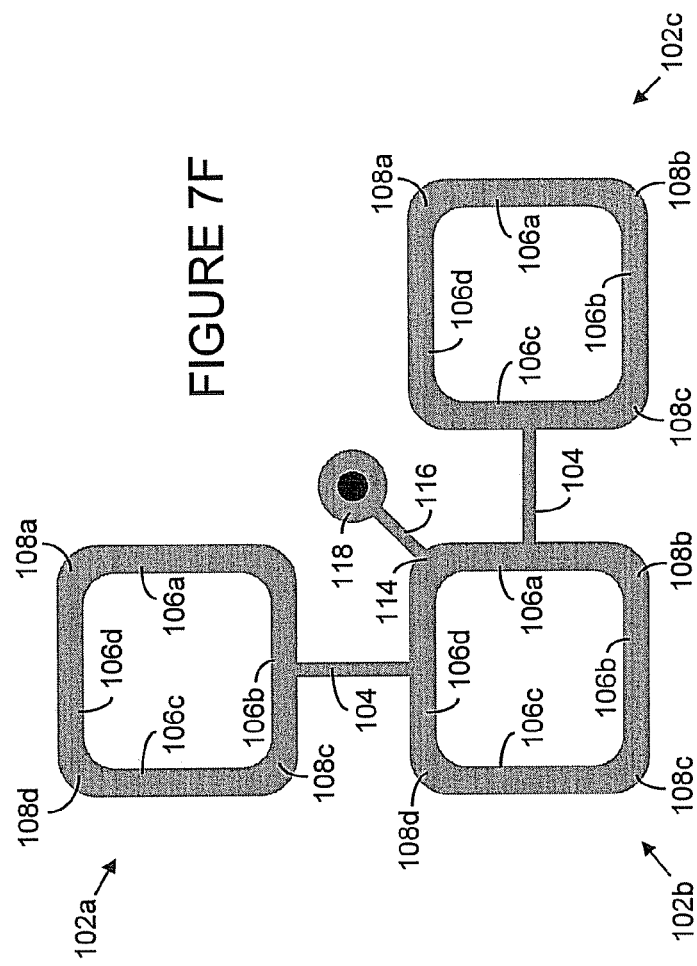

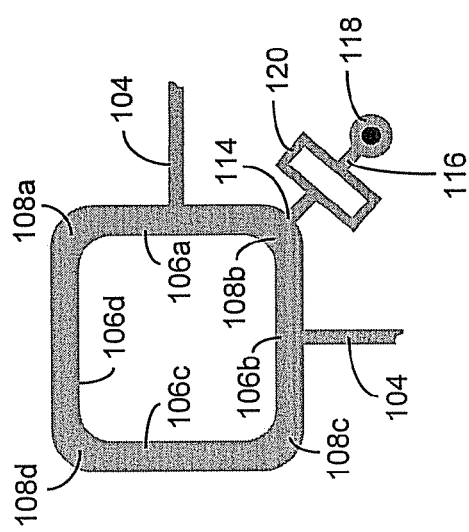
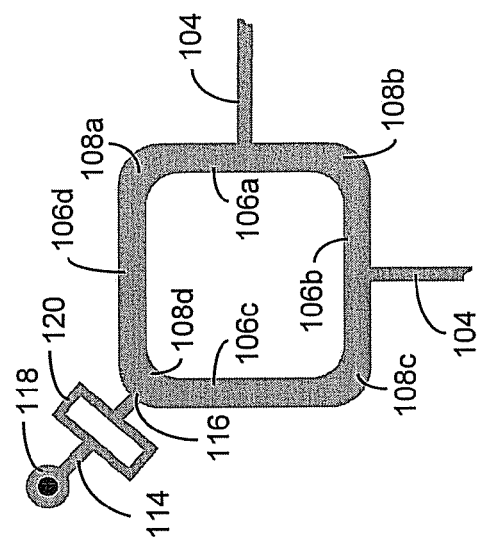
FIGURE 11A
FIGURE 11B

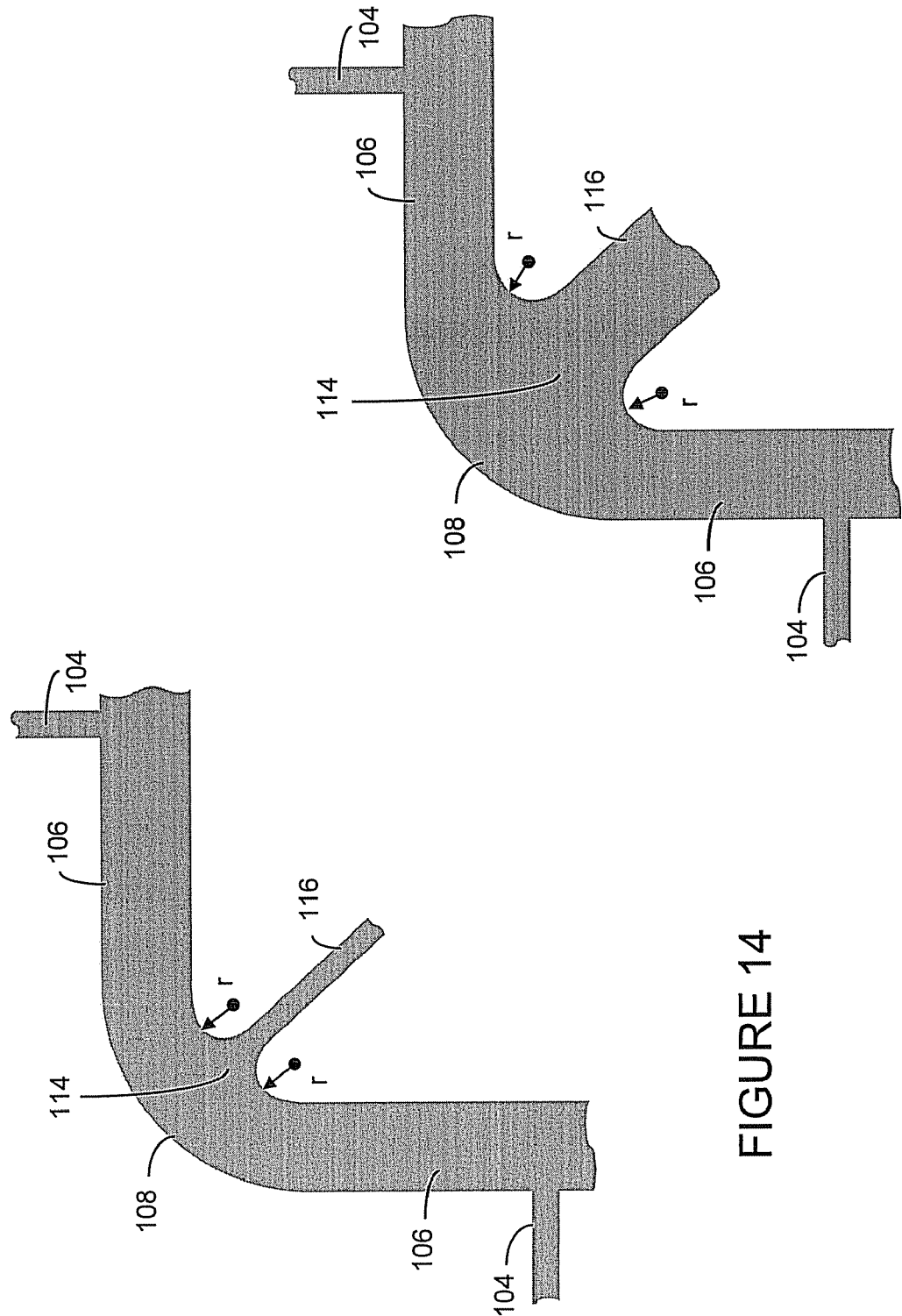

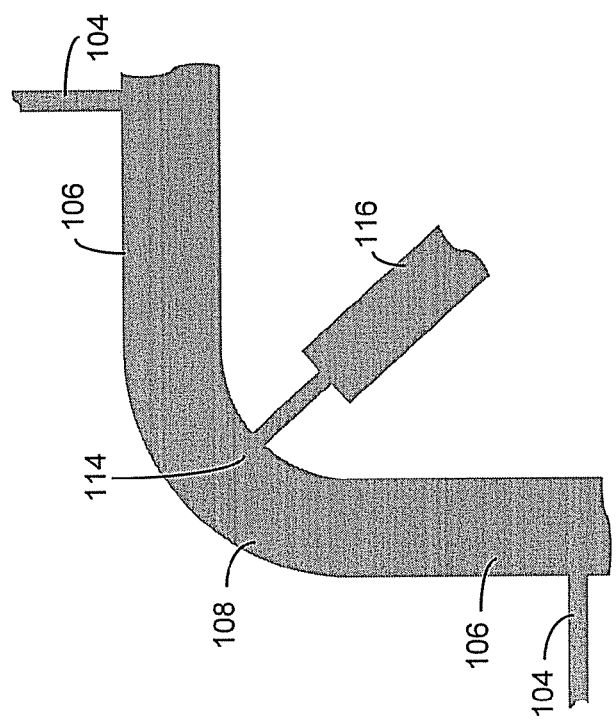
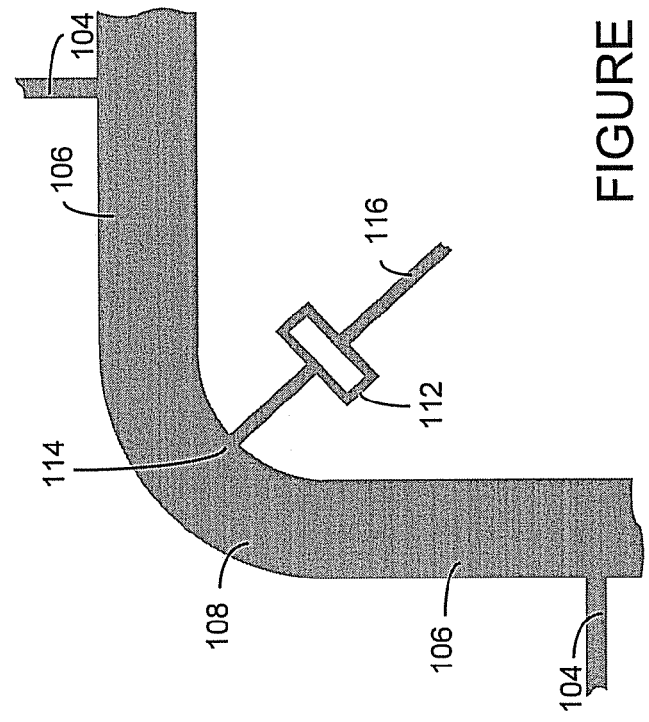
FIGURE 18
FIGURE 19

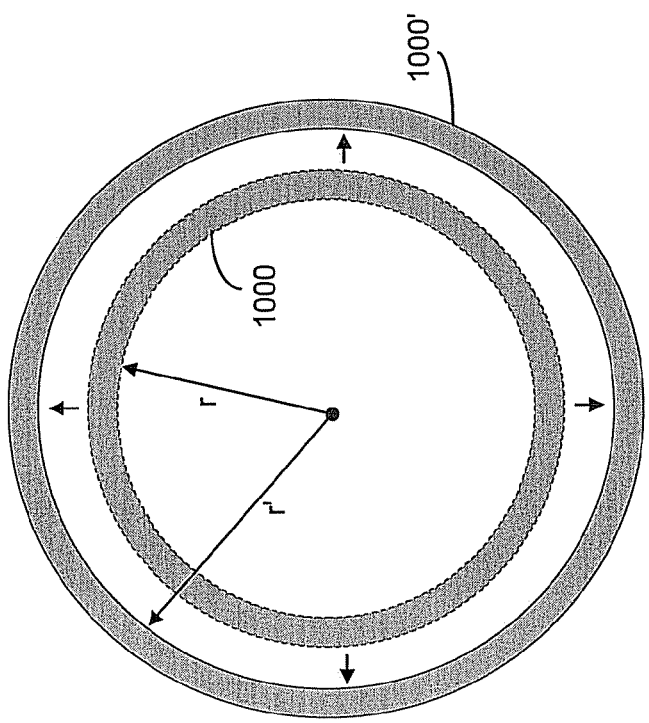
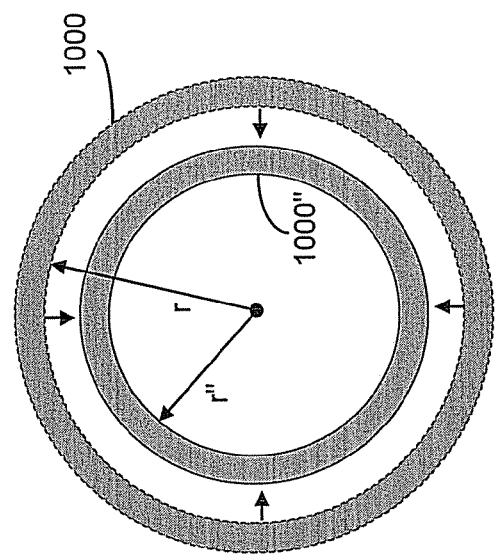
FIGURE 22A
FIGURE 22B

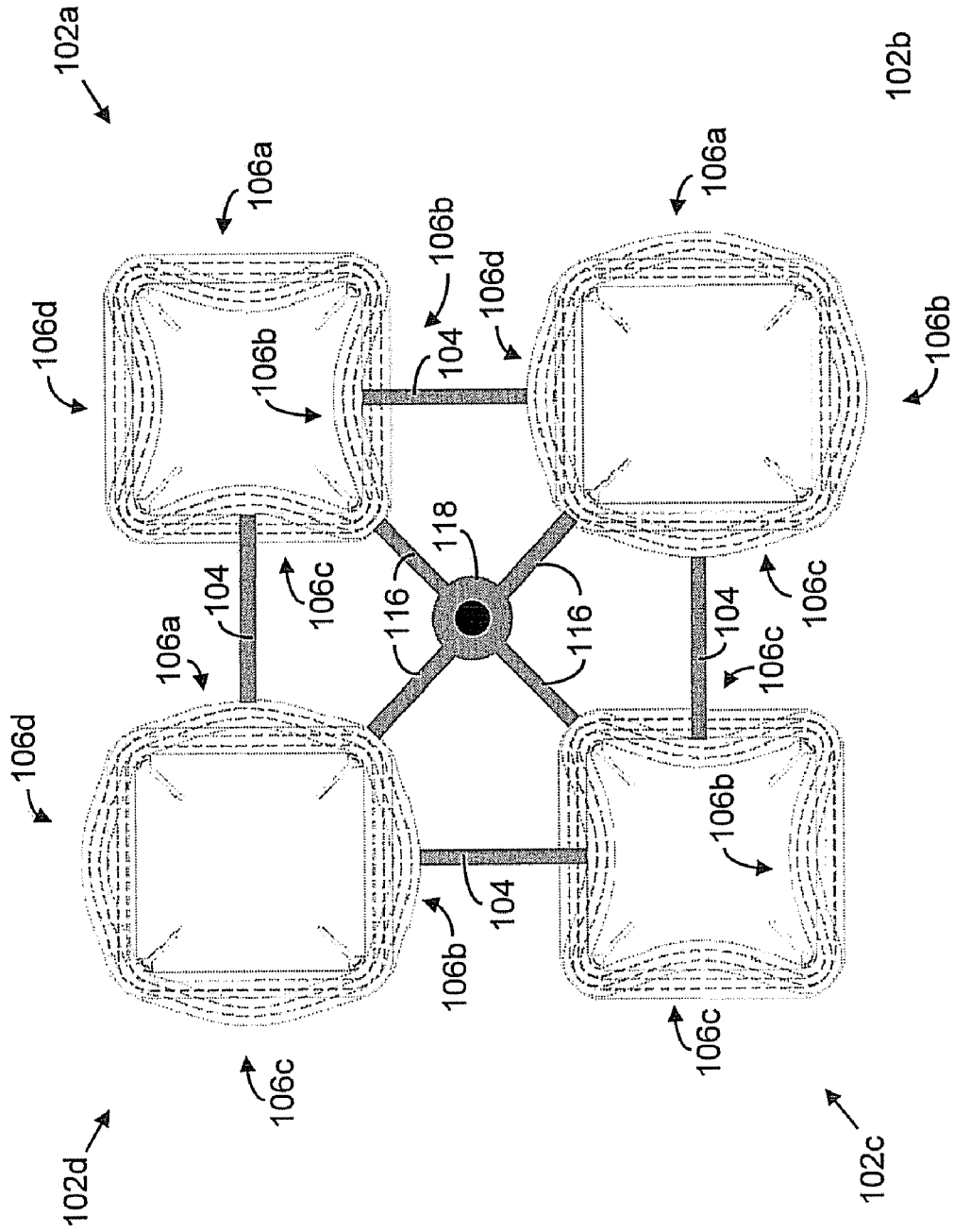

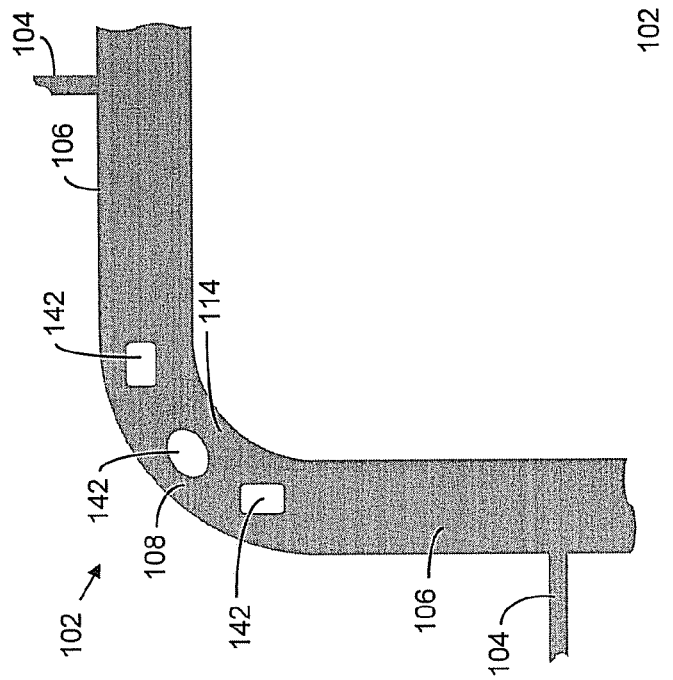
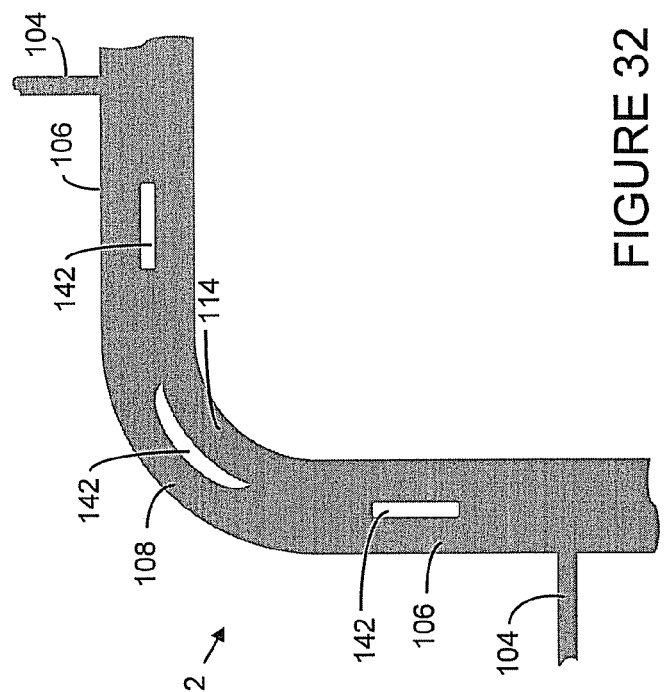
FIGURE 31
FIGURE 32

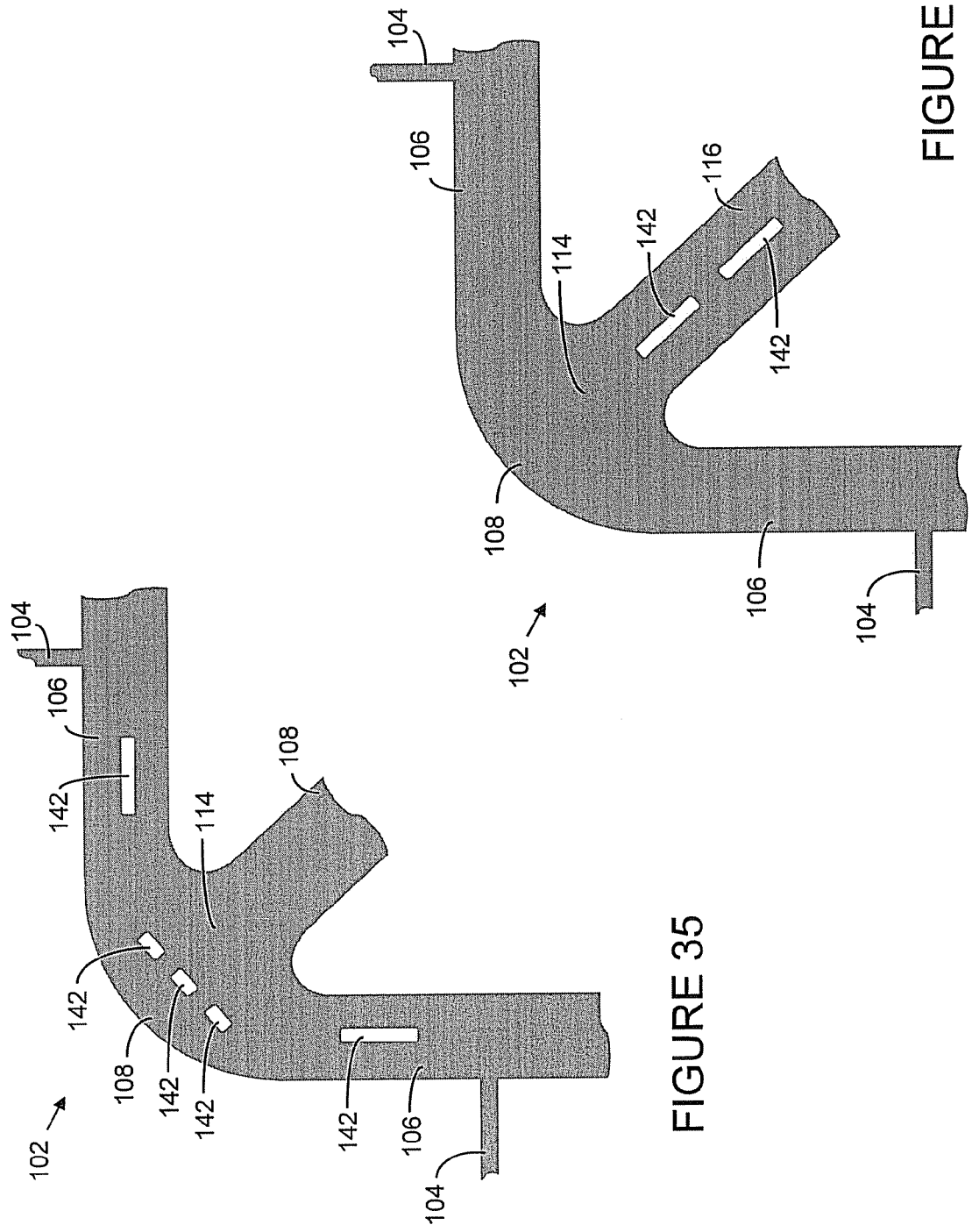

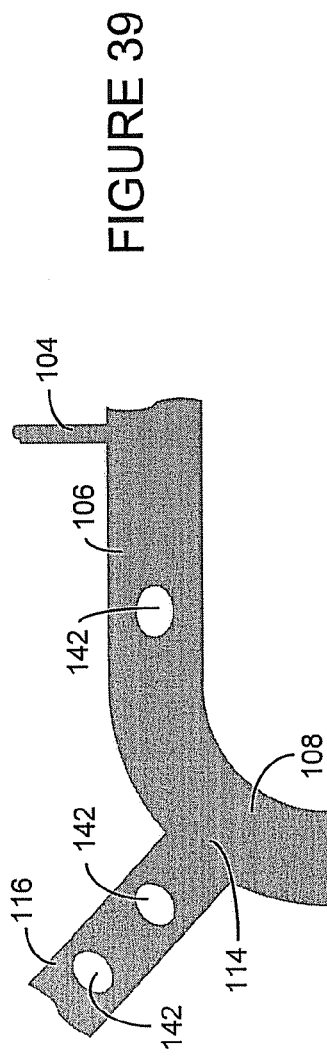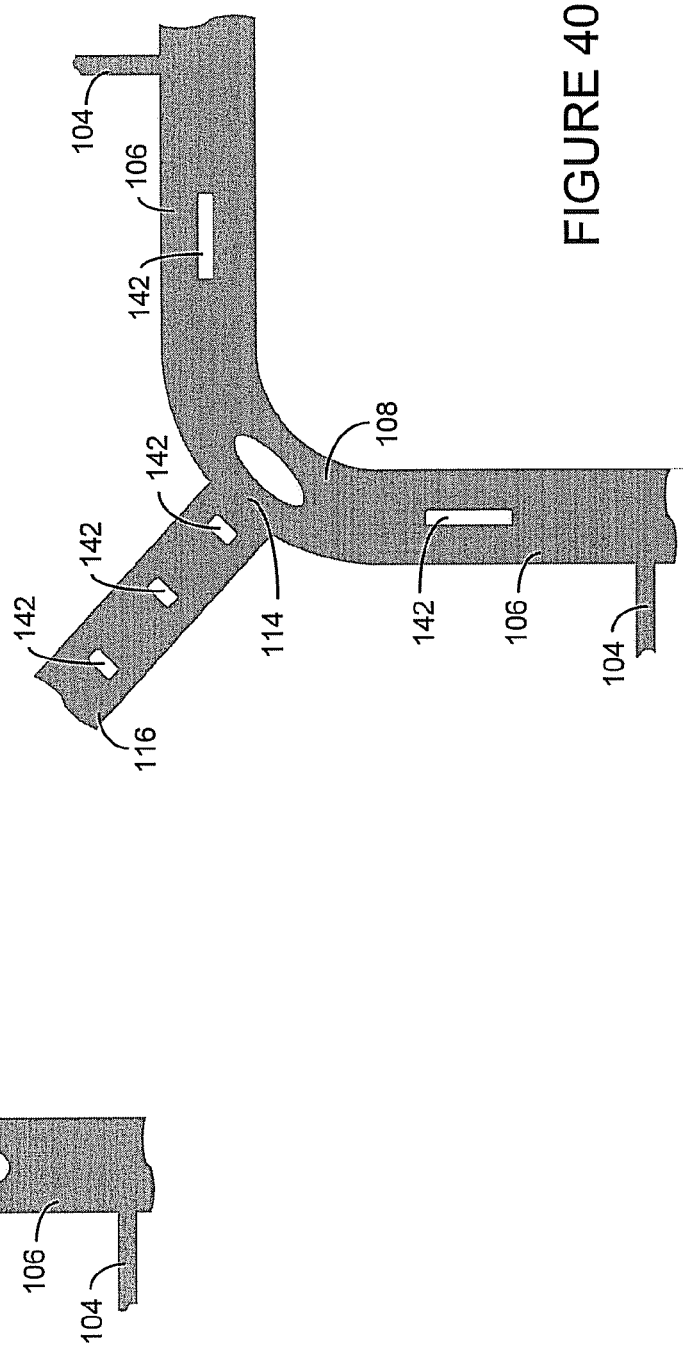

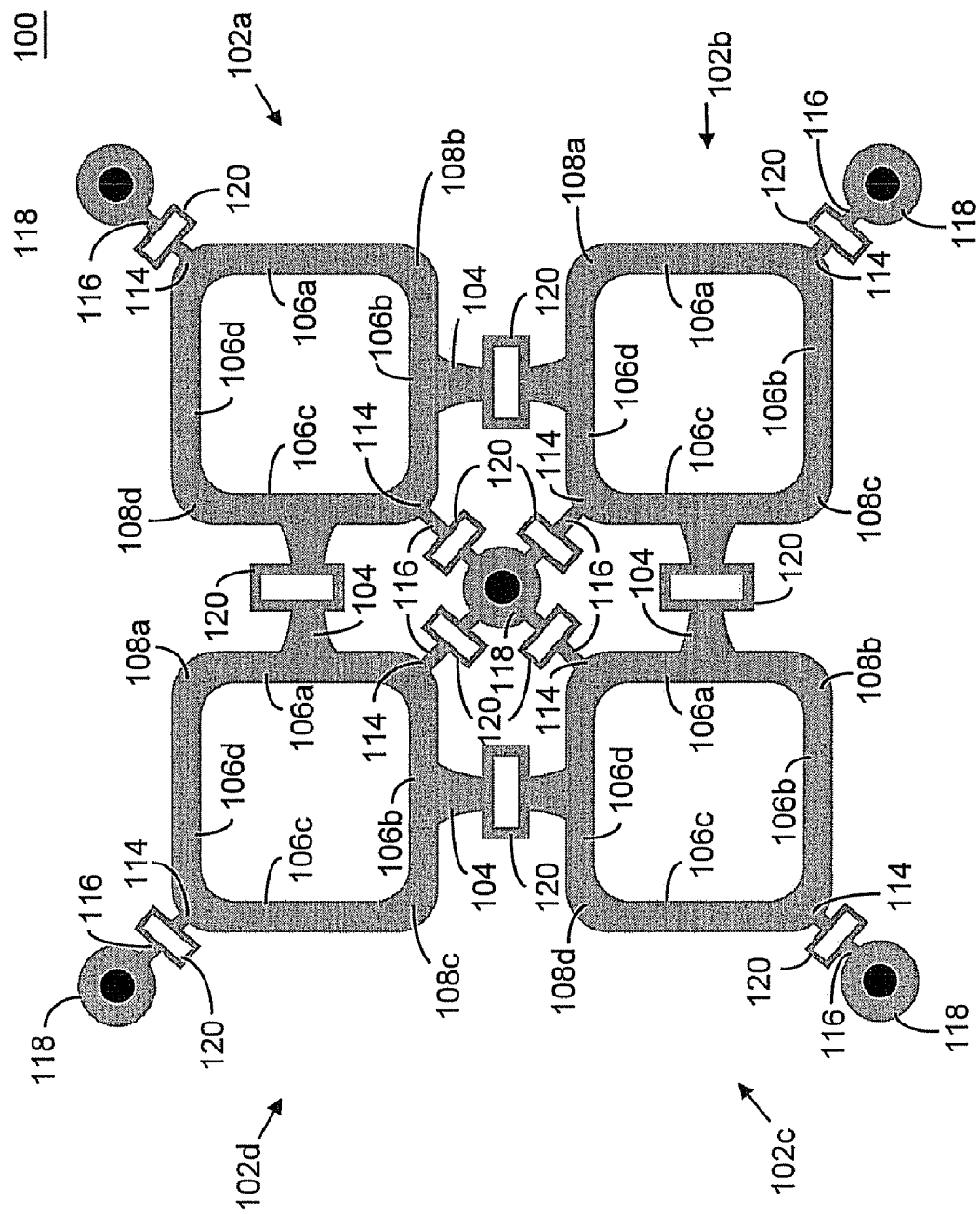

MEMS RESONATOR ARRAY STRUCTURE

CROSS-REFERENCE TO RELATED APPLICATION

This application is a continuation of and claims priority under 35 U.S.C. § 120 to U.S. application Ser. No. 11/172,143 filed Jun. 30, 2005, now U.S. Pat. No. 7,227,432, the entirety of which is incorporated herein by reference in its entirety.

BACKGROUND

This invention relates to a microelectromechanical or nanoelectromechanical resonator array structure, and method of designing, operating, controlling and/or using such an architecture; and more particularly, in one aspect, to a plurality of microelectromechanical or nanoelectromechanical resonators (for example, a plurality of resonators at least one of which includes one or more enhanced nodal points that facilitate substrate anchoring in order to minimize influence of packaging stress and/or energy loss via substrate anchoring) that are mechanically coupled to provide one or more output signals having one or more frequencies.

Generally, high Q microelectromechanical resonators are regarded as a promising choice for integrated single chip frequency references and filter. In this regard, high Q microelectromechanical resonators tend to provide high frequency outputs that are suitable for many high frequency applications requiring compact and/or demanding space constrained designs. However, while the resonator is being scaled smaller, packaging stress, energy loss into the substrate through substrate anchors, reduced signal strength, and/or instability or movement of the center of gravity during oscillation tend to adversely impact the frequency stability as well as "Q" of the resonator.

There are several well-known resonator architectures. For example, one group of conventional resonator architectures employs closed-ended or open-ended tuning fork. For example, with reference to FIG. 1, closed-ended or double-clamped tuning fork resonator 10 includes beams or tines 12a and 12b. The beams 12a and 12b are anchored to substrate 14 via anchors 16a and 16b. The fixed electrodes 18a and 18b are employed to induce a force to beams 12a and 12b to cause the beams to oscillate (in-plane).

The characteristics and response of tuning fork resonator 10 are well known. However, such resonator architectures are often susceptible to changes in mechanical frequency of resonator 10 by inducing strain into resonator beams 12a and 12b as a result of packaging stress. In addition, conventional resonator architectures, like that illustrated in FIG. 1, experience or exhibit energy loss, though the anchors, into the substrate.

Certain architectures and techniques have been described to address Q-limiting loss mechanism of energy loss into the substrate through anchors as well as changes in frequency due to certain stresses. In one embodiment, the beams of the resonator may be "suspended" above the ground plane and sense electrode whereby the vibration mode of the beam is out-of-plane. (See, for example, U.S. Pat. No. 6,249,073). While such architectures may alleviate energy loss through the anchors, resonators that include an out-of-plane vibration mode (i.e., transverse mode) tend to exhibit relatively large parasitic capacitance between drive/sense electrodes and the substrate. Such capacitance may lead to a higher noise floor of the output signal (in certain designs).

Other techniques designed to improve the Q-factor of the resonator have been proposed and include designing the spacing between the vibrating beams so that such beams are closely spaced relative to a wavelength associated with their vibrating frequency. (See, for example, the single-ended or single-clamped resonator of U.S. Pat. No. 6,624,726). The vibrating beams are driven to vibrate one-half of a vibration period out of phase with each other (i.e., to mirror each others motion). While these architectures and techniques to improve the Q of the resonator may suppress acoustic energy leakage, such an architecture remain predisposed to packaging stress, energy loss into the substrate through substrate anchors as well as a "moving" of the center of gravity of the resonator during motion by the vibrating beams of the single-ended or single-clamped resonator.

Further, other resonator architectures have been described to address energy loss through the anchor, for example, a "disk" shaped resonator design. (See, for example, U.S. Patent Application Publication 2004/0207492). Indeed, an array of identical mechanically-coupled disk-shaped resonators has been proposed to decrease motional resistance while improving linearity. (See, for example, U.S. Pat. No. 6,628, 177 and "Mechanically Corner-Coupled Square Microresonator Array for Reduced Series Motional Resistance", Demirci et al., Transducers 2003, pp. 955-958).

There is a need for a resonator array architecture, configuration or structure that overcomes the shortcomings of one, some or all of the conventional architectures, configurations or structures. In this regard, there is a need for improved array of microelectromechanical and/or nanoelectromechanical resonators having improved packaging stress characteristics, reduced and/or minimal energy loss into the substrate though substrate anchors, and/or improved or optimal stability of the center of gravity during oscillation. In this way, the signal to noise of the output signal is increased, the stability and/or linearity of the output frequency of the resonator is enhanced, and/or the "Q" factor of the resonator is relatively high.

Further, there is a need for an improved microelectromechanical resonator array architecture, configuration or structure that includes relatively small motional resistance and good linearity, implements full differential signaling and/or possesses a high immunity to on the input signals and/or the output signals. Moreover, there is a need for an improved method of designing, operating, controlling and/or using such a resonator array that overcomes the shortcomings of one, some or all of the conventional resonator array architectures, configurations or structures.

SUMMARY OF THE INVENTION

There are many inventions described and illustrated herein, as well as many aspects and embodiments of those inventions. This Summary discusses some of the inventions described and claimed herein. By no means is this Summary of the Invention is not exhaustive of the scope of the present inventions. With that in mind, in a first principal aspect, the present invention is a MEMS array structure comprising a plurality of MEMS resonators coupled via one or more resonator coupling sections. In one embodiment, each MEMS resonator includes a plurality of elongated straight beam sections (for example, four elongated straight beam sections), each including first and second ends, and a plurality of curved sections (for example, four curved sections), each including first and second ends, wherein each end of a beam section is connected to an associated end of one of the curved section to thereby form a geometric shape (for example, a rounded square shape).

In one embodiment, the MEMS array structure may further include at least one resonator coupling section which is disposed between each of the opposing elongated straight beam sections of adjacent MEMS resonators.

In addition, in one embodiment, at least one curved section of at least one MEMS resonator may include a nodal point wherein the MEMS array structure further includes at least one anchor coupling section and a substrate anchor, coupled to the nodal point via the anchor coupling section, to secure the MEMS resonator to a substrate. The MEMS array structure may also include a stress/strain relief mechanism disposed within the anchor coupling section and between the substrate anchor and the nodal point.

In another embodiment, at least one curved section of each MEMS resonator includes a nodal point and wherein the MEMS array structure further includes at least one anchor coupling section disposed between an associated nodal point and a substrate anchor and wherein the substrate anchor secures the MEMS resonator to a substrate. A stress/strain relief mechanism maybe disposed within the anchor coupling section and between the substrate anchor and the nodal point.

In one embodiment, each resonator coupling section includes voids to reduce the mass of the section. In another embodiment, each resonator coupling section includes a filleted shape at the ends such that the ends of the resonator coupling section have a greater width than the middle of the resonator coupling section.

Notably, each curved section of each MEMS resonator may include at least one nodal point. In this embodiment, the at least one nodal point of each MEMS resonator is connected to a substrate anchor via an associated anchor coupling section. The MEMS resonator array structure may include a plurality of stress/strain relief mechanisms disposed within an associated anchor coupling section and between an associated substrate anchor and an associated nodal point.

In certain embodiment, the plurality of elongated straight beam sections of each MEMS resonator includes a plurality of slots disposed therein. Moreover, at least one of the plurality of curved sections of each MEMS resonator includes a plurality of slots disposed therein. Indeed, the width of each elongated straight beam section of the MEMS resonator is greater at the ends than in the center thereof.

In another principal aspect, the present invention is a MEMS array structure comprising a plurality of MEMS resonators, a plurality of resonator coupling sections and a plurality of anchor coupling sections. Each MEMS resonator includes a plurality of elongated straight beam sections and a plurality of curved sections (for example, four elongated straight beam sections and four curved sections). Each beam section includes a first end and a second end. Further, each curved section includes a first end and a second end, wherein each end of a beam section is connected to an associated end of one of the curved section to thereby form a geometric shape (for example, a rounded square shape). Moreover, at least one curved section includes a nodal point.

In this aspect, at least one resonator coupling section is disposed between at least one pair of opposing elongated straight beam sections of adjacent MEMS resonators such that each MEMS resonator is connected to at least one adjacent MEMS resonator. In addition, the at least one nodal point of each MEMS resonator is connected to a substrate anchor via an associated anchor coupling section.

In one embodiment, MEMS array structure further includes a plurality of stress/strain relief mechanisms, wherein at least one stress/strain relief mechanism is disposed within an associated anchor coupling section and between the substrate anchor and the nodal point of the MEMS resonator. The resonator coupling sections may include voids to reduce the mass of the section. The resonator coupling sections may, in addition to or in lieu thereof, include a filleted shape at the ends such that the ends of the resonator coupling section have a greater width than the middle of the resonator coupling section.

In another embodiment, the plurality of elongated straight beam sections of each MEMS resonator includes a plurality of slots disposed therein. Indeed, the plurality of curved sections of each MEMS resonator may include a plurality of slots disposed therein.

The MEMS array structure may also include a plurality of sense electrodes, a plurality of drive electrodes, and sense circuitry. The sense and drive electrodes are juxtaposed the plurality of elongated straight beam sections of the MEMS resonators. The sense circuitry is coupled to the sense electrodes to provide an output signal.

The sense electrodes may provide one or more signals to the sense circuitry which, in response, provides a differential output signal. The sense electrodes may provide one or more signals to the sense circuitry which, in response, provides a single ended output signal.

In another principal aspect, the present invention is a MEMS array structure comprising a plurality of MEMS resonators wherein each MEMS resonator includes a plurality of elongated straight beam sections, a plurality of curved sections, wherein each end of a beam section is connected to an associated end of one of the curved section to thereby form a geometric shape. The MEMS array structure may further include one or more resonator coupling sections. In this embodiment, each of the opposing elongated straight beam sections of adjacent MEMS resonators includes a resonator coupling section connected therebetween. The MEMS array structure may also include a plurality of sense electrodes, a plurality of drive electrodes, wherein the sense and drive electrodes are juxtaposed one or more of the plurality of elongated straight beam sections of the MEMS resonators. Sense circuitry, coupled to the sense electrodes, provides an output signal (for example, a differential output signal and/or a single ended output signal).

In one embodiment, one or more sense electrodes are disposed within the geometric shape of at least one of the MEMS resonators. Indeed, the one or more sense electrode may be juxtaposed a plurality of elongated straight beam sections of the at least one of the MEMS resonator.

In one embodiment, at least one curved section of at least one of the plurality of MEMS resonators includes a nodal point. In this embodiment, the MEMS array structure further includes at least one anchor coupling section and a substrate anchor, coupled to the nodal point via the anchor coupling section, to secure the MEMS resonator to a substrate.

The MEMS array structure may include a stress/strain relief mechanism disposed within the anchor coupling section and between the substrate anchor and the nodal point.

In another embodiment, each curved section of each MEMS resonator includes at least one nodal point. In this embodiment, at least one nodal point of each MEMS resonator is connected to a substrate anchor via an associated anchor coupling section. A plurality of stress/strain relief mechanisms may be disposed within an associated anchor coupling section and between an associated substrate anchor and an associated nodal point. The resonator coupling sections may include voids to reduce the mass of the section to a filleted shape at the ends such that the ends of the resonator coupling section have a greater width than the middle of the resonator coupling section.

Again, there are many inventions, and aspects of the inventions, described and illustrated herein. This Summary discusses some of the inventions described and claimed herein.

By no means is this Summary of the Invention is not exhaustive of the scope of the present inventions. Moreover, this Summary of the Invention is not intended to be limiting of the invention and should not be interpreted in that manner. While certain embodiments have been described and/or outlined in this Summary of the Invention, it should be understood that the present invention is not limited to such embodiments, description and/or outline. Indeed, many others embodiments, which may be different from and/or similar to, the embodiments presented in this Summary, will be apparent from the description, illustrations and claims, which follow. In addition, although various features, attributes and advantages have been described in this Summary of the Invention and/or are apparent in light thereof, it should be understood that such features, attributes and advantages are not required whether in one, some or all of the embodiments of the present inventions and, indeed, need not be present in any of the embodiments thereof.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 4A-4I illustrate top views of exemplary MEMS resonator arrays having a plurality of rounded square shaped MEMS resonators according to certain embodiments of the present inventions wherein the plurality of rounded square shaped MEMS resonators are mechanically coupled to one or more adjacent MEMS resonators of the MEMS resonator array employing various resonator coupling sections;

FIGS. 6A, 6B, 6D-6H, 7A-7H, 8A, 8B, 9A-9C, 10A and 10B illustrate top views of exemplary MEMS resonator arrays having a plurality of rounded square shaped MEMS resonators according to certain embodiments of present the inventions wherein one or more of the plurality of rounded square shaped MEMS resonators are mechanically coupled to one or more substrate anchors using various anchoring techniques and/or configurations;

FIGS. 11A and 11B illustrate top views of a portion of exemplary MEMS resonator arrays including a rounded square shaped MEMS resonator according to certain embodiments of the present inventions wherein the MEMS resonator array includes stress/strain relief mechanisms which are mechanically coupled between a rounded square shaped MEMS resonator and a substrate anchor;

FIGS. 14 and 15 are top views of a portion of exemplary embodiments of rounded square shaped MEMS resonator, according to certain embodiments of MEMS resonator array of the present inventions, wherein the rounded or curved sections have different radii, and a plurality of anchor coupling sections that connect the rounded or curved sections to one or more anchors;

FIGS. 16-18 are top views of various embodiments of anchor coupling sections in conjunction with a section of a MEMS resonator, according to certain embodiments of the present inventions;

FIGS. 19-21 are top views of various embodiments of anchor coupling sections and stress/strain mechanisms, in conjunction with a section of a MEMS resonator, according to certain embodiments of the present inventions;

FIGS. 22A and 22B are top views of a ring oscillator that is oscillating in plane in a breathing-like mode or motion, wherein the ring oscillator expands (FIG. 22A) and contracts (FIG. 22B) in relation to a non-induced state;

FIGS. 24A and 24B are top views of an exemplary embodiment of a MEMS resonator array including four rounded square shaped MEMS resonators, having in-plane vibration of elongated beam sections, according to one aspect of present invention, wherein the MEMS resonators oscillate between deflection states and wherein each deflected state is superimposed over (or illustrated relative to) the stationary state of MEMS resonator;

FIGS. 30A, 30B and 31-42 are top views of embodiments of a MEMS resonator array (or portions thereof) according to an aspect of the invention, wherein the MEMS resonator device includes openings, voids or slots for improved manufacturability (for example, faster release of the mechanical structures in those instances where the opening, void or slot extends the entire height/thickness of the beam section) and/or to improve temperature management techniques (for example, decrease thermo elastic energy dissipation) implemented in one or more elongated beam sections, one or more curved sections, and/or one or more anchor coupling sections;

FIGS. 53-55 are top views of exemplary MEMS resonator arrays including various exemplary anchoring techniques and stress/strain mechanisms in conjunction with various exemplary embodiments of resonator mechanical coupling techniques and loading relief mechanisms, according to certain embodiments of the present inventions;

DETAILED DESCRIPTION

Figure 1:
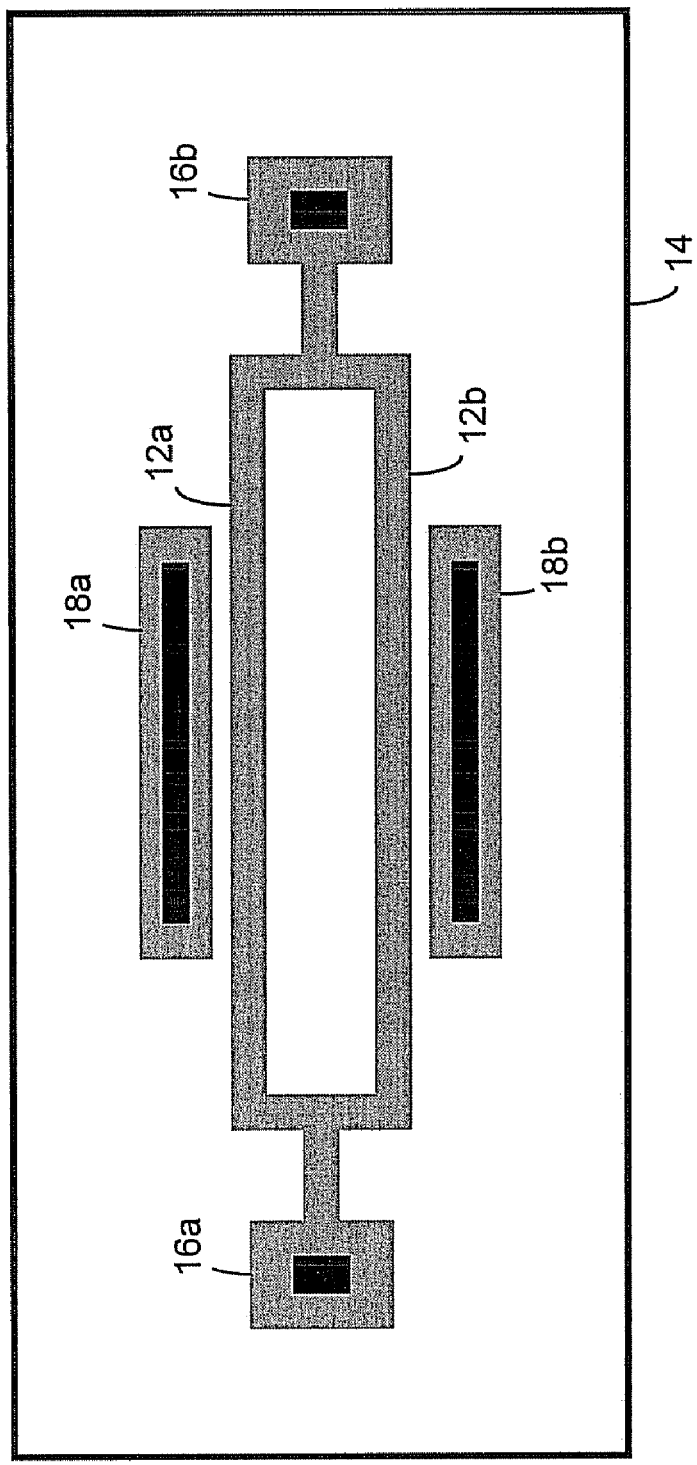
FIG. 1 is a block diagram (top view) representation of a conventional microelectromechanical tuning fork resonator device.

There are many inventions described and illustrated herein, as well as many aspects and embodiments of those inventions. In one aspect, the present invention is directed to a plurality of mechanically coupled resonators that are arranged in an N×M MEMS array structure (where N and M are integers). Each of the resonators includes a plurality of straight (or substantially straight) elongated beam sections that are connected by curved or rounded sections. Each elongated beam section of a given resonator is connected to another elongated beam section at a distal end via the curved or rounded sections thereby forming a geometric shape having at least two elongated beam sections that are interconnected via curved or rounded sections.

Each resonator is mechanically coupled to at least one other resonator of the MEMS array via a resonator coupling section. The resonator coupling sections are disposed or connected between elongated beam sections of mechanically coupled resonators. In this way, all of the resonators, when induced or during operation, vibrate at the same or substantially the same frequency. That is, in one embodiment, each beam section of each resonator of the array oscillates or vibrates at the same or substantially the same frequency oscillates or vibrates at the same or substantially the same frequency.

In one embodiment, each MEMS resonator of a MEMS array of the present invention includes three elongated beam sections that are interconnected via curved sections to form a rounded triangle shape. In another embodiment, the MEMS array of the present invention includes a plurality of resonators having four straight (or substantially straight) elongated beams that are connected, at distal ends, to rounded sections thereby forming a rounded square or rectangle shape.

In operation, when induced or during operation; each MEMS resonator of the array oscillates in a combined elongating (or breathing) mode and bending mode. In this regard, the beam sections of each MEMS resonator of the array exhibit an elongating-like (or breathing-like) motion and a bending-like motion. Further, when induced or during operation, each beam section of the MEMS resonators oscillates or vibrates at the same or substantially the same frequency. The beam sections of the MEMS resonators of the array all exhibit the same or substantially the same elongating-like (or breathing-like) motion and bending-like motion to thereby produce the same or substantially the same frequency.

The design and motion of each MEMS resonator of the array structure is such that the resonator includes one or more nodal points or areas (i.e., portions of the resonator structure that are stationary, experience little movement, and/or are substantially stationary in one or more degrees of freedom (whether from a rotational and/or translational perspective) during oscillation of the resonator structure). The nodal points are located in one or more portions or areas of the curved sections of the resonator structure. The nodal points are suitable and/or preferable locations to anchor the resonator structure and/or the array structure to the substrate. In this way, energy loss into the substrate may be minimized, limited and/or reduced, thereby enhancing the Q-factor of the resonator structure and/or the array structure. Notably, such a configuration may minimize and/or reduce communication of stress and/or strain between the resonating beams of one or more resonators of the array and the substrate.

In addition, although the beam sections of each MEMS resonator of the array, when induced or during operation, move in an elongating-like (or breathing-like) manner (for example, like that of a ring oscillator) and a bending-like manner (for example, like that of a beam of a double-claimed tuning fork), each MEMS resonator tends to maintain a relatively stable or fixed center of gravity. In this way, the resonators may avoid energy loss and thereby provide an array structure having a higher Q-factor.

Notably, the present inventions are described in the context of microelectromechanical systems. The present inventions, however, are not limited in this regard. Rather, the inventions described herein are applicable to, for example, nanoelectromechanical systems. Thus, the present inventions are pertinent to microelectromechanical and nanoelectromechanical (herein collectively "MEMS" unless specifically noted to the contrary) systems, for example, gyroscopes, resonators, and/or accelerometers, implementing one or more of the MEMS resonator array structures of the present inventions.

As mentioned above, in one aspect, the present invention is an array of N×M MEMS resonators (where N and M are integers) coupled to one or more of the adjacent MEMS resonators.

Figure 2A:
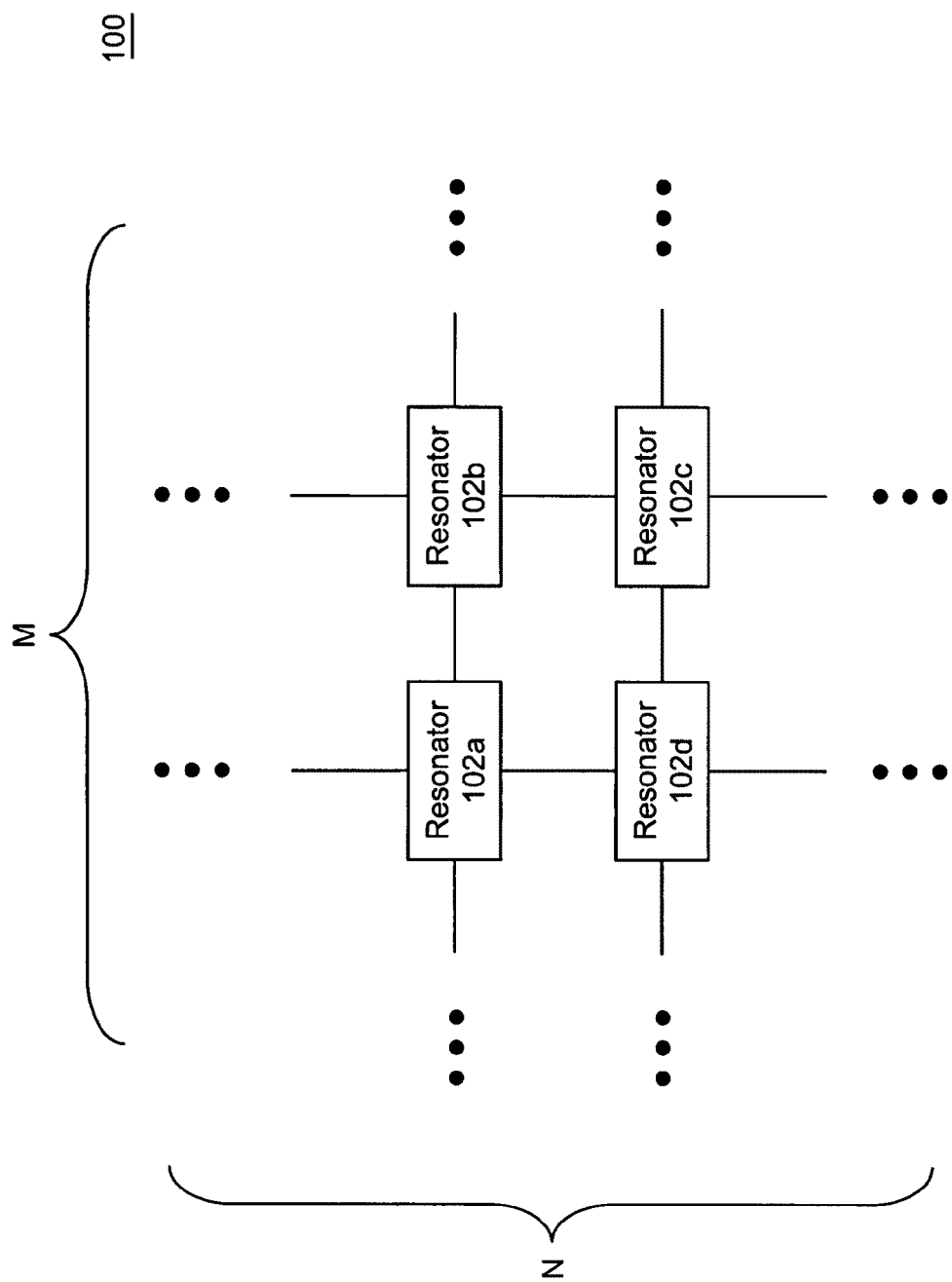
FIG. 2A is a schematic representation of MEMS resonator array having an N×M MEMS resonator configuration, according to one aspect of the present inventions, wherein each MEMS resonator of the array is coupled to the adjacent resonator.

Each MEMS resonator is mechanically coupled to at least one other resonator of the array via a resonator coupling section. With reference to FIG. 2A, in one embodiment, MEMS resonator array 100 includes a plurality of MEMS resonators 102a-d which are mechanically coupled, via resonator coupling sections 104, to each adjacent MEMS resonator. In this way, each MEMS resonator 102 is coupled to all adjacent MEMS resonator(s) 102.

Figure 2B:
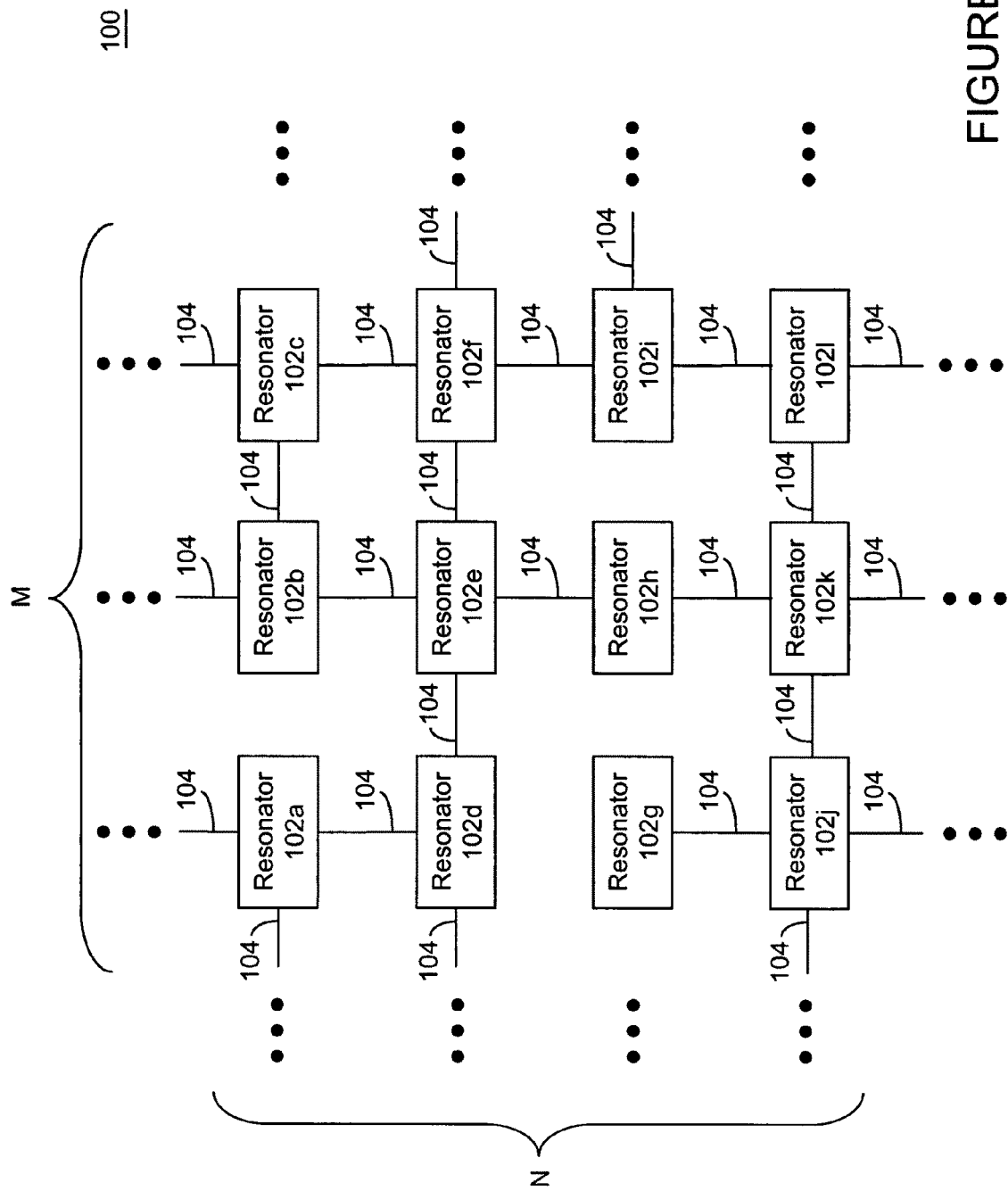
FIG. 2B is a schematic representation of MEMS resonator array having an N×M MEMS resonator configuration, according to one aspect of the present inventions, wherein the MEMS resonators of the array are coupled to at least one adjacent resonator.

With reference to FIG. 2B, in another embodiment, MEMS resonator array 100 includes a plurality of MEMS resonators 102a-d which are mechanically coupled, via resonator coupling sections 104, to at least one adjacent MEMS resonator. For example, MEMS resonator 102e is mechanically coupled to adjacent MEMS resonators 102b, 102d, 102f and 102h. In contrast, MEMS resonator 102h is mechanically coupled to adjacent MEMS resonators 102e and 102k. In this embodiment, MEMS resonator 102h is not coupled to adjacent MEMS resonators 102g and 102i.

Figure 3A:
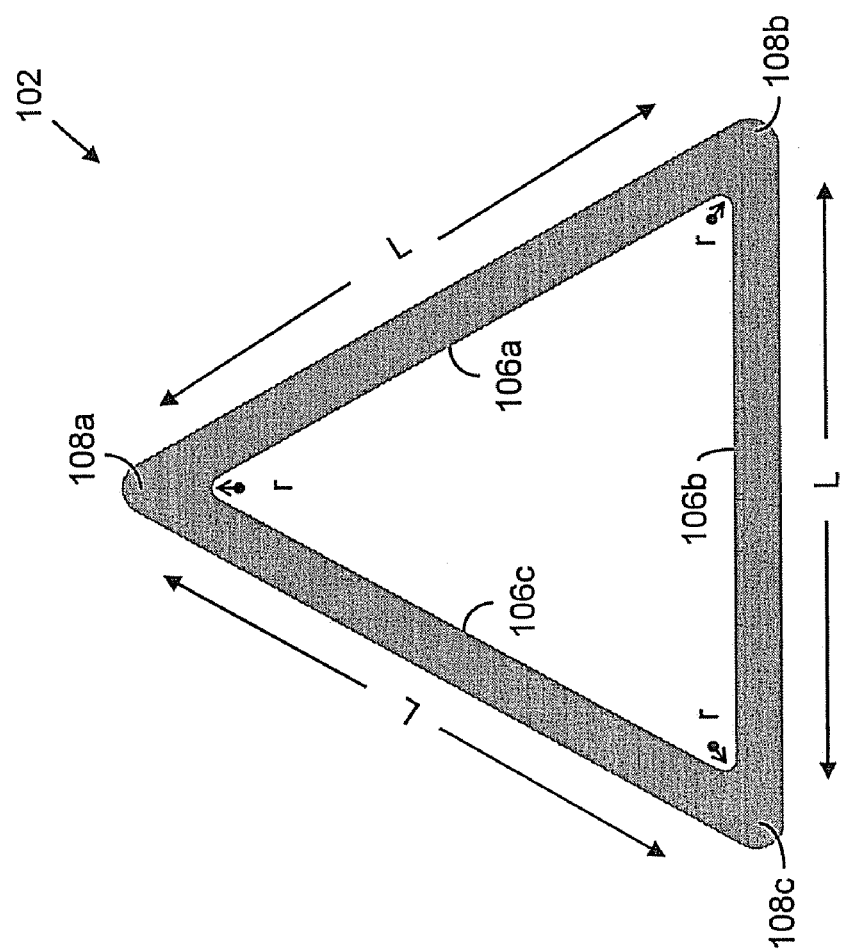
FIG. 3A is a top view of one embodiment of a rounded triangle shaped MEMS resonator, having three elongated beam sections that are connected via rounded or curved sections, according to an embodiment of one aspect of the MEMS resonator array of the present inventions.
Figure 3B:
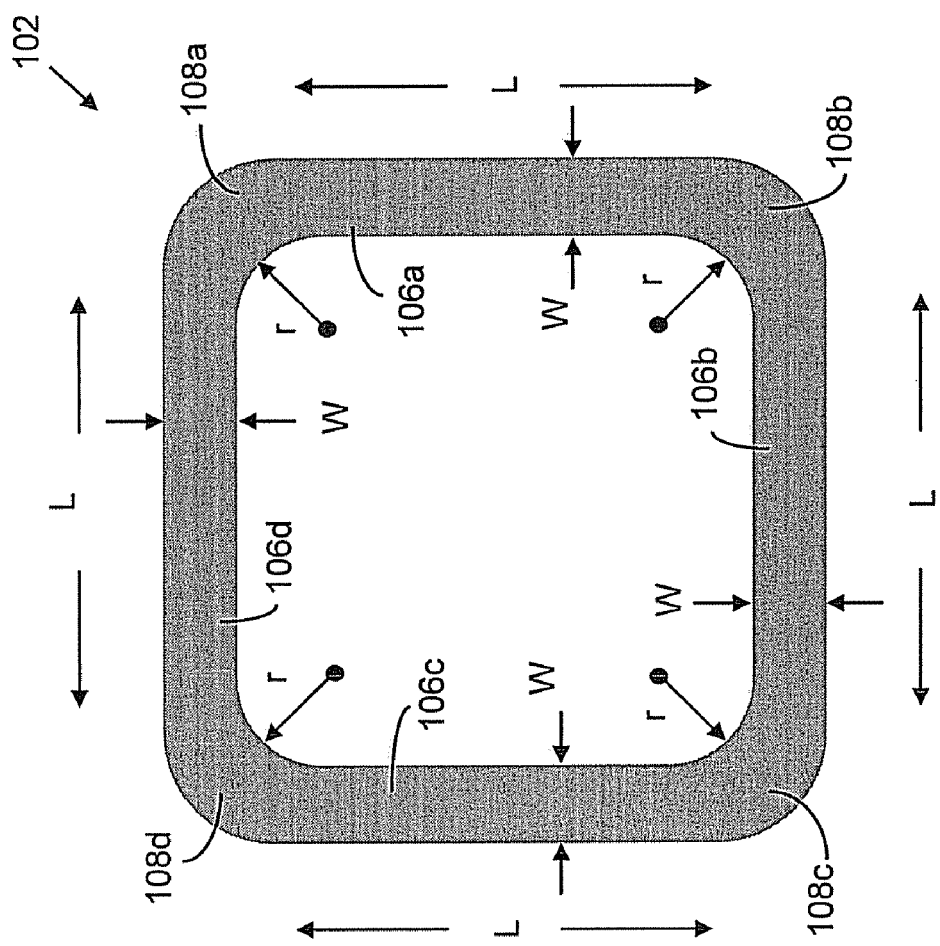
FIG. 3B is a top view of one embodiment of a rounded square shaped MEMS resonator, having four elongated beam sections that are connected via rounded or curved sections, according to an embodiment of one aspect of the MEMS resonator array of the present inventions.

As mentioned above, each MEMS resonator of the MEMS resonator array, according to one aspect of the present invention, includes a plurality of elongated beam sections that are connected by curved or rounded sections. Each elongated beam section is connected to another beam section of the MEMS resonator at each distal end via the curved or rounded sections thereby forming a geometric shape having at least two elongated beams that are interconnected via curved or rounded sections. In one embodiment, with reference to FIG. 3A, MEMS resonator 102 includes three elongated beam sections 106a-c that are connected via curved sections 108a-c to form a rounded triangle shape. With reference to FIG. 3B, in another embodiment, MEMS resonator 102 includes four elongated beam sections 106a-d that are connected via curved sections 108a-d to form a rounded square shape.

Figure 3C:
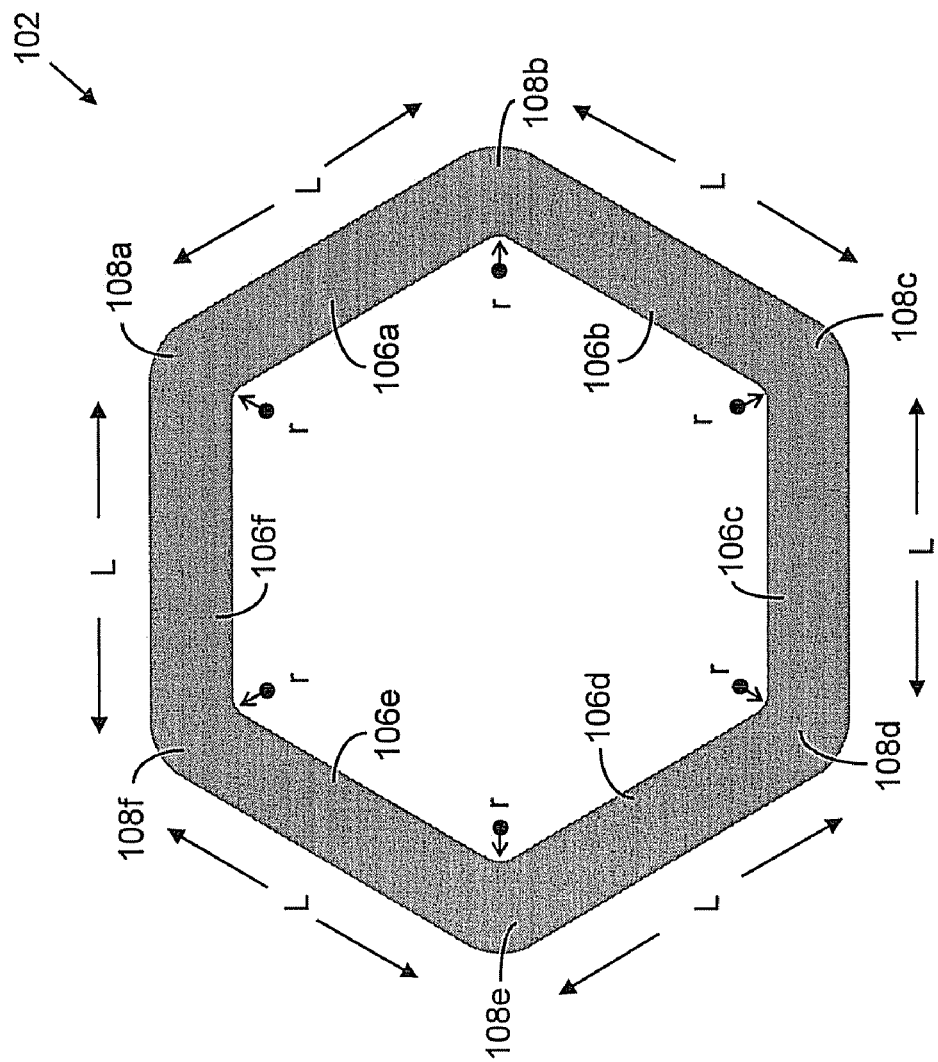
FIG. 3C is a top view of one embodiment of a rounded hexagon shaped MEMS resonator, having six elongated beam sections that are connected via rounded or curved sections, according to an embodiment of one aspect of the MEMS resonator array of the present inventions.

Notably, MEMS resonator 102 of the present inventions may include more than four elongated beam sections, for example, MEMS resonator 102 may include six elongated beam sections 106a-f that are connected together via curved sections 108a-f to form a rounded hexagon shape (see, FIG. 3C). Indeed, the resonator structure of the present inventions may take any geometric shape whether now know or later developed that includes two or more straight elongated beam sections which are interconnected by two or more curved or rounded sections.

The length and width of each beam section 106 and inner radii of the curved sections 108 (and/or, more generally the shape of the radii of the curved sections) may determine one or more resonant frequencies of MEMS resonator 102. The beam sections 106 oscillate or vibrate at the same frequency. TABLE 1 provides a resonant frequency in conjunction with exemplary dimensions of the length and width of each beam section 106 and inner radii of the curved sections 108 of rounded square MEMS resonator 102 which is fabricated from a polycrystalline silicon material. Notably, in these exemplary embodiments, the width of elongated beam sections 106 and curved sections 108 are the same or substantially the same.

TABLE 1

| Elongated Beam Section | | Curved Section | Resonant Frequency |
|---|---|---|---|
| Width (μm) | Length (μm) | Inner Radius (μm) | (MHz) |
| Example 1   24 | 122.43 | 34.787 | 5.3034 |

TABLE 2 provides a resonant frequency in conjunction with exemplary dimensions of the length and width of each beam section 106 and inner radii of the curved sections 108 of a rounded square MEMS resonator 102 which is fabricated from a monocrystalline silicon material. Again, in these exemplary embodiments, the width of elongated beam sections 106 and curved sections 108 are the same or substantially the same.

TABLE 2

| Elongated Beam Section | | Curved Section | Resonant Frequency |
|---|---|---|---|
| Width (μm) | Length (μm) | Inner Radius (μm) | (MHz) |
| Example 1   8 | 209.61 | 7.1944 | 1.1903 |
| Example 2   24 | 129.89 | 31.055 | 4.8286 |

Notably, the dimensions of the MEMS resonators set forth in Tables 1 and 2 are merely exemplary. The dimensions, characteristics and/or parameters of a MEMS resonator according to the present invention may be determined using a variety of techniques including modeling and simulation techniques (for example, a finite element modeling and/or simulation process implemented via a computer driven analysis engine, such as FEMLab (from Consol), ANSYS (ANSYS INC.), IDEAS and/or ABAKUS) and/or empirical data/measurements. For example, a finite element analysis engine, using or based on a set of boundary conditions (for example, the size of the resonator structure), may be employed to design, determine and assess the dimensions, characteristics and/or parameters of (i) elongated beam sections 106, (ii) curved sections 108, and (iii) other elements or properties of the resonator structure that are discussed below. Notably, an empirical approach may also be employed (in addition to or in lieu of a finite element analysis (or the like) approach) to design, determine and assess the dimensions, characteristics and/or parameters of (i) elongated beam sections 106, (ii) curved sections 108, and (iii) other elements or properties of the resonator structure.

Figure 4C:
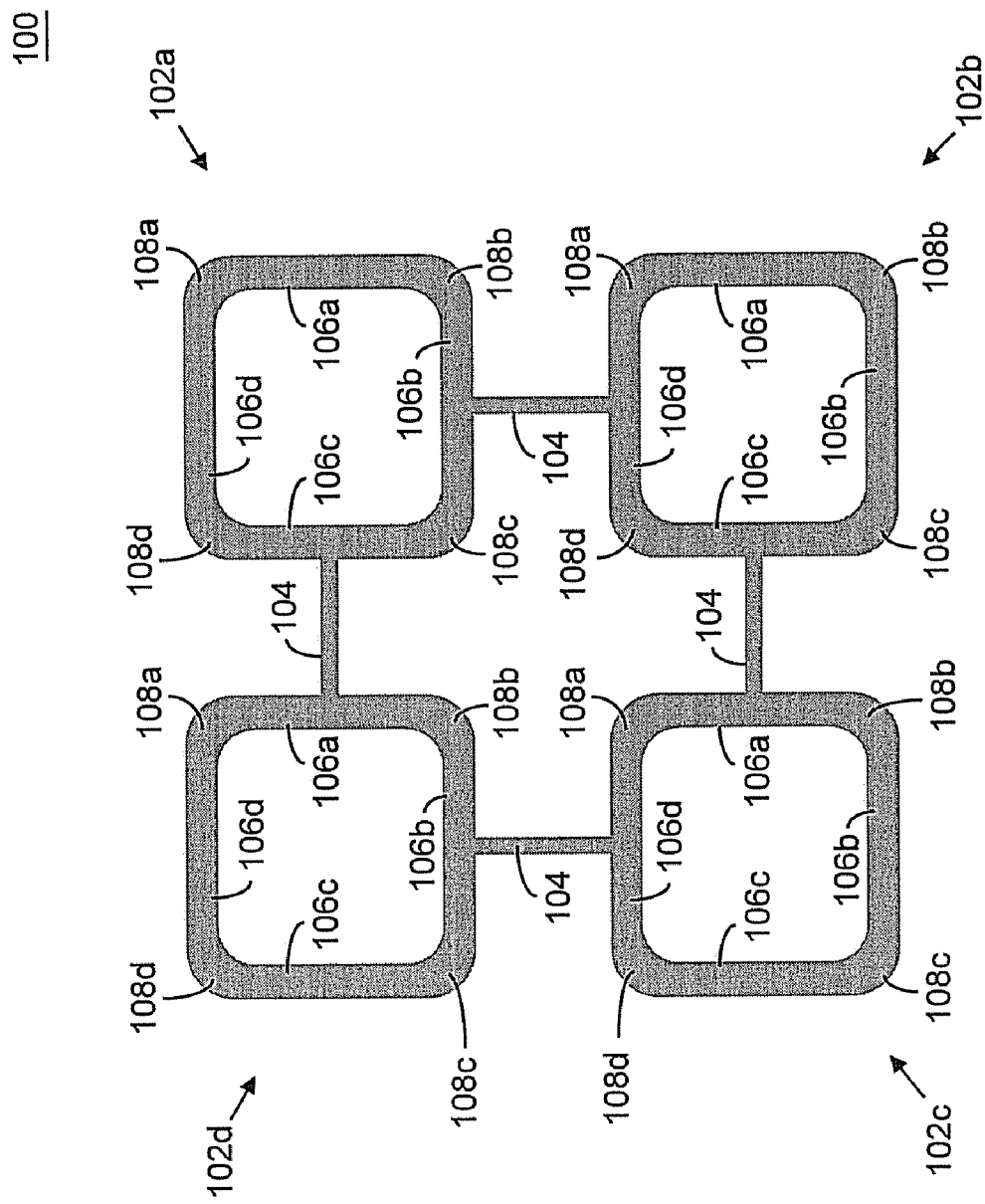

The MEMS resonators 102 of MEMS resonator array 100 are mechanically coupled via one or more resonator coupling sections 104. With reference to FIGS. 4A-4C, in one embodiment, resonator coupling sections 104 may be substantially straight beams having relatively uniform width.

Further, each of resonator coupling section 104 may have the same or substantially the same length and the same or substantially the same shape. For example, with reference to FIGS. 4B and 4C, resonator coupling section 104 that mechanically couples MEMS resonators 102a and 102b is substantially identical in shape and dimensions as resonator coupling sections 104 that mechanically couples MEMS resonators 102b and 102c.

Figure 4D:
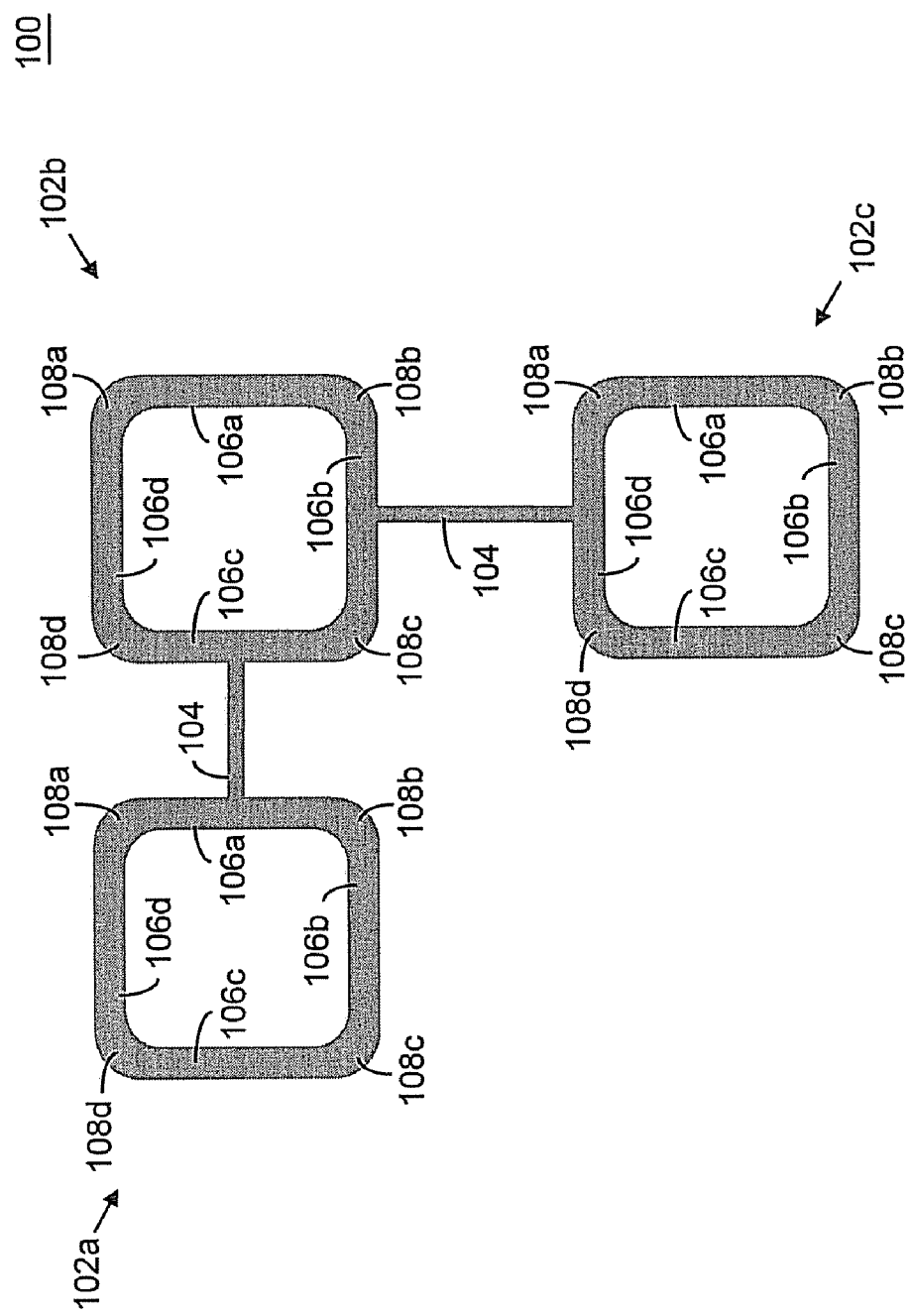
Figure 4E:
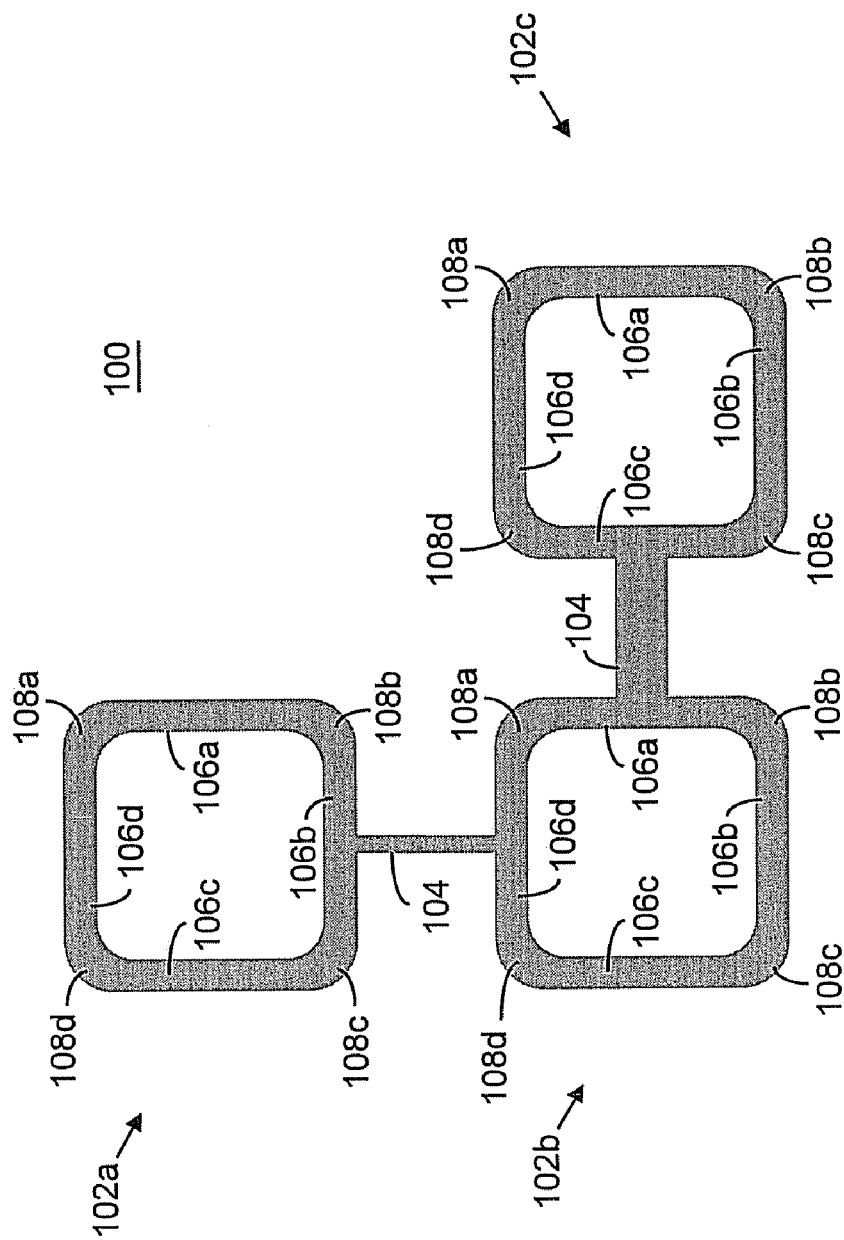

In another embodiment, resonator coupling sections 104 may be substantially straight beams having different widths and/or lengths. (See, for example, FIGS. 4D and 4E).

Figure 4F:
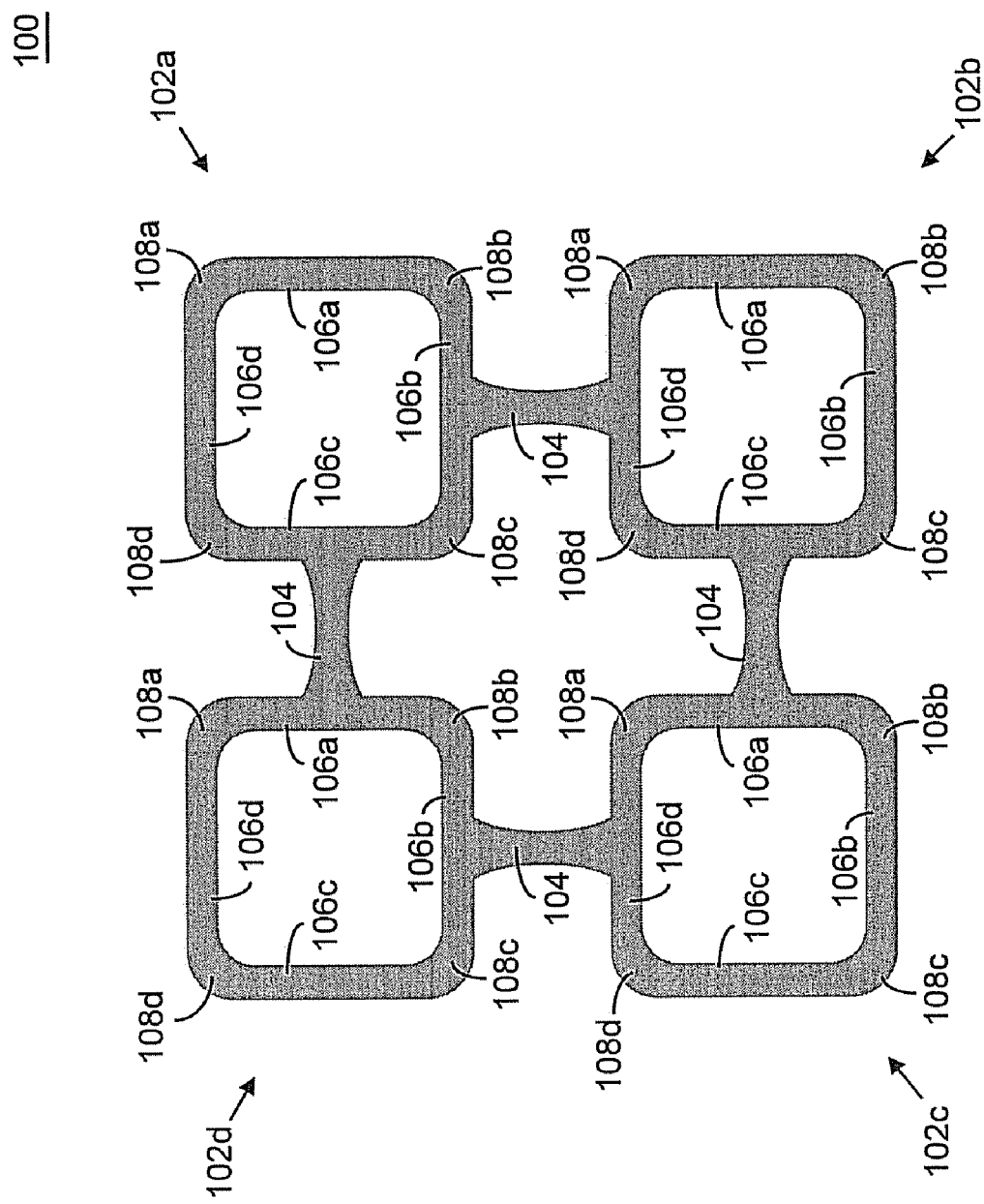

In yet another embodiment, with reference to FIGS. 4F and 4G, resonator coupling sections 104 includes a design (for example, shape and width) of anchor coupling sections 116 to manage, control, reduce and/or minimize the stress concentration in or at the connection of resonator coupling sections 104 and elongated beams 106. In this embodiment, resonator coupling sections 104 are filleted to enhance the management of the stresses between resonator coupling section 104 and associated elongated beams 106. Such a design, however, may tend to increase the loading on elongated beams 106 relative to non-filleted designs. In this regard, by adjusting the shape and width of resonator coupling section 104 in the vicinity of elongated beam 106 (for example by filleting resonator coupling section 104 in the vicinity of elongated beam 106), the stress on resonator coupling section 104 and associated elongated beams 106 may be managed, controlled, reduced and/or minimized. In this way, the durability and/or stability of MEMS resonator array 100 may be increased, enhanced and/or optimized while the mode of operation or mode shape remains relatively undisturbed (or any disturbance is acceptable) and thereby the quality of the nodal points (discussed in more detail below), if any, remains relatively undisturbed (or any disturbance is acceptable). In addition thereto, reducing, minimizing and/or limiting the loading on elongated beams 106 may facilitate an adverse impact on the "Q" factor MEMS resonator array 100.

Figure 4H:
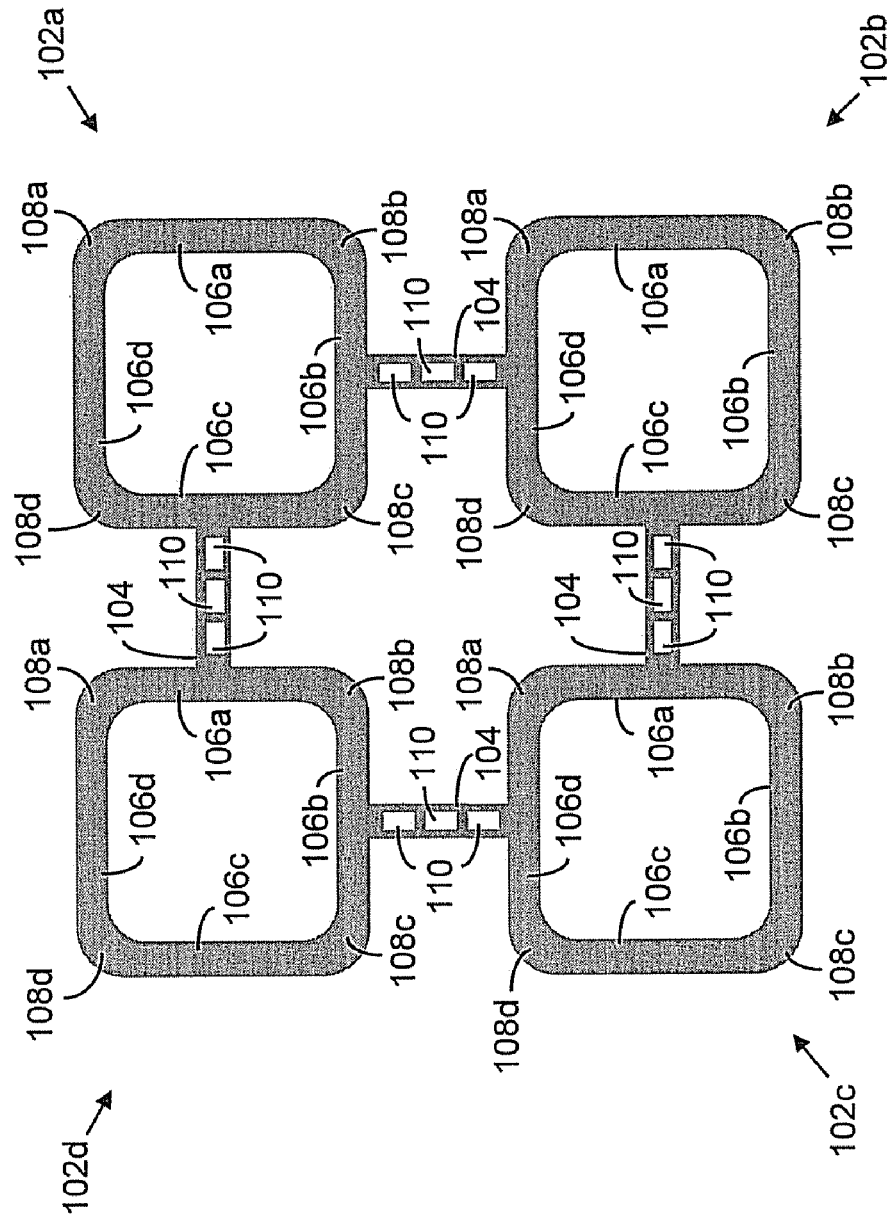
Figure 4I:
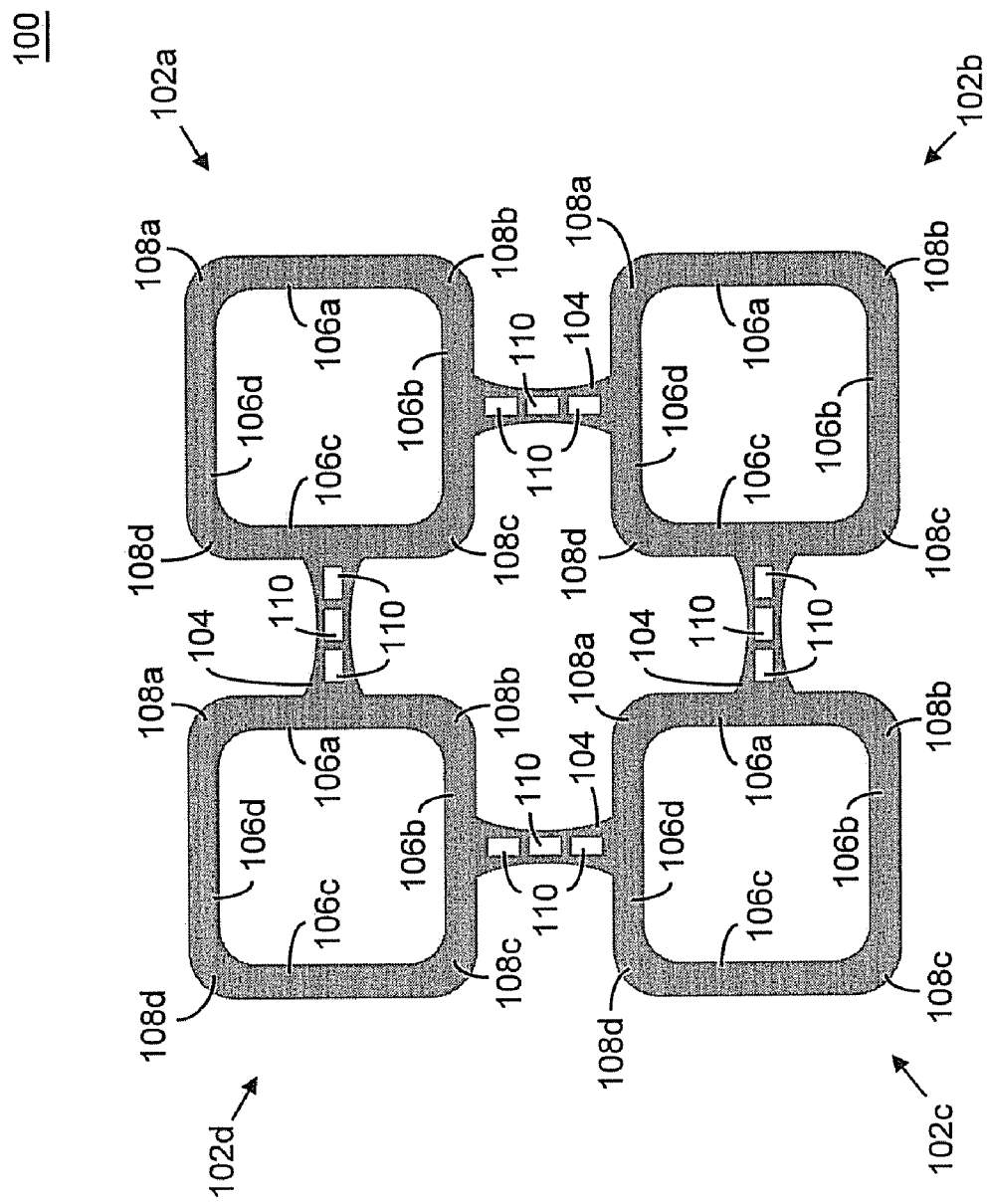

Other designs and/or configurations of resonator coupling section 104 may be employed to, for example, affect the durability and/or stability of MEMS resonator array 100 as well as minimize, reduce or limit any adverse impact on "Q" factor of MEMS resonator array 100. Indeed, all designs of resonator coupling section 104 whether now known or later developed are intended to fall within the scope of the present invention. For example, with reference to FIG. 4H and 4I, resonator coupling section 104 may include voids 110. The voids 110 may of any shape or size and extend partially or entirely through the height/thickness of coupling sections 104. Implementing voids in one or more of the resonator coupling sections 104 reduces the mass of resonator coupling section 104 which further minimizes, reduces or limits the loading on elongated beam sections 106 and thereby further minimizes, reduces or limits any adverse impact on "Q" factor of MEMS resonator array 100. Notably, in certain embodiments, resonator coupling sections 104 have small dimensions (for example, the shape, length, width and/or thickness of resonator coupling sections 104) to provide a small mass while adding little to no stiffness to elongated beam sections 106 is preferred.

Figure 5A:
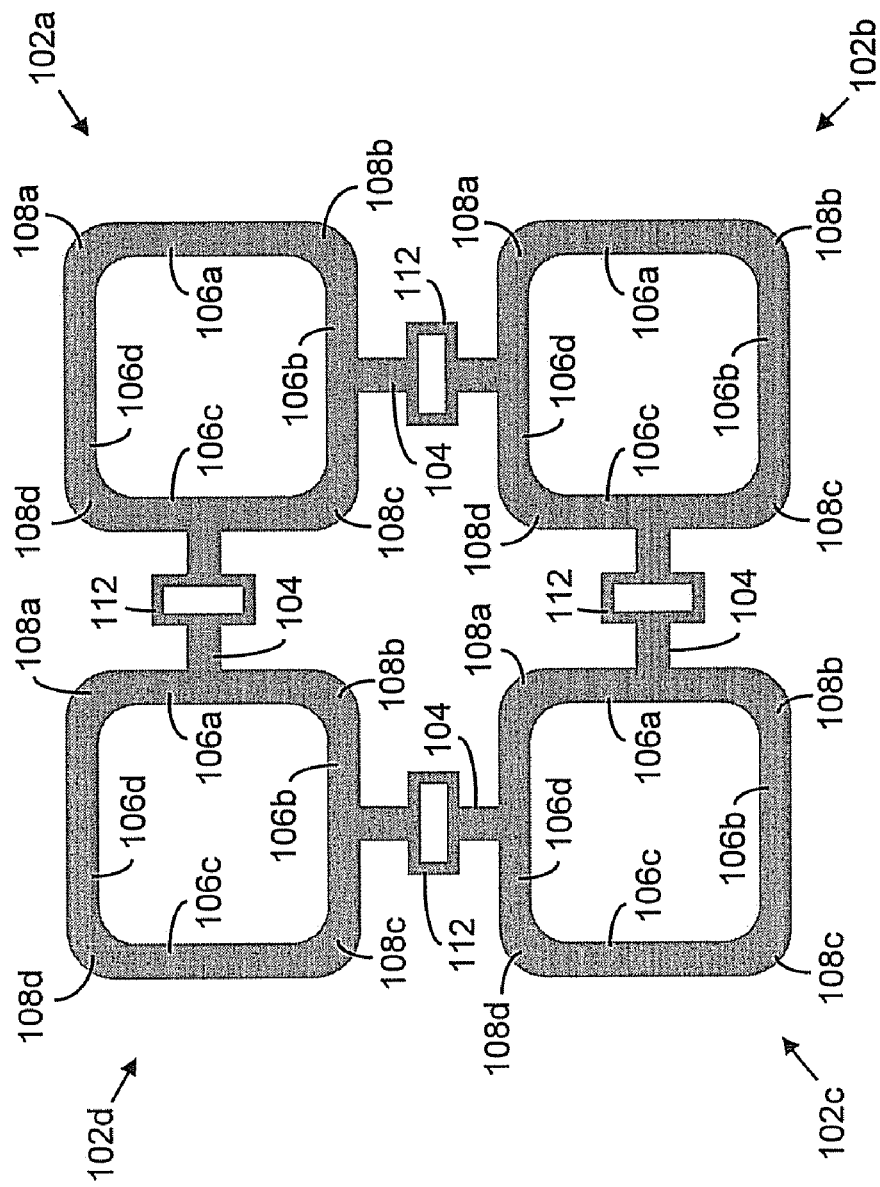
FIGS. 5A and 5B illustrate top views of exemplary MEMS resonator arrays having a plurality of rounded square shaped MEMS resonators according to certain embodiments of the present inventions wherein the plurality of rounded square shaped MEMS resonators are mechanically coupled to one or more adjacent MEMS resonators of the MEMS resonator array employing various resonator coupling sections that include one or more loading relief mechanisms which are mechanically disposed within the resonator coupling section.
Figure 5B:
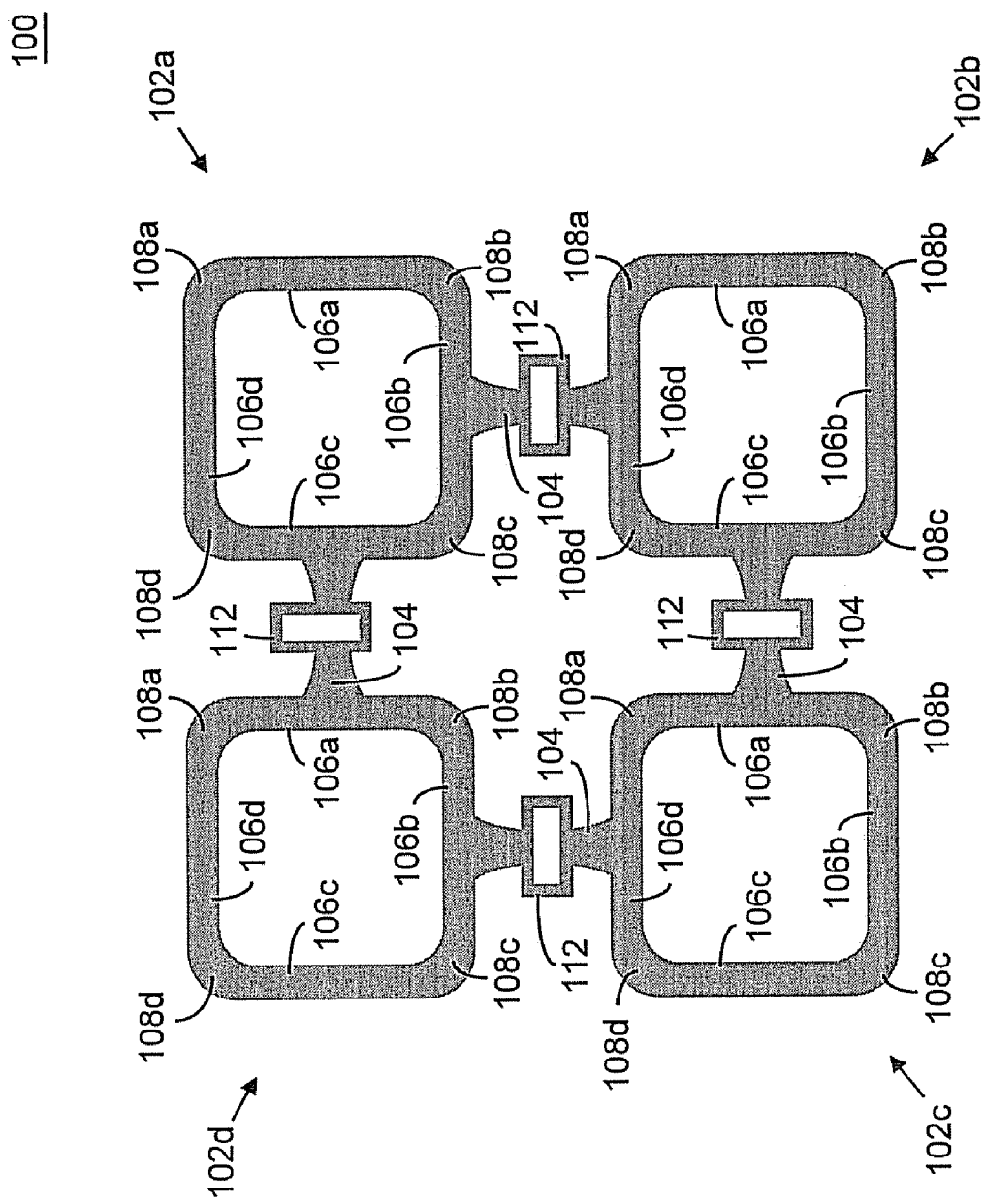

With reference to FIGS. 5A and 5B, MEMS resonator array 100 of the present inventions may employ loading relief mechanisms 112 (for example, springs or spring-like components) within an associated resonator coupling section 104 to manage, control, reduce, eliminate and/or minimize any stress or strain on the associated pair of elongated beams 106 that are mechanically coupled by resonator coupling section 104. In particular, loading relief mechanism 112 is disposed within resonator coupling section 104 which mechanically couples elongated beam 106a of MEMS resonator 102b and elongated beam 106a of MEMS resonator 102c.

In operation, loading relief mechanisms 112 slightly expand and contract in conjunction with the motion of one, some or all of elongated beam sections 106a-d and/or curved sections 108a-d in order to reduce, eliminate and/or minimize any stress or strain on an associated the associated elongated beam sections 106a-d which are coupled by resonator coupling section 104. In addition, this coupling technique of MEMS resonator array 100 may further reduce, eliminate and/or minimize loading on the elongated beam sections 106a-d thereby decreasing, reducing, minimizing and/or eliminating energy losses of MEMS resonators 102 due to the mechanical coupling to adjacent MEMS resonators.

The loading relief mechanisms 112 may be employed in conjunction with any of the mechanical coupling techniques and/or architectures described and/or illustrated herein. For example, loading relief mechanisms 112 may be implemented within, before and/or after one or more of the one or more resonator coupling section 104 of FIG. 5A and 5B.

Notably, loading relief mechanisms 112 may be well known springs or spring-like components, or may be any mechanism that reduces, eliminates and/or minimizes stress and/or strain on coupled elongated beams 106.

As mentioned above, in operation, the motion of the MEMS resonator is such that the MEMS resonator array and/or the individual MEMS resonators include one or more nodal points (i.e., areas or portions of the resonator structure that do not move, experience little movement, and/or are substantially stationary when the MEMS resonators oscillates). It may be advantageous to anchor the MEMS resonator array and/or the individual MEMS resonators to the substrate through or at one or more of the nodal points of one or more of the individual MEMS resonators of the MEMS resonator array.

Figure 6C:
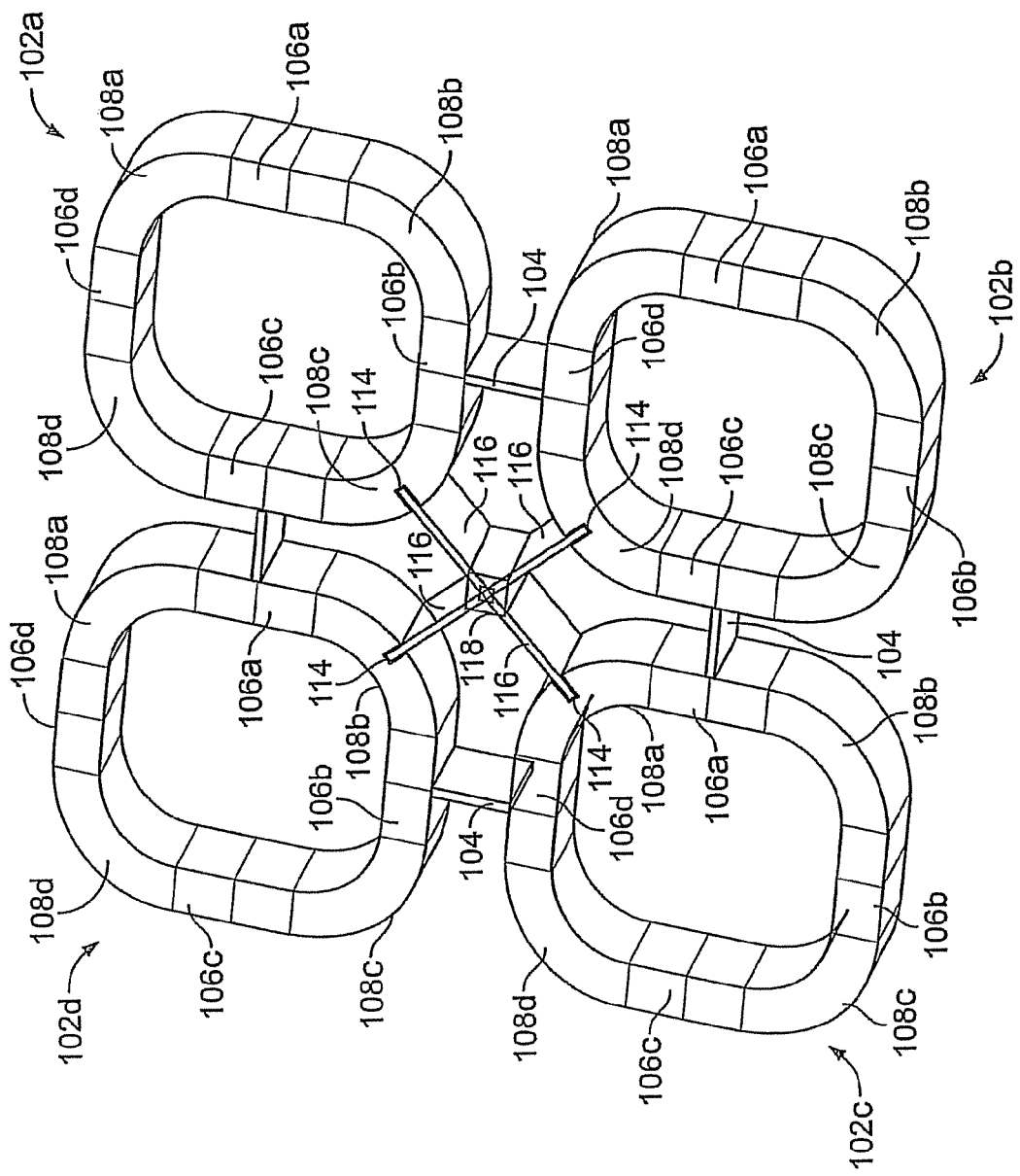
FIG. 6C illustrates an oblique view of the MEMS resonator array of FIG. 6D.
Figure 6D:
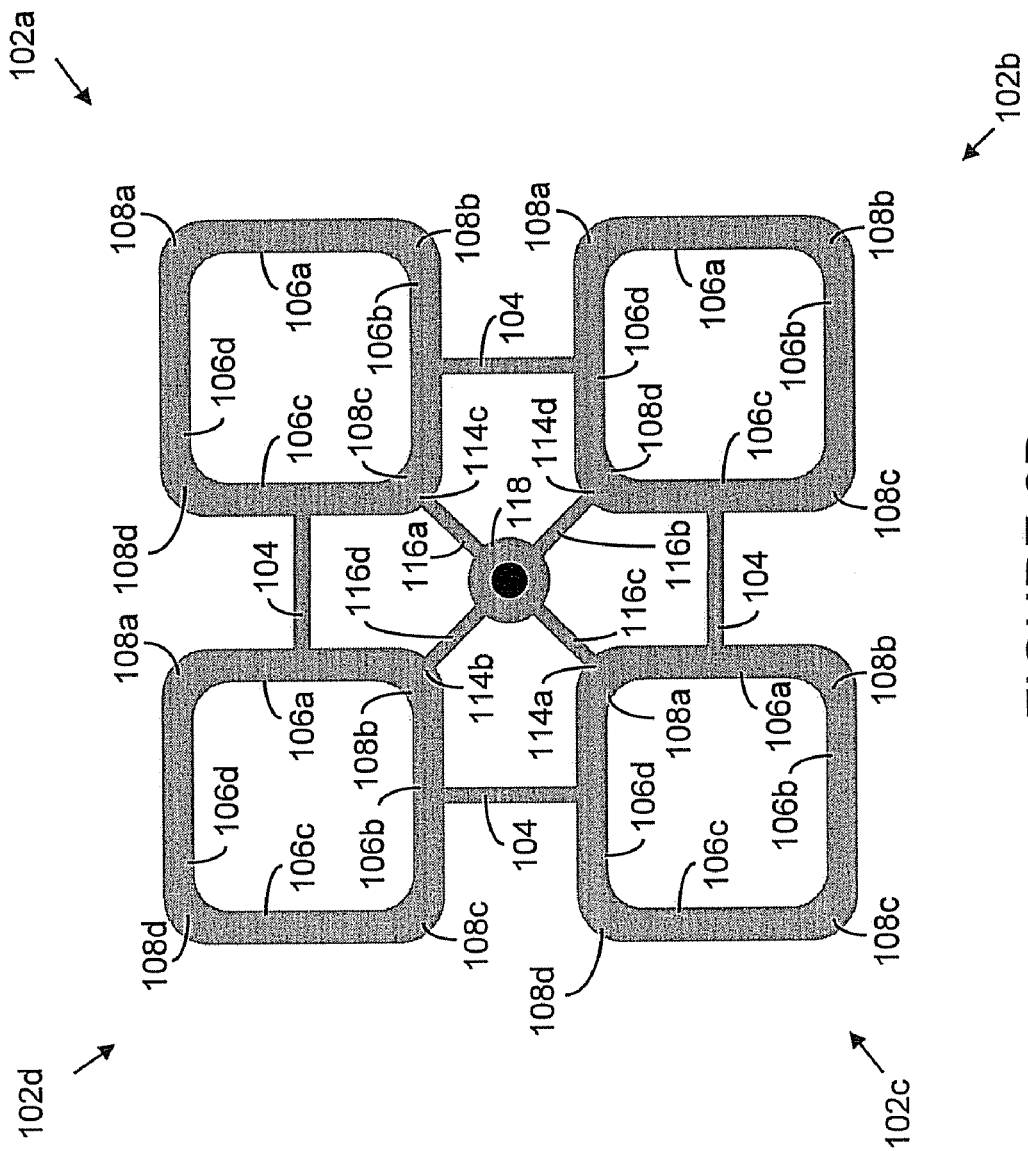
Figure 6E:
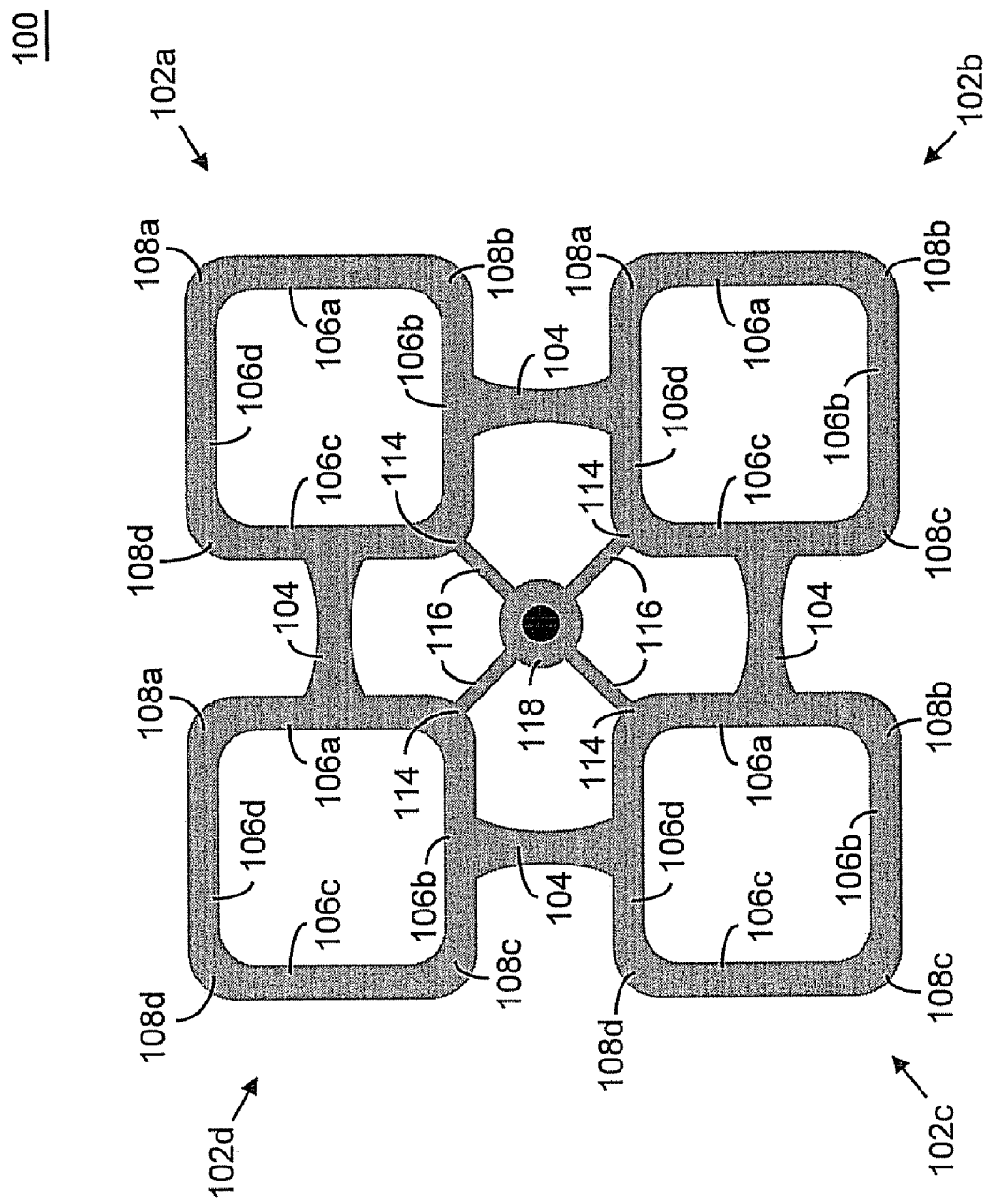
Figure 6F:
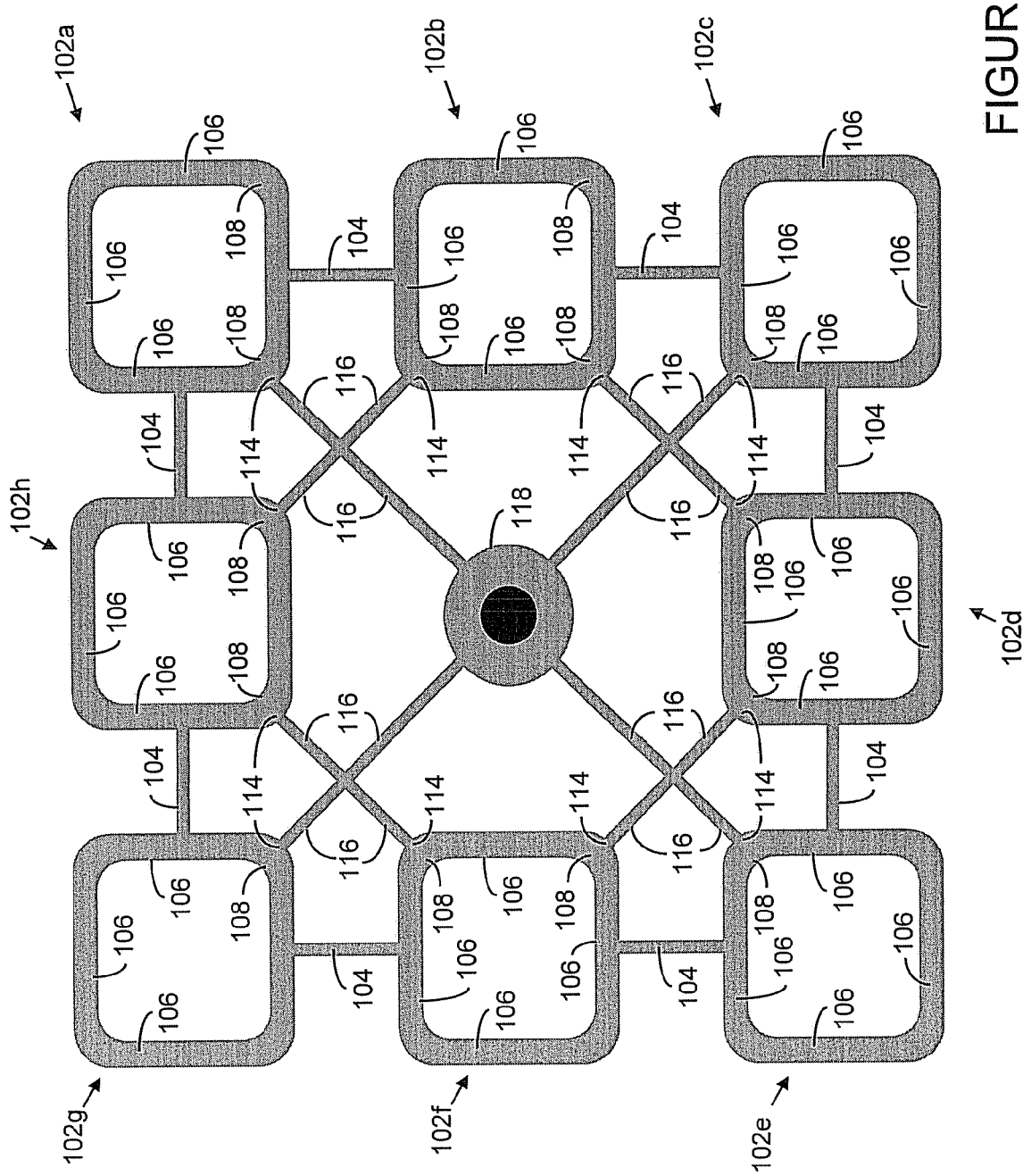
Figure 6G:
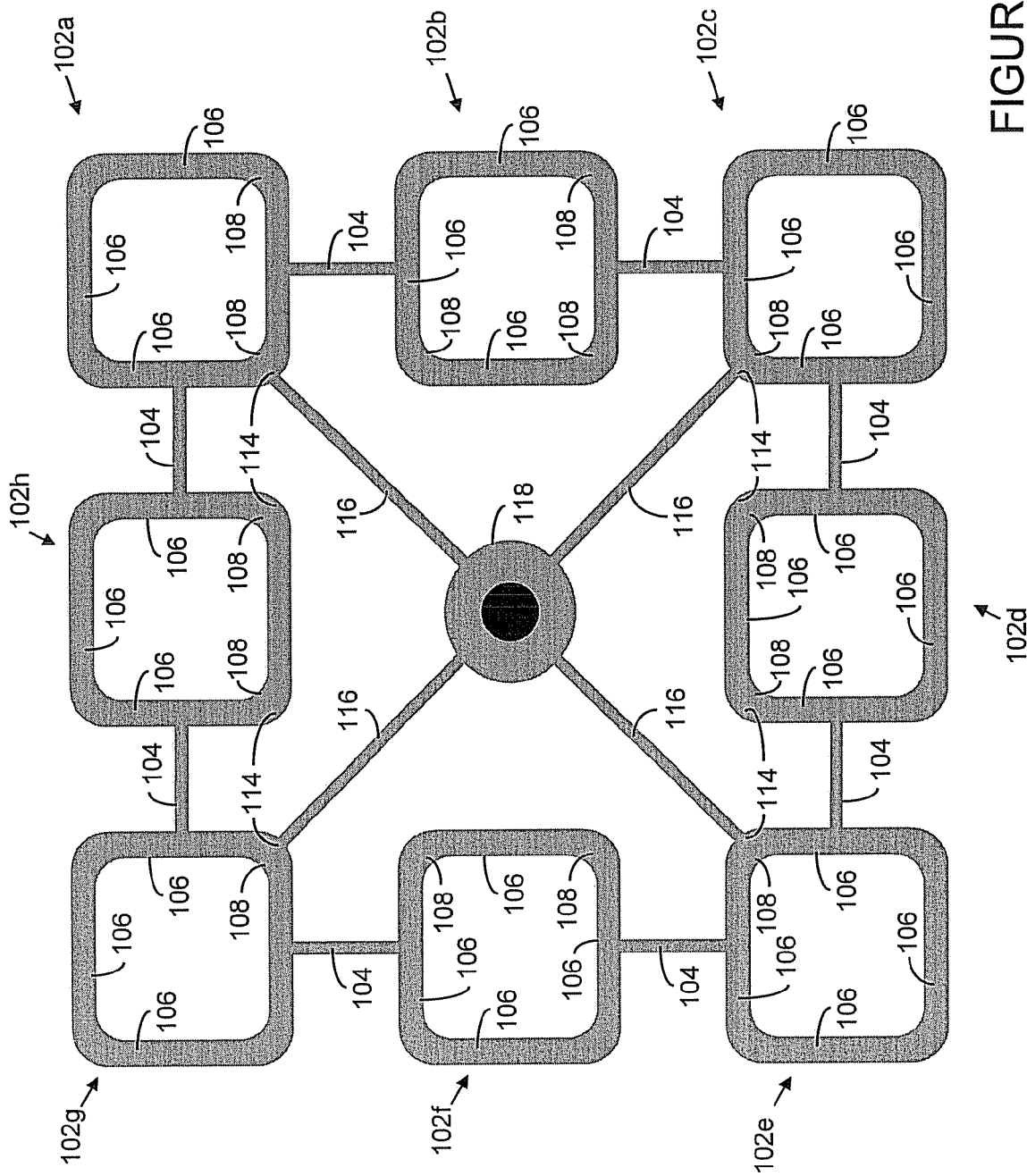
Figure 6H:
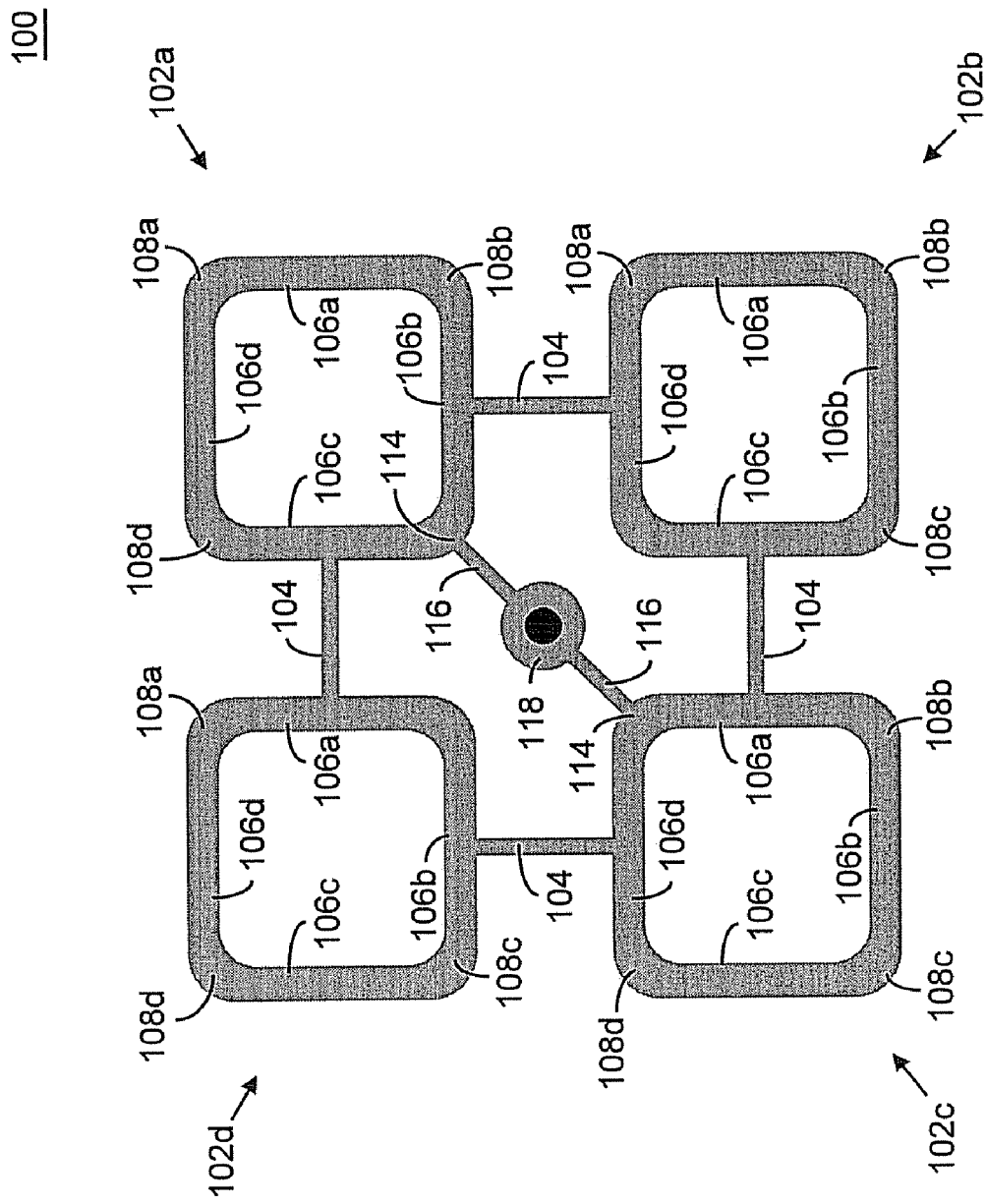
Figure 7A:
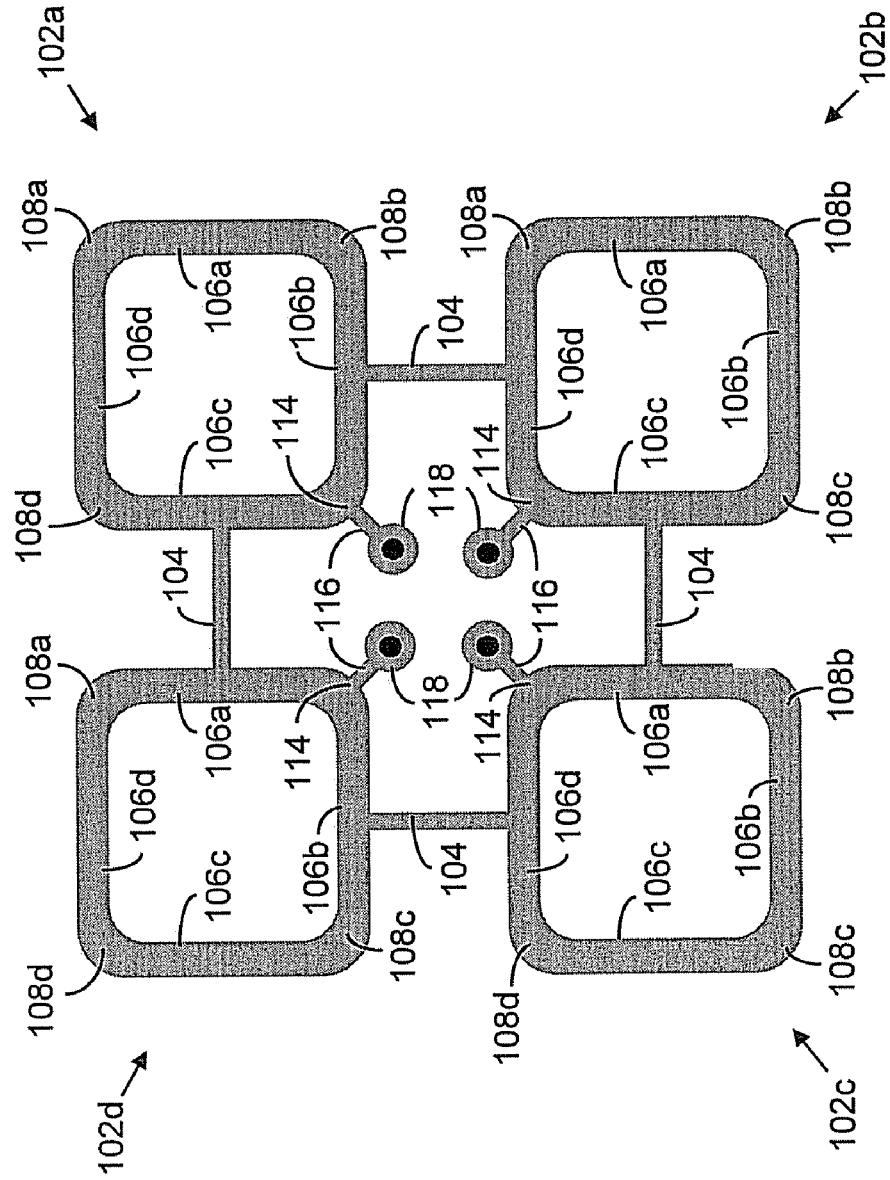
Figure 7B:
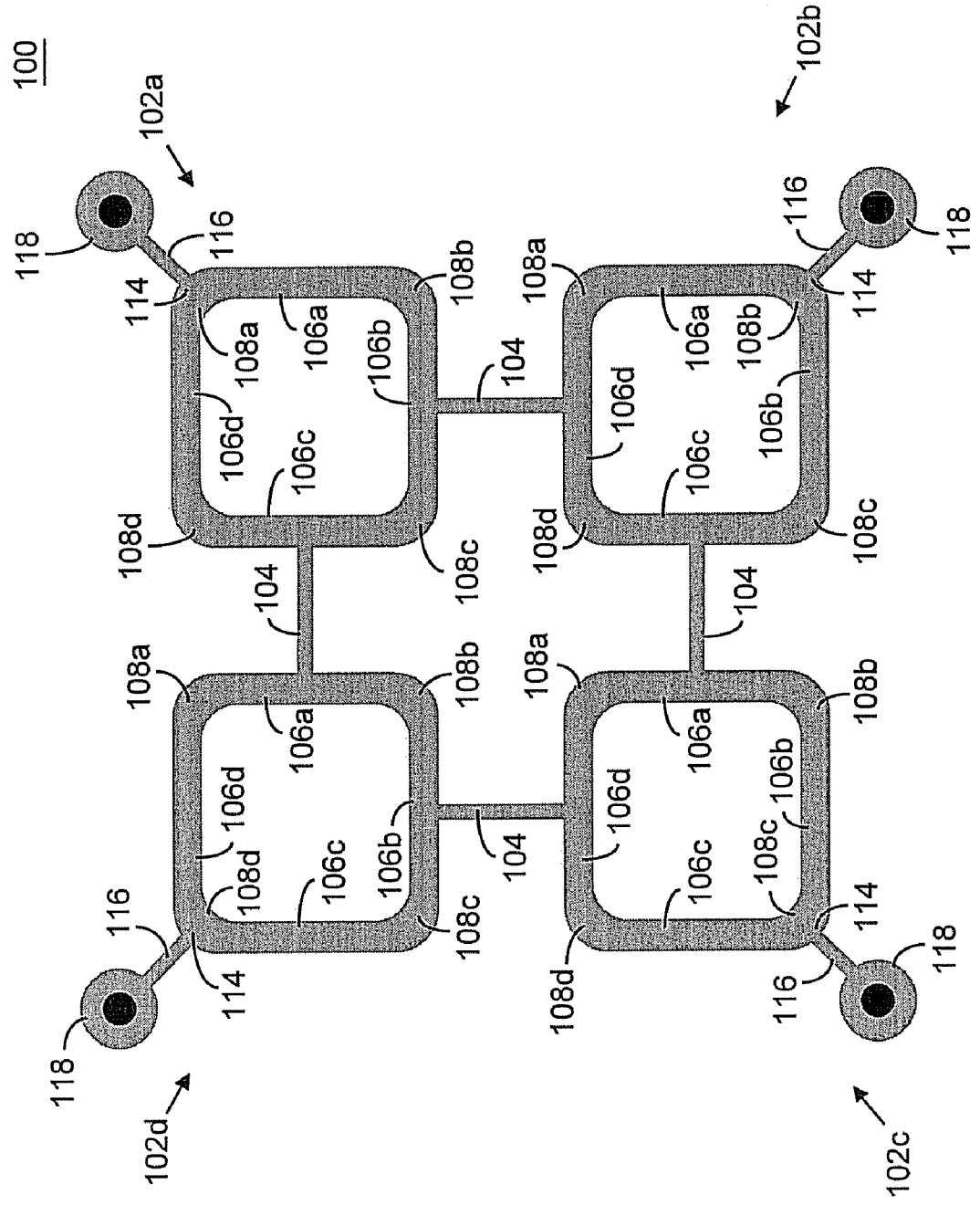
Figure 7C:
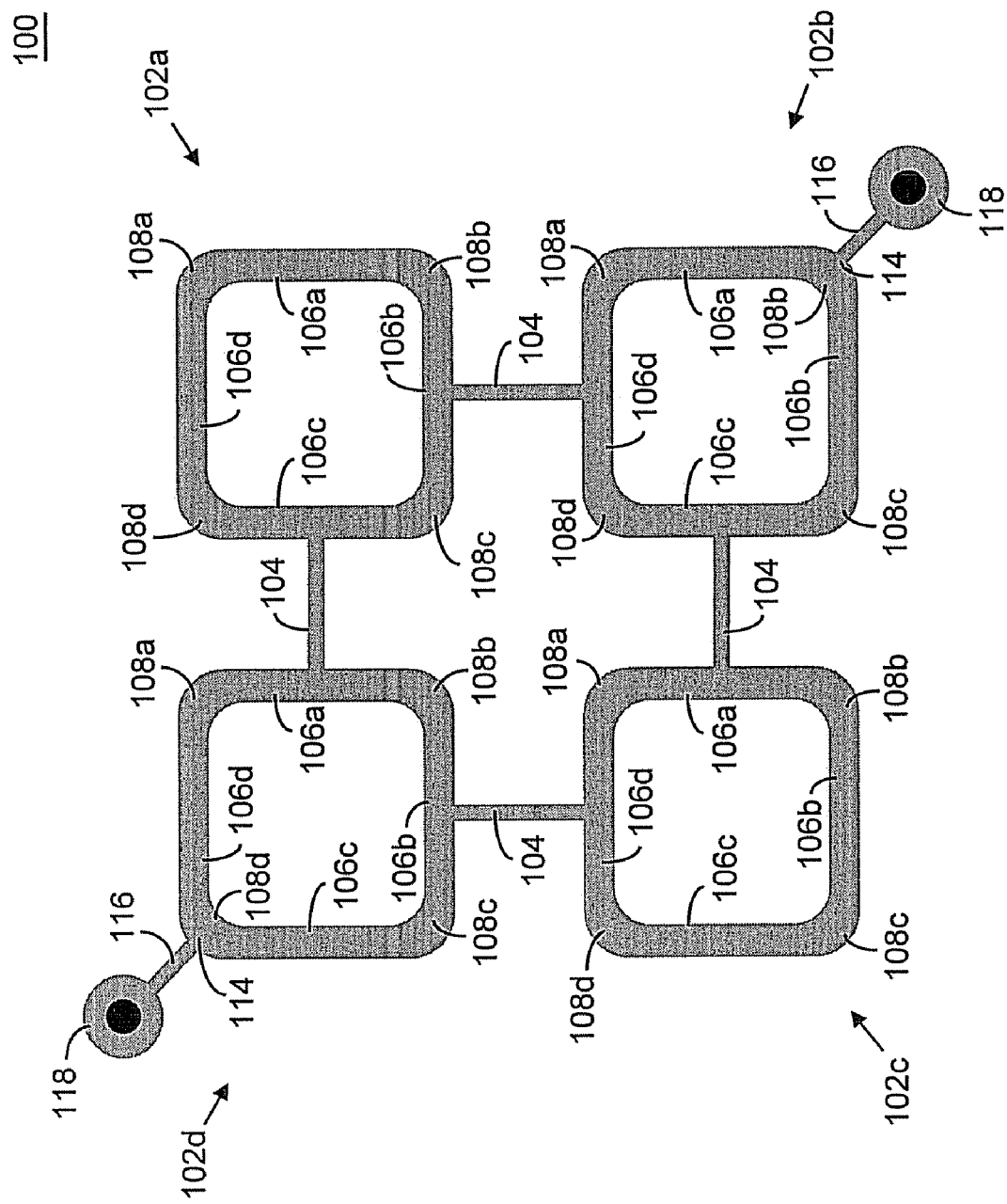
Figure 7D:
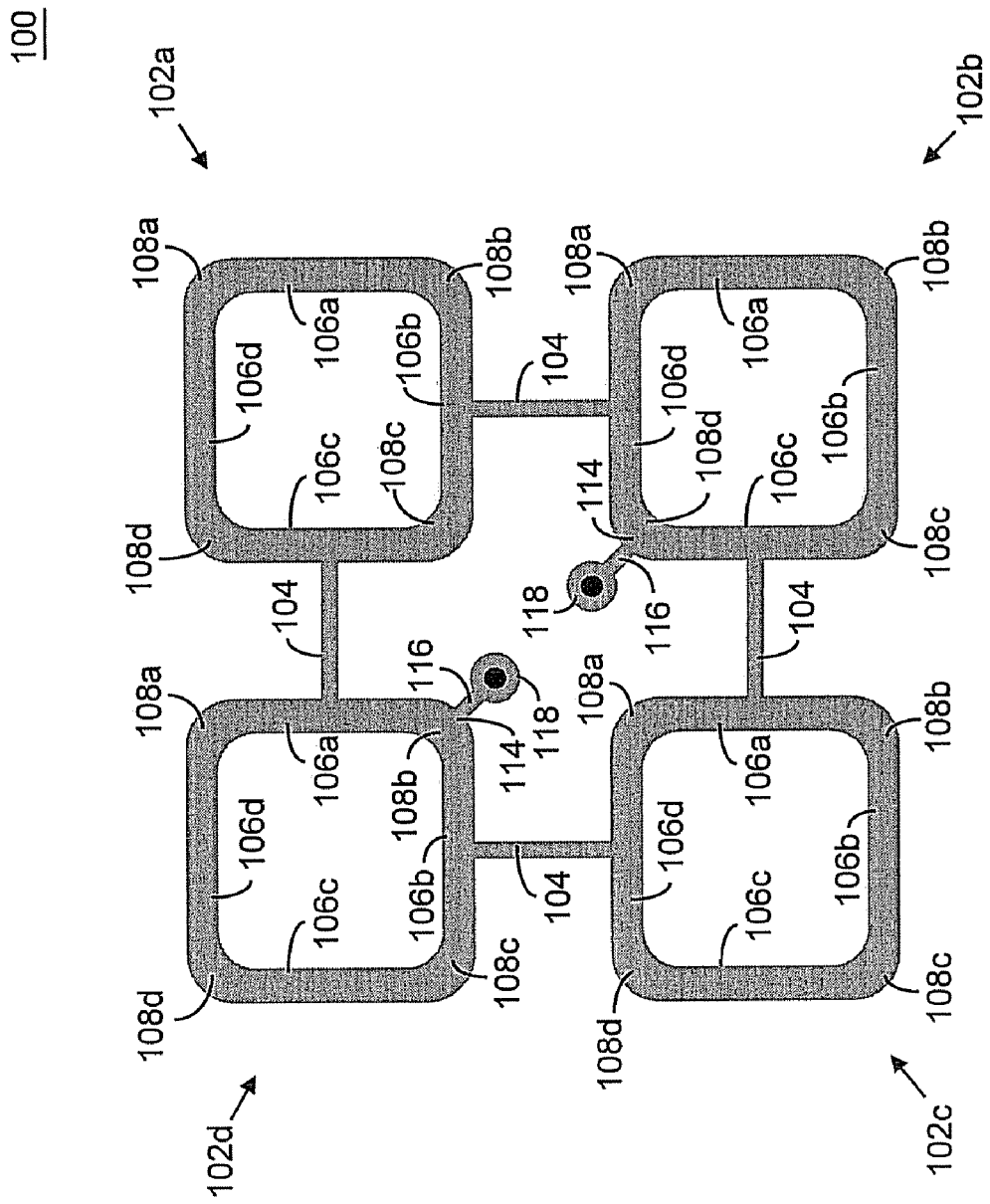
Figure 7G:
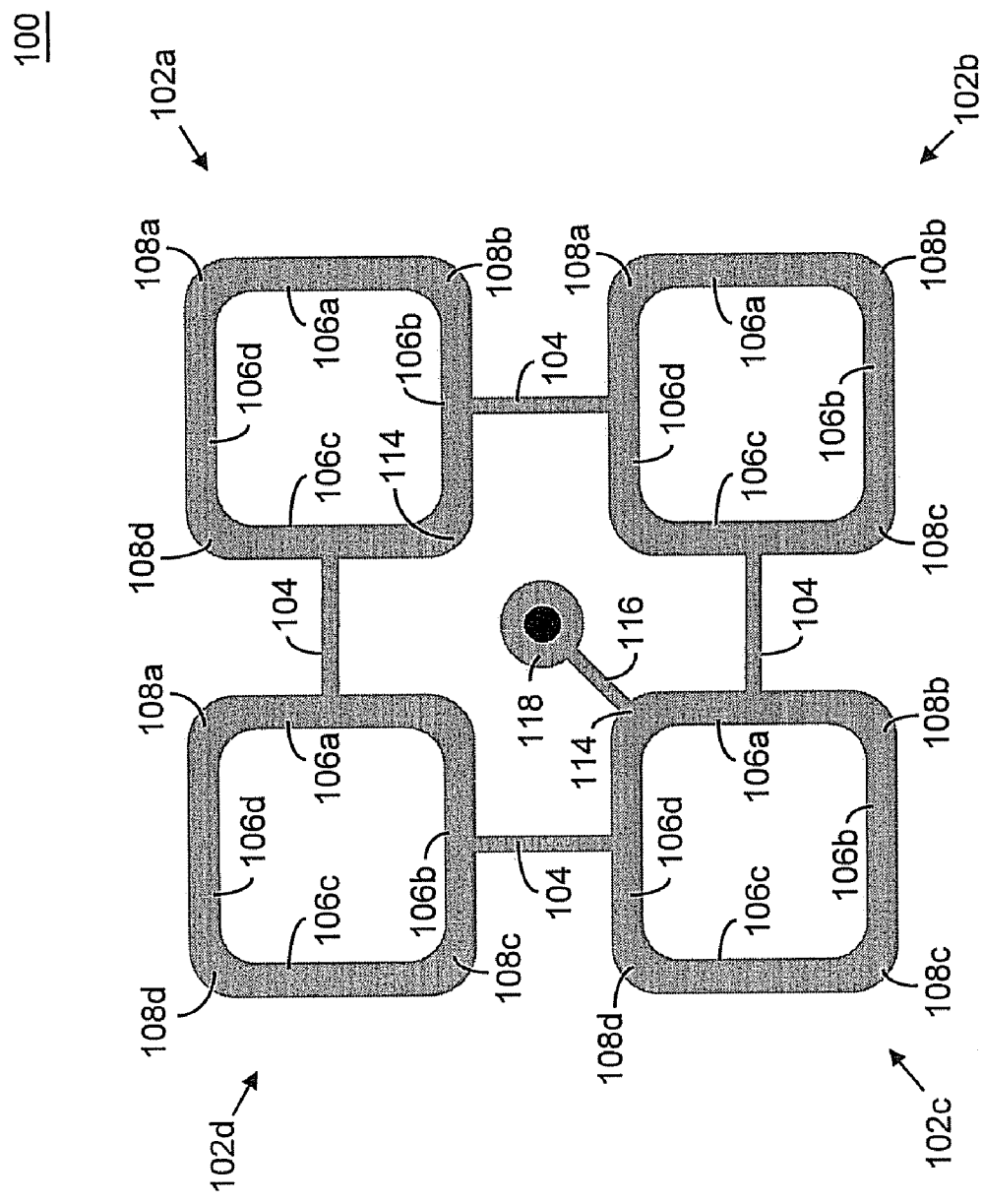
Figure 7H:
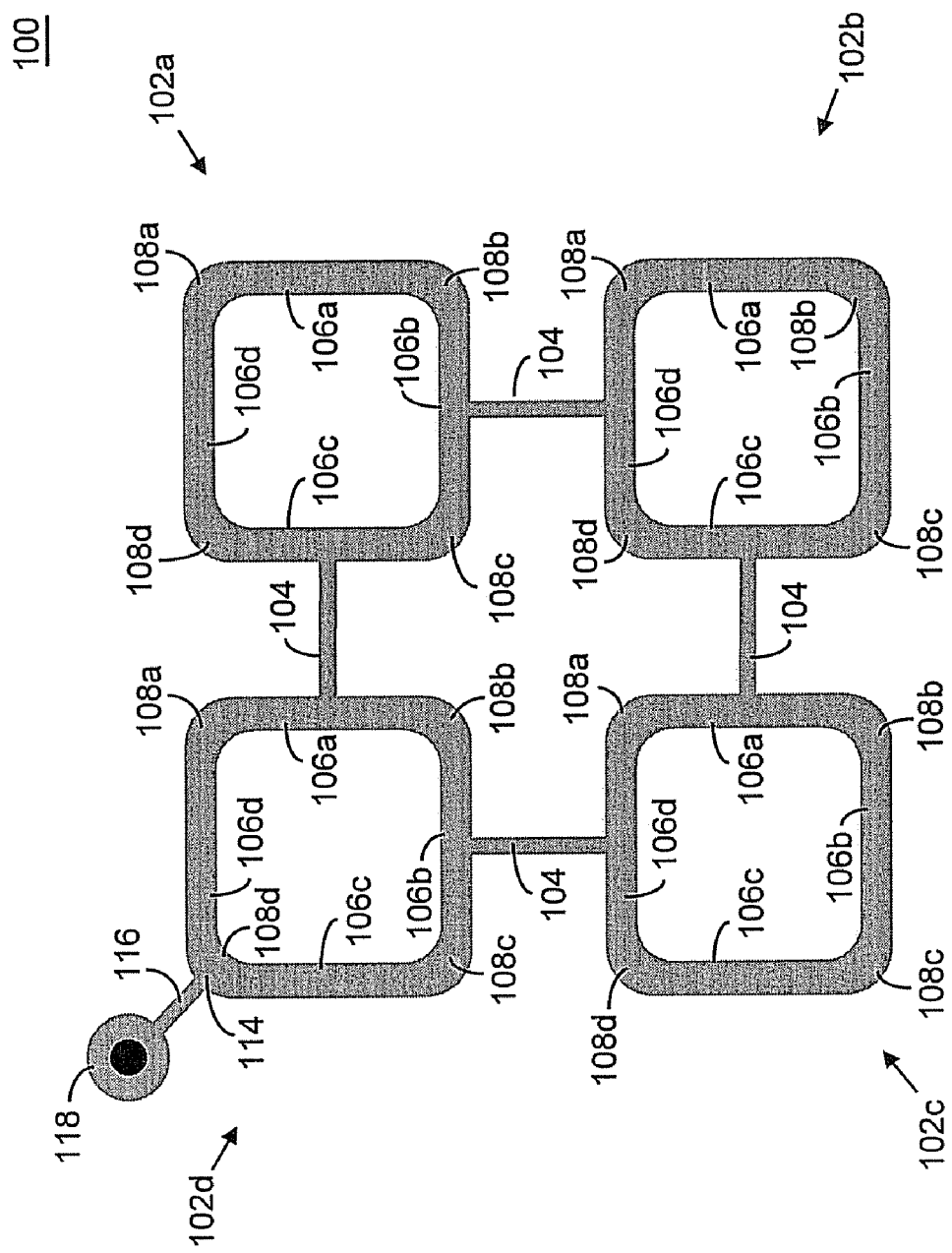

In one embodiment, the nodal points may be located in or near one or more of curved sections of one or more of the MEMS resonators. For example, with reference to FIG. 6A, in one embodiment, MEMS resonators 102a and 102b each include nodal points 114 located on or near an outer area, portion or region of curved sections 108. The anchor coupling section 116a is connected at or near nodal point 114 of MEMS resonator 102a to secure, fix and/or connect MEMS resonator 102a to the substrate via anchor 118. Similarly, anchor coupling section 116b is connected at or near nodal point 114c of curved section 108c of MEMS resonator 102b to secure, fix and/or connect MEMS resonator 102b to the substrate via anchor 118. In this embodiment, MEMS resonator 102a and 102b are separately connected to a common substrate anchor 118.

The MEMS resonator array 100 may be anchored to the substrate using a variety of anchoring techniques and/or configurations. In this regard, MEMS resonator 102 of MEMS resonator array 100 may be anchored separately to a common and/or individual anchor. For example, with reference to FIGS. 6C-6H, one or more of MEMS resonators 102a-d are anchored to common anchor 118. In lieu of a common type anchoring structure, one or more of MEMS resonators 102a-d may be anchored separately to individual anchors. (See, for example, FIGS. 7A-7H). In this embodiment, MEMS resonator array 100 includes one or more individual anchors 118 that are "dedicated" to an associated MEMS resonator 102 of array 100.

Figure 8A:
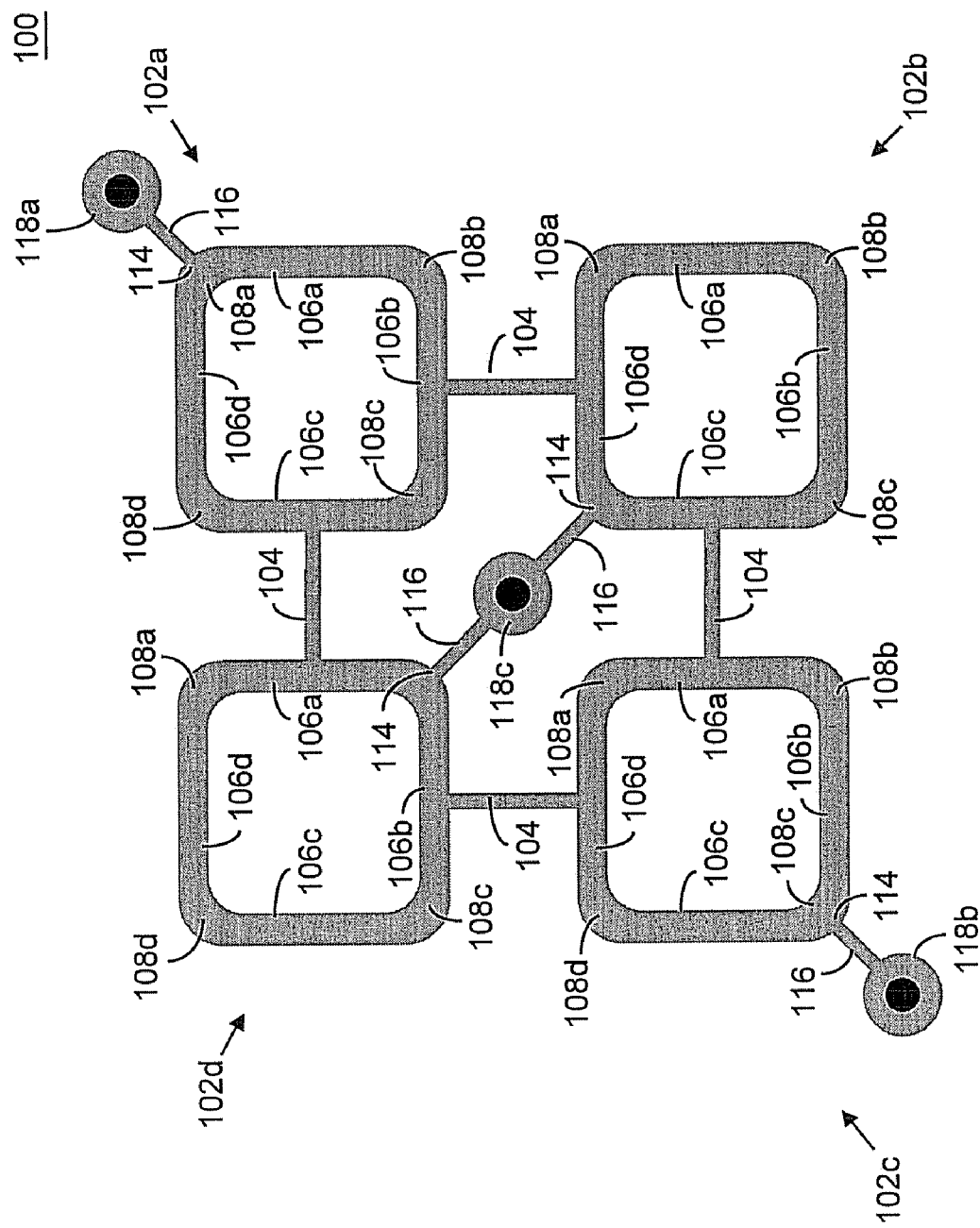
Figure 8B:
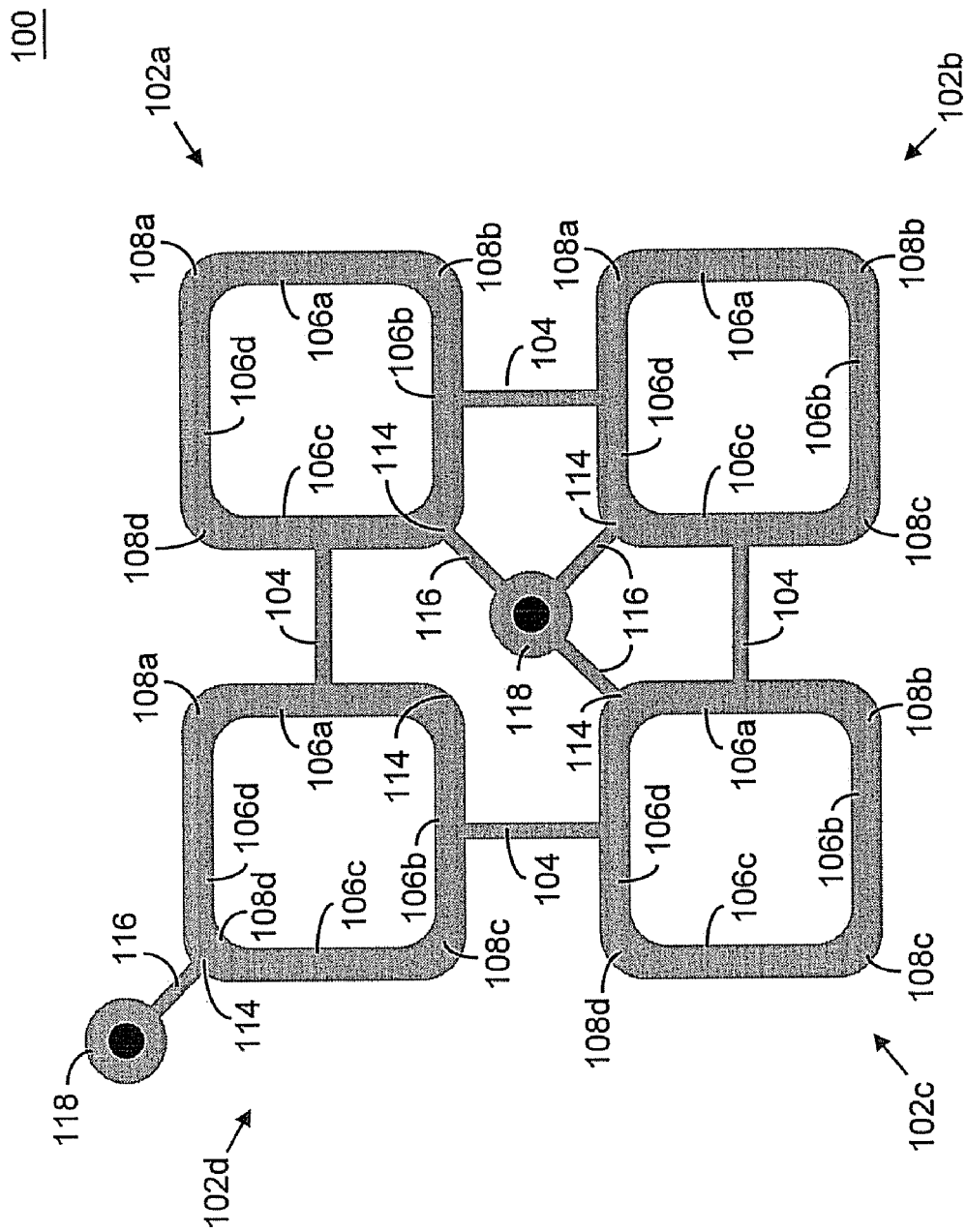

Moreover, the anchoring structure of MEMS resonator array 100 may include combinations or permutations of common and individual anchor techniques. (See, for example, FIGS. 8A and 8B). For example, with reference to FIG. 8A, MEMS resonators 102a and 102c are anchored separately to individual anchors 118a and 118b and MEMS resonators 102B and 102d are anchored to a common anchor 118c. All combinations and permutations of the various anchoring techniques are intended to fall within the scope of the present invention.

Notably, in those embodiments where MEMS resonator array 100 employ an anchor technique whereby anchor coupling sections 116 extend outward from one or more curved sections 108, nodal points 114 may be located on or near an outer region or portion of curved sections 108. (See, for example, FIGS. 6A-6H, 7A-7H, 8A and 8B). As such, one or more anchor coupling sections 116 may connect MEMS resonators 102 to one or more substrate anchors 118, which are located "outside" each of the rounded square shape of MEMS resonators 102a-d. In this anchoring configuration, outer regions or areas of curved sections 108 are nodal points 114 of MEMS resonators 102. Thus, by anchoring one or more of MEMS resonators 102a-d at or near the outer region or portion of curved section 108 (i.e., at or near one or more nodal points 114), the vertical and/or horizontal energy losses of MEMS resonator array 100 and/or MEMS resonator 102 are minimized, limited and/or reduced.

Figure 9A:
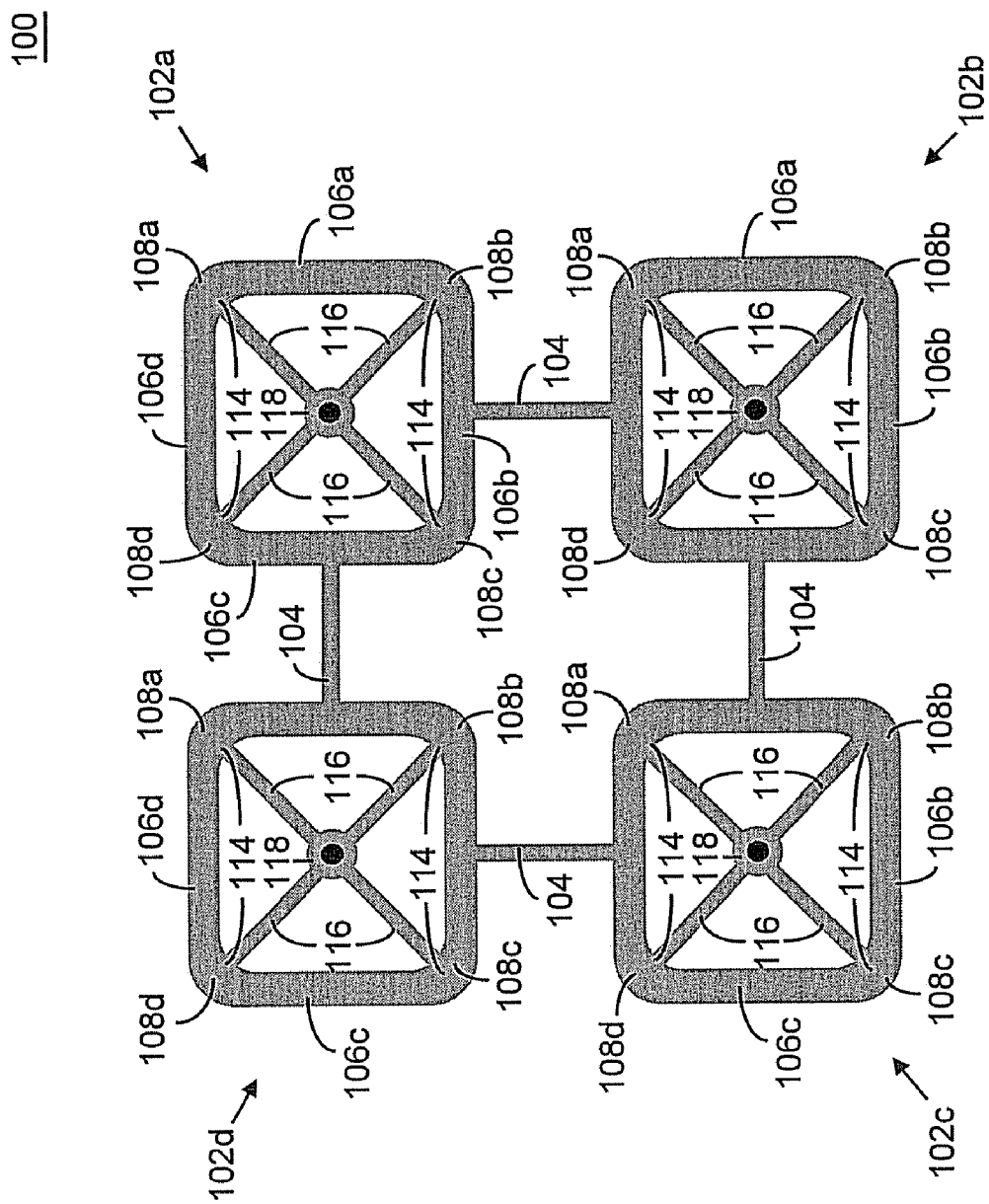
Figure 9B:
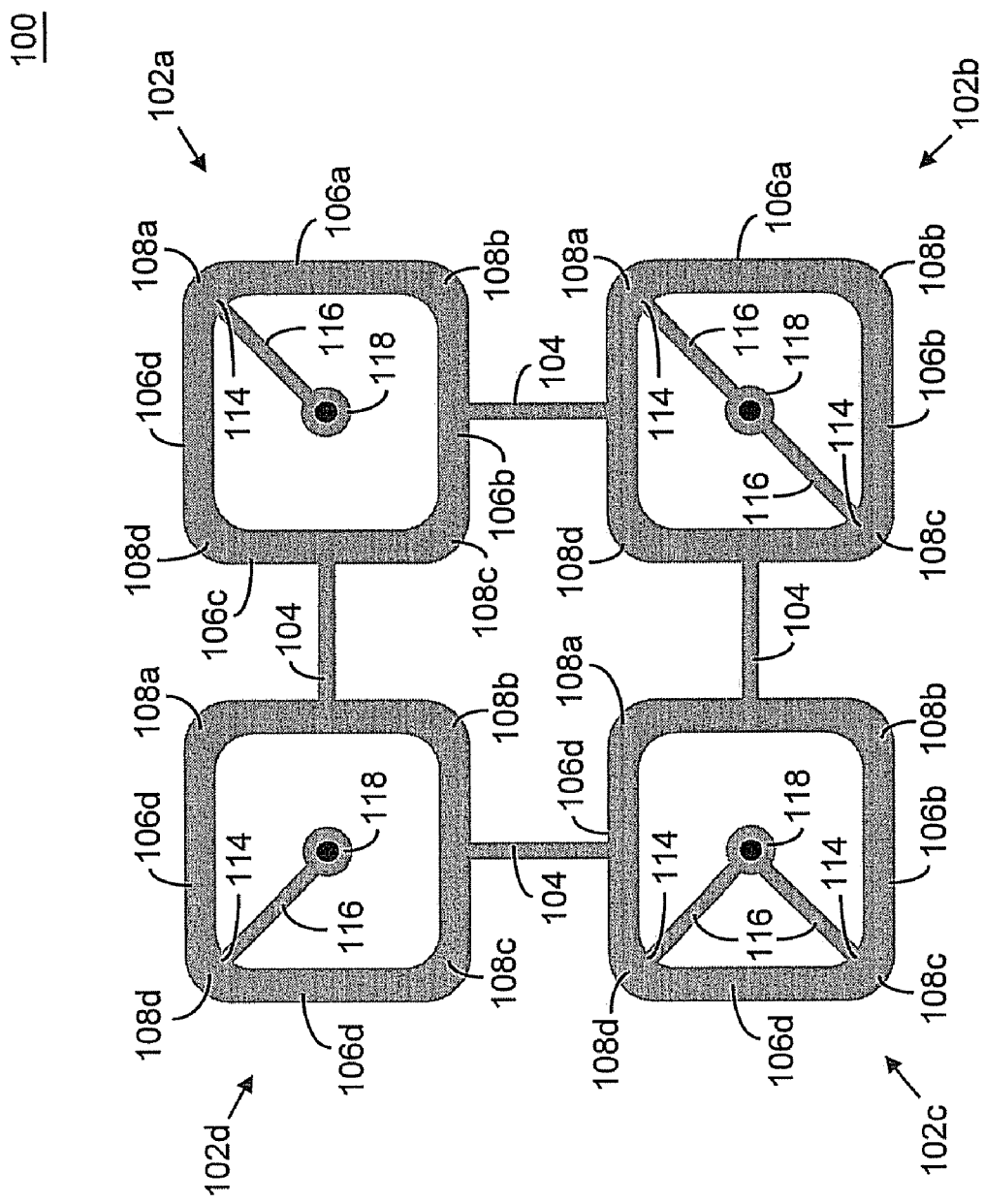
Figure 9C:
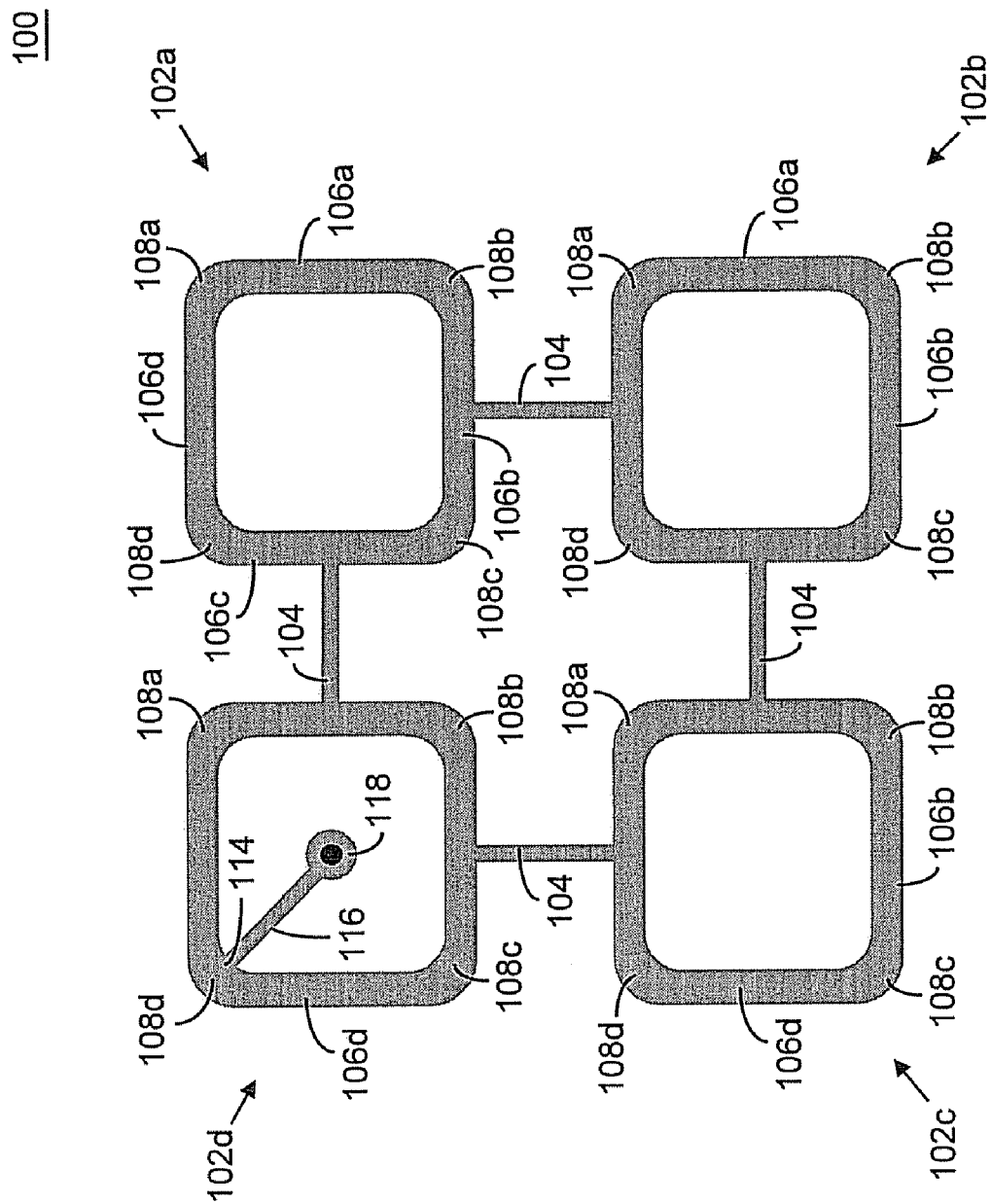

In lieu of nodal points located on or near an outer area, portion or region of one or more curved sections 108, one or more MEMS resonators 102 may include nodal points 114 located on or near an inner area, portion or region of one or more curved sections 108. (See, for example, FIGS. 9A-9C). The anchor coupling sections 116 are connected at or near nodal points 114, respectively, to secure, fix and/or connect one or more of MEMS resonators 102 of MEMS resonator array 100 to the substrate via one or more anchors 118. In this way, MEMS resonator array 100 is anchored to the substrate via anchoring one or more of MEMS resonators 102 to the substrate. In this embodiment, at least one MEMS resonator 102 of the MEMS resonator array 100 is anchored according to this technique is coupled to an internal "center" anchor 118.

Figure 10A:
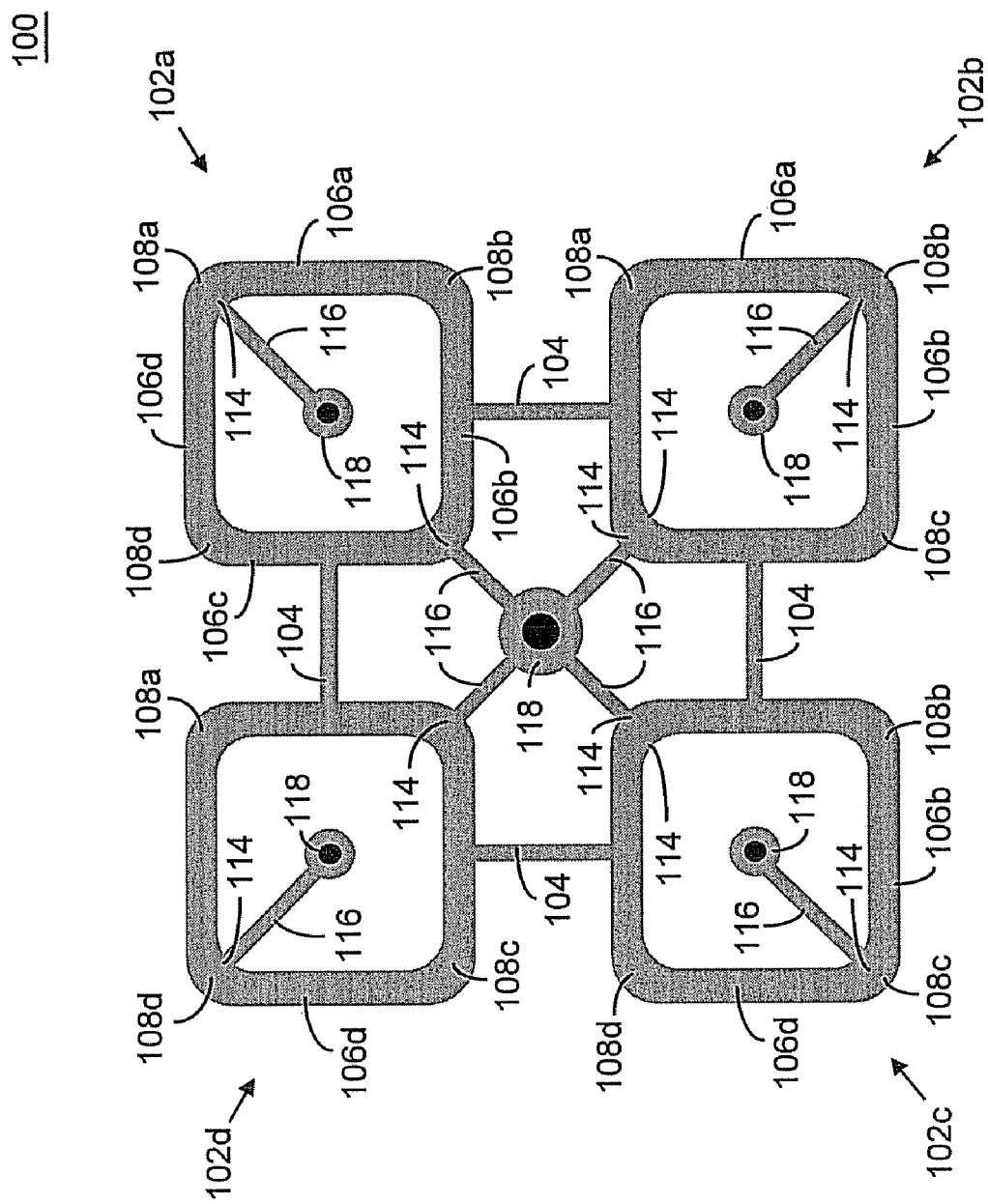
Figure 10B:
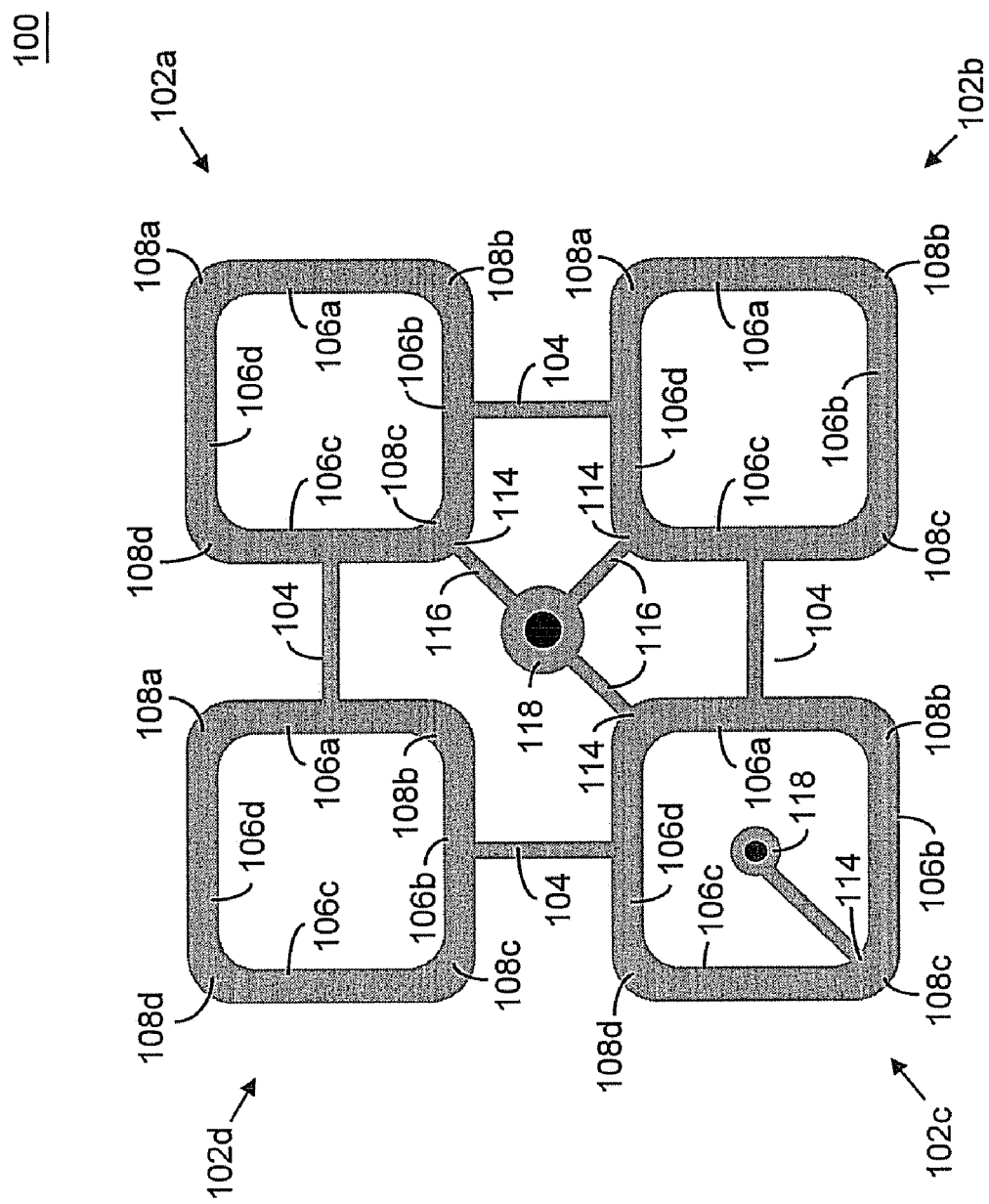
Figure 12A:
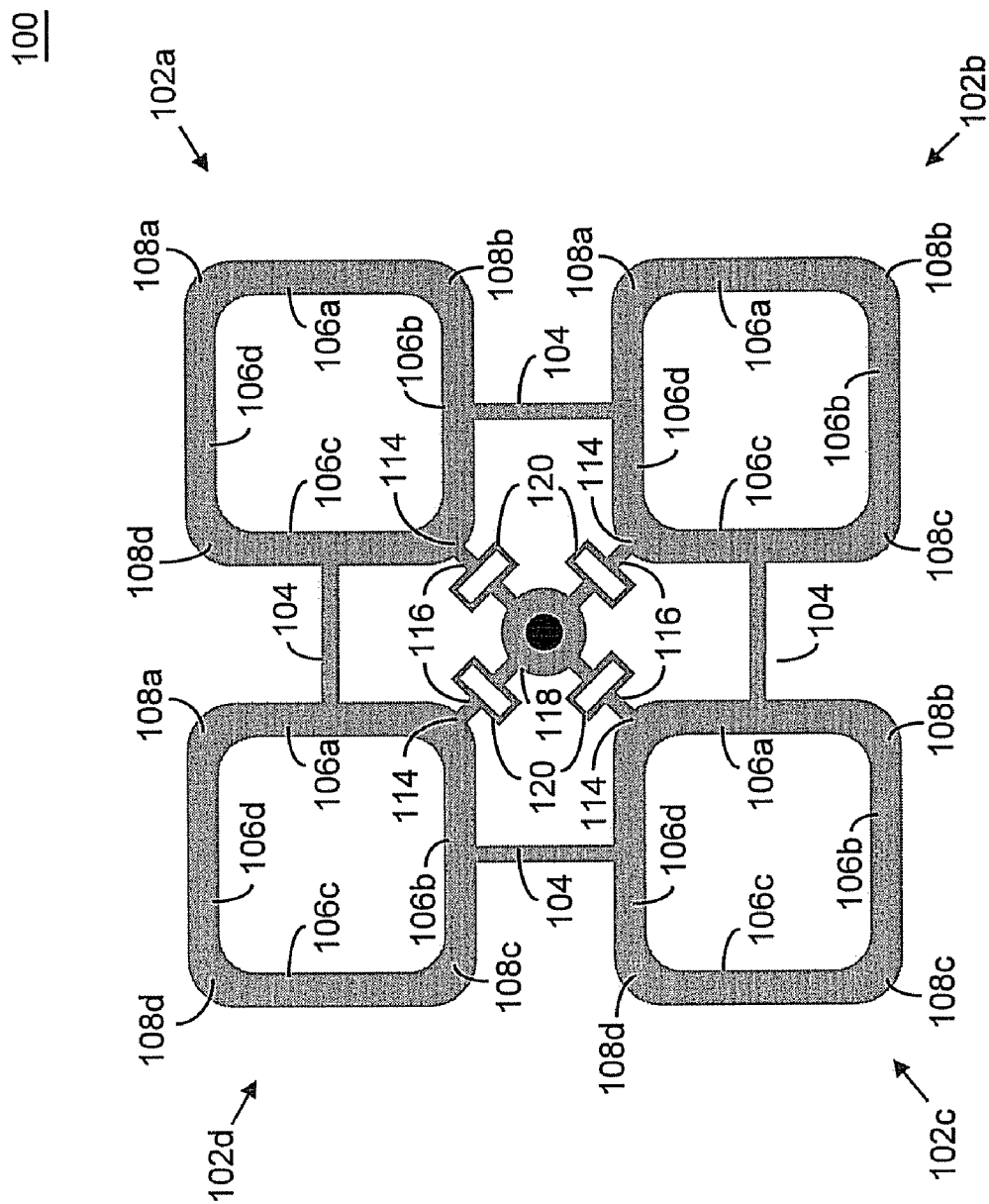
FIGS. 12A-12C and 13A-13C illustrate top views of exemplary MEMS resonator arrays including a plurality of rounded square shaped MEMS resonators according to certain embodiments of the present inventions wherein each MEMS resonator array includes stress/strain relief mechanisms which are mechanically coupled between one or more of the rounded square shaped MEMS resonators and one or more substrate anchor(s)
Figure 12B:
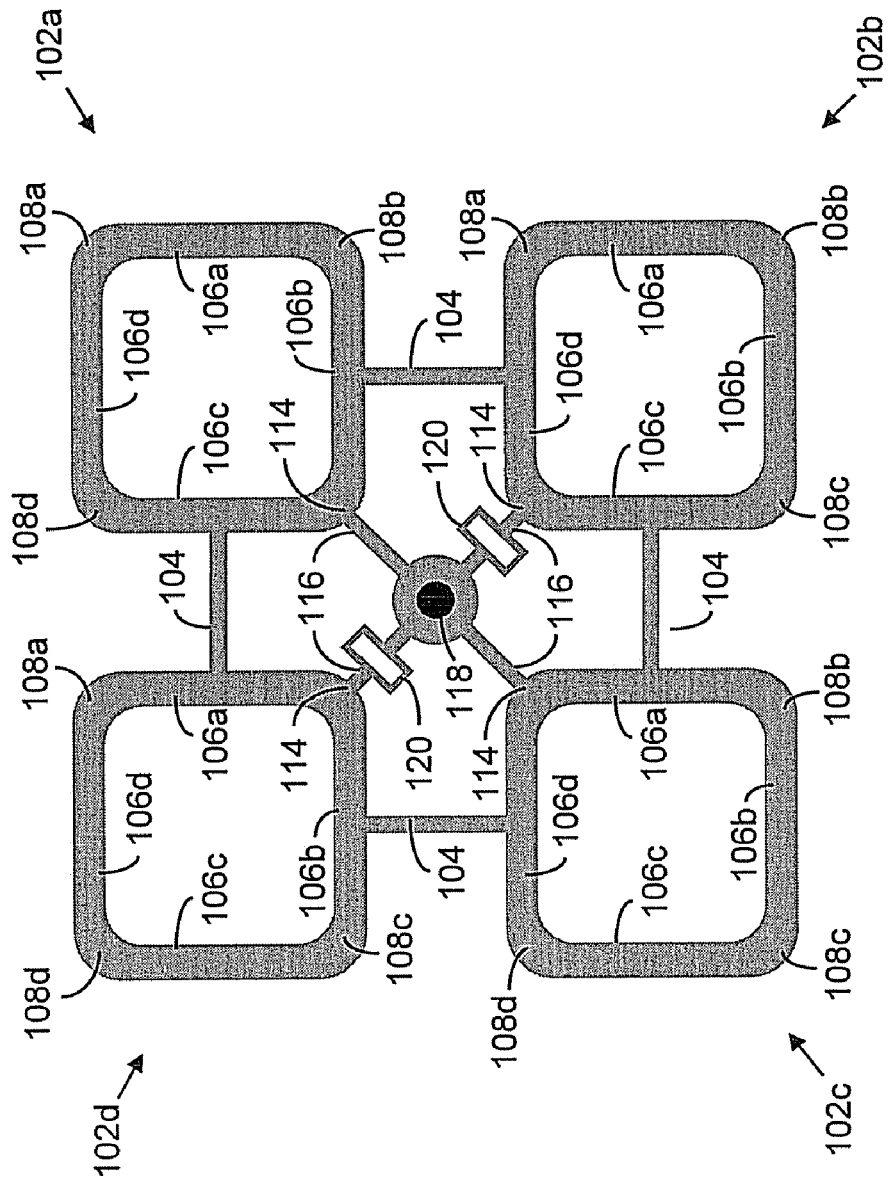
Figure 12C:
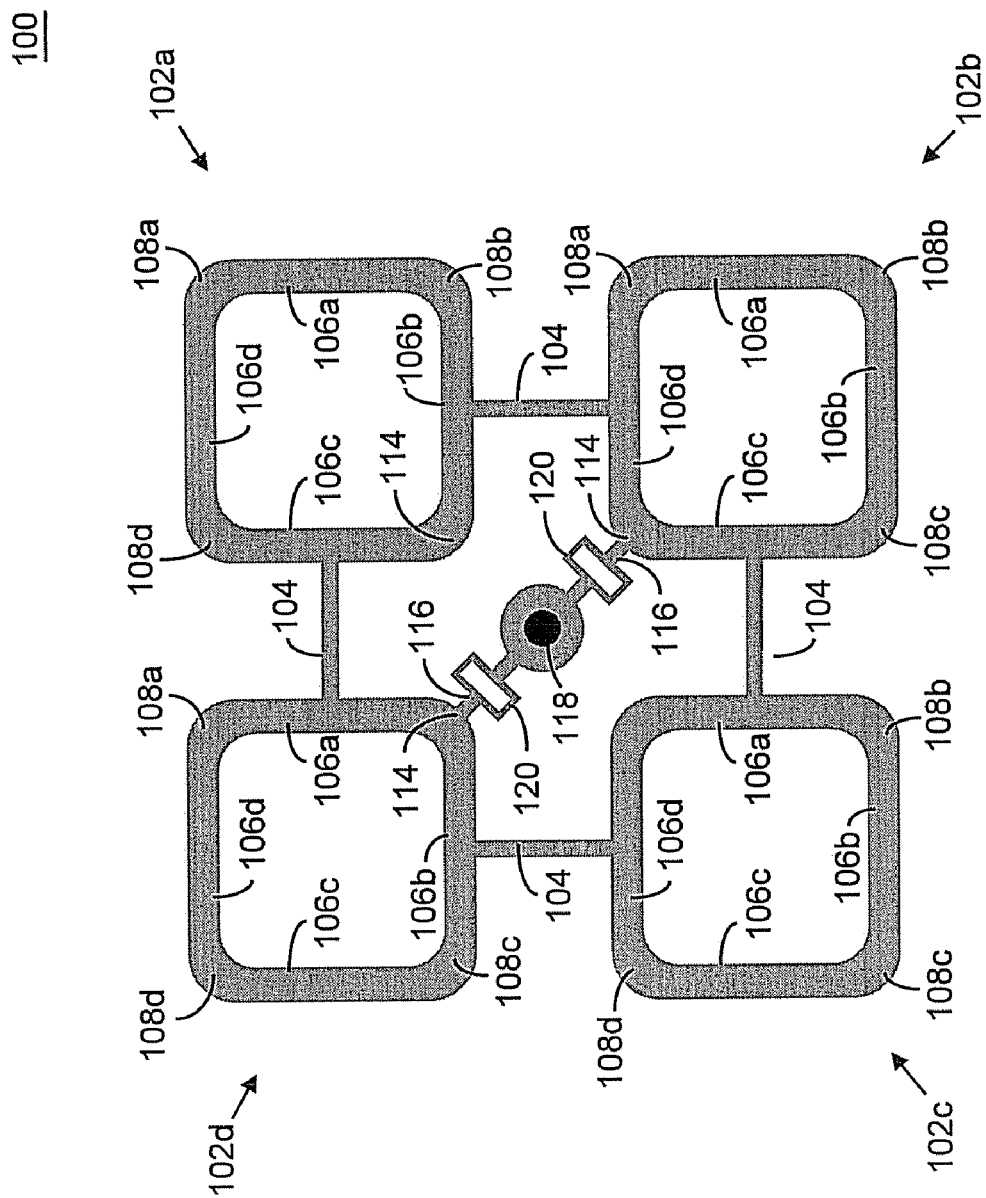
Figure 13A:
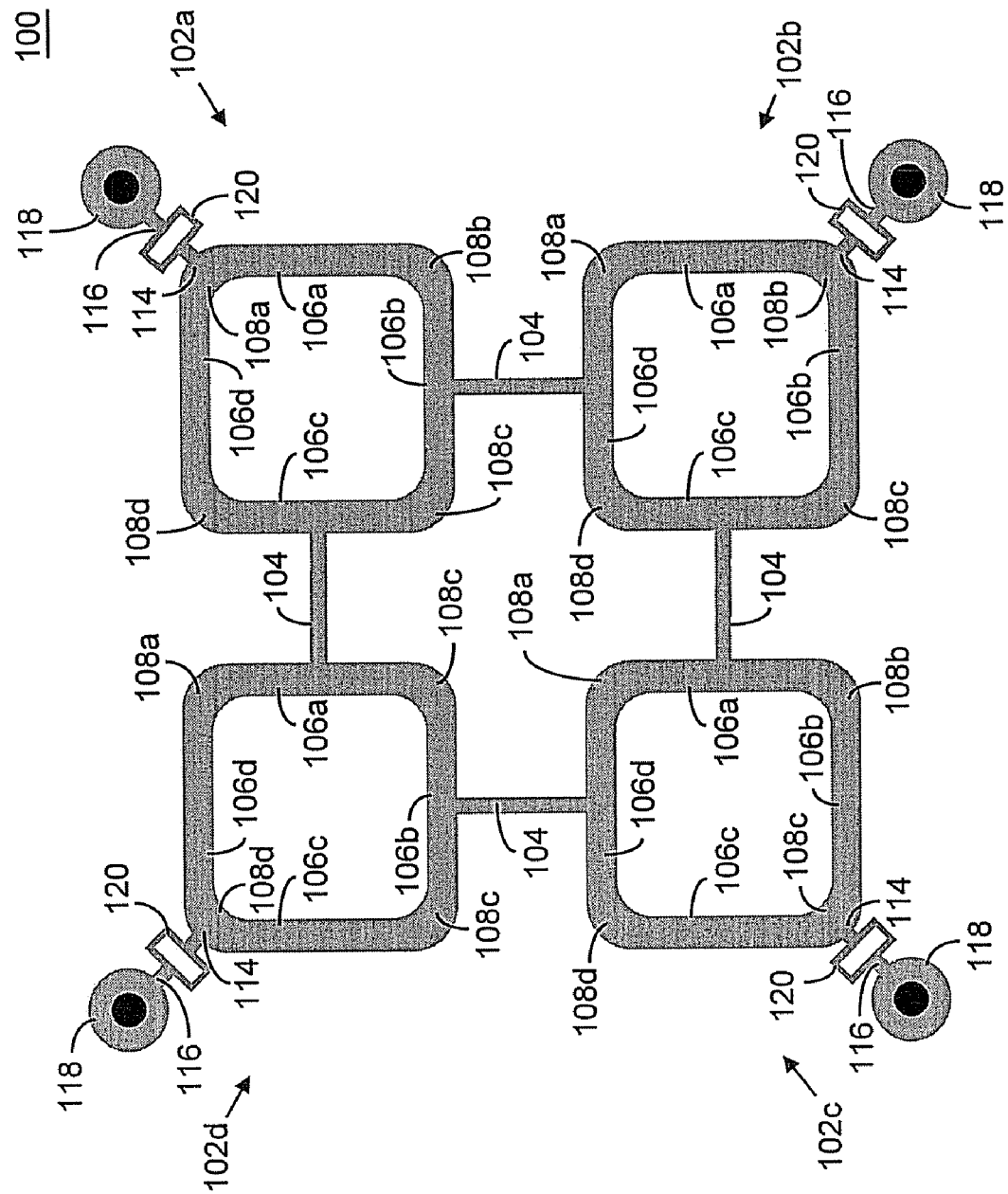
Figure 13B:
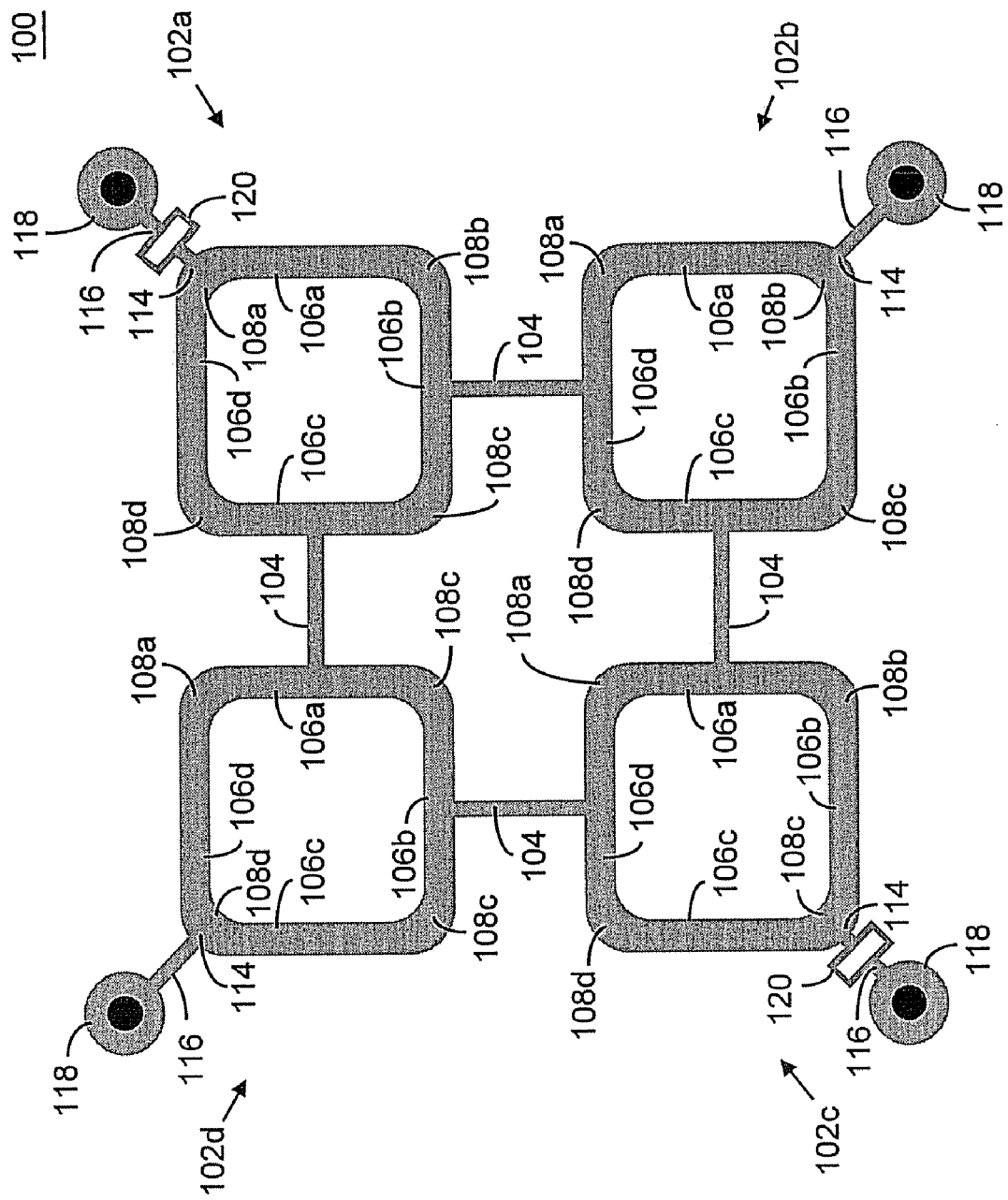
Figure 13C:
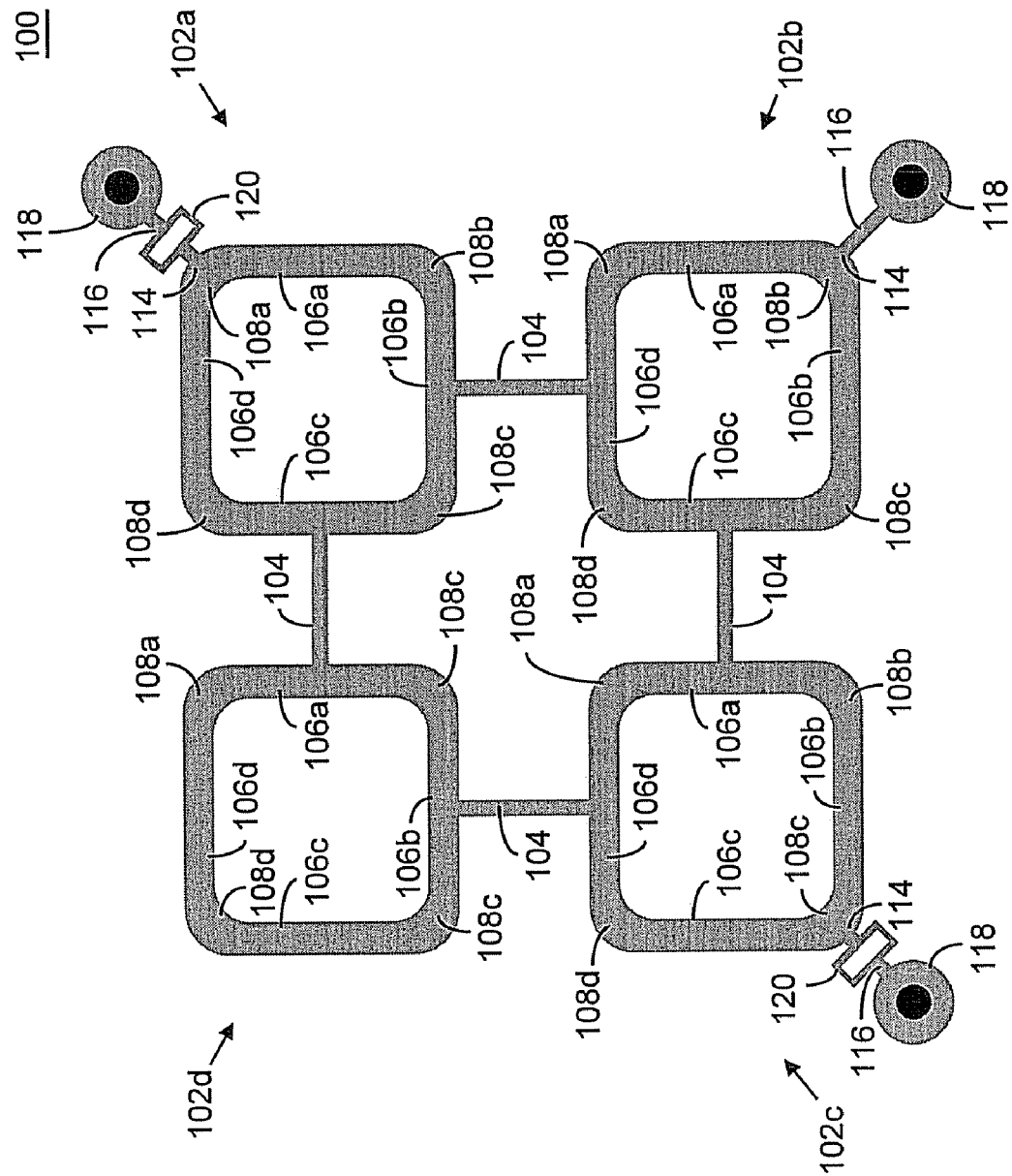
Figure 16:
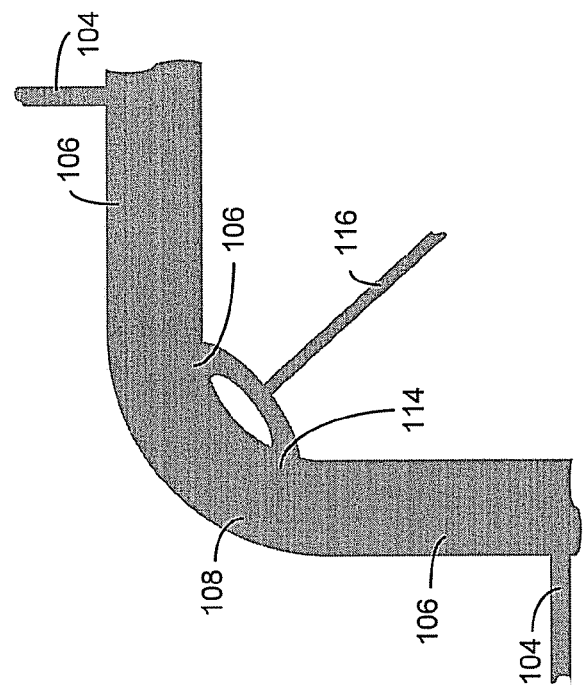
Figure 17:
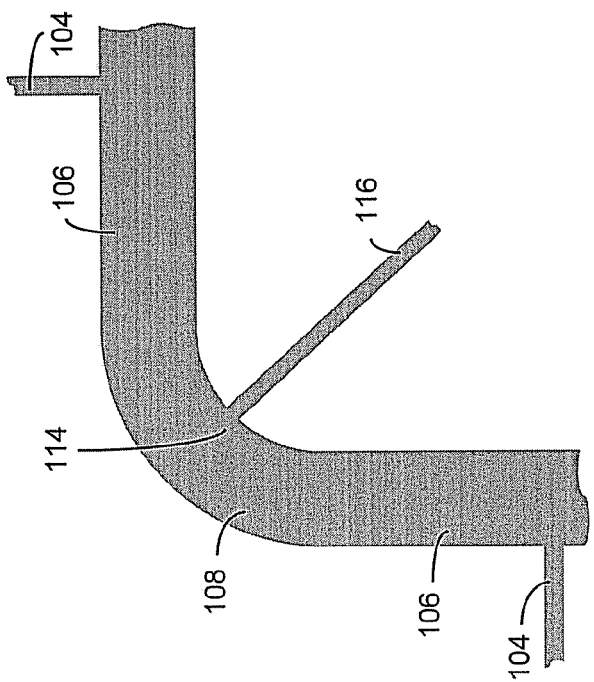
Figure 20:
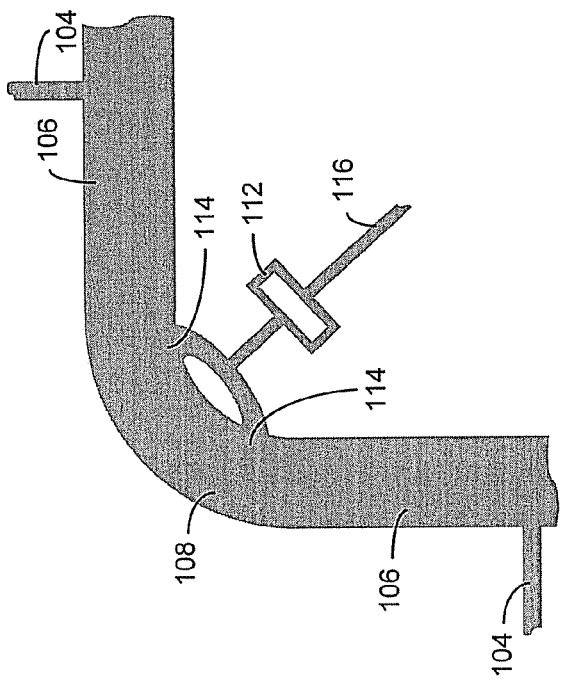
Figure 21:
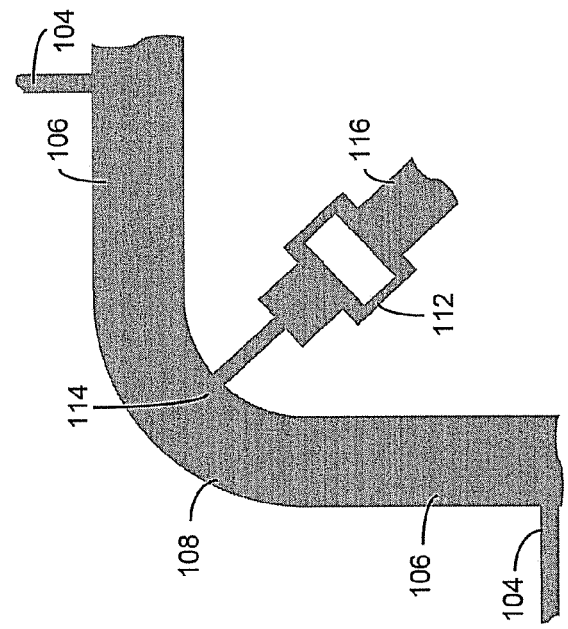

In addition to nodal points located on or near an outer area, portion or region of one or more curved sections 108, MEMS resonators 102 may include nodal points 114 located on or near an inner area, portion or region of one or more curved sections 108. (See, for example, FIGS. 10A and 10B). The anchor coupling sections 116 are connected at or near nodal points 114 of one or more MEMS resonators 102 to secure, fix and/or connect MEMS resonator array 100 to the substrate. Thus, in this embodiment, MEMS resonator array 100 employs both common anchoring and internal "center" anchoring techniques.

Notably, MEMS resonator array 100 may be anchored to the substrate by anchoring one or more—but not all—of MEMS resonators 102 to the substrate. (See, for example, FIGS. 6G, 6H, 7C-H, 9C and 10B). For example, with reference to FIGS. 6G, MEMS resonators 102b, 102d, 102f and 102h are indirectly anchored to substrate anchor 118 via one, some or all of MEMS resonators 102a, 102c, 102e and 102g, which are directly connected to anchor 118 via anchor coupling sections 116. Thus, in these embodiments, one or more MEMS resonators 102 are directly anchored to the substrate and one or more MEMS resonators 102 are indirectly anchored to the substrate. The one or more MEMS resonators that are directly anchored to the substrate may be anchored to a "common" type anchor (see, for example, FIGS. 6G and 6H) or an "individual" type anchor (see, for example, FIGS. 7C-7H, 9C), or both (see, FIGS. 8A, 8B and 10B).

With reference to FIGS. 11A, 11B, 12A-12C and 13A-13C, MEMS resonator array 100 of the present inventions may employ stress/strain relief mechanisms 120 (for example, springs or spring-like components) to manage, control, reduce, eliminate and/or minimize any stress or strain on the substrate at the location of the anchor 118 which is caused by the motion of one, some or all of points at which MEMS resonator array 100 is anchored through or at the substrate. For example, with reference to FIGS. 11A and 11B, curved portions 108 of MEMS resonator 102a is mechanically coupled to stress/strain relief mechanism 120 via anchor coupling section 116.

With reference to FIGS. 12A-12C and 13A-13C, in operation, stress/strain relief mechanisms 120 expand and contract in conjunction with the motion of one, some or all of elongated beam sections 106*a-d* and curved sections 108*a-d* of MEMS resonators 102*a-d* in order to reduce, eliminate and/or minimize any stress or strain on the substrate and/or to compensate for small remaining movements of the anchoring point due to small asymmetries from manufacturing, material properties may change thereby resulting in a non-100% optimized design (even where Finite Element Modeling (also known as Finite Element Analysis, "FEA" or "F E Analysis") is employed). In this way, the anchoring architecture of MEMS resonator array 100 may be relatively stress-free and/or strain-free which may significantly decrease, reduce, minimize and/or eliminate any anchor energy loss and thereby increase, enhance, maximize the Q (and output signal) of MEMS resonators 102 and anchor stress will have little to no effect on the resonating frequency of MEMS resonators 102. Notably, stress/strain relief mechanism 120 and anchor coupling section 116, in addition to decreasing, reducing, minimizing and/or eliminating anchor energy losses, suspend MEMS resonators 102 (including elongated beam sections 106 and curved sections 108) of MEMS resonator array 100 above the substrate.

The stress/strain relief mechanisms 120 may be employed within one or more of the one or more anchor coupling section 116. It may be advantageous to implement stress/strain relief mechanisms 120 in those situations where the point at which MEMS resonator array 100 is anchored through or at the substrate is not sufficiently or adequately motionless (i.e., where there is undesirable movement of the curved section 108 or coupling section 116 which may originate from or be caused by the one or more MEMS resonators 102 or the substrate) or where additional de-coupling from the substrate is desired. For example, it may also be advantageous to employ stress/strain relief mechanisms 120 to reduce, eliminate and/or minimize communication of energy between one or more MEMS resonators 102 and the substrate (for example, in those situations where there is an impedance mismatch to a curved section 108 or where "noise" originates in the substrate and is communicated to one or more MEMS resonator 102).

The stress/strain relief mechanisms 120 may be employed in conjunction with any of the anchoring techniques and/or architectures described and/or illustrated herein. For example, stress/strain relief mechanisms 120 may be implemented within one or more of the one or more anchor coupling section 116 of FIG. 12A-12C and/or FIG. 13A-13C.

The stress/strain relief mechanisms 120 may be well known springs or spring-like components, or may be any mechanism that reduces, eliminates and/or minimizes: (i) stress and/or strain on the substrate at the location of the anchor which is caused by the motion of one, some or all of points at which one or more MEMS resonators 102 are anchored through or at the substrate, and/or (ii) communication of energy between one or more MEMS resonators 102 and the substrate.

Notably, MEMS resonators 102 need not be anchored at every nodal point or area but may be anchored at one or more locations, preferably at one or more nodal locations (areas or locations of the resonator that do not move, experience little movement, and/or are substantially stationary when the resonator oscillates). For example, with reference to FIGS. 7A-7F, MEMS resonator array 100, may be anchored at one point, two points and/or three areas or portions of MEMS resonators 102 (preferably, for example, at or near nodal points 106 of one or more MEMS resonators 102). In this regard, one or more anchor coupling sections 116 connect(s) elongated beam sections 106 and curved section 108 of MEMS resonator(s) 102 to corresponding anchors 118.

A finite element analysis and simulation engine may also be employed to design, determine and/or define the location(s) of one or more nodal points at which MEMS resonator 102 may be anchored to the substrate with predetermined, minimal and/or reduced energy loss (among other things). In this regard, beam sections 108 of MEMS resonator 102, when induced during operation, move in an elongating (or breathing-like) manner and a bending manner. As such, the length of elongated beam sections 106 and the radii of curved sections 108 may determine the location of nodal points on or in the resonator structure whereby there is little, no or reduced rotation movement due to the elongating (breathing-like) mode, as well as little, no or reduced radial movement due to the bending-like mode. The finite analysis engine may be employed to design, determine and assess the location of such nodal points in or on MEMS resonator 102 using a given length of elongated beam sections 106, and the shape and/or the radii of curved sections 108 of MEMS resonator 102. In this way, areas or portions in or on curved sections 108 of MEMS resonator 102 that exhibit acceptable, predetermined, and/or little or no movement (radial, lateral and/or otherwise) for anchoring MEMS resonator 102 may be rapidly determined and/or identified.

Notably, a finite element analysis and simulation engine may also be employed to design, determine, assess and/or define the location(s) of one or more nodal points of MEMS resonators 102 when implemented in MEMS resonator array 100. In addition, an empirical approach may also be employed (in addition to or in lieu of a finite element analysis and simulation engine (or the like)) to design, determine, assess and/or define the location(s) of one or more nodal points of MEMS resonators 102 when implemented in MEMS resonator array 100. Indeed, the entire discussion above regarding finite element analysis and simulation engine is pertinent to the design, analysis and response of MEMS resonator array 100 having a plurality of MEMS resonators 102. For the sake of brevity those discussions will not be repeated.

The MEMS resonator array of the present invention employ any anchor structure and technique whether now known or later developed. Indeed, all structures and techniques are intended to fall within the scope of the present invention. For example, the present invention may employ the anchoring structures and techniques described and illustrated in non-provisional patent application entitled "Anchors for Microelectromechanical Systems Having an SOI Substrate, and Method for Fabricating Same", which was filed on Jul. 25, 2003 and assigned Ser. No. 10/627,237 (hereinafter "Anchors for Microelectromechanical Systems Patent Application"). It is expressly noted that the entire contents of the Anchors for Microelectromechanical Systems Patent Application, including, for example, the features, attributes, alternatives, materials, techniques and advantages of all of the embodiments and/or inventions, are incorporated by reference herein.

In those embodiments where one or more of MEMS resonators 102 are anchored to a "center" anchor 118 (see, for example, 9A-9C, 10A and 10B), the design (for example, the shape and width) of anchor coupling sections 116 may impact the inner radii of curved sections 108 and thereby (i) the location of nodal points (if any) in or on MEMS resonator 102 as well as (ii) the resonant frequency of MEMS resonator 102. In addition to impacting the inner radii of curved sections 108, the design of anchor coupling section 1 16 may also affect the durability and/or stability of MEMS resonator 102.

In this regard, by adjusting the shape and width of the anchor coupling section 116 in the vicinity of curved section 108 (for example by filleting anchor coupling section 116 in the vicinity of curved section 108 as shown in FIGS. 14 and 15), the stress on MEMS resonator 102 may be managed, controlled, reduced and/or minimized.

For example, with reference to FIGS. 14 and 15, the width of anchor coupling section 116 may be increased (see, for example, FIG. 15 relative to FIG. 14) to manage, control, reduce and/or minimize the stress concentration in or at nodal points 114. In this way, the durability and/or stability of MEMS resonator 102 may be increased, enhanced and/or optimized.

Other designs and/or configurations of anchor coupling sections 116 may be employed to, for example, affect the durability and/or stability of MEMS resonator 101 as well as impact the inner radii of curved sections 108 and the location of nodal points (if any) and the resonant frequency of MEMS resonator 102. (See, for example, FIGS. 16-21). Indeed, all designs of anchor coupling sections 116 whether now known or later developed are intended to fall within the scope of the present invention.

Notably, the shape and/or width of elongated beam section 106 in the vicinity of curved section 108 may also impact the durability and/or stability of MEMS resonator 102 (and in particular, the stress in curved sections 108 which are employed as anchoring locations) as well as impact the inner radii of curved sections 108 and the location of nodal points (if any) and the resonant frequency of MEMS resonator 102. In this regard, by widening elongated beam section 106 in the vicinity of curved section 108 and/or filleting elongated beam section 106 in the vicinity of curved section 108, the stress on the resonator may be reduced and/or minimized.

Thus, in one embodiment, by controlling the shape and width of elongated beam sections 106 and/or anchor coupling section 116, the inner radii of curved sections is defined thereby defining the relationship between the whether and how curved sections 108 move relative to elongated beam sections 106. In addition to determining the inner radii of curved sections 108 and, as such, the locations of nodal points 114, the shape of elongating beam sections 106 and/or anchor coupling section 116 in the vicinity of curved section 108 may affect the durability and stability of MEMS resonator 102. In this regard, by widening elongated beam section 106 in the vicinity of curved section 108 and/or widening (or filleting) the anchor coupling section 116, the stress on MEMS resonator 102 may be managed, controlled, reduced, minimized and/or optimized.

Notably, as mentioned above, the curvature and/or shape of curved sections 108 may be selected and/or designed to include one or more nodal points or areas in or in the vicinity of curved sections 108. For example, where curved section 108 moves out-of-phase with elongated beam section 106 connected thereto, the radius of a particular curved section 108 may be too small. Conversely, if the radius of a particular curved section 108 is too large, curved section 108 may move in-phase with beam sections 106 that are connected to curved section 108. In each instance, the particular curved section 108 may or may not include a nodal point that minimizes or reduces energy loss and/or substrate stress.

The aforementioned relationship is discussed in detail in "Microelectromechanical Resonator Structure, and Method of Designing, Operating and Using Same", filed May 19, 2005, and assigned U.S. patent application Ser. No. 11/132,941. The inventions described and illustrated in the aforementioned patent application may be employed to design; implement, and/or fabricate one or more of the MEMS resonators of the MEMS resonator array of the present invention. For the sake of brevity, those discussions will not be repeated. It is expressly noted, however, that the entire contents of the patent application, including, for example, the features, attributes, alternatives, materials, techniques and/or advantages of all of the inventions/embodiments, are incorporated by reference herein.

In operation, beam sections 106 of each MEMS resonator 102 of array 100 oscillate or vibrate at the same frequency. In this regard, beam sections 106 oscillate in an elongating (or breathing) motion or mode (for example, like that of a ring oscillator; see ring oscillator 1000 of FIG. 22A (expanding motion—ring oscillator 1000') and FIG. 22B (contracting motion—ring oscillator 1000")) as well as a bending motion or mode. Focusing on one MEMS resonator 102 of MEMS resonator array 100, in one embodiment, during operation, beam sections 106*a-d* of rounded square shaped MEMS resonator 102 oscillate between a first deflected state (see, FIG. 23A) and a second deflected state (see, FIG. 23B). Each deflected state in FIGS. 23A and 23B is superimposed over (or illustrated relative to) the stationary state of beam sections 106 and curved sections 108 of MEMS resonator 102.

Notably, when in the first deflected state, in addition to bending, beam sections 106*a-d* elongate by an amount of $\Delta L1$. Similarly, in the second deflected state, beam sections 106*a-d* elongate by an amount of $\Delta L2$ and bend in the opposite direction to that of the first deflected state. The amount of elongation (i.e., $\Delta L1$ and $\Delta L2$) may or may not be equal.

Figure 23A:
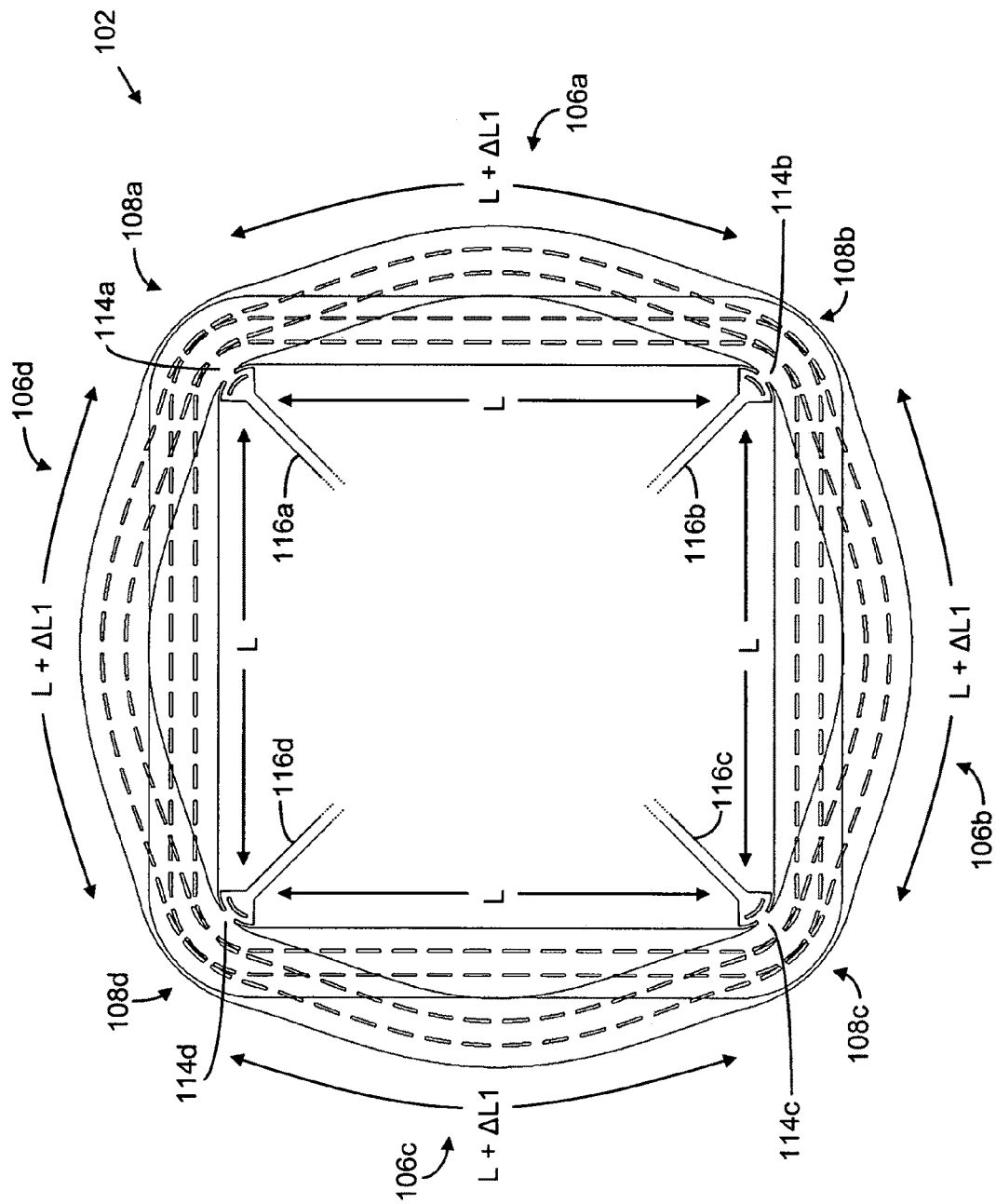
FIGS. 23A and 23B are top views of one embodiment of a rounded square shaped MEMS resonator, including in-plane vibration of elongated beam sections, according to one aspect of present invention, wherein the MEMS resonator oscillates between a first deflected state (FIG. 23A) and a second deflected state (FIG. 23B) and wherein each deflected state is superimposed over (or illustrated relative to) the stationary state of MEMS resonator.
Figure 23B:
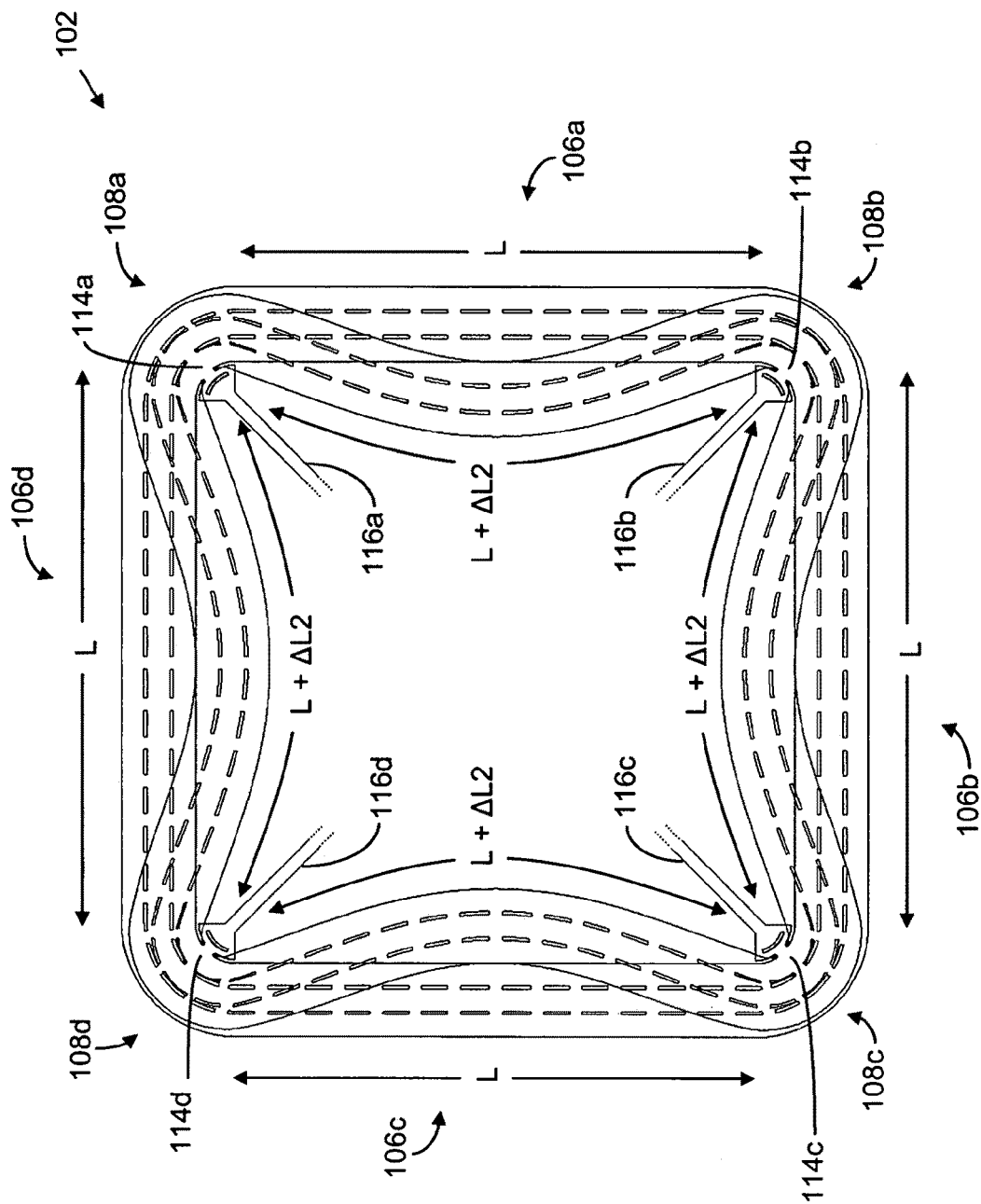

Moreover, with continued reference to FIGS. 23A and 23B, nodal points 114*a-d* in or on curved sections 108*a-d* experience little to no movement during operation. That is, as MEMS resonator 102 oscillates between the first deflected state and the second deflected state, the areas or portions of curved sections 108*a-d* which are connect to anchor coupling sections 116 are relatively stationary. The anchors are not illustrated.

Notably, each MEMS resonator 102 of MEMS resonator array 100 may oscillate in an inherently or substantially linear mode. As such, the considerations and requirements of the drive and sense circuitry, discussed below, to provide a linear resonator/oscillator may be less stringent and/or complex because there may be no need to very precisely or very accurately control the resonant amplitude of beam sections 106. In this regard, some resonator structures (for example, resonators having double-clamped beams, such as double-clamped tuning forks) have modes that are non-linear wherein the output frequency is a function of the resonant amplitude. This effect is evident when a beam transitions from a bending mode transitions to a tensile (elongating) mode. A double-clamped beam, in a primary mode, may exhibit this behavior because at smaller amplitudes the "restring" forces are dominated by bending stress and, at larger amplitudes, the resorting force is dominated by tensile stress. Under this situation, to maintain a constant frequency in such a case the resonant amplitude of the beam may need to be carefully regulated, which may be difficult and likely introduces additional complexity.

Figure 24A:
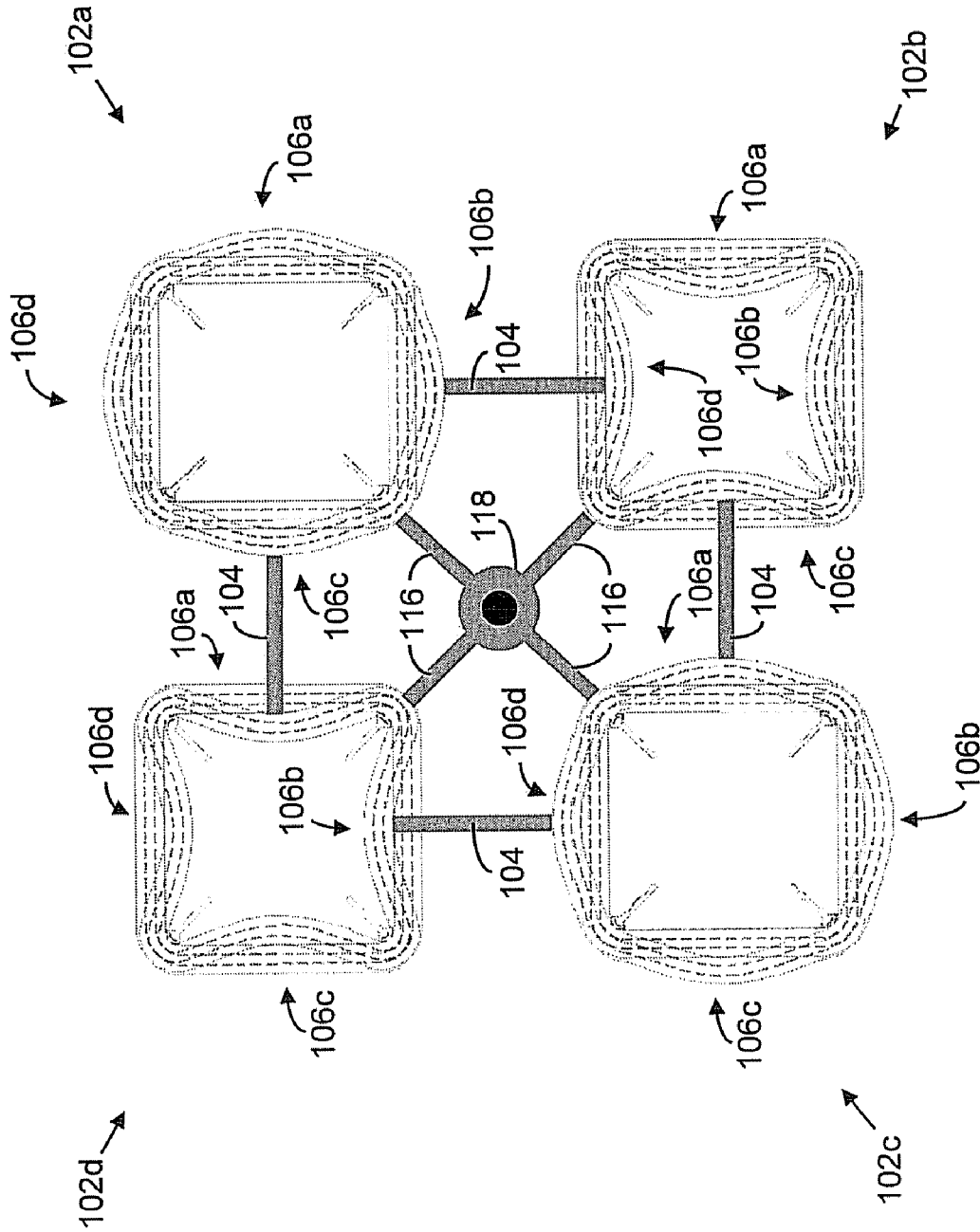

Focusing now on MEMS resonator array 100, with reference to FIGS. 24A and 24B, in one embodiment, during operation, beam sections 106*a-d* of each rounded square shaped MEMS resonator 102 oscillate between the first deflected state and the second deflected state—but in an opposite direction relative to beam sections 106*a-d* of an adjacent MEMS resonator 102. In this regard, opposing beam sections 106 of adjacent MEMS resonators 102 oscillate, in relation to the other, in-phase—but in opposite directions—between the first deflected state and the second deflected state. That is, when beam section 106b of MEMS resonator 102a is in a first deflected state, beam section 106d of MEMS resonator 102b (i.e., the beam section opposing beam section 106b of MEMS resonator 102a) is in a second deflected state. (See, FIG. 24A). Similarly, when beam section 106b of MEMS resonator 102a is in a second deflected state, beam section 106d of MEMS resonator 102b is in a first deflected state. (See, FIG. 24B). In this way, beams sections 106a-d of MEMS resonators 102a-d of array 100 oscillate or vibrate at the same or substantially the same frequency. Moreover, resonator coupling sections 104 experience relative little to no expansion or contraction as the beams oscillate between the first and second deflected states.

Notably, the deflected states in FIG. 24A and 24B is superimposed over (or illustrated relative to) the stationary state of beam sections 106 and curved sections 108 of MEMS resonators 102a-d.

Figure 25:
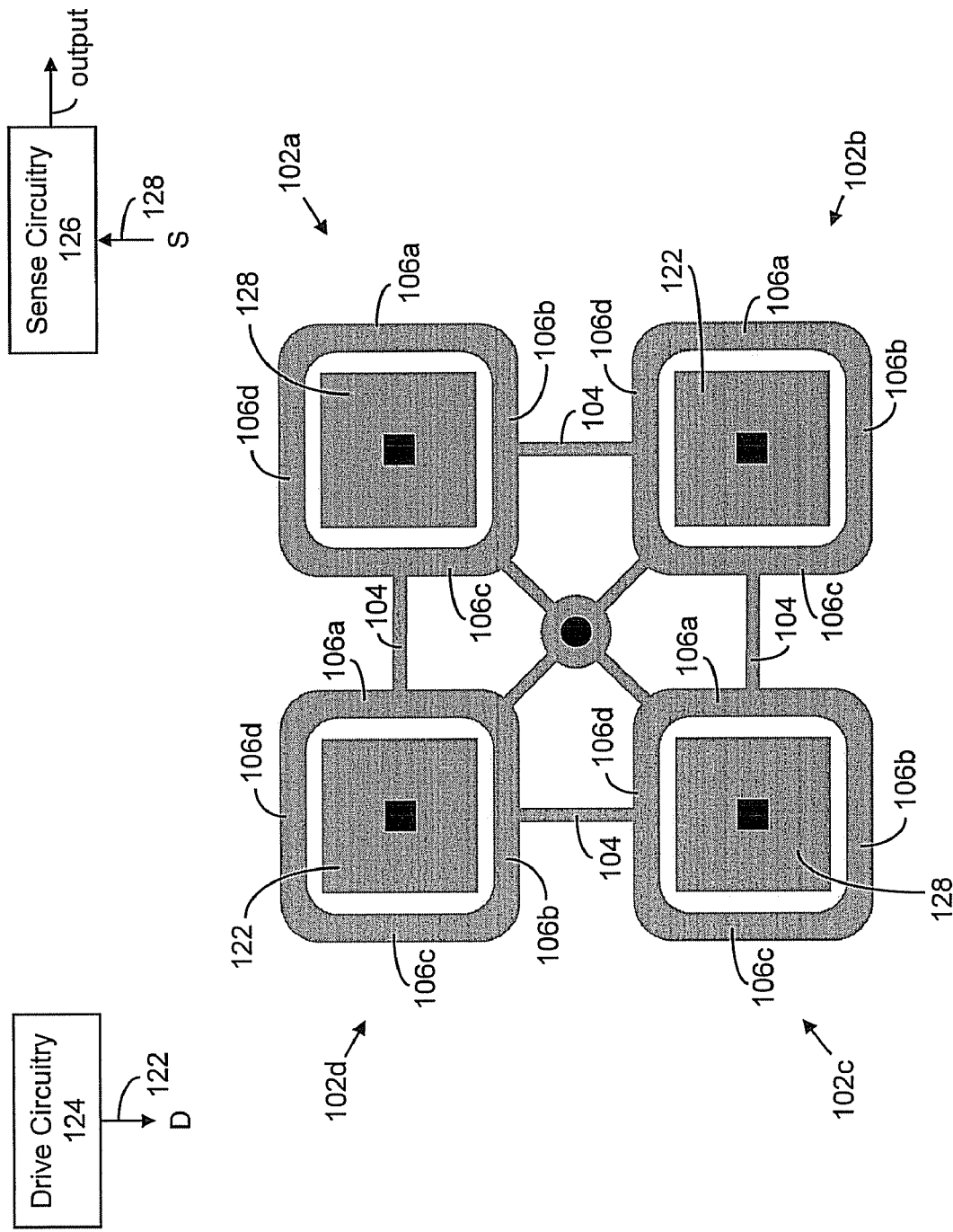
FIG. 25 illustrates an exemplary embodiment of a MEMS resonator array including four rounded square shaped MEMS resonators, in conjunction with drive and sense electrodes and drive and sense circuitry, according to an aspect of present invention.

The sense and drive electrodes and circuitry may be configured to provide a single-ended output signal or differential output signals. With reference to FIG. 25, in one exemplary embodiment of a single-ended output signal configuration, drive electrodes 122 (which are electrically connected to drive circuitry 124) are juxtaposed to beam sections 106a-d of MEMS resonators 102b and 102d to induce beam sections 106a-d of resonators 102b and 102d to oscillate or vibrate wherein the oscillation or vibration has one or more resonant frequencies. The sense circuitry 126, in conjunction with sense electrodes 128 which are also juxtaposed to beam sections 106a-d of MEMS resonators 102a and 102c, sense, sample and/or detect a signal having the one or more resonant frequencies. In this regard, sense electrodes 128 are disposed adjacent to beam sections 106 to provide a signal (for example, resulting from a change in capacitance between beam sections 106 and sense electrodes 128 due to the oscillating motion of each MEMS resonator structure) which is representative of the oscillation or vibration to sense circuitry 126. The sense circuitry 126 receives the signal and, in response thereto, may output a signal, for example, a clock signal having a resonant frequency. Typically the sense signal output is connected to the drive circuit 124 to close the electronic oscillator loop. In this regard, the phase of the drive signal should be appropriate to stimulate/drive the desired mode.

Notably, drive circuitry 124 and sense circuitry 126, as well as drive electrodes 122 and sense electrodes 128, may be conventional well-known drive and sense circuitry. Indeed, drive circuitry 124 and sense circuitry 126 may be any MEMS sense and drive circuitry whether now known or later developed.

In addition, drive electrodes 122 and sense electrodes 128 may be disposed or positioned relative to beam sections 106 in order to detect one or more selected or predetermined harmonics of beam sections 106 of MEMS resonators 102. Moreover, the number and length of drive electrodes 122 and sense electrodes 128 may be selected in order to optimize, enhance and/or improve the operation of MEMS resonator array 100 and/or MEMS resonators 102. Indeed, drive electrodes 122 and sense electrodes 128 may be of any type and/or shape whether now known or later developed.

Moreover, drive circuitry 124 and/or sense circuitry 126 may be integrated on the same substrate in which MEMS resonator array 100 resides (or is fabricated in). In addition thereto, or in lieu thereof, drive circuitry 124 and/or sense circuitry 126 may be integrated on a substrate that is physically separate from (and electrically interconnected with) the substrate in which MEMS resonator array 100 resides.

In another embodiment, MEMS resonator array 100 is configured to provide a differential output signal. In this embodiment, the sense and drive electrodes and circuitry are configured to provide output signals that are (or are substantially) 180 degrees out of phase. In this way, MEMS resonator array 100 provides a differential output signal pair which includes a relatively large signal to noise relationship due to the summing effects of oscillating beam sections 106 (for example, symmetrical oscillating beam sections) of the plurality of MEMS resonators 102.

Figure 26A:
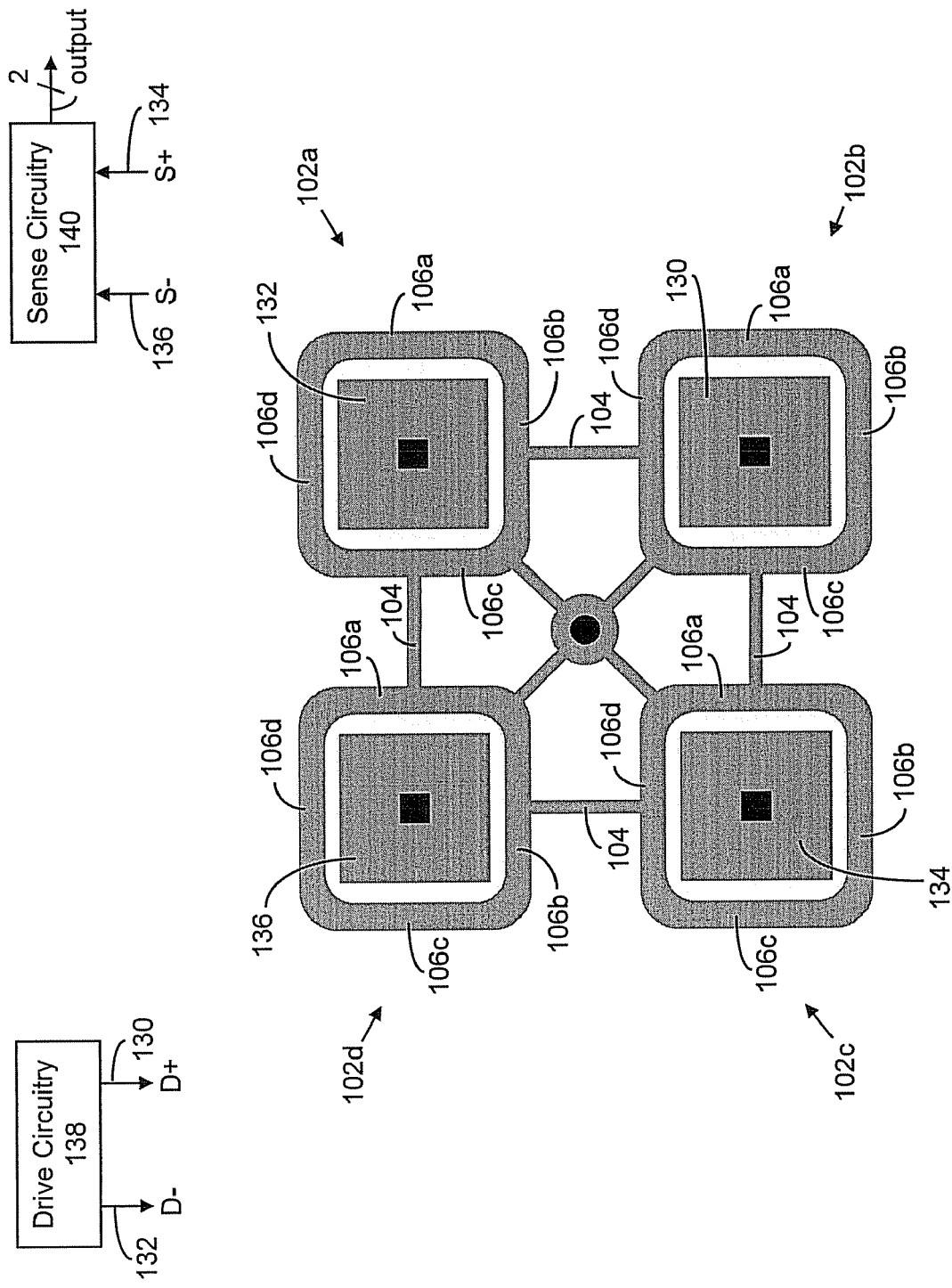
FIGS. 26A and 26B illustrate exemplary embodiment of a MEMS resonator array including rounded square shaped MEMS resonators, in conjunction with a differential output signaling technique and embodiment, having drive and sense electrodes and differential drive and sense circuitry, according to exemplary embodiments of the present invention.

With reference to FIG. 26A, in one exemplary embodiment of a differential output signal configuration, drive electrodes 130 and 132 (which are electrically connected to differential drive circuitry 138) are juxtaposed to beam sections 106a-d of MEMS resonator 102a and 102b to induce beam sections 106a-d of MEMS resonator 102a and 102b to oscillate or vibrate. In this regard, each MEMS resonator 102 vibrates or resonates, in-plane, to generate output signals that are (or are substantially) 180 degrees out of phase. The sense electrodes 134 and 136 are disposed adjacent to beam sections 106a-d of MEMS resonator 102c and 102d to provide a signal (for example, resulting from a change in capacitance between beam sections 106 and sense electrodes 134 and 136 due to the oscillating motion of the resonator structure) which is representative of the oscillation or vibration to differential sense circuitry 140 which senses, samples and/or detects a signal having the one or more resonant frequencies. The differential sense circuitry 140 receives the signal and, in response thereto, may output a differential signal pair, for example, a differential clock signal having a resonant frequency.

The differential drive circuitry 138 and differential sense circuitry 140 may be conventional well-known circuitry. Indeed, differential drive circuitry 138 and differential sense circuitry 140 may be any type of circuitry (whether or not integrated (or fabricated) on the same substrate in which the MEMS resonator structure resides), and all such circuitry, whether now known or later developed, are intended to fall within the scope of the present invention.

In addition, drive electrodes 130 and 132, and sense electrodes 134 and 136, may be of a conventional, well known type or may be any type and/or shaped electrode whether now known or later developed. Further, the physical electrode mechanisms may include, for example, capacitive, piezoresistive, piezoelectric, inductive, magnetorestrictive and thermal. Indeed, all physical electrode mechanisms whether now known or later developed are intended to fall within the scope of the present invention.

In addition, drive electrodes 130/132 and sense electrodes 134/136 may be disposed or positioned relative to beam sections 106 of MEMS resonators 102 in order to detect one or more selected or predetermined harmonics of beam sections 106. Moreover, the number and length of drive electrodes 130/132 and sense electrodes 134/136 may be selected in order to optimize, enhance and/or improve the operation of the MEMS resonator.

Notably, differential drive circuitry 138 and differential sense circuitry 140 maybe integrated on the same substrate in which the MEMS resonator structure resides (or is fabricated in). In addition thereto, or in lieu thereof, differential drive circuitry 138 and differential sense circuitry 140 may be integrated on a substrate that is physically separate from (and electrically interconnected with) the substrate in which the MEMS resonator structure resides.

In the embodiment of FIG. 26A, drive electrodes 130/132 and sense electrodes 134/136, are symmetrically configured, which in conjunction with the symmetrical structures of MEMS resonators 102, manage the stress on resonator coupling sections 104, beam sections 106, curved sections 108, anchor coupling sections 116, anchors 118 and/or the substrate. In this way, resonator coupling sections 104 and/or anchor coupling sections 116 may be a low stress point which may manage, minimize and/or reduce energy loss of one, some or all of MEMS resonator 102 of MEMS resonator array 100.

Figure 26B:
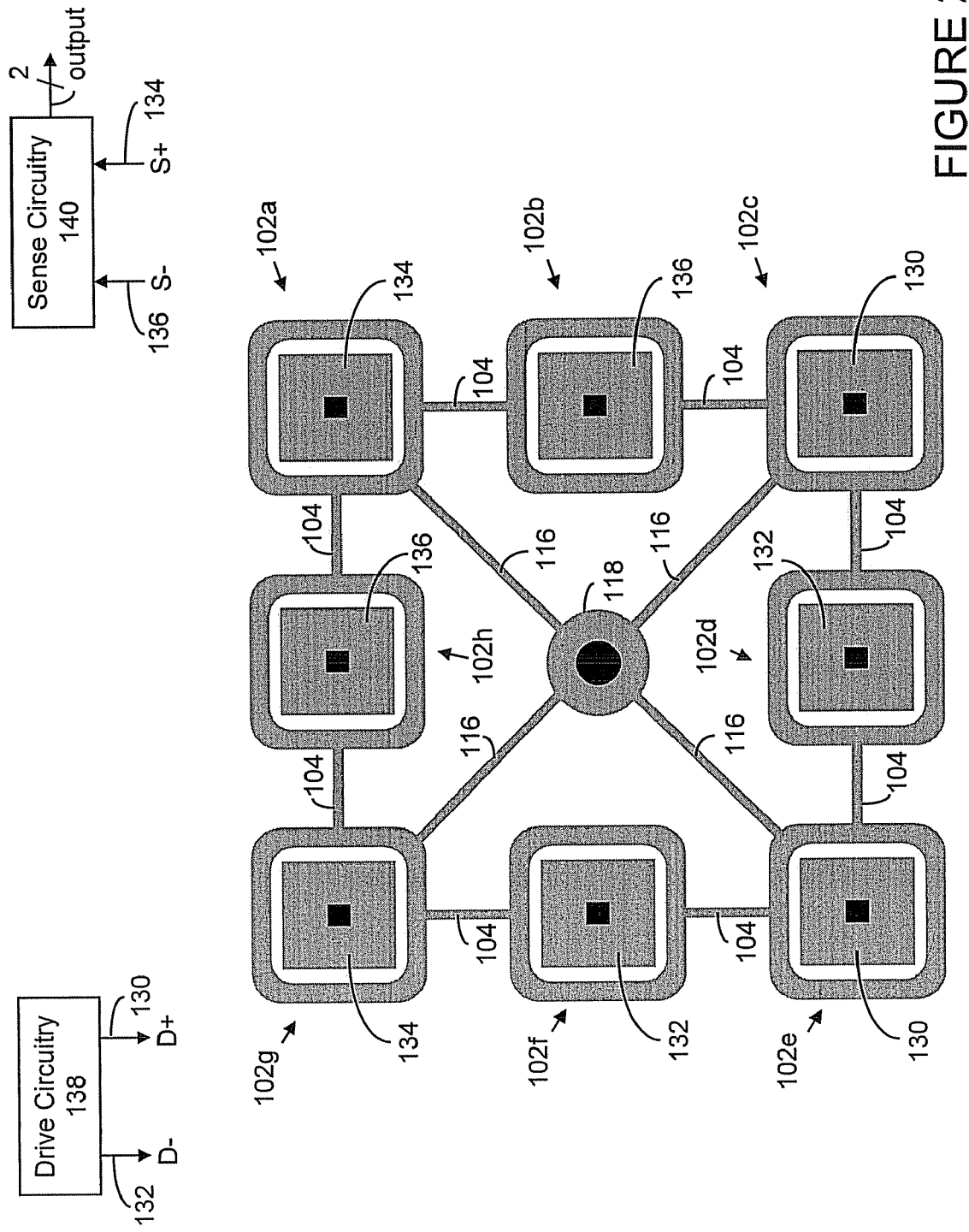

Notably, the differential and single-ended output signal configurations maybe implemented in MEMS resonator arrays 100 having less than or greater than four MEMS resonators 102. (See, for example, the differential output signal configuration of FIG. 26B). Indeed, all of the features, embodiments and alternatives discussed herein with respect to MEMS resonator array 100 in the context of sensing and driving the array are applicable to arrays of any size (for example, an array having 2, 3, 4, 5, 6, 7 and 8 MEMS resonators 102) and/or configuration (for example, arrays comprised of the same or different geometric shapes of MEMS resonators 102 such as rounded squares, rounded hexagons or rounded triangles). For the sake of brevity, those discussions will not be repeated.

Figure 27A:
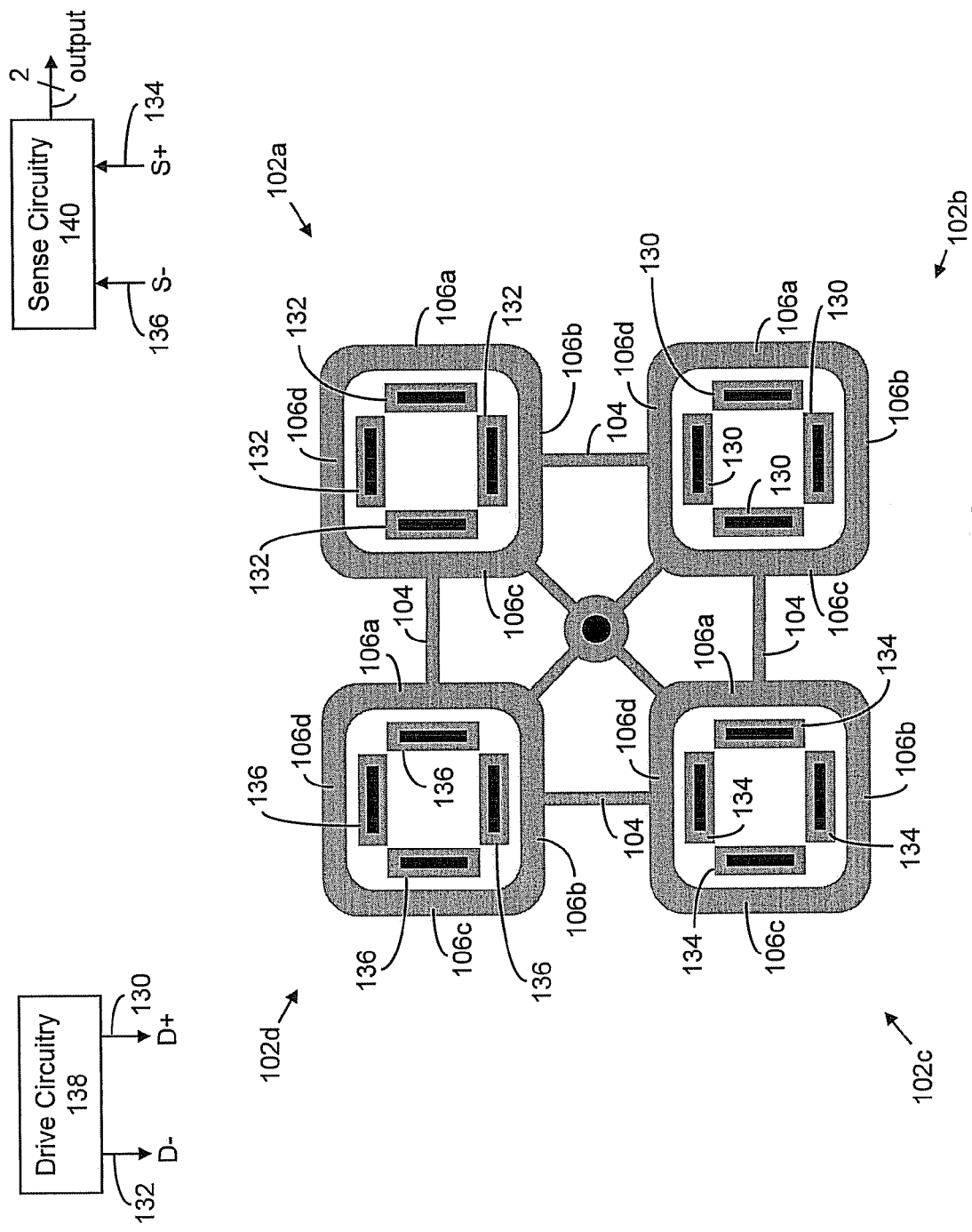
FIGS. 27A and 27B illustrate exemplary embodiments of a MEMS resonator array, including four rounded square shaped MEMS resonators, in conjunction with a differential output signaling technique and embodiment, having drive and sense electrodes and differential drive and sense circuitry, according to another embodiment of the present invention.
Figure 27B:
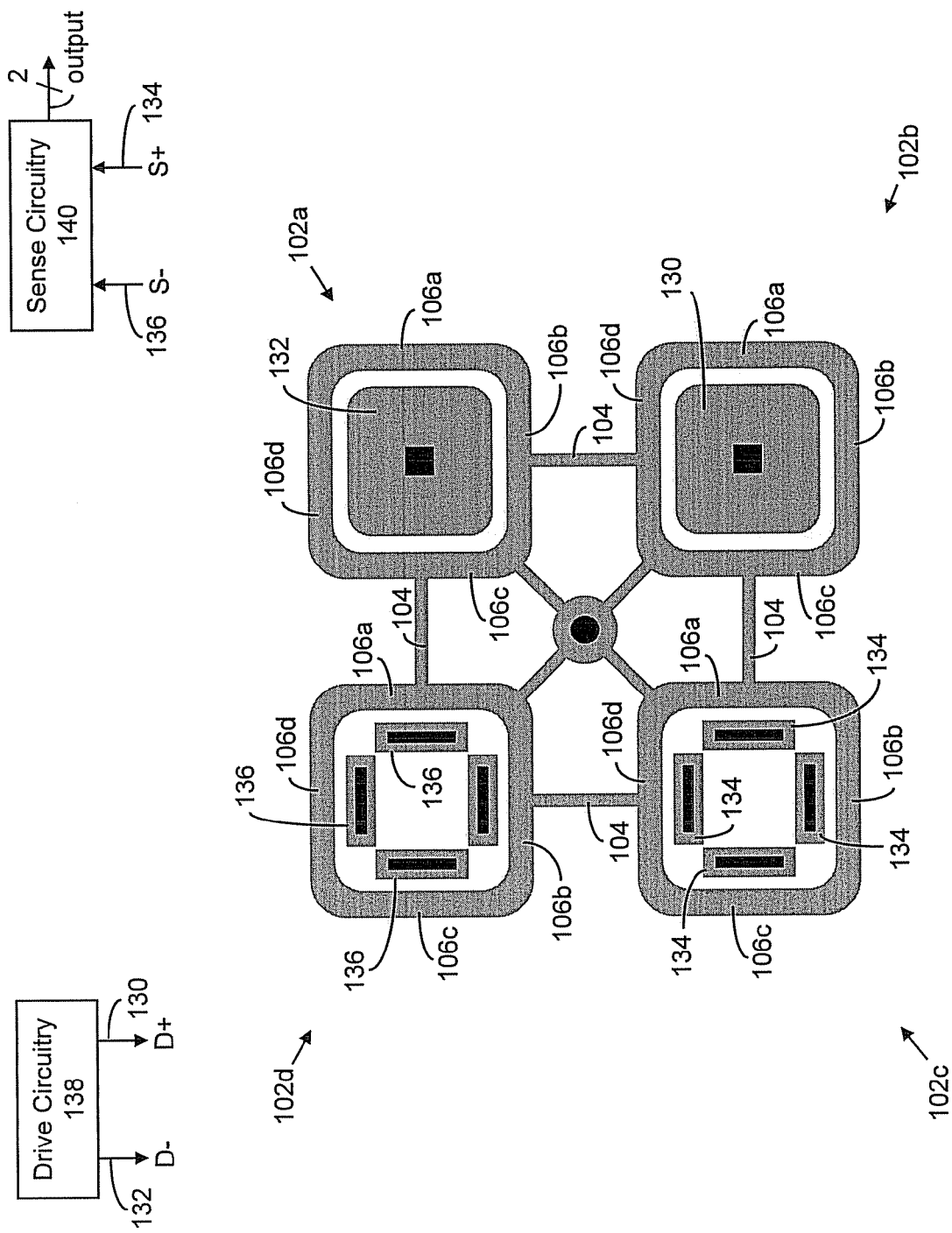
Figure 28A:
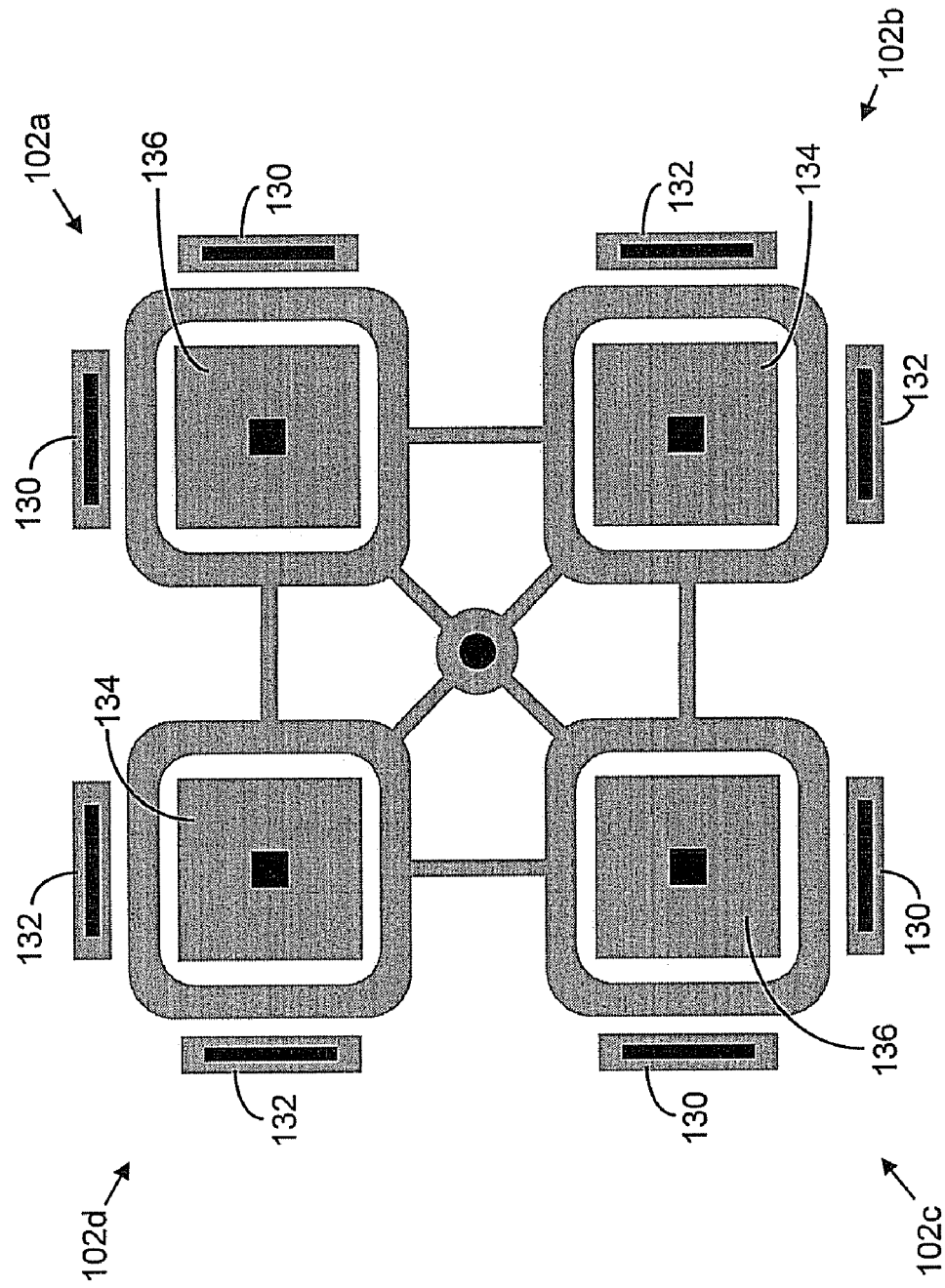
FIGS. 28A, 28B and 29A-29F illustrate exemplary embodiments of a MEMS resonator array, including four rounded square shaped MEMS resonators, in conjunction with various embodiments of drive and sense electrodes, according to exemplary embodiments of the present invention.
Figure 28B:
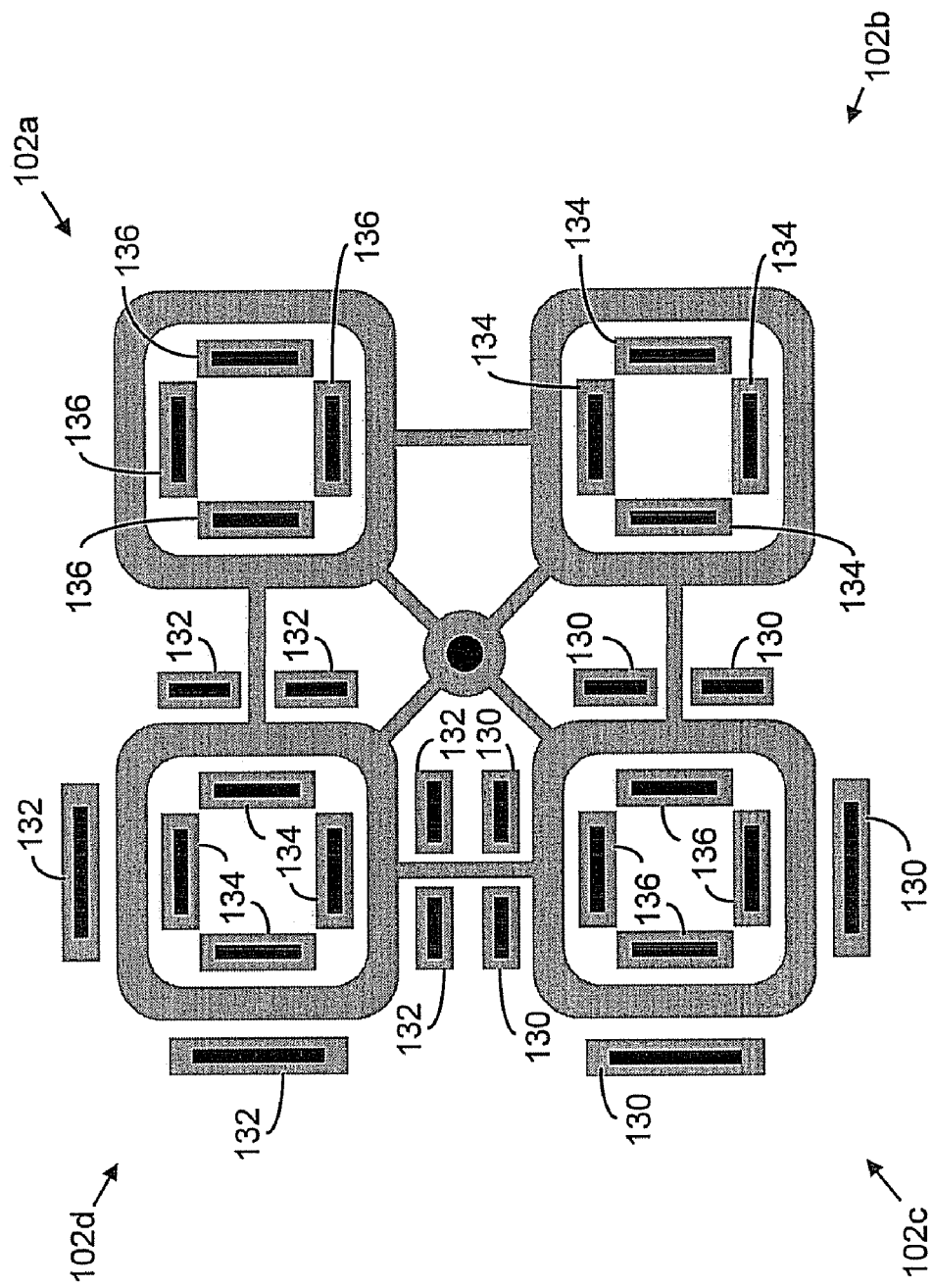
Figure 29A:
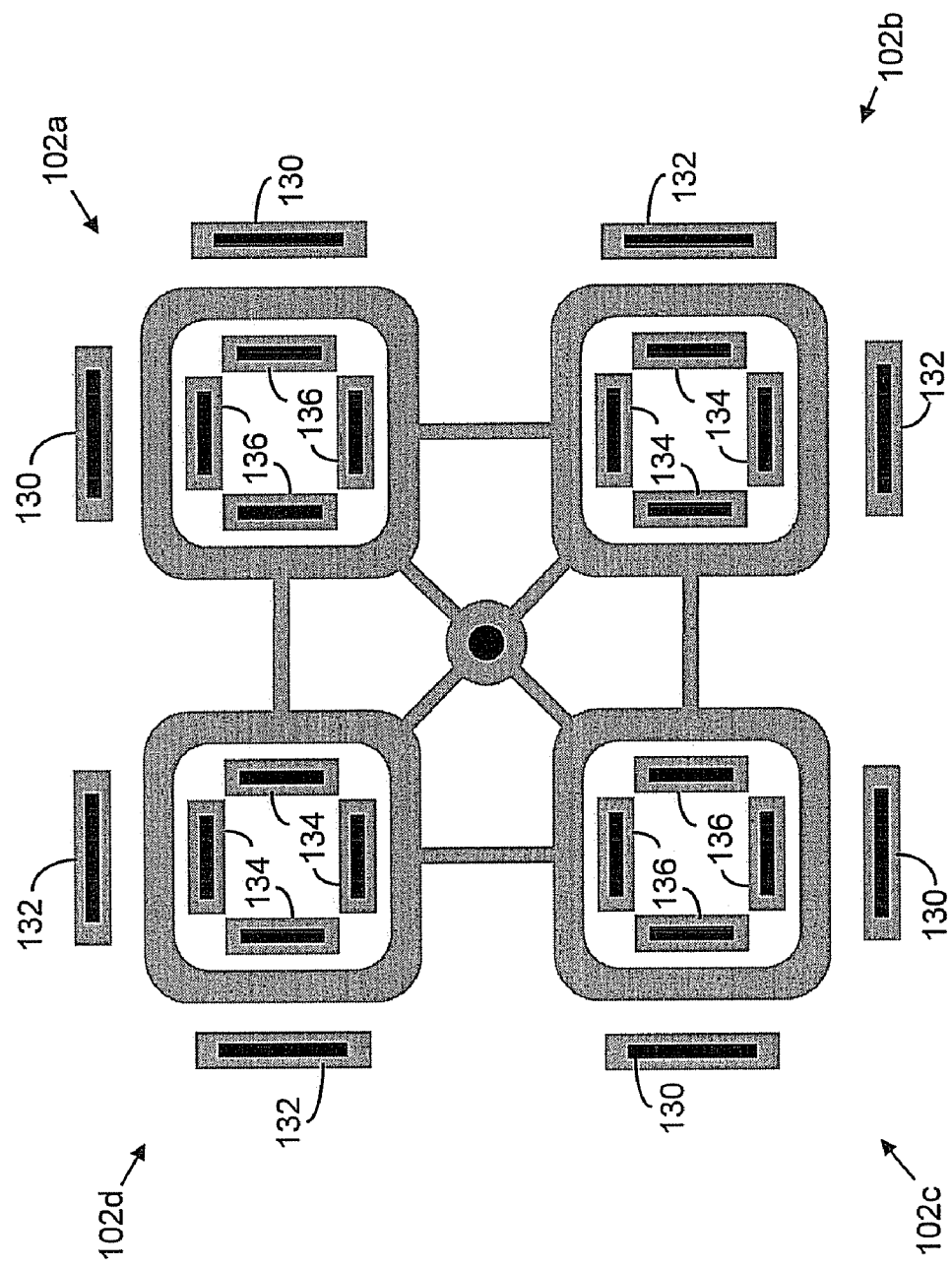
Figure 29B:
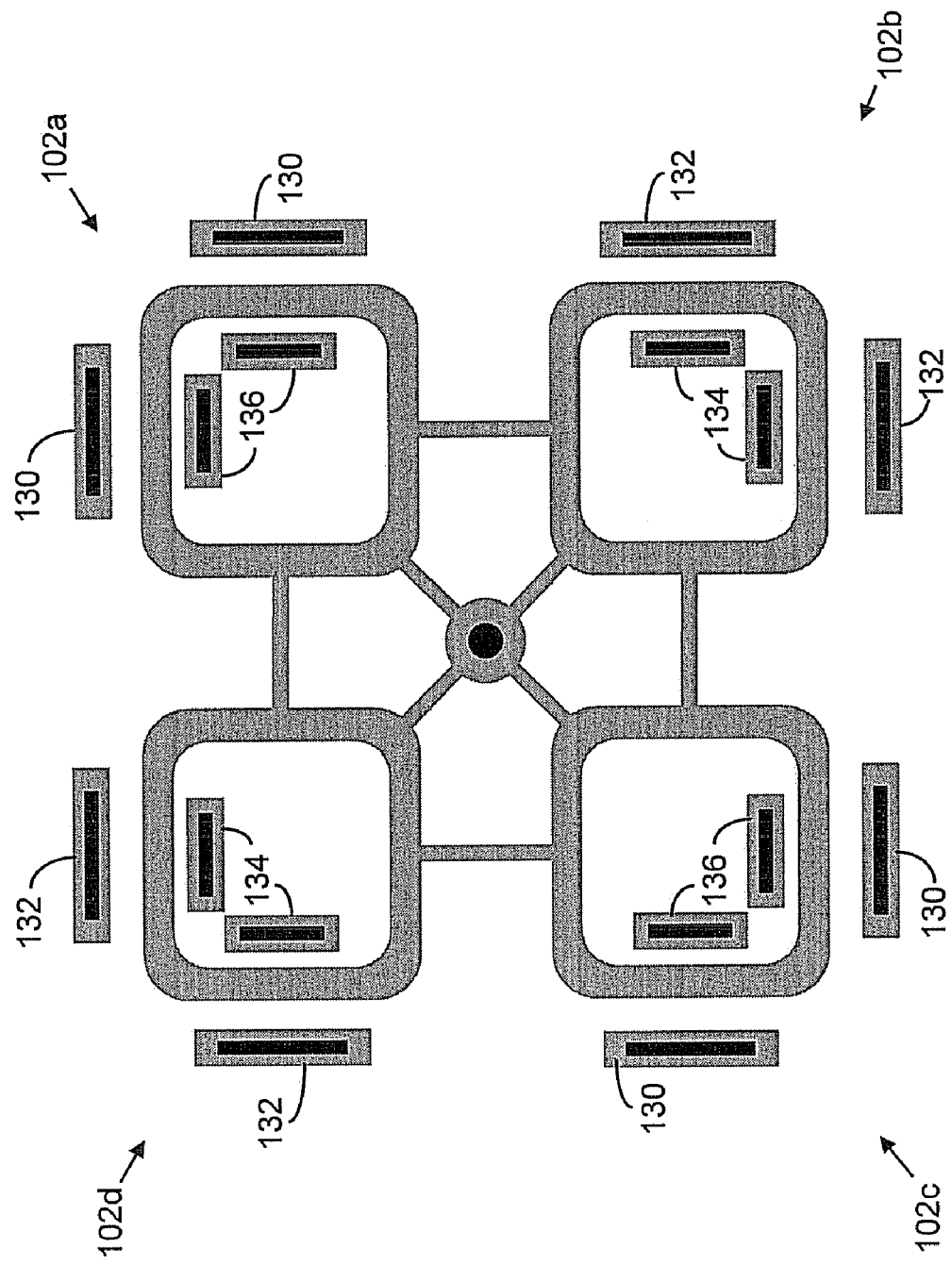
Figure 29C:
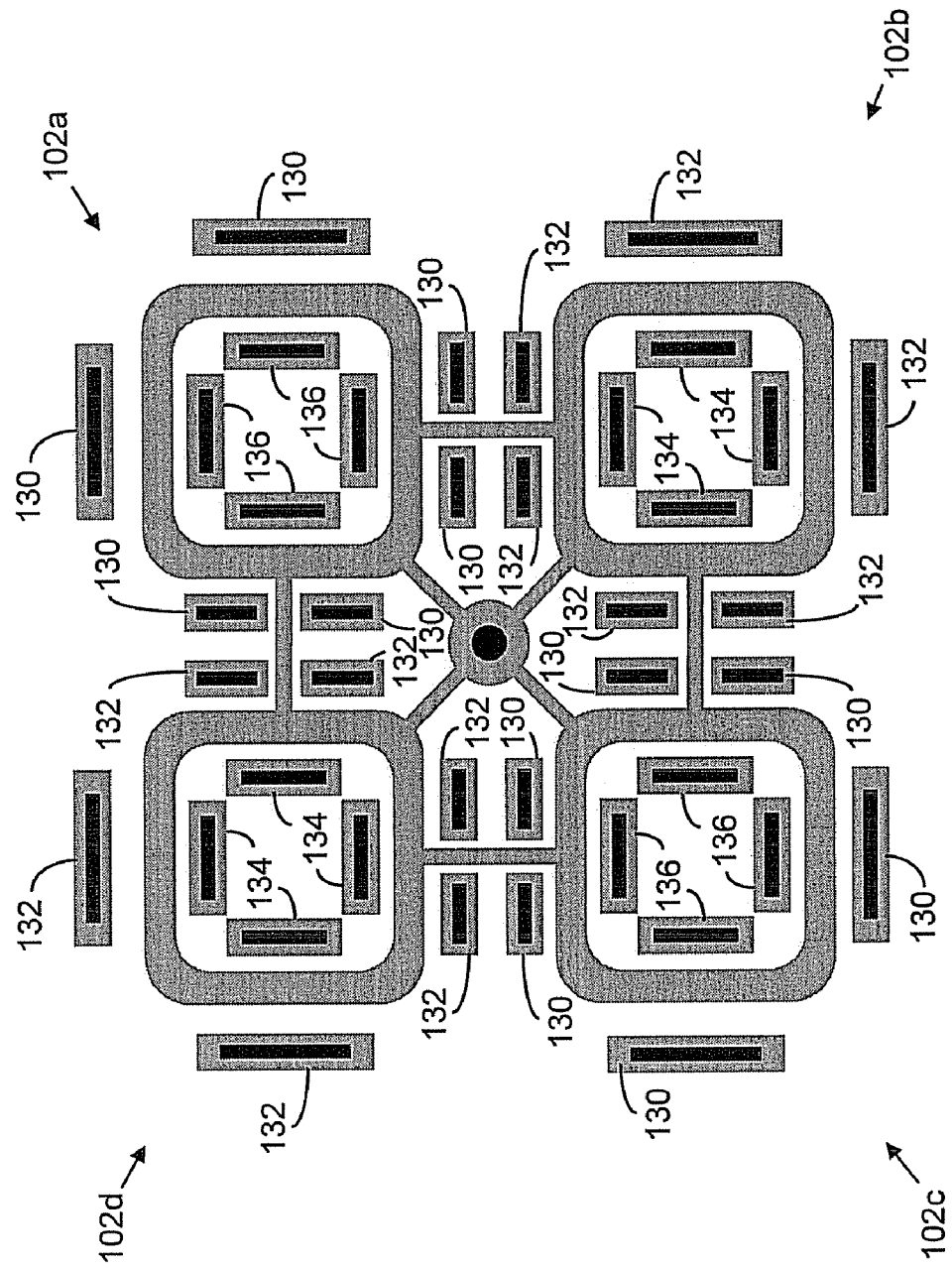
Figure 29D:
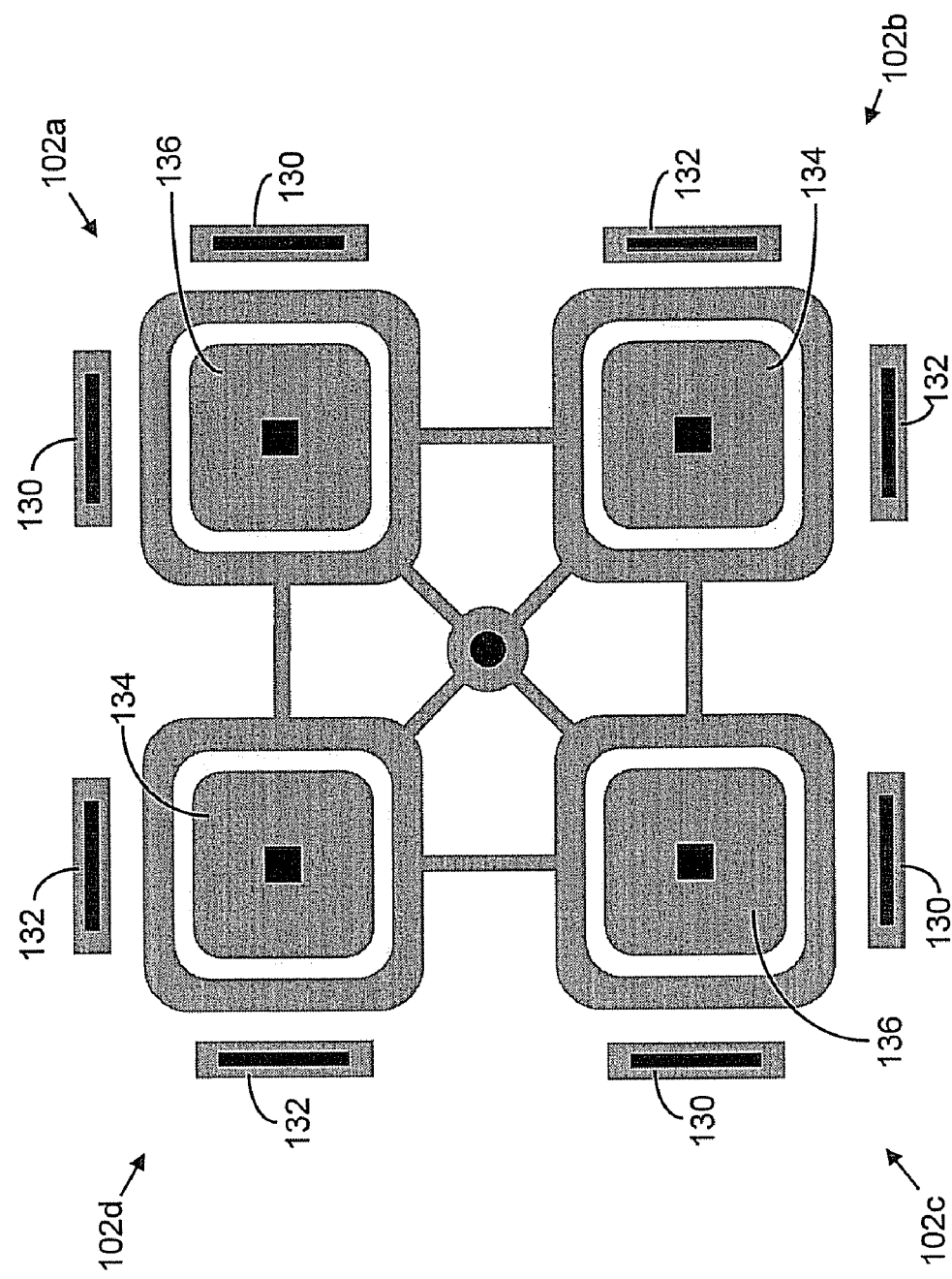
Figure 29E:
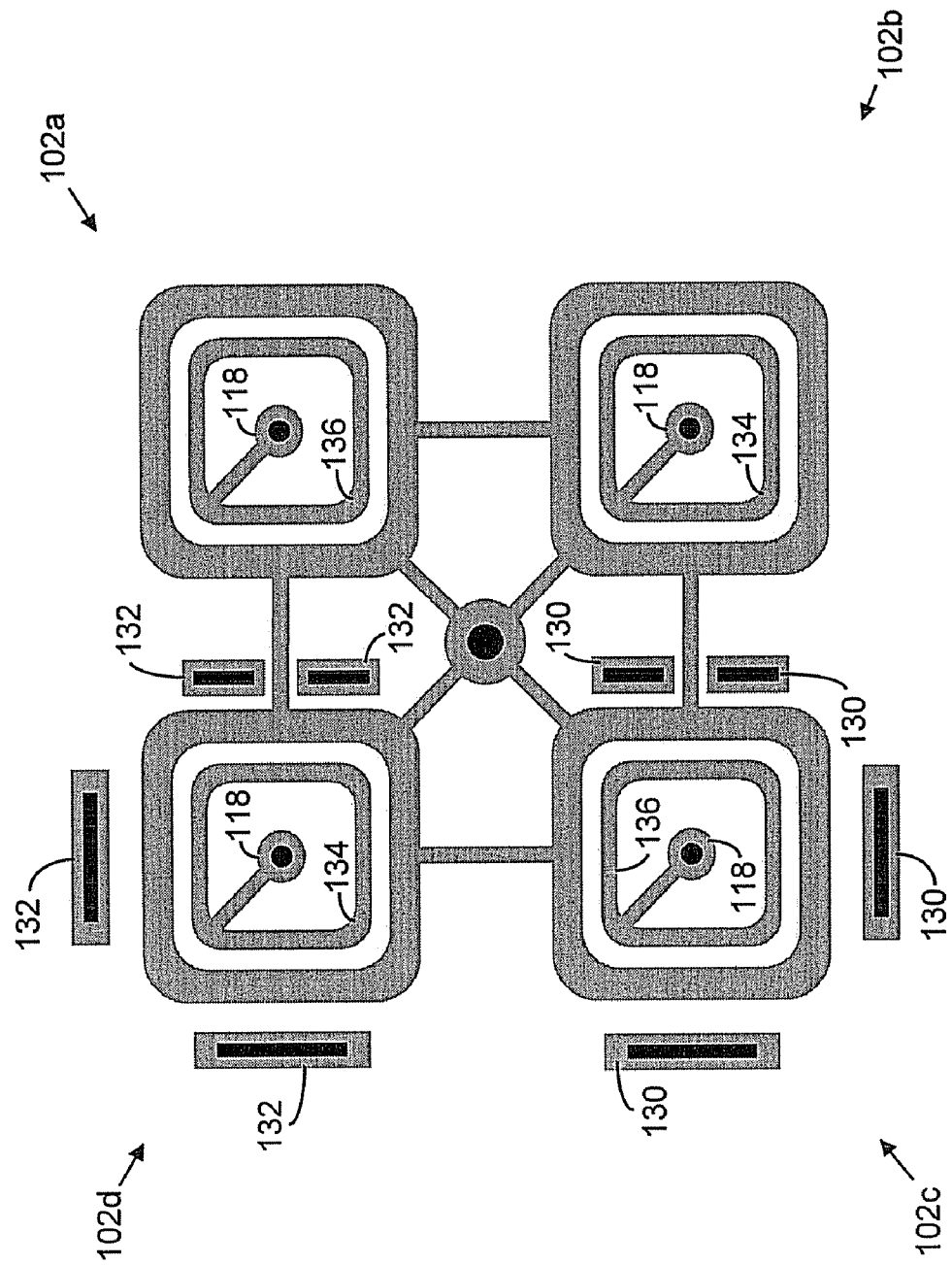
Figure 29F:
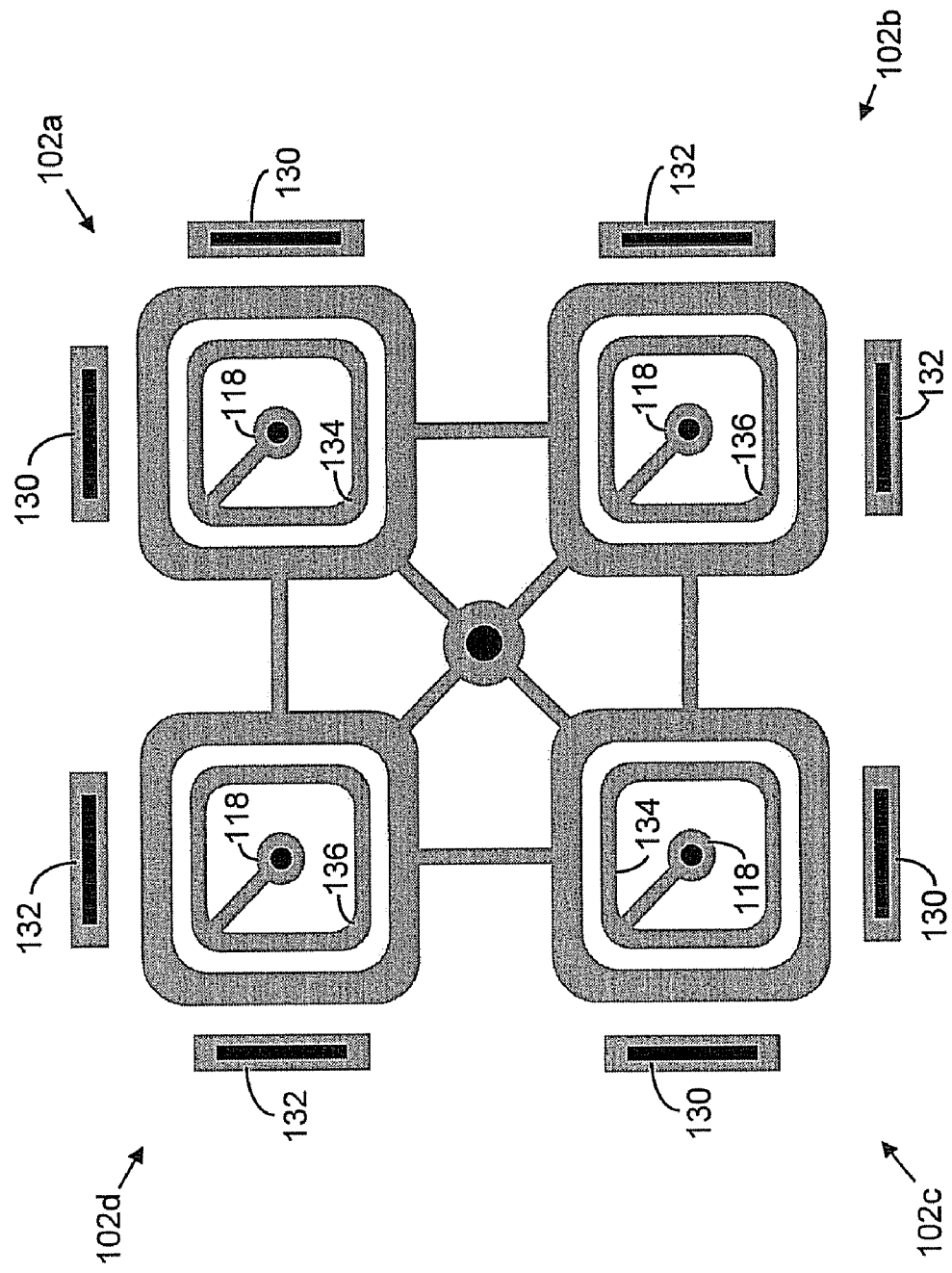

Further, it should be noted that there are many other configurations and/or architectures of the sense and drive electrodes that cause or induce beam sections 106 to resonate and thereby generate and/or produce output signals that are (or are substantially) 180 degrees out of phase. The MEMS resonator array 100 of the present invention may employ any sense and drive structure, technique, configurations and/or architectures whether now known or later developed. For example, the drive and sense electrodes may be of a conventional type or may be any type and/or shape. (See, for example, FIGS. 27A and 27B). The number and design of drive and/or sense electrodes may be selected to provide addition drive signal and/or sense signal. For example, in one embodiment, the number of sense electrodes, and the cross-sectional sense electrode-beam section interface, is increased in order to increase the signal provided to sense circuitry (for example, the differential sense circuitry). (See, for example, FIG. 28A). In one embodiment, sense electrodes are disposed on the inner and outer perimeters of one or more of MEMS resonators 102. (See, for example, FIG. 28B). Thus, MEMS resonator array 100 of the present invention may employ any sense and drive electrode structure and configuration whether now known or later developed. (See, for example, FIGS. 29A-29F).

Moreover, implementing a differential signal configuration may facilitate canceling, limiting, reducing and/or minimizing the effect of capacitive coupling from the drive electrodes to the sense electrodes. In addition, a fully differential signaling configuration may also significantly decrease any sensitivity to electrical and/or mechanical noise coupled from the substrate. Further, implementing MEMS resonator array 100 in a differential signaling configuration may also eliminate, minimize and/or reduce charge flow through the anchor to and from the structure. As such, a voltage drop between the substrate anchor and drive and sense electrodes may be avoided. Notably, this voltage drop could degrade or adversely impact the electric transfer function of the MEMS resonators of the array especially at higher frequencies (for example, frequencies greater than 100 MHz).

In one embodiment of the present invention, MEMS resonator array 100 employs temperature management techniques in order to manage and/or control the Q factor of MEMS resonators 102. In this regard, when beam sections 106 and/or curved sections 108 bend, one side of the section is stretched thereby causing a slight cooling in the area of the stretching, and the other side is compressed, thereby causing a slight heating in the area of the compression. The heat gradient causes diffusion from the "hotter" side to the "cooler" side. The diffusion of heat ("heat flow") results in a loss of energy, which may impact (for example, reduce) the Q factor of MEMS resonator 102. This effect is often referred to as Thermoelastic Dissipation ("TED"), which may be a dominate limit of the Q factor of a resonant structure. As such, is may be advantageous to implement temperature management techniques in order to manage, control, limit, minimize and/or reduce TED.

Figure 30A:
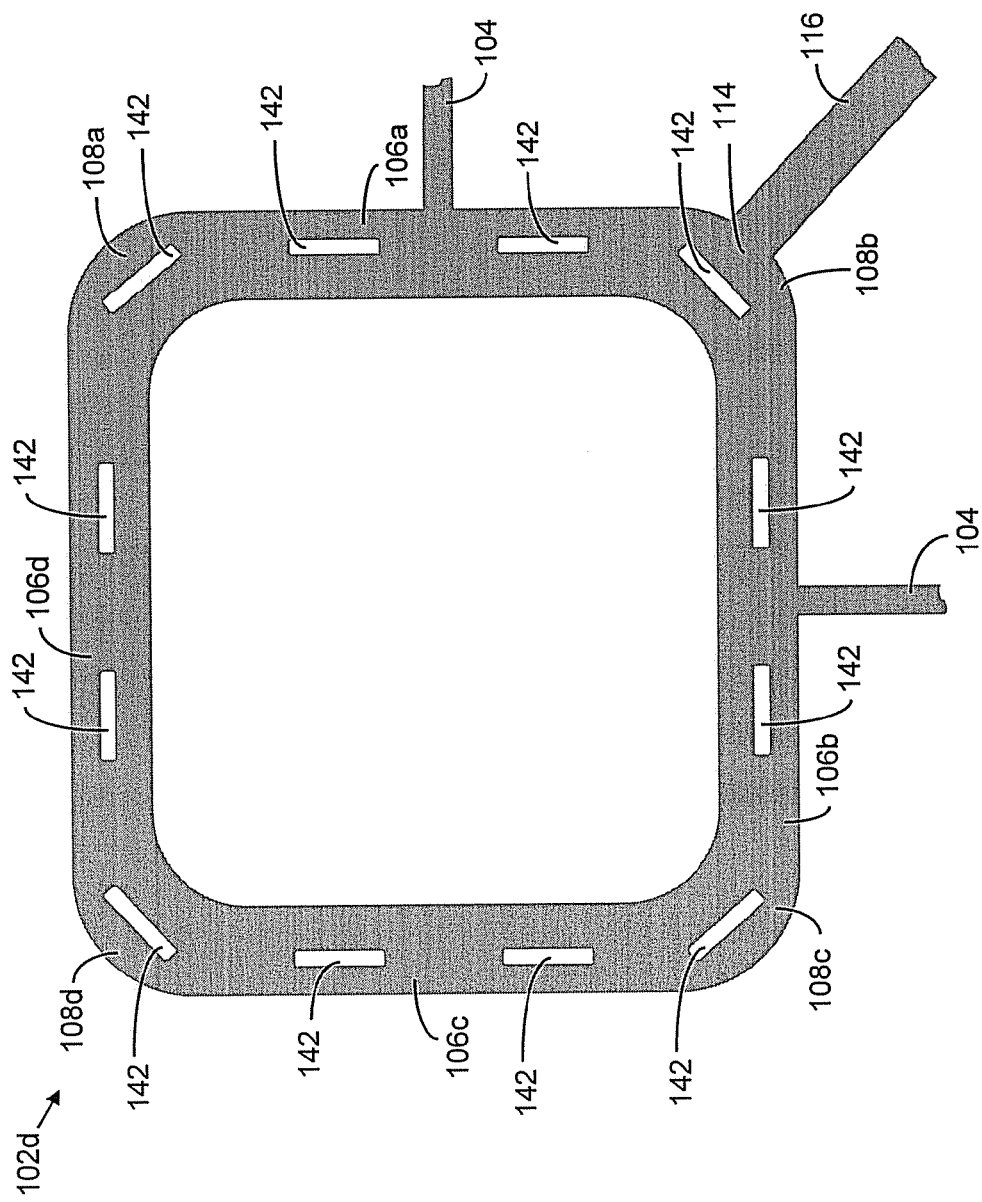
Figure 30B:
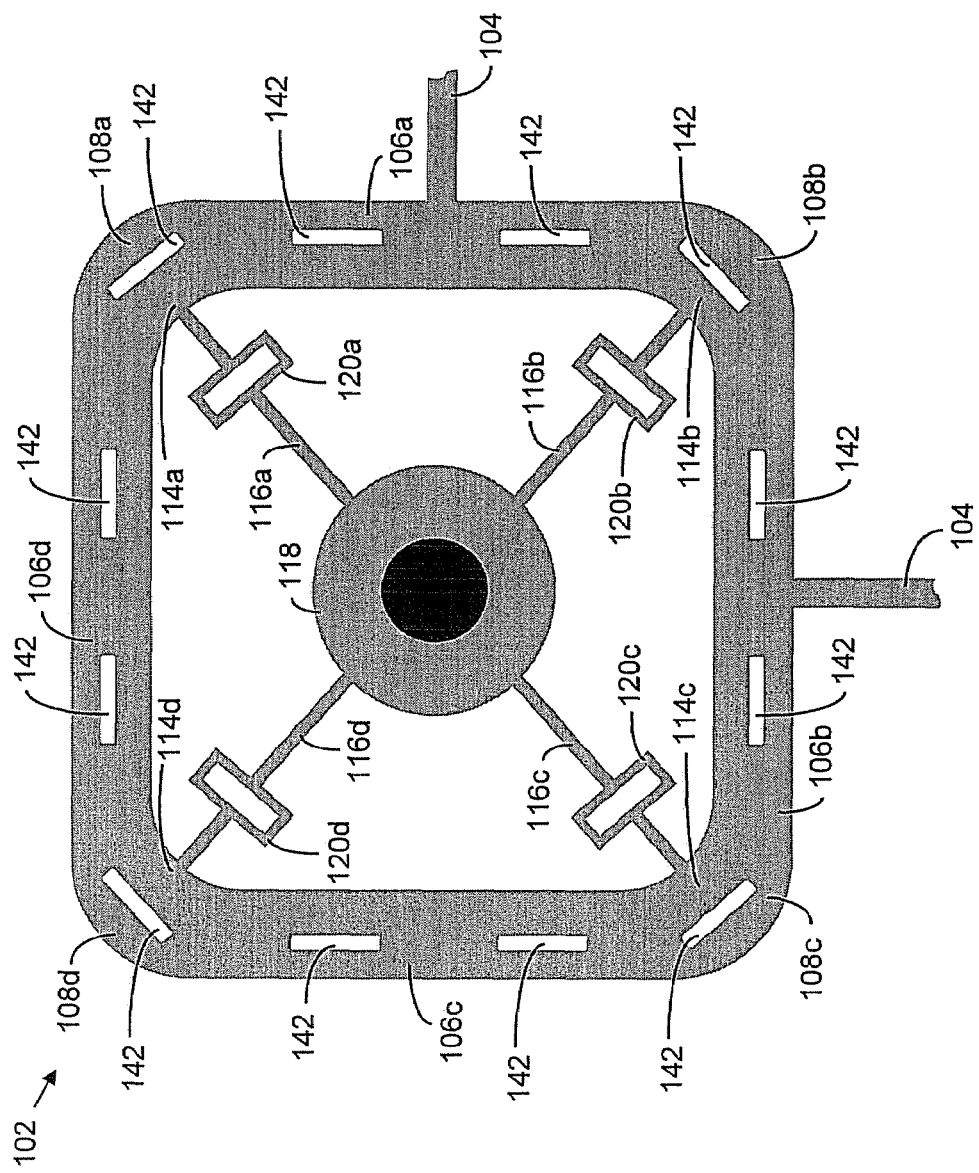
Figure 33:
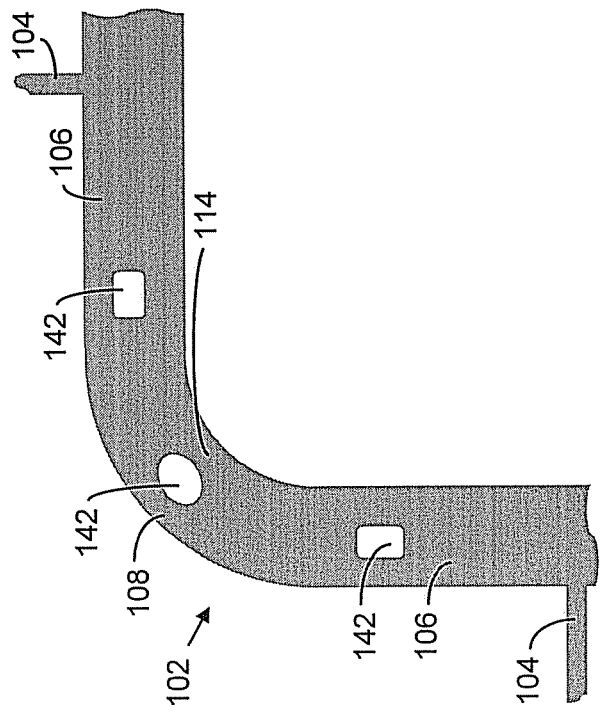
Figure 34:
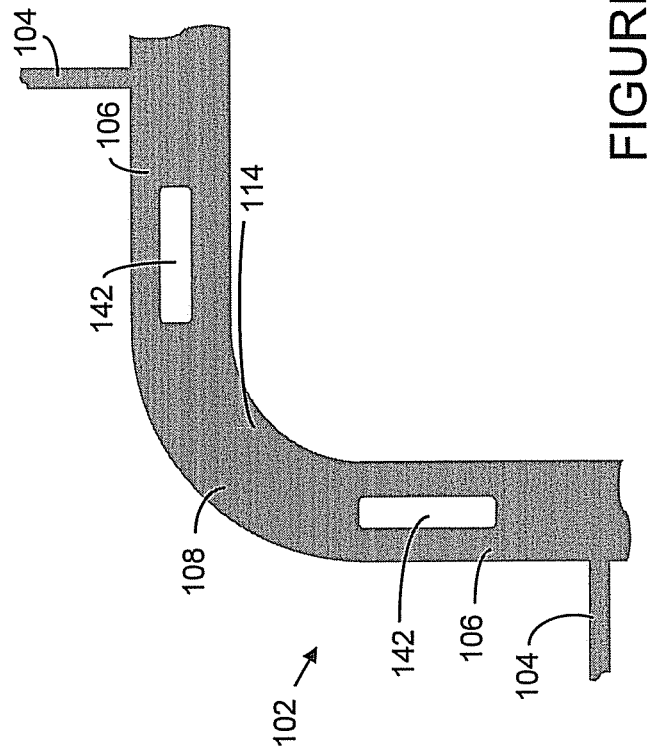
Figure 37:
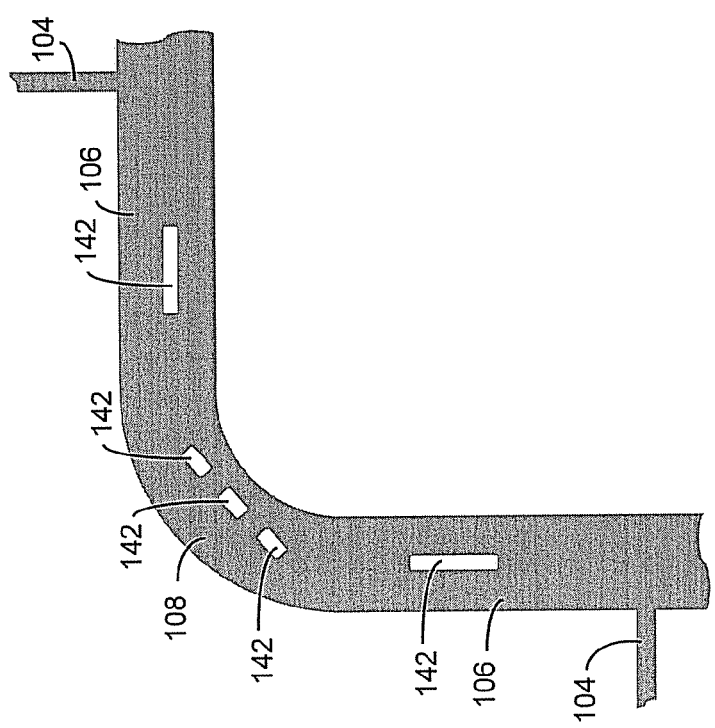
Figure 38:
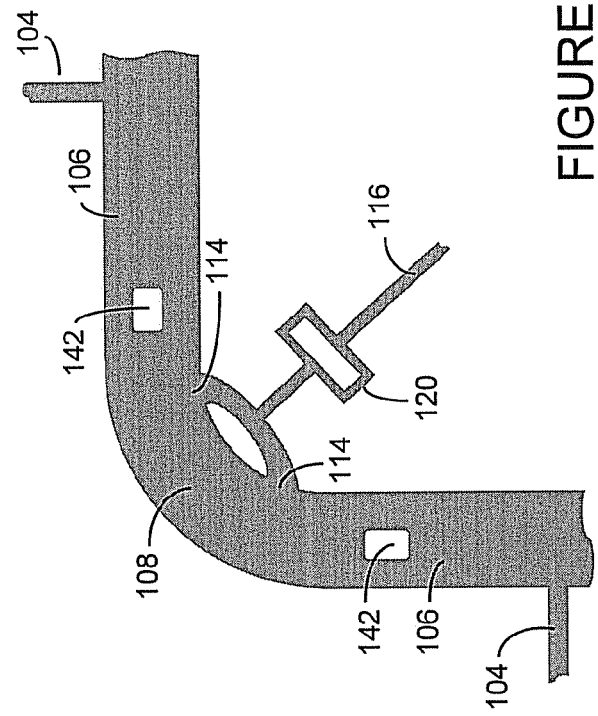

In one temperature management embodiment, with reference to FIGS. 30A and 30B, slots 142 are formed in one or more of beam sections 106*a-d* and curved sections 108*a-d* of MEMS resonator 102. The slots 142 suppress/reduce heat flow between the sides of beam sections 106*a-d* and the sides of curved sections 108*a-d* as beam sections 106*a-d* and curved sections 108*a-d* stretch and compress during operation. The suppression/reduction of heat transfer within the beam sections 106*a-d* and curved sections 108*a-d* may lead to a higher Q factor for MEMS resonator 102 and MEMS resonator array 100. It has to be noted that the methods of temperature management by using slots affects the optimization of the zero movement at the anchoring point and has to be considered by the design (for example, FEA).

Figure 41:
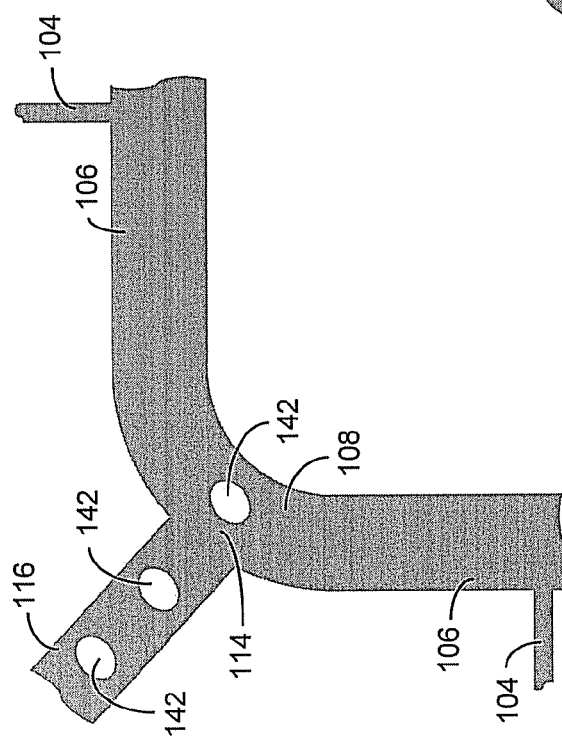
Figure 42:
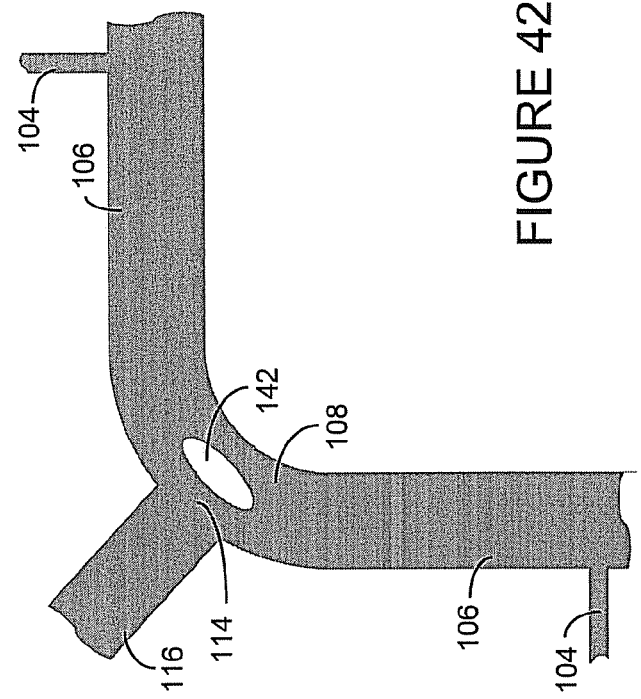

The temperature management techniques may be employed in one or more beam sections 106 or one or more curved sections 108 of one or more MEMS resonators 102 (see, for example, FIGS. 31, 34, 38 and 41), or both (see, for example, FIGS. 32, 33, 35, 37 and 42). In addition thereto, or in lieu thereof, the temperature management techniques may also be implemented in anchor coupling sections 116. (See, for example, FIGS. 36, 41 and 42). The slots 142 may be any shape including, for example, square, rectangle, circular, elliptical and/or oval. Indeed, slots 142 of any shape, whether geometric or otherwise, may be incorporated into beam sections 106, curved sections 108 and/or anchoring coupling sections 116.

Notably, slots 142 may also change the stiffness of the beam sections 106, curved sections 108 and/or anchoring coupling sections 116.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

Figure 43A:
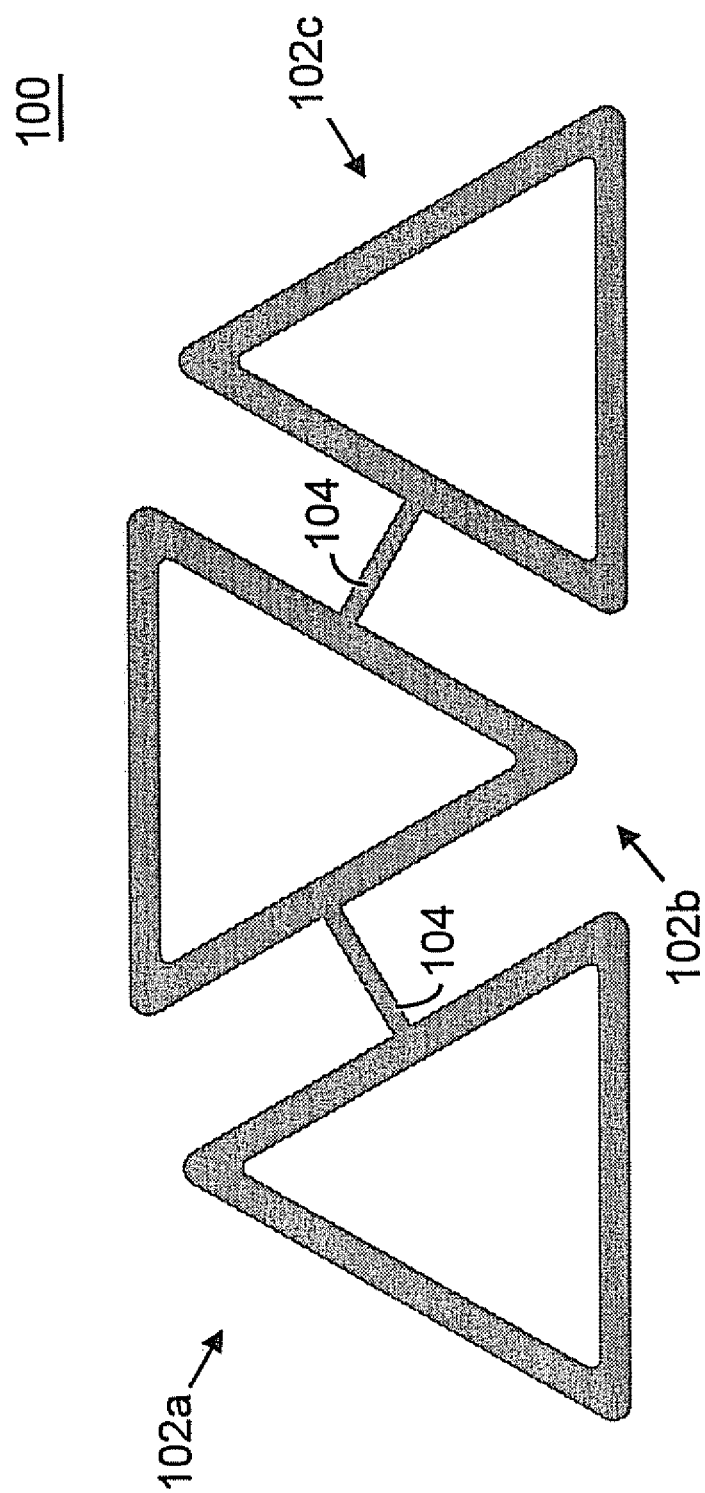
FIGS. 43A and 43B illustrate top views of exemplary MEMS resonator arrays having a plurality of rounded triangle shaped MEMS resonators according to certain exemplary embodiments of the present inventions wherein the plurality of triangle shaped MEMS resonators are mechanically coupled to one or more adjacent triangle shaped MEMS resonators of the MEMS resonator array.
Figure 43B:
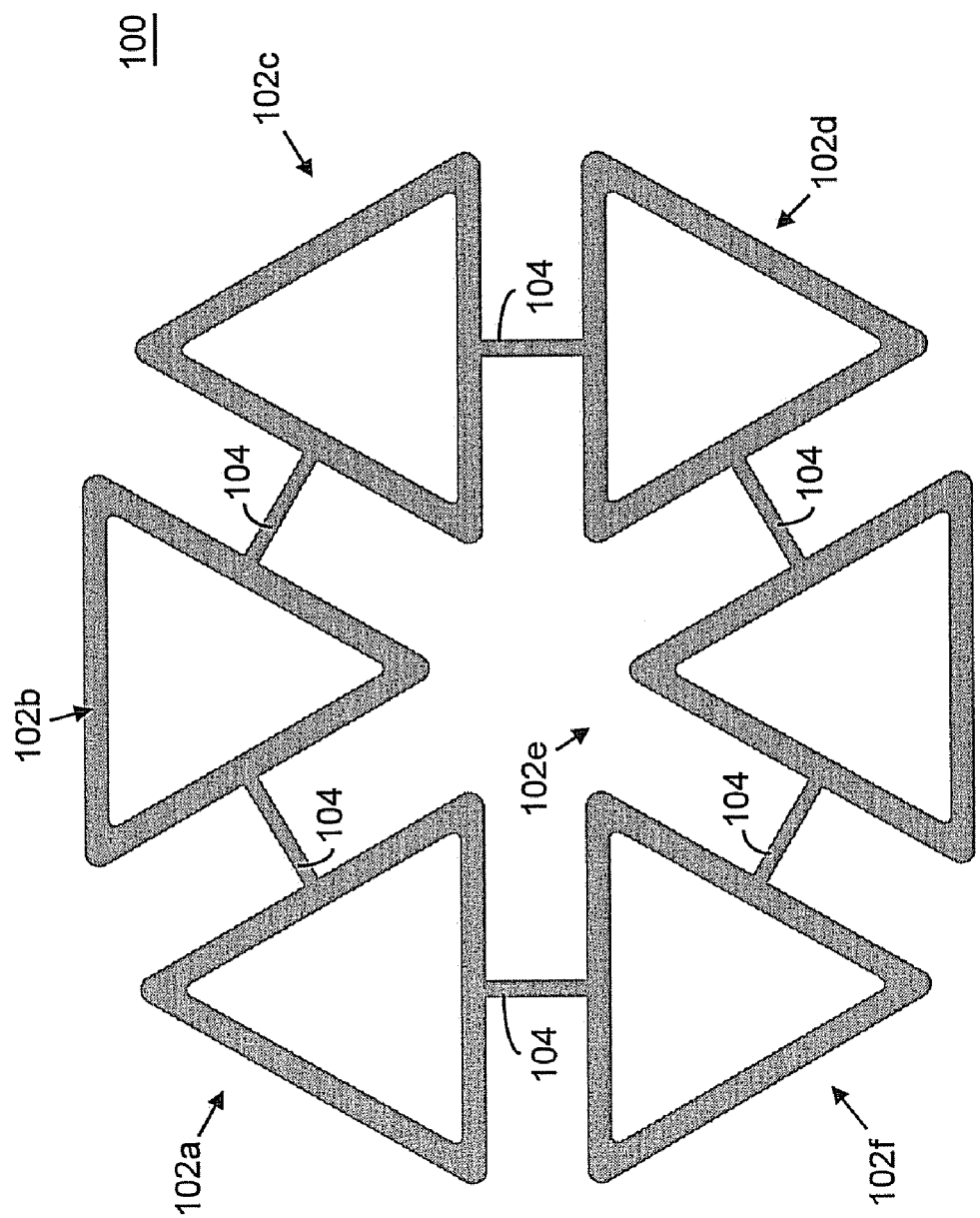

Notably, although a significant portion of the description of the present inventions was set forth in the context of a MEMS resonator array including a plurality of rounded square shaped MEMS resonators, a MEMS resonator array according to the present invention may include MEMS resonators of any geometric shaped resonator architecture or structure including a plurality of elongated beam sections that are connected by curved or rounded sections. For example, as mentioned above, in one embodiment, the MEMS resonator array of the present inventions may include three elongated beam sections that are connected together via curved sections to form a rounded triangle shape, as illustrated in FIG. 3A. In another embodiment, the MEMS resonator array of the present invention may include six beam sections and six curved sections as illustrated in FIG. 3C. All of the features, embodiments and alternatives discussed herein with respect to a MEMS resonator having a rounded square shape are applicable to MEMS resonators, according to the present invention, which have other shapes. (See, for example, FIGS. 43A and 43B). Moreover, all of the features, embodiments and alternatives discussed herein with respect to MEMS resonator array 100 having a plurality of rounded square shaped resonators are applicable to MEMS resonators, according to the present invention, which have other shapes. For the sake of brevity, those discussions will not be repeated.

Figure 43C:
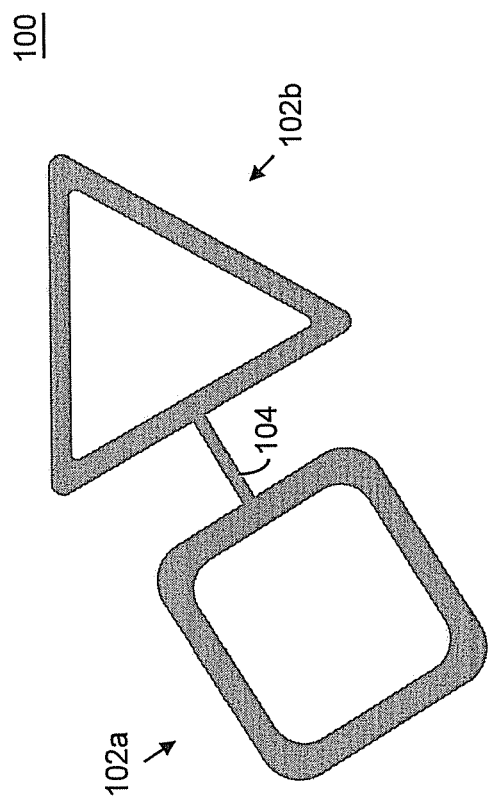
FIGS. 43C and 43D illustrate top views of exemplary MEMS resonator arrays having different shaped MEMS resonators including, a rounded triangle shaped MEMS resonator mechanically coupled to a rounded square shaped MEMS resonator (FIG. 43C) and rounded hexagon shaped MEMS resonators mechanically coupled to a rounded square shaped MEMS resonator (FIG. 43D)
Figure 43D:
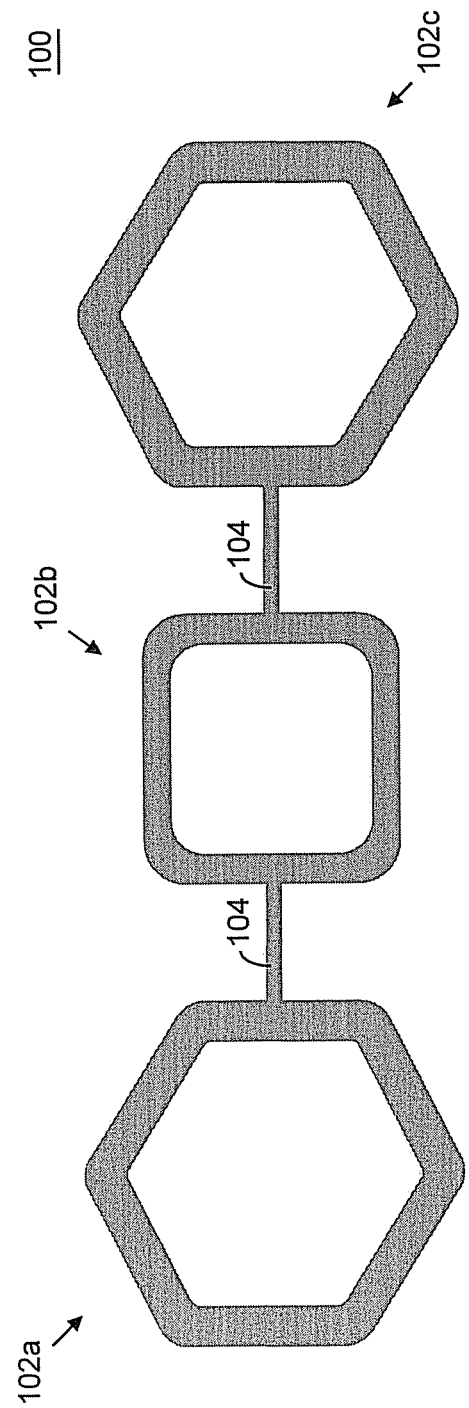
Figure 44:
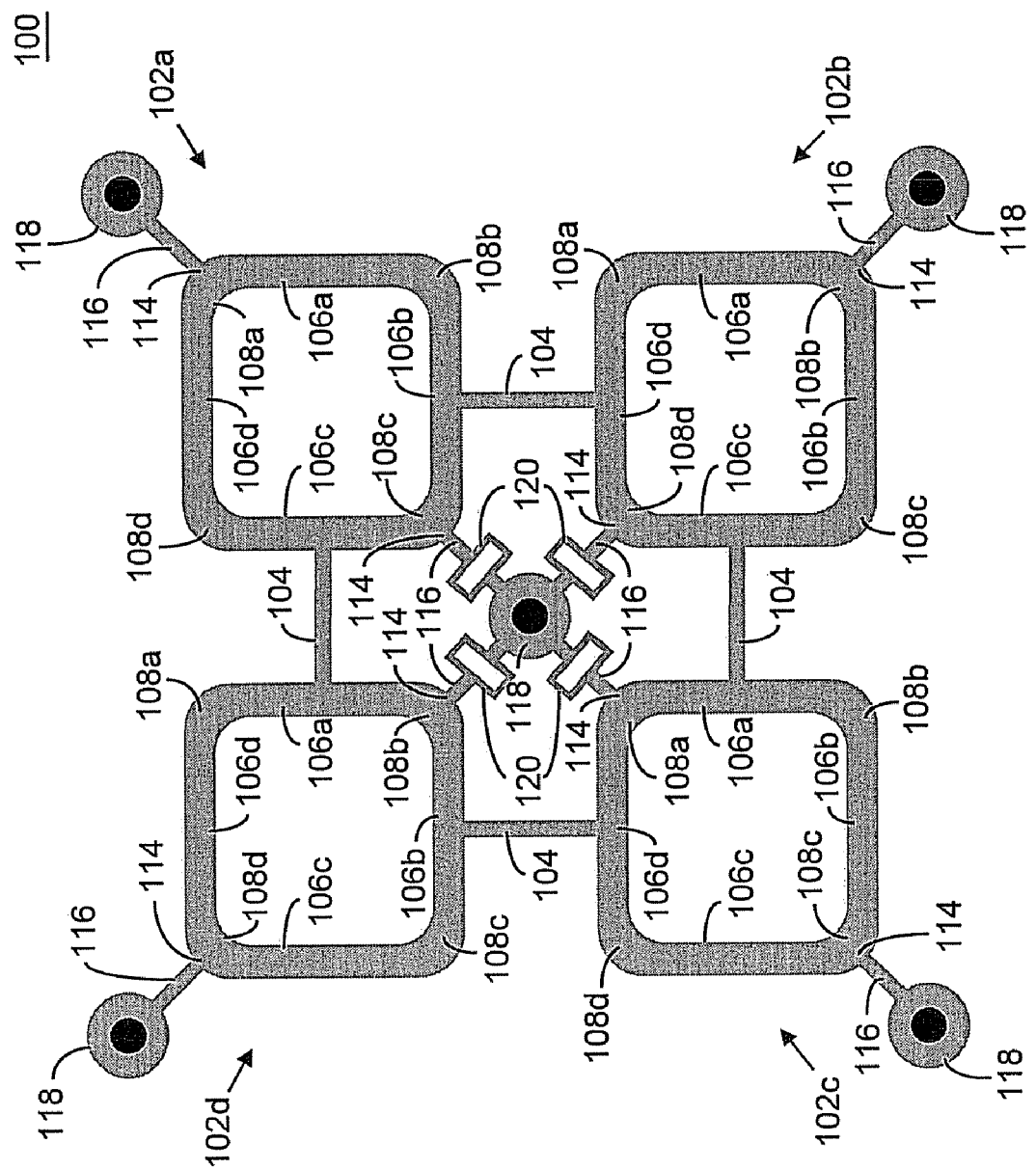
FIGS. 44-46 are top views of various embodiments of exemplary MEMS resonator arrays including various exemplary anchor coupling sections and stress/strain mechanisms, in conjunction with a curved section of a MEMS resonator, according to certain embodiments of the present inventions.
Figure 45:
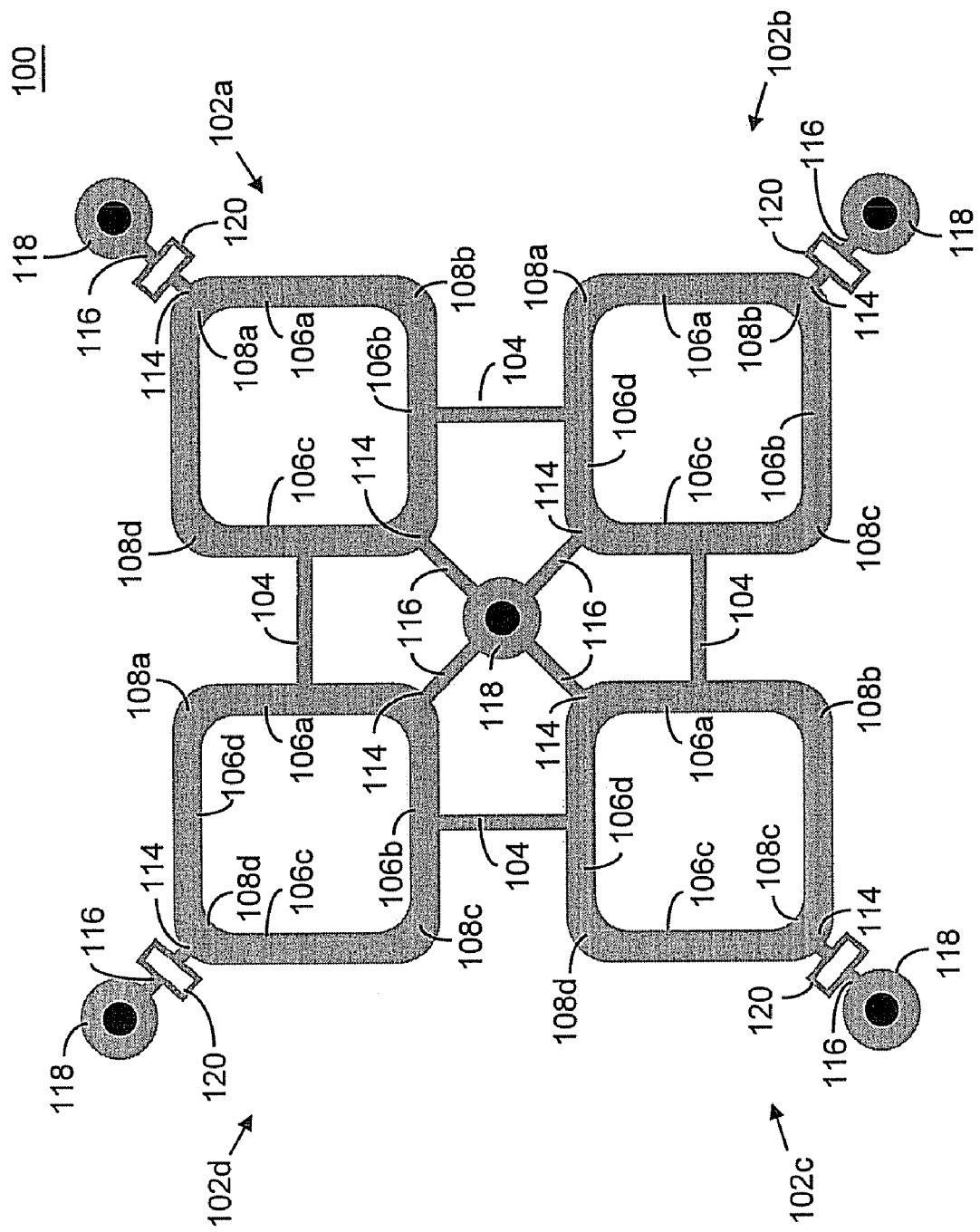
Figure 46:
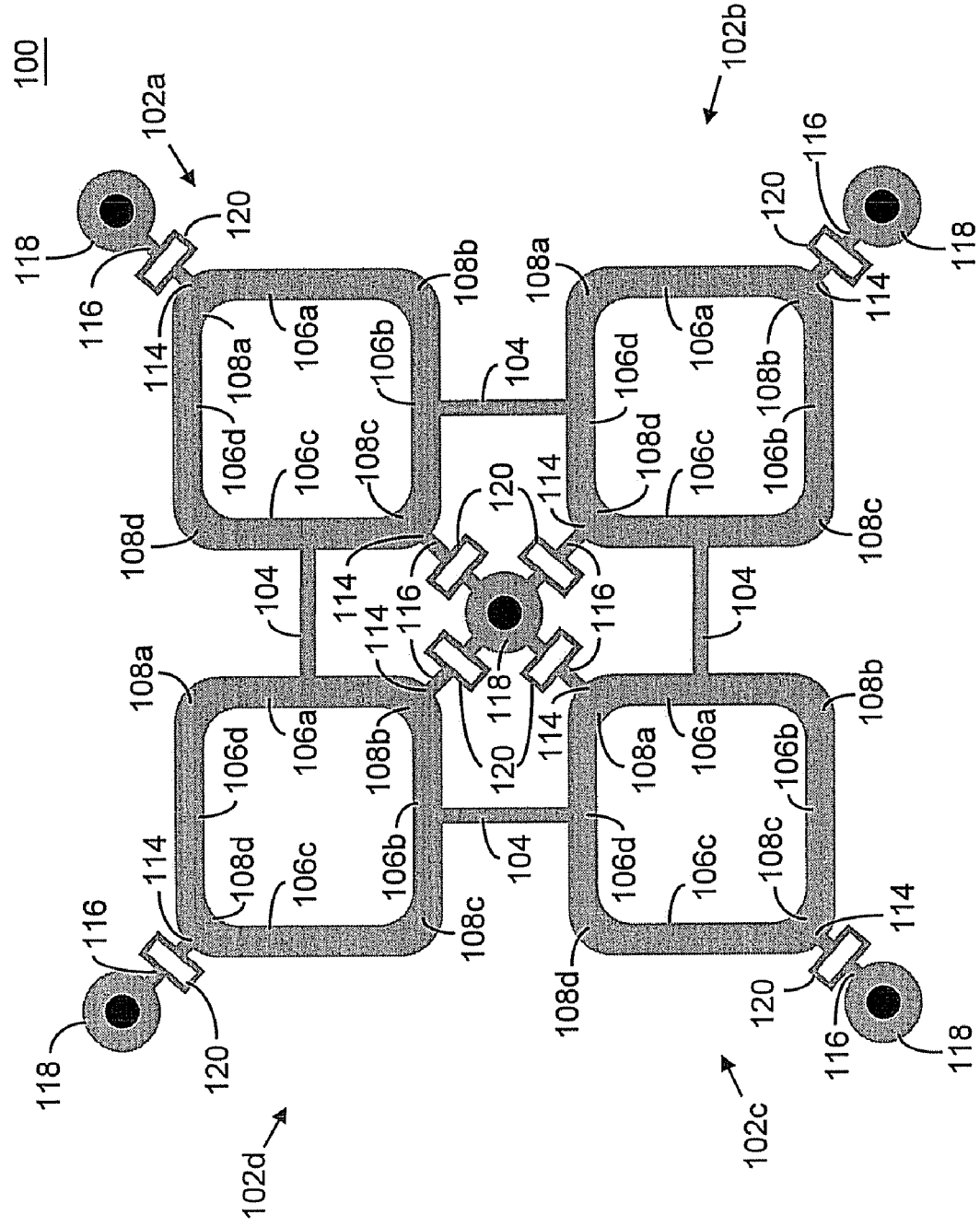
Figure 48:
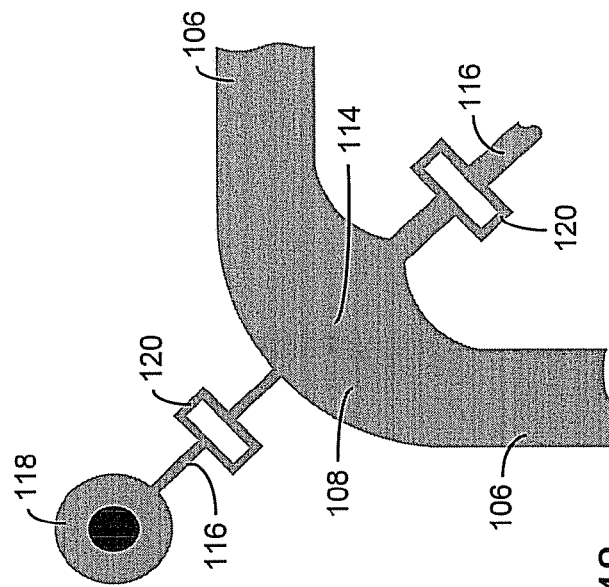
FIGS. 47 and 48 are top views of a portion of an exemplary MEMS resonator arrays including various exemplary anchoring techniques to anchor the MEMS resonator array (and/or the MEMS resonators thereof) to the substrate.
Figure 47:
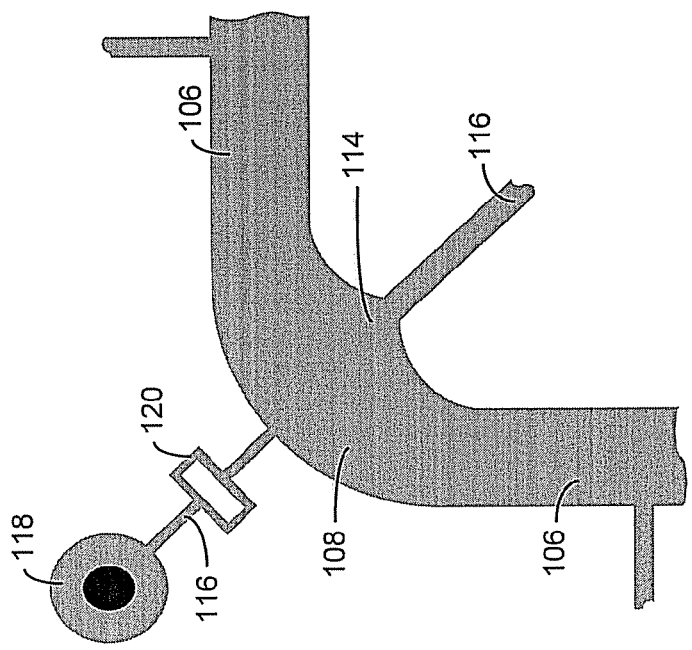
Figure 49:
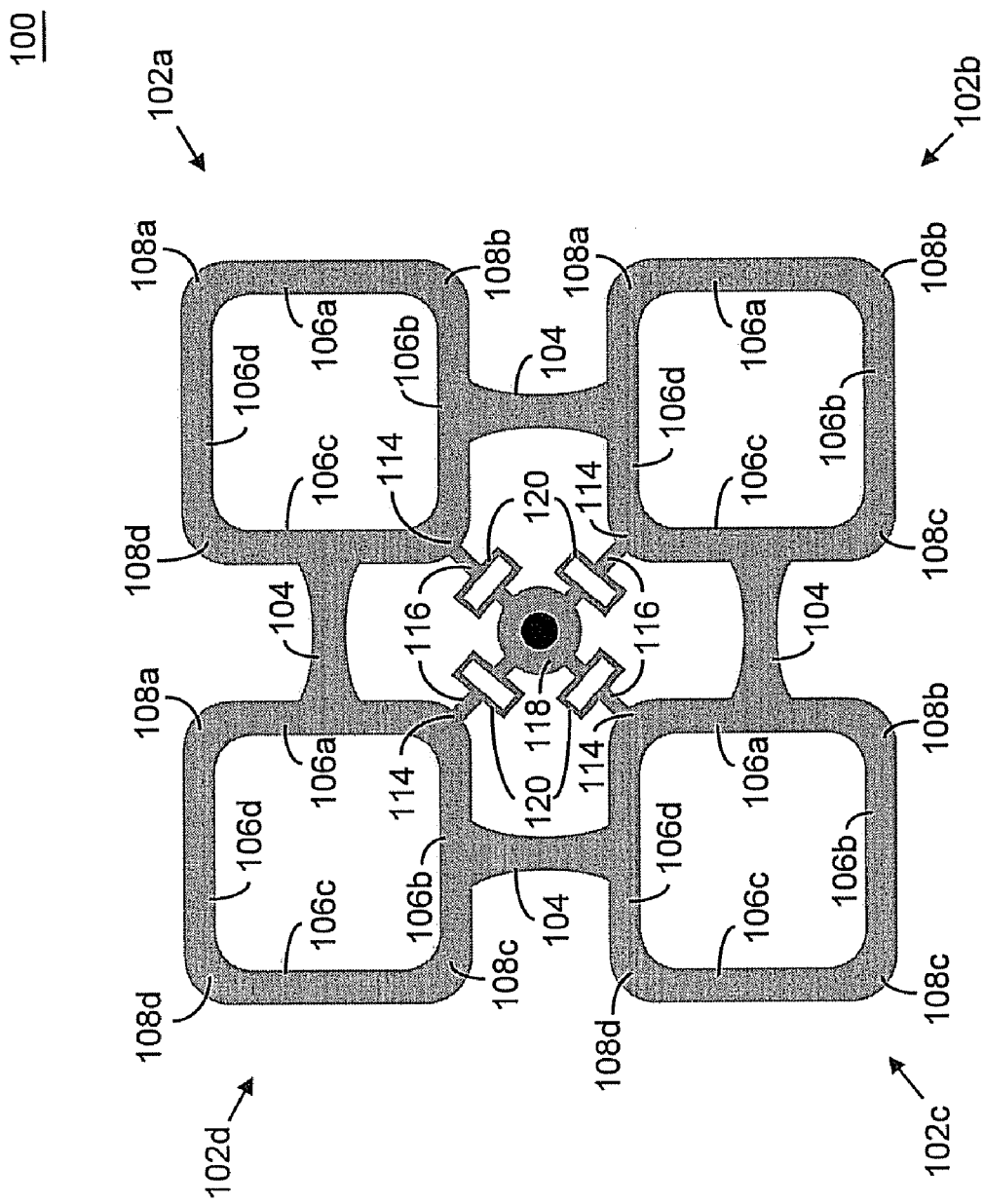
FIGS. 49-52 are top views of exemplary MEMS resonator arrays including various exemplary anchoring techniques and stress/strain mechanisms in conjunction with various exemplary embodiments of resonator mechanical coupling techniques, according to certain embodiments of the present inventions.
Figure 50:
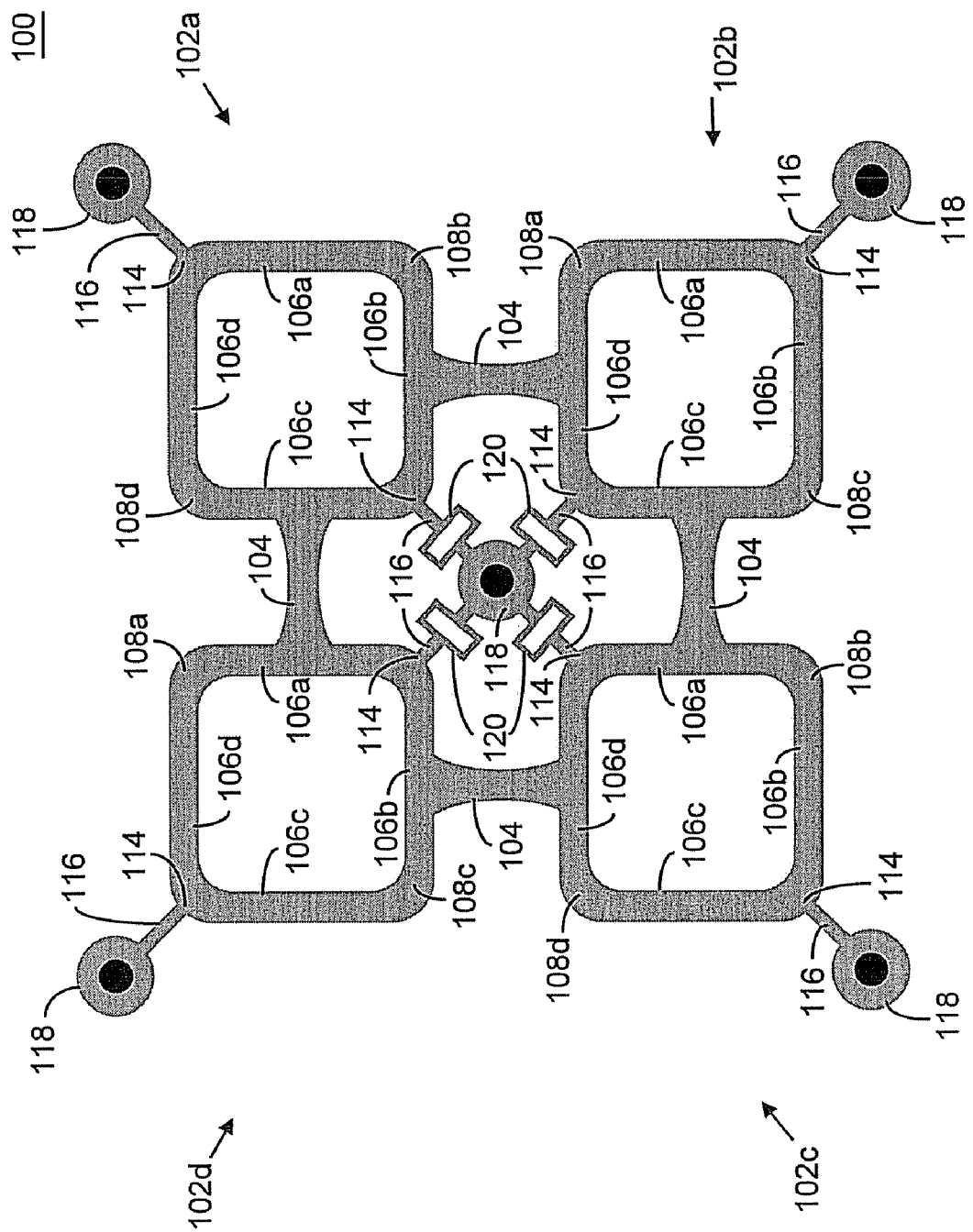
Figure 51:
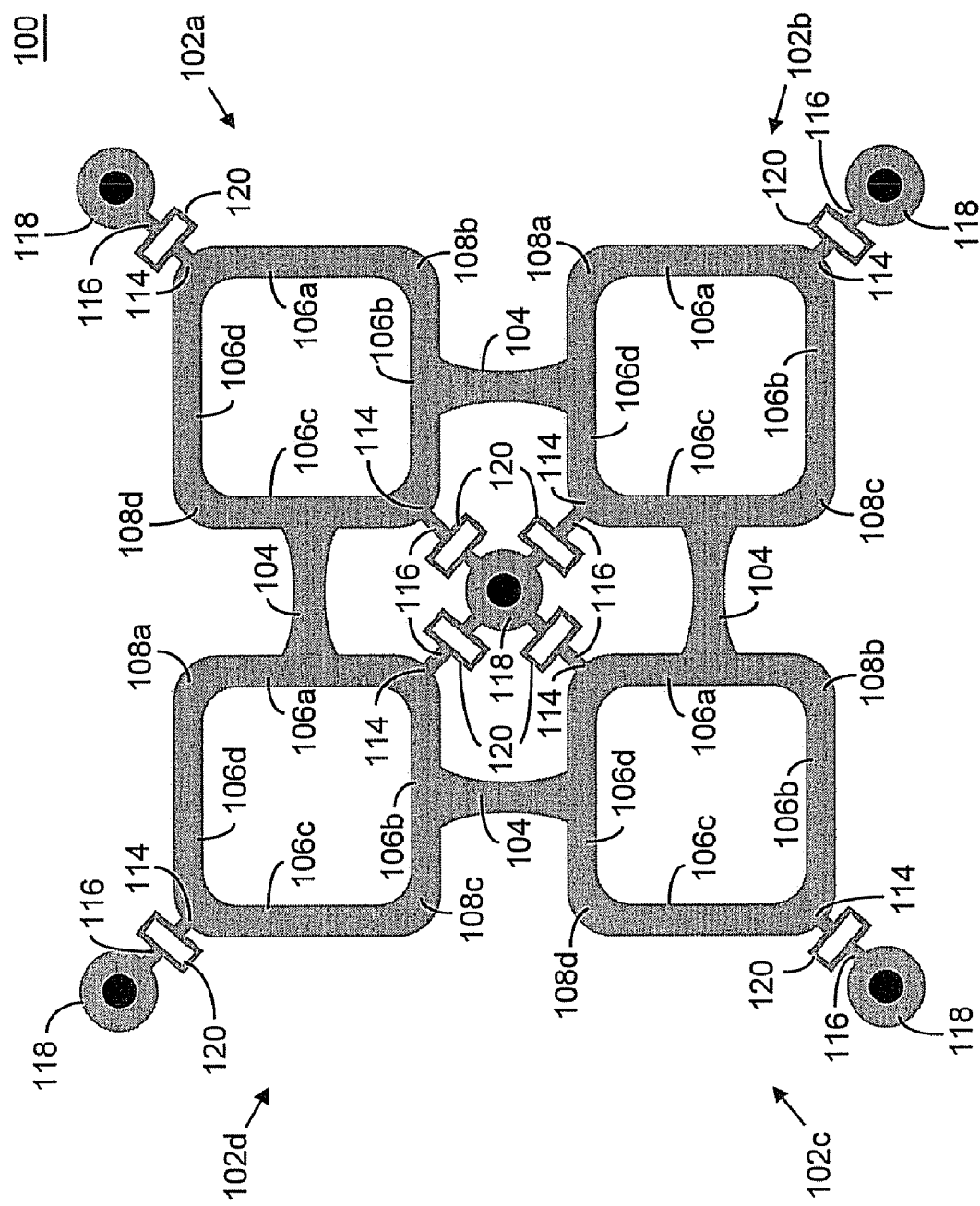
Figure 52:
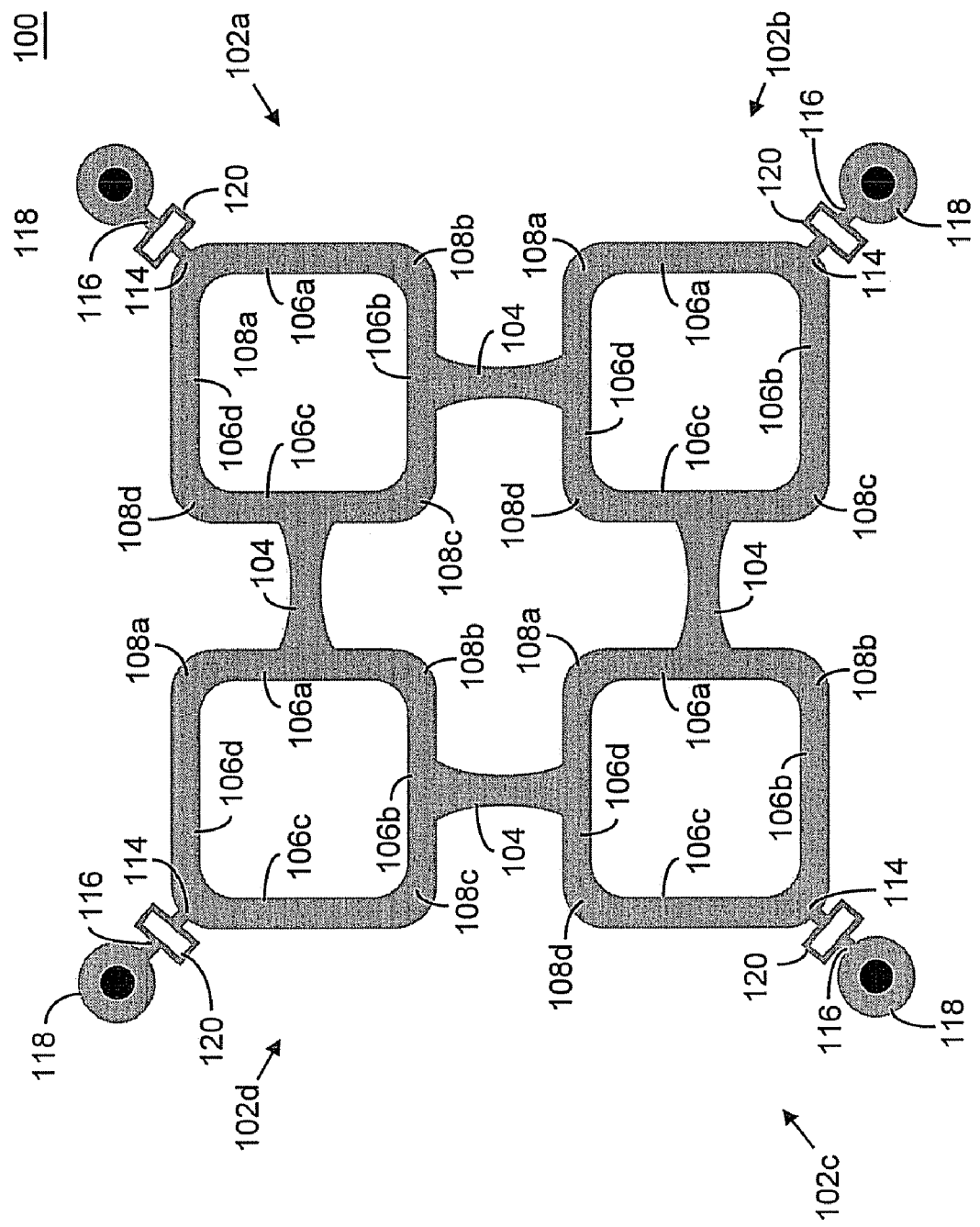
Figure 53:
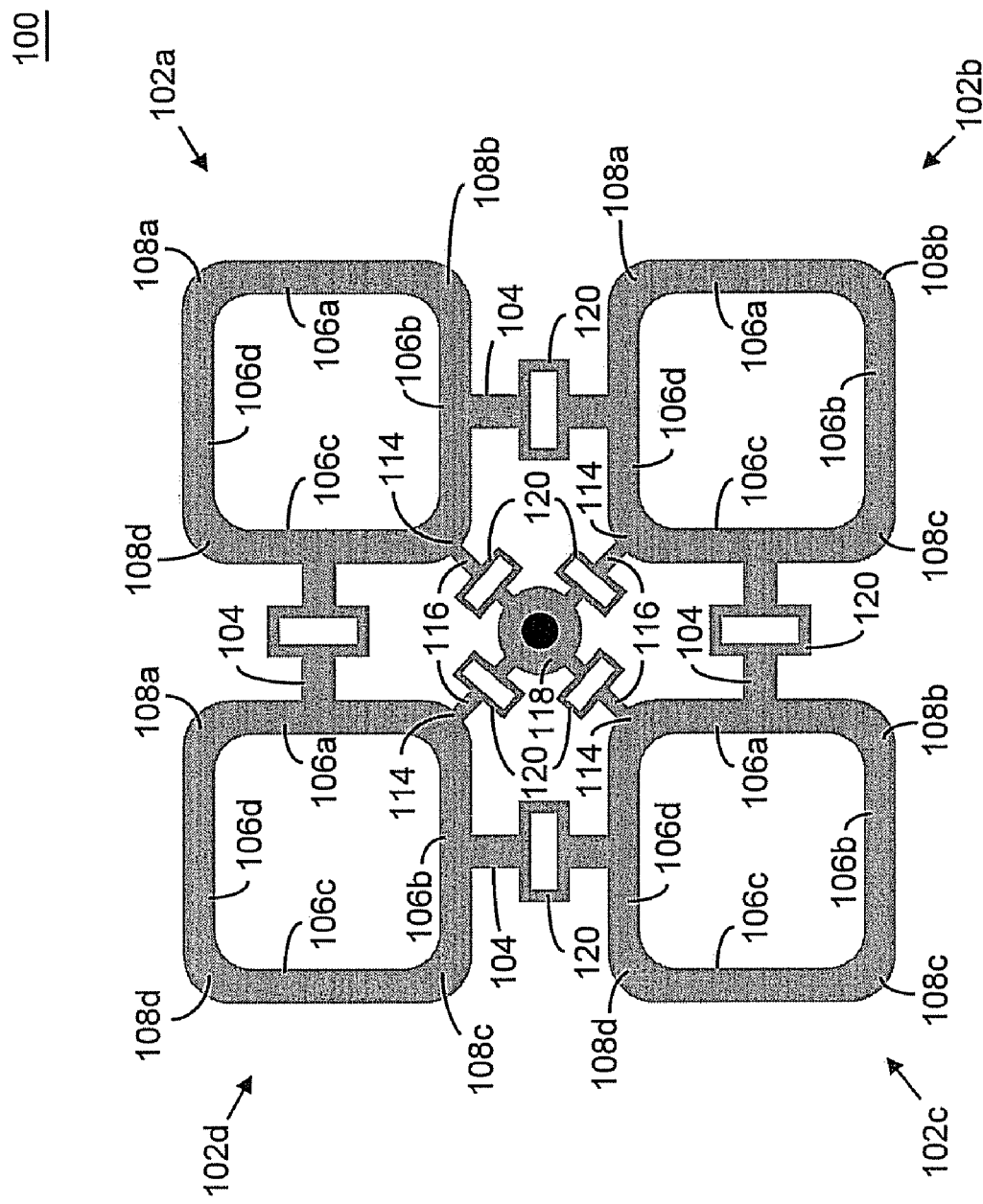
Figure 54:
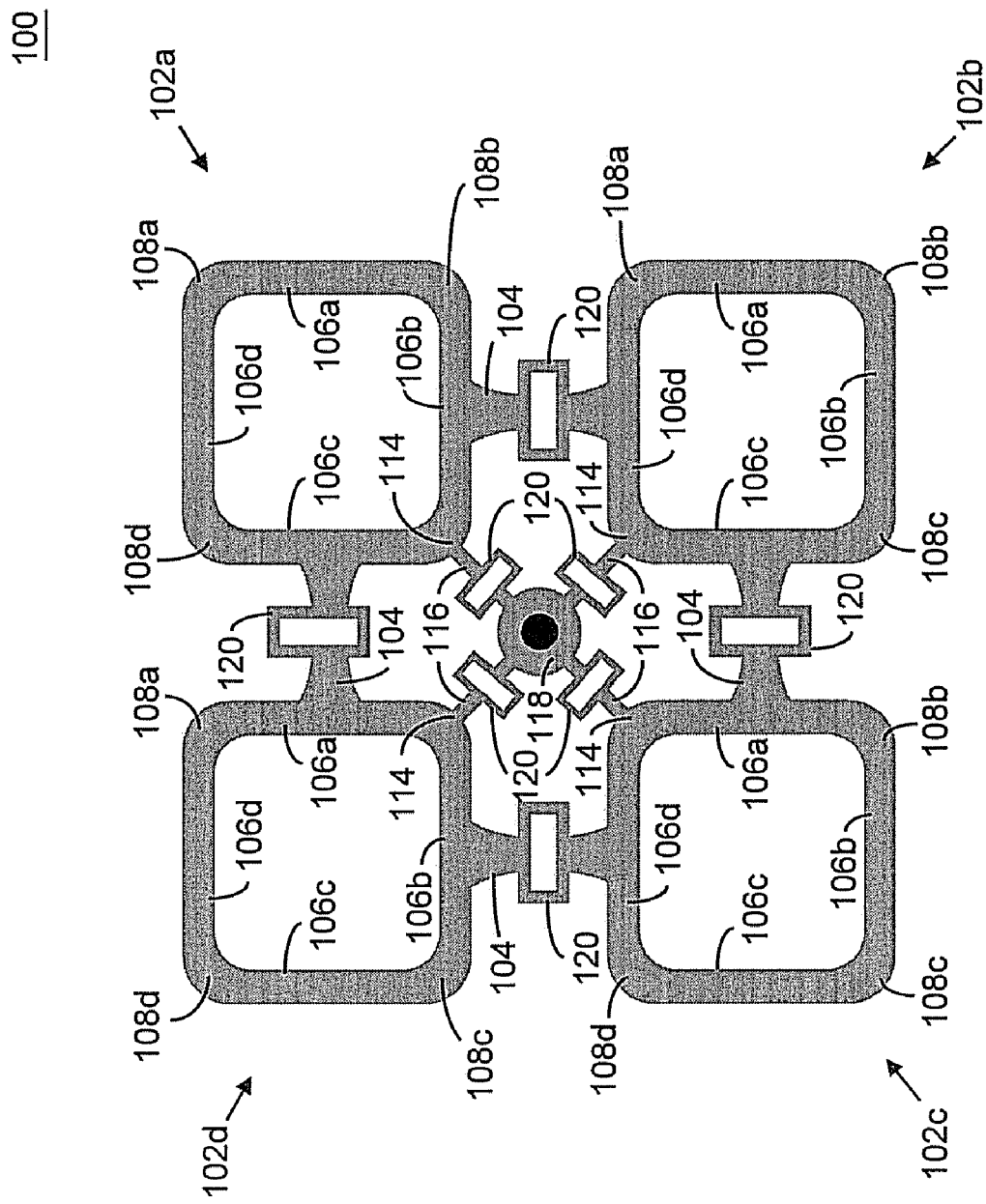

In another embodiment, the MEMS resonator array of the present invention may include a plurality of MEMS resonators 102 having different shapes. For example, with reference to FIG. 43C, rounded square shaped MEMS resonator 102a may be mechanically coupled to rounded triangle shaped MEMS resonator 102b (FIG. 43C). With reference to FIG. 43D, in another example, rounded hexagon shaped MEMS resonators 102a and 102c maybe mechanically coupled to rounded square shaped MEMS resonator 102b. All of the features, embodiments and alternatives discussed herein with respect to a MEMS resonator array 100 having a plurality of rounded square shaped resonators are applicable to MEMS resonator array including a plurality of MEMS resonators 102 having two or more different shapes. For the sake of brevity, those discussions will not be repeated.

Further the MEMS resonator array of the present invention may employ any sense and drive techniques whether now known or later developed. The drive and sense circuitry (whether differential or not) may be integrated on the same substrate in which the MEMS resonators of the array resides (or is fabricated in). In addition thereto, or in lieu thereof, drive and sense circuitry may be integrated on a substrate that is physically separate from (and electrically interconnected with) the substrate in which the MEMS resonators resides. Moreover, the drive and sense electrode may be of a conventional type or may be any type and/or shape whether now known or later developed.

Notably, the dimensions, characteristics and/or parameters of the MEMS resonators and MEMS resonator array according to the present inventions may be determined using a variety of techniques including finite element modeling and simulation techniques (for example, a finite element modeling via a computer driven analysis engine such as FemLab (from Consol), ANSYS (from ANSYS INC.), IDEAS and/or ABAKUS and/or empirical data/measurements. For example, a finite element modeling engine, using or based on a set of boundary conditions (for example, the size of the resonator structure), may be employed to design, determine and/or assess the dimensions, characteristics and/or parameters of (i) elongated beam sections 106, (ii) curved sections 108, (iii) loading relief mechanisms 112, (iv) nodal point(s) 114 (if any), (v) anchor coupling sections 116 and/or (vi) stress/strain mechanisms 120. Indeed, the impact and/or response of MEMS resonator 102, alone or incorporated into a MEMS resonator array 100, on or at the anchor and/or substrates may also be observed and/or determined using such a finite element modeling, simulation and analysis engine.

As mentioned above, a finite element analysis and simulation engine may also be employed to design and/or determine the location of any nodal points. Such nodal points may provide a suitable location at which MEMS resonator array 100 (and/or one or more of MEMS resonator 102) may be anchored to the substrate with predetermined, minimal and/or reduced energy loss (among other things). In this regard, beam sections 106 of MEMS resonator 102, when induced, move in a breathing-like manner and a bending-like manner. As such, the length of beam sections 106 and the radii of curved sections 108 may determine the location of nodal points of MEMS resonator 102 (when incorporated into the MEMS resonator array 100) whereby there is little, no or reduced rotation movement due to the elongating-like (breathing-like) mode, as well as little, no or reduced radial movement due to the bending-like mode. A finite element analysis engine may be employed to design, determine or predict the location of such nodal points based on a given length of beam sections 106 and the radii of curved sections 108 of each MEMS resonator 102 of MEMS resonator array 100. In this way, locations that exhibit acceptable, predetermined, and/or little or no movement (radial and/or otherwise) for anchoring MEMS resonator array 100 and/or one or more MEMS resonators 102 may be rapidly determined and/or identified.

Moreover, an empirical approach may also be employed (in addition to or in lieu of a finite element analysis (or the like) approach) to design, determine, define and/or assess the dimensions, characteristics and/or parameters of (i) elongated beam sections 106, (ii) curved sections 108, (iii) loading relief mechanisms 112, (iv) nodal point(s) 114 (if any), (v) anchor coupling sections 116 and/or (vi) stress/strain mechanisms 120. Such an empirical approach may be implemented in the context of one or more MEMS resonators 102 and/or MEMS resonator array 100.

As mentioned above, in the context of MEMS resonator array 100, a finite element analysis 1 5 and simulation engine, using or based on a set of boundary conditions (for example, the size of the resonator structure), may be employed to design, determine and/or assess the dimensions, characteristics and/or parameters of(i) elongated beam sections 106, (ii) curved sections 108 and/or (iii) nodal point(s) 114 (if any) of the MEMS resonators 102, and/or (iv) loading relief mechanisms 112, (v) anchor coupling sections 116 and/or (vi) stress/strain mechanisms 120.

Further, a thermo-mechanical finite element analysis engine may be employed to enhance any temperature considerations of beam sections 106, curved sections 108 and/or anchoring coupling sections 116 during operation. In this regard, thermo-mechanical finite element analysis engine may model the operation of MEMS resonator array 100 and/or MEMS resonators 102 and thereby determine the size, location, dimensions, and number of slots to implement in one or more beam sections 106, curved sections 108 and/or anchoring coupling sections 116. In this way, the characteristics of MEMS resonator array 100 and/or MEMS resonators 102, having temperature management techniques implemented therein, may be enhanced and/or optimized and the TED loss minimized and/or reduced.

Thus, as mentioned above, many of the properties of the structures of the present inventions may be optimized with Finite Element Modeling (FEM), which is also known as "FEA" or "FE Analysis".

The beam sections 106 of MEMS resonators 102 may or may not include identical or substantially identical dimensions/designs (i.e., have the same or substantially the same width, thickness, height, length and/or shape). In addition, curved sections 108 may or may not include identical or substantially identical dimensions/designs (i.e., have the same or substantially the same inner radius, width, thickness, height, length, outer radius and/or shape). As such, MEMS resonators 102 of array 100 may include beam sections 106 and/or curved sections 108 having different dimensions, shapes and/or designs.

The MEMS resonator array of the present inventions may be fabricated from well-known materials using well-known techniques. For example, the MEMS resonator array (including its constituent parts) may be fabricated from well-known semiconductors such as silicon, germanium, silicon-germanium or gallium-arsenide. Indeed, the MEMS resonator array may be comprised of, for example, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, the MEMS resonator array according to the present inventions may be formed in or on semiconductor on insulator (SOI) substrate using well-known lithographic, etching, deposition and/or doping techniques. For the sake of brevity, such fabrication techniques are not discussed herein. However, all techniques for forming or fabricating the resonator structure of the present invention, whether now known or later developed, are intended to fall within the scope off the present invention (for example, well-known formation, lithographic, etching and/or deposition techniques using a standard or over-sized ("thick") wafer (not illustrated) and/or bonding techniques (i.e., bonding two standard wafers together where the lower/bottom wafer includes a sacrificial layer (for example, silicon oxide) disposed thereon and the upper/top wafer is thereafter thinned (ground down or back) and polished to receive the mechanical structures in or on).

Notably, the SOI substrate may include a first substrate layer (for example, a semiconductor (such as silicon), glass or sapphire), a first sacrificial/insulation layer (for example, silicon dioxide or silicon nitride) and a first semiconductor layer (for example, silicon, gallium arsenide or germanium) disposed on or above the sacrificial/insulation layer. The mechanical structure maybe formed using well-known lithographic, etching, deposition and/or doping techniques in or on the first semiconductor layer (for example, semiconductors such as silicon, germanium, silicon-germanium or gallium-arsenide).

In one embodiment, the SOI substrate may be a SIMOX wafer which is fabricated using well-known techniques. In another embodiment, the SOI substrate may be a conventional SOI wafer having a first semiconductor layer. In this regard, SOI substrate, having a relatively thin first semiconductor layer, may be fabricated using a bulk silicon wafer which is implanted and oxidized by oxygen to thereby form a relatively thin $SiO_2$ beneath or underneath the single or mono crystalline wafer surface. In this embodiment, the first semiconductor layer (i.e., monocrystalline silicon) is disposed on the first sacrificial/insulation layer (i.e. silicon dioxide) which is disposed on a first substrate layer (i.e., monocrystalline silicon in this example).

In those instances where the MEMS resonators of the MEMS resonator array are fabricated in or on polycrystalline silicon or monocrystalline silicon, certain geometric shaped MEMS resonator structures according to the present inventions, for example, the rounded square shaped resonator, may maintain structural and material symmetry with polycrystalline silicon or monocrystalline silicon. In particular, a rounded square shape MEMS resonator according to the present inventions may be inherently more compatible with the cubic structure of monocrystalline silicon. In each lateral orthogonal direction on a standard wafer (e.g. 100, 010, or 110), the properties of the monocrystalline silicon may be matched to one or more geometric shaped resonators. In this regard, the crystalline properties of monocrystalline silicon may have the same or suitable symmetry as the one or more geometric shaped resonator structure.

The MEMS resonator array 100 of the present invention may be packaged using a variety of techniques and materials, for example, thin film techniques, substrate bonding techniques (for example, bonding semiconductor or glass-like substrates) and prefabricated package (for example, a TO-8 "can"). Indeed, any packaging and/or fabricating techniques may be employed, whether now known or later developed; as such, all such fabrication and/or packaging techniques are intended to fall within the scope of the present invention. For example, the systems, devices and/or techniques described and illustrated in the following non-provisional patent applications may be implemented:

(1) "Electromechanical System having a Controlled Atmosphere, and Method of Fabricating Same", which was filed on Mar. 20, 2003 and assigned Ser. No. 10/392,528;

(2) "Microelectromechanical Systems, and Method of Encapsulating and Fabricating Same", which was filed on Jun. 4, 2003 and assigned Ser. No. 10/454,867; and (3) "Microelectromechanical Systems Having Trench Isolated Contacts, and Methods of Fabricating Same", which was filed on Jun. 4, 2003 and assigned Ser. No. 10/455,555.

The inventions described and illustrated in the aforementioned patent applications may be employed to fabricate MEMS resonators and the array of the present inventions. For the sake of brevity, those discussions will not be repeated. It is expressly noted, however, that the entire contents of the aforementioned patent applications, including, for example, the features, attributes, alternatives, materials, techniques and/or advantages of all of the inventions/embodiments, are incorporated by reference herein.

Where MEMS resonator 102 implements a rounded square shape resonator structure that is symmetrically anchored (see, for example, FIG. 30B), the center of gravity of the structure remains relatively constant or fixed during operation. Notably, the four beam sections of MEMS resonator 102 implementing a rounded square shape resonator structure may statistically average Gaussian process tolerances which may provide better parameter control.

As mentioned above, MEMS resonator array 100 may employ any anchoring technique or anchor structure, whether now known or later developed. In addition, the stress/strain management techniques/structures (for example, stress/strain mechanisms 120) may be implemented in conjunction with any of the anchoring technique or anchor structure described and illustrated herein and/or, whether now known or later developed. For example, the substrate anchors and/or stress/strain management techniques/structures may be placed at one, some or all of nodal points and/or anchors of one or more of the MEMS resonators 102. Other substrate anchoring-stress/strain management techniques may also be suitable. (See, for example, FIGS. 44-48). Indeed, MEMS resonator 102 may be coupled to a substrate anchor (and stress/strain mechanism 120) at non-nodal points in a symmetrical or non-symmetrical manner (for example, in or around a "center" of MEMS resonator 102). Notably, the anchoring-stress/strain management techniques may be implemented in conjunction with any of the embodiments described and illustrated herein. (See, for example, FIGS. 49-52).

Further, the loading relief techniques/structures (for example, loading relief mechanisms 12) may also be implemented in conjunction with any of the embodiments described and illustrated herein. (See, for example, FIGS. 52-55).

In the claims, the term "straight elongated beam section" means (i) a straight or substantially straight elongated beam, and/or (ii) an elongated beam having a longitudinal axis that is straight or substantially straight regardless of variations in thickness and/or width (if any) of the beam, and/or (iii) a beam that is substantially more straight than curved.

Further, in the claims, the term "slots" means openings, voids and/or slots (whether extending partially or entirely through the entire height/thickness of the elongated beam section or curved section), of any shape and/or size. Moreover, in the claims, the term "voids" means openings, voids and/or slots (whether extending partially or entirely through the entire height/thickness of the resonator coupling section), of any shape and/or size.

The above embodiments of the present inventions of MEMS resonator array 100 are merely exemplary. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present invention. As such, the foregoing description of the exemplary embodiments of the invention has been presented for the purposes of illustration and description. Many modifications and variations are possible in light of the above teaching. It is intended that the scope of the invention not be limited solely to this detailed description.

In another aspect, the present invention is a plurality of square frame resonators arranged in an N×M MEMS frame array structure (where N and M are integers). Each beam section of the individual square shaped MEMS resonator is shared with an adjacent resonator. In this way, the structure provides different and resonant coupling effects. In addition, the structure provides a relatively low energy loss, high Q-factor and flexibility of driving/sensing electrode placement.

Figure 56A:
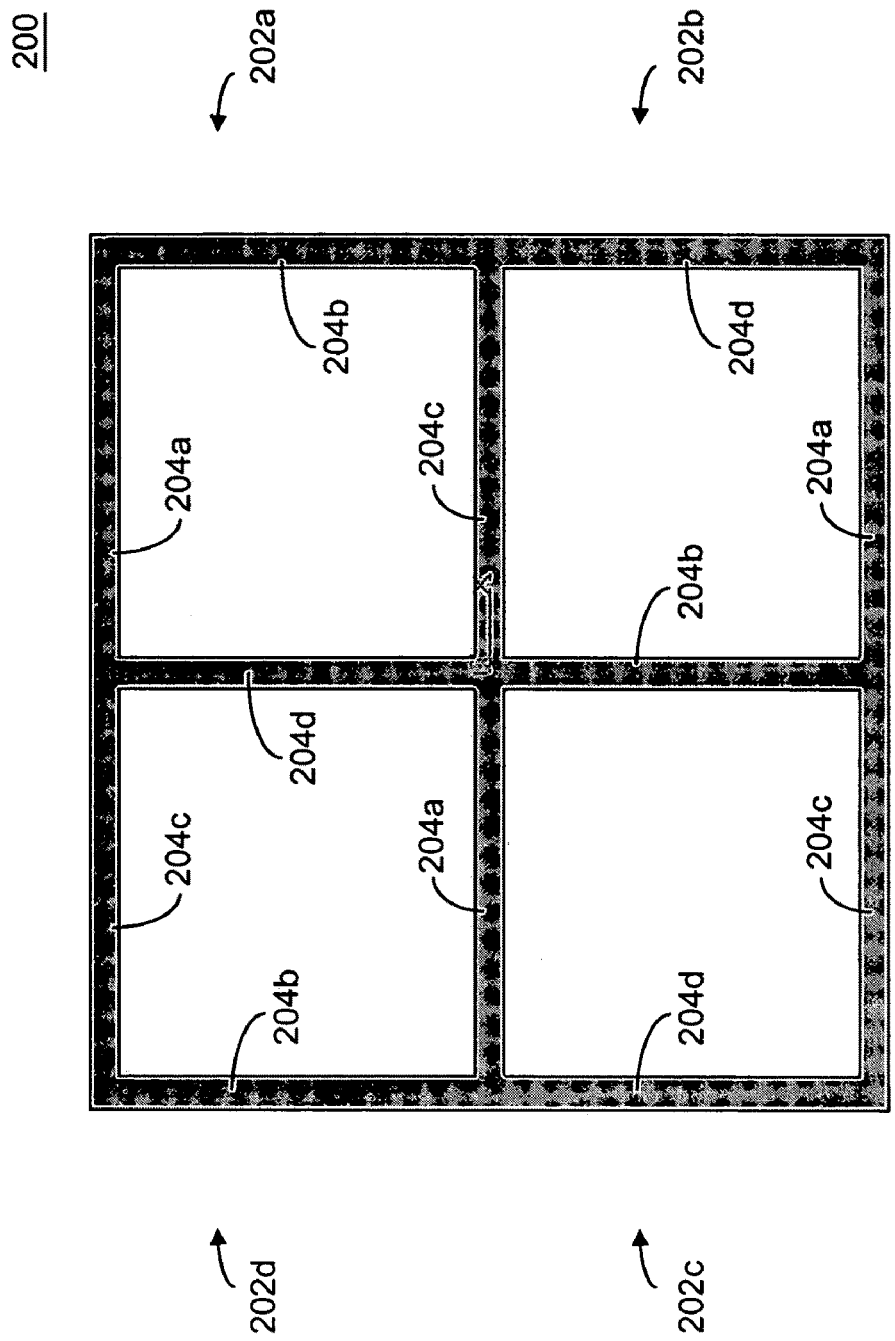
FIG. 56A is a top view of a MEMS frame array structure having a plurality of square shaped MEMS resonators, wherein each square shaped MEMS resonator of the array is coupled to the adjacent square shaped MEMS resonator and shares a beam section therewith, according to another aspect of the present inventions.
Figure 56B:
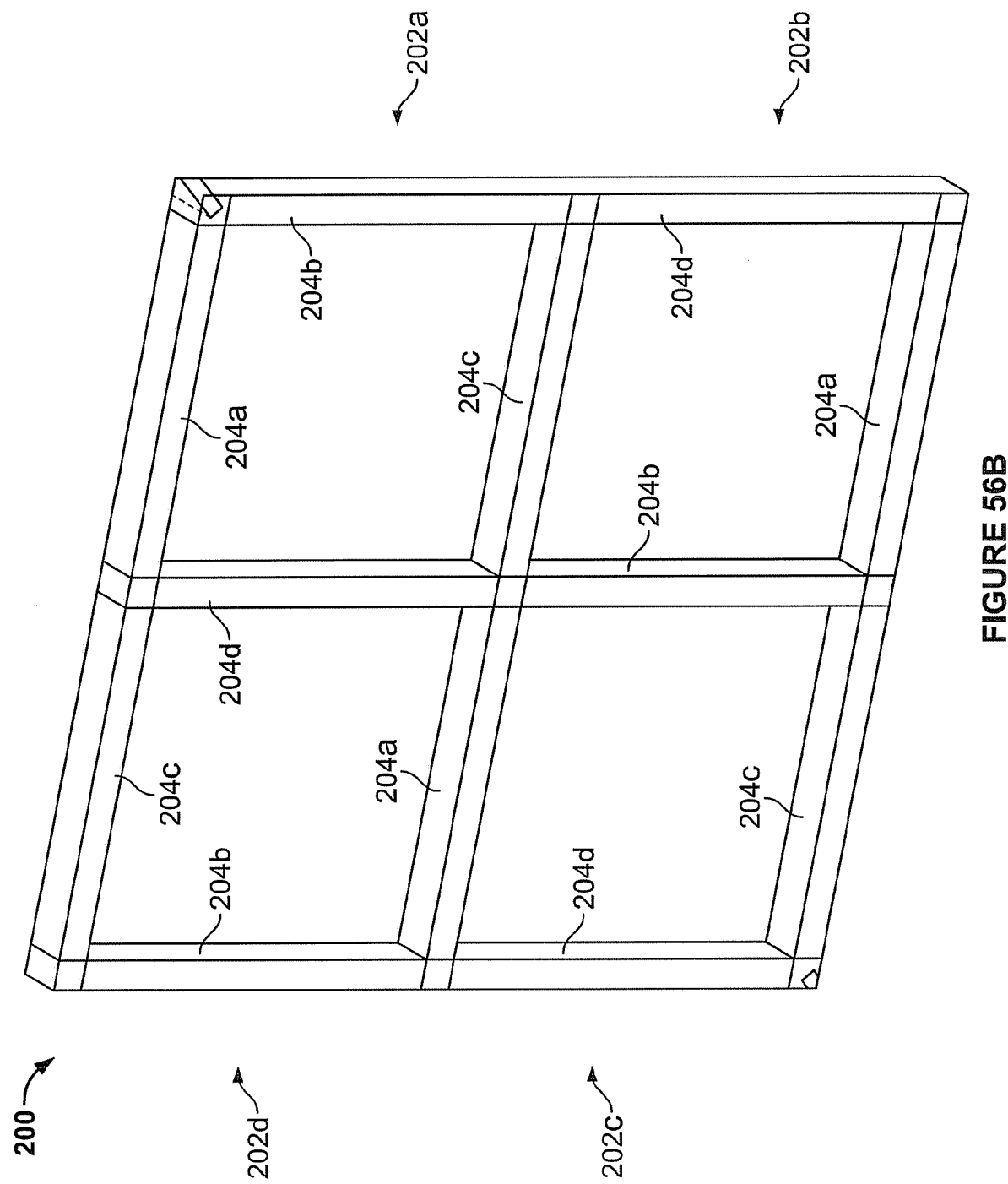
FIG. 56B illustrates an oblique view of the MEMS frame array structure of FIG. 56A.

With reference to FIGS. 56A and 56B, N×M MEMS frame array structure 200 (in this exemplary embodiment, where N and M are equal to 2) includes square shaped MEMS resonators 202a-d. The square shaped MEMS resonators 202a-d each includes four beam sections 204. Two of the beam sections 204 of each square shaped MEMS resonators 202a-d are shared with adjacent square shaped MEMS resonators 202a-d. For example, square shaped MEMS resonator 202a shares (i) beam section 204c with square shaped MEMS resonator 202b and (ii) beam section 204d with square shaped MEMS resonator 202d. Similarly, square shaped MEMS resonator 202c shares (i) beam section 204b with square shaped MEMS resonator 202b and (ii) beam section 204a with square shaped MEMS resonator 202d. In this way, each square shaped MEMS resonators 202a-d is mechanically coupled to and/or integrated with the other square shaped MEMS resonators 202a-d. In operation, square shaped MEMS resonators 202a-d vibrate in-plane and at the same frequency because of the mechanic coupling.

The MEMS frame array structure may be anchored using a number of techniques, including those described above with respect to MEMS frame array structure. Where the corner sections of one or more square shaped MEMS resonators include nodal points, it may be advantageous to anchor MEMS frame array structure to the substrate at the nodal points. In this regard, with reference to FIGS. 57A and 57B, in one embodiment, MEMS frame array structure 200 includes anchor coupling sections 206 that mechanically couple MEMS frame array structure 200 to anchors 208. The anchor coupling sections 206 are connected to MEMS frame array structure 200 at or near nodal points 210. In this way, the vertical and horizontal energy losses due to anchoring will be minimized, reduced and/or limited, which may result or provide a relatively high Q MEMS structure.

Figure 57A:
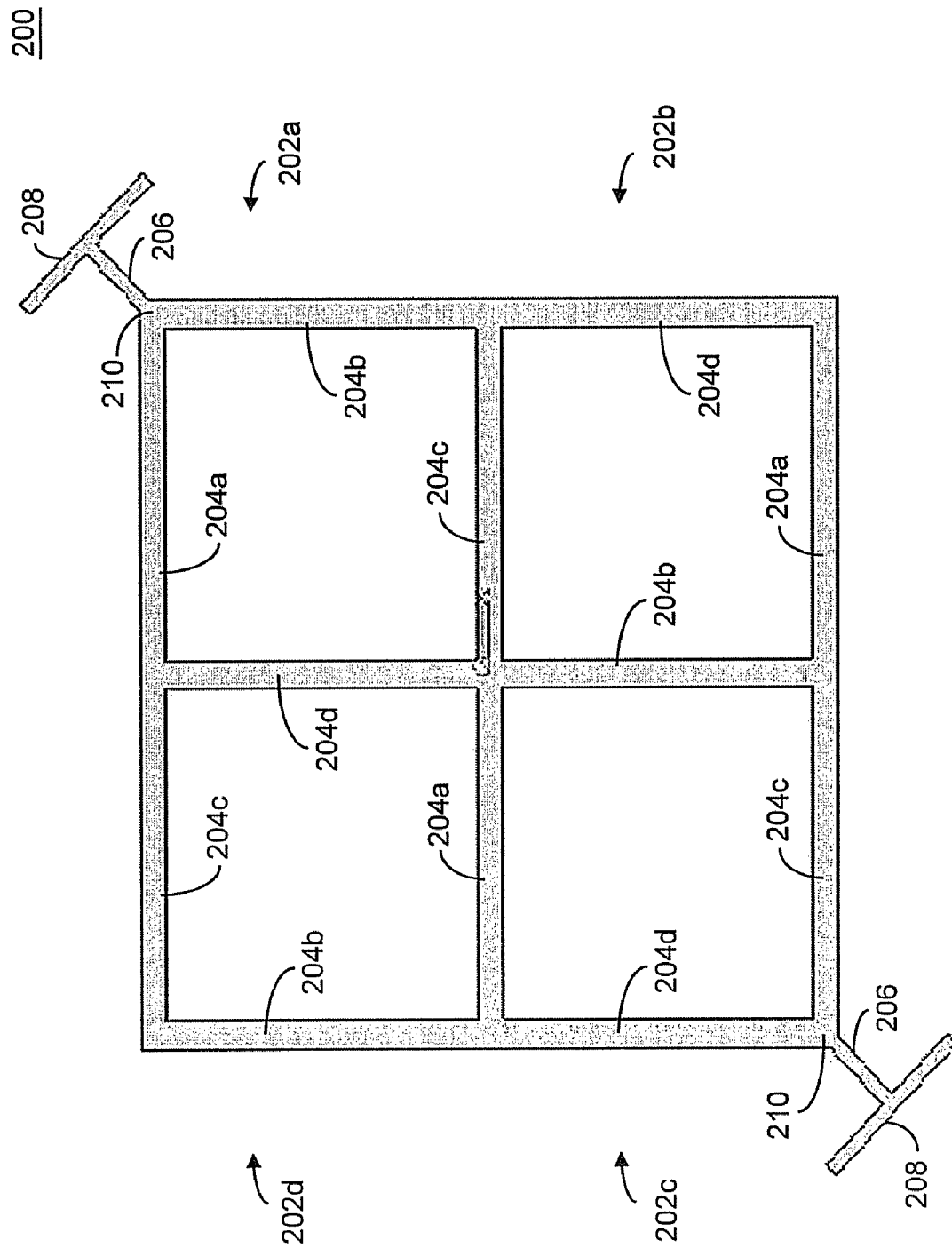
FIGS. 57A, 58 and 59 illustrate top views of exemplary MEMS frame array structures having a plurality of square shaped MEMS resonators wherein one or more of the plurality of rounded square shaped MEMS resonators are mechanically coupled to an associated one of the substrate anchors using various anchoring techniques and/or configurations.
Figure 57B:
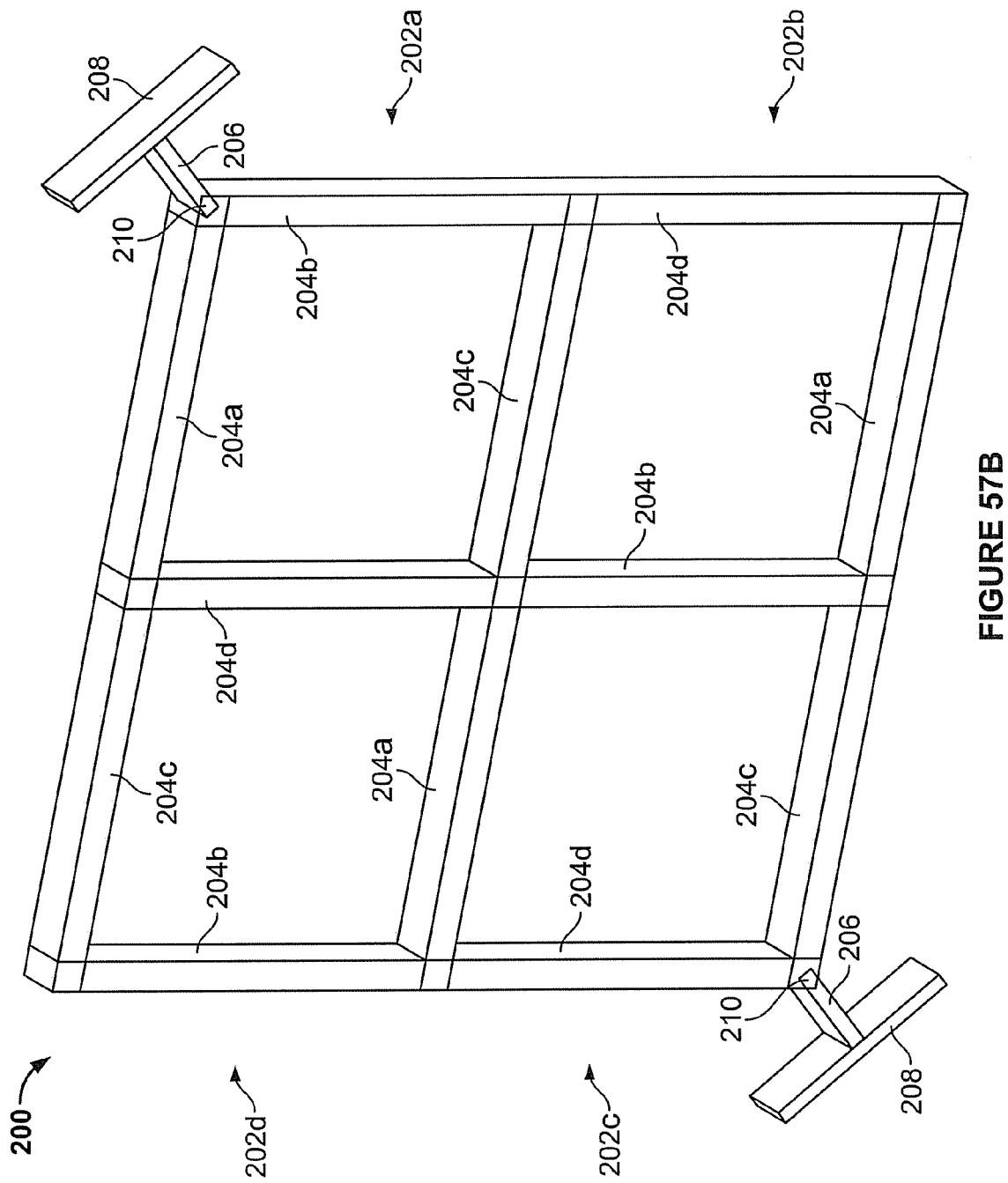
FIG. 57B illustrates an oblique view of the MEMS frame array structure of FIG. 57A.
Figure 58:
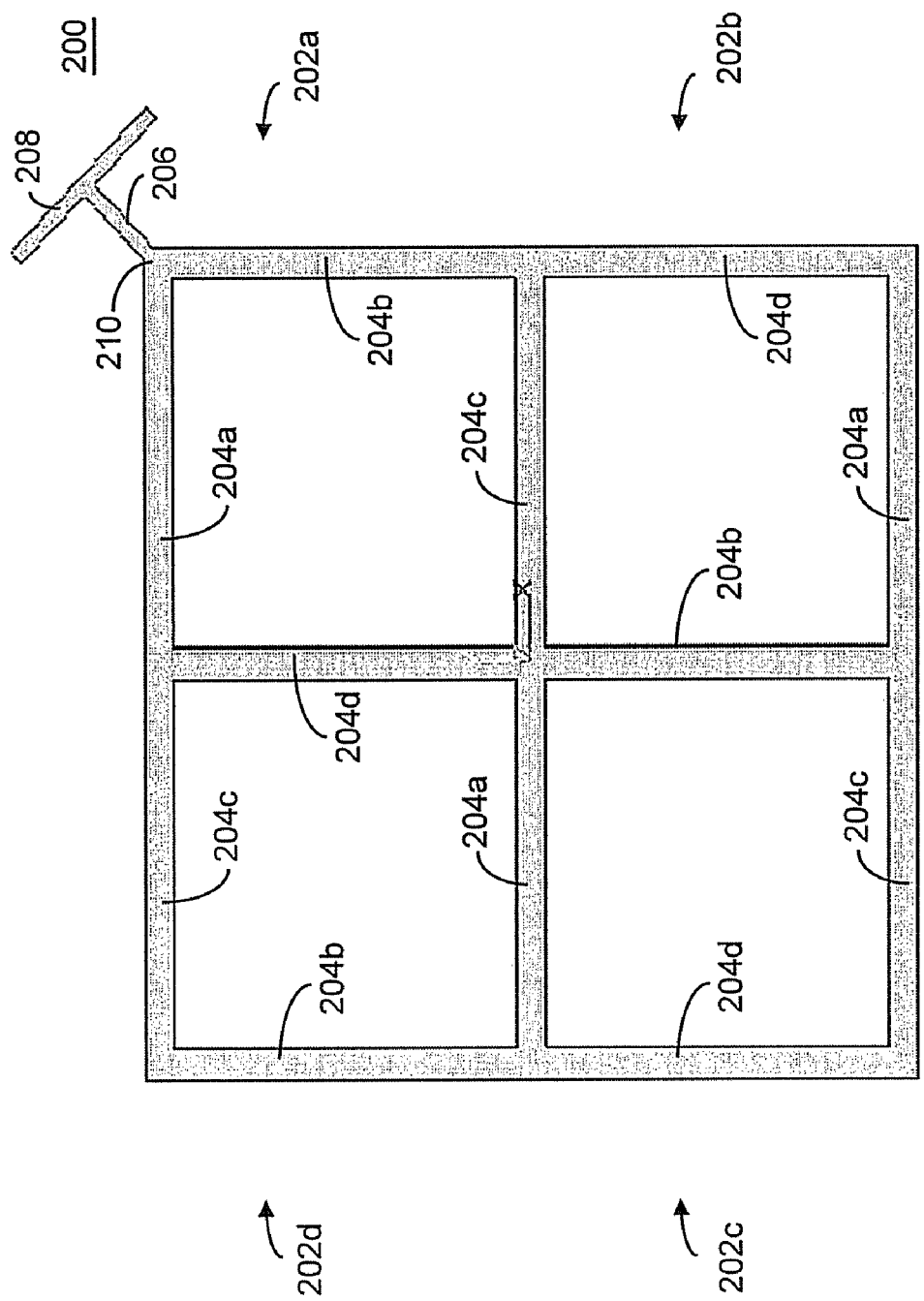
Figure 59:
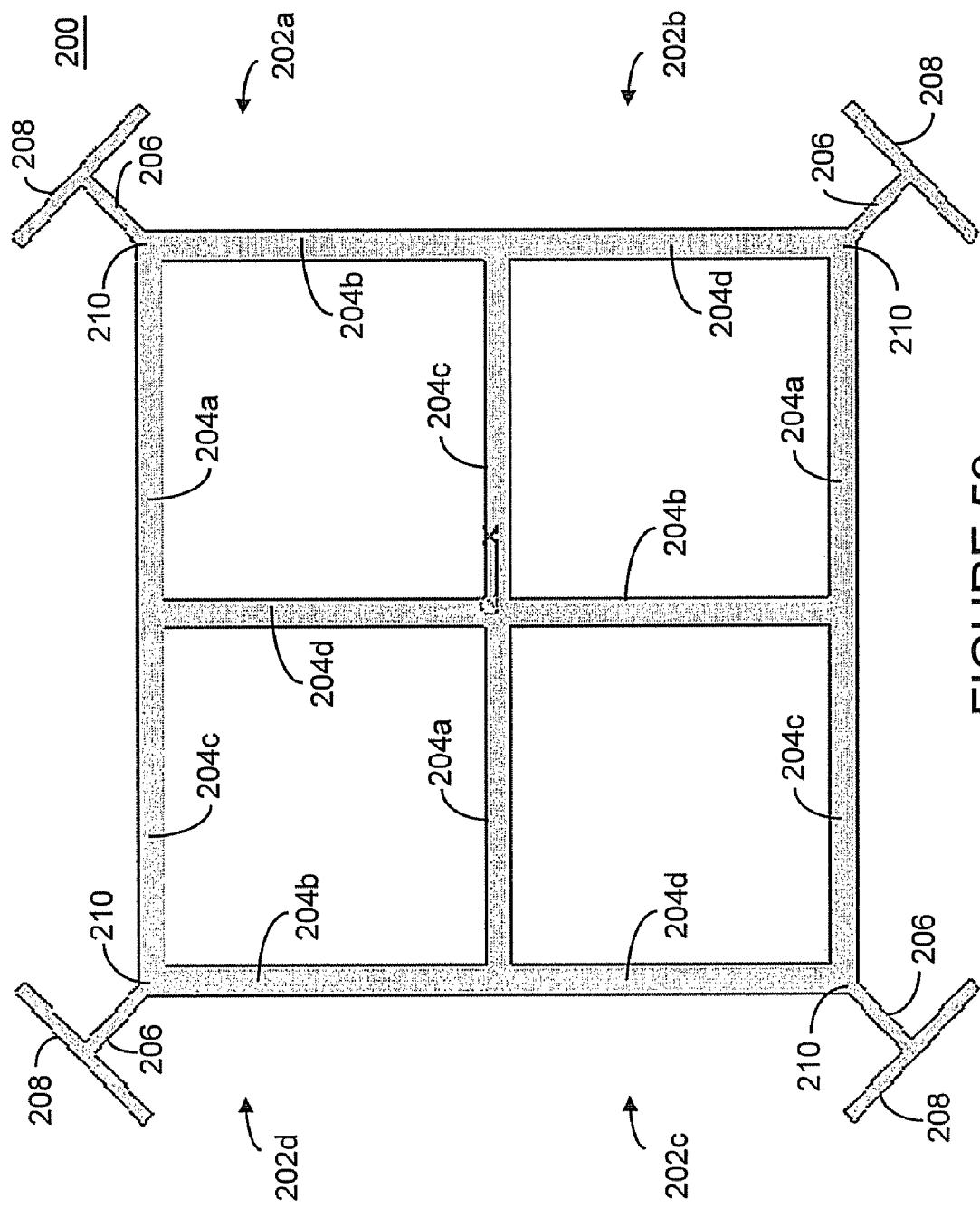

Notably, the anchoring technique illustrated in FIGS. 57A and 577B, further provides the benefit whereby no additional or extra mask is necessary for defining the anchor to the substrate. That is, square shaped MEMS resonators 202a-d and the anchoring structure may be fabricated contemporaneously. The MEMS frame array structure 200 need not be anchored at every nodal point or area but may be anchored at one or more locations, preferably at one or more nodal locations (areas or locations of the resonator that do not move, experience little movement, and/or are substantially stationary when the resonator oscillates). For example, with reference to FIGS. 57A, 58 and 59, MEMS frame array structure 200, may be anchored at one point, two points and/or four areas or portions of MEMS frame array structure 200 (preferably, for example, at or near nodal points 210 of one or more square shaped MEMS resonators 202a-d). In this regard, one or more anchor coupling sections 206 connect(s) certain corners formed by beam sections 204 to corresponding anchors 208.

Figure 60A:
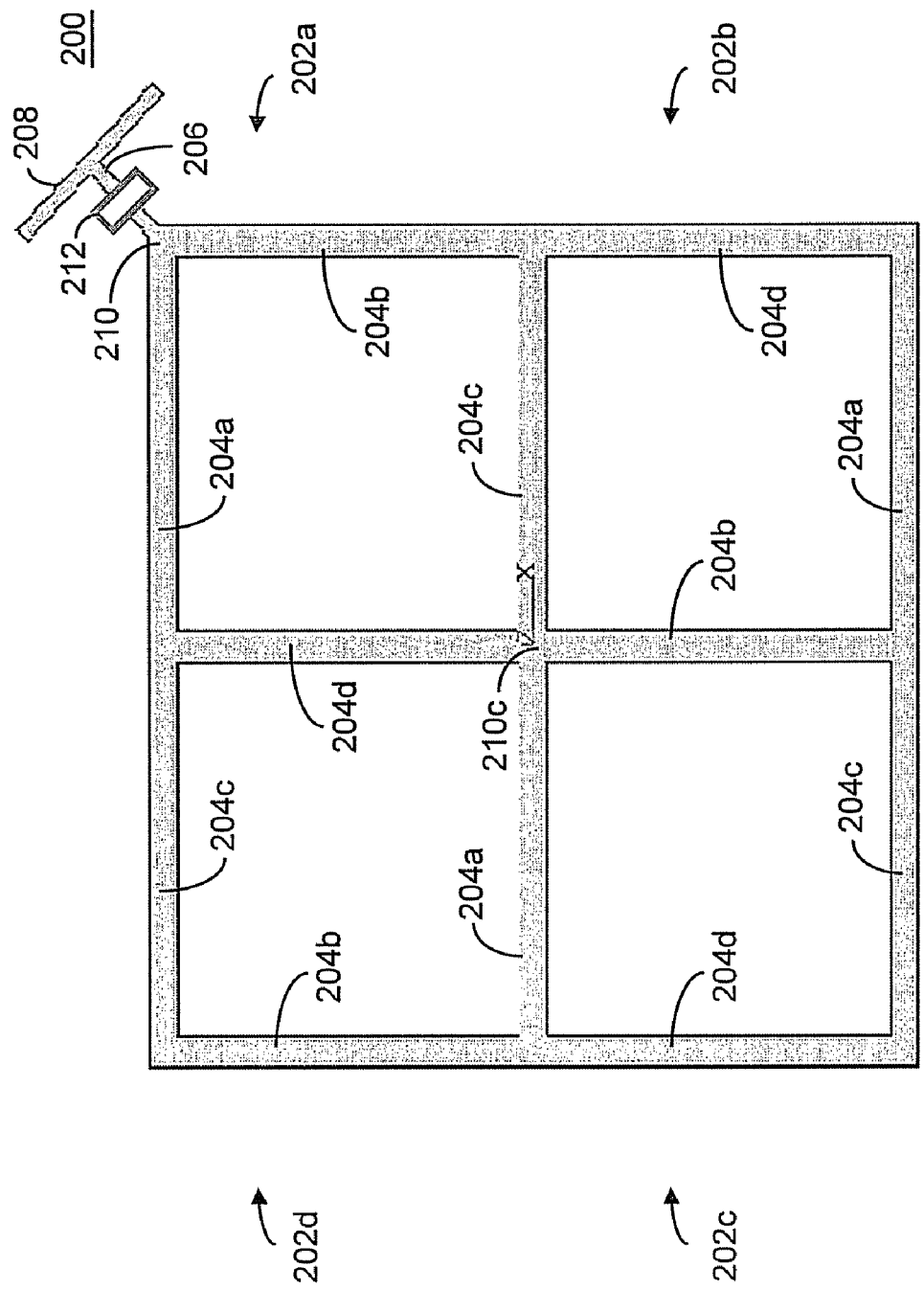
FIG. 60A and 60B illustrate top views of a portion of exemplary MEMS frame array structures including a plurality of square shaped MEMS resonators according to one embodiment of present inventions wherein the MEMS frame array structure includes stress/strain relief mechanisms which are mechanically coupled between (i) one or more of the square shaped MEMS resonators and (ii) to a substrate anchor.
Figure 60B:
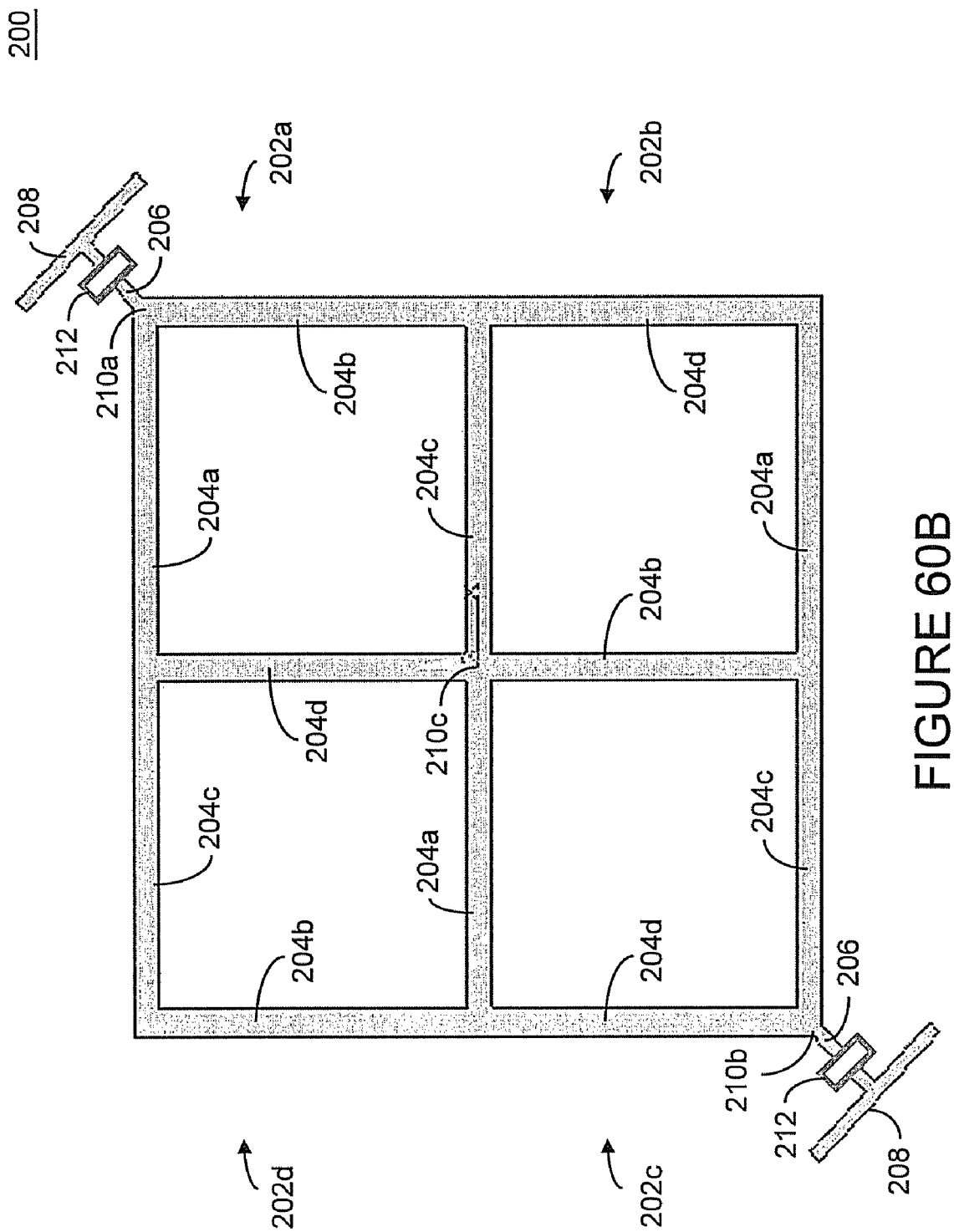

Notably, with reference to FIGS. 60A and 60B, MEMS frame array structure 200 of the present inventions may employ stress/strain relief mechanisms 212 (for example, springs or spring-like components) to manage, control, reduce, eliminate and/or minimize any stress or strain on the substrate at the location of the anchor 208 which is caused by the motion of one, some or all of points at which MEMS frame array structure 200 is anchored through or at the substrate. For example, the corner of square shaped MEMS resonators 202a is mechanically coupled to stress/strain relief mechanism 212 via anchor coupling section 206.

Notably, in addition to or in lieu thereof, MEMS frame array structure 200 may be anchored to the substrate via one or more of the internal corners of square shaped MEMS resonators 202 (see, for example, nodal points 210c in FIGS. 60A and 60B). In this regard, the anchor may be located under one, some or all of the internal corners of square shaped MEMS resonators 202 since all those corners may be designed to include motionless nodes. Where MEMS frame array structure 200 includes a large number of square shaped MEMS resonators 202, in order to enhance horizontal plane (in-plane) vibration of MEMS frame array structure 200, it may be advantageous to employ one or more anchor structures in or at internal corners of square shaped MEMS resonators 202.

Figure 61:
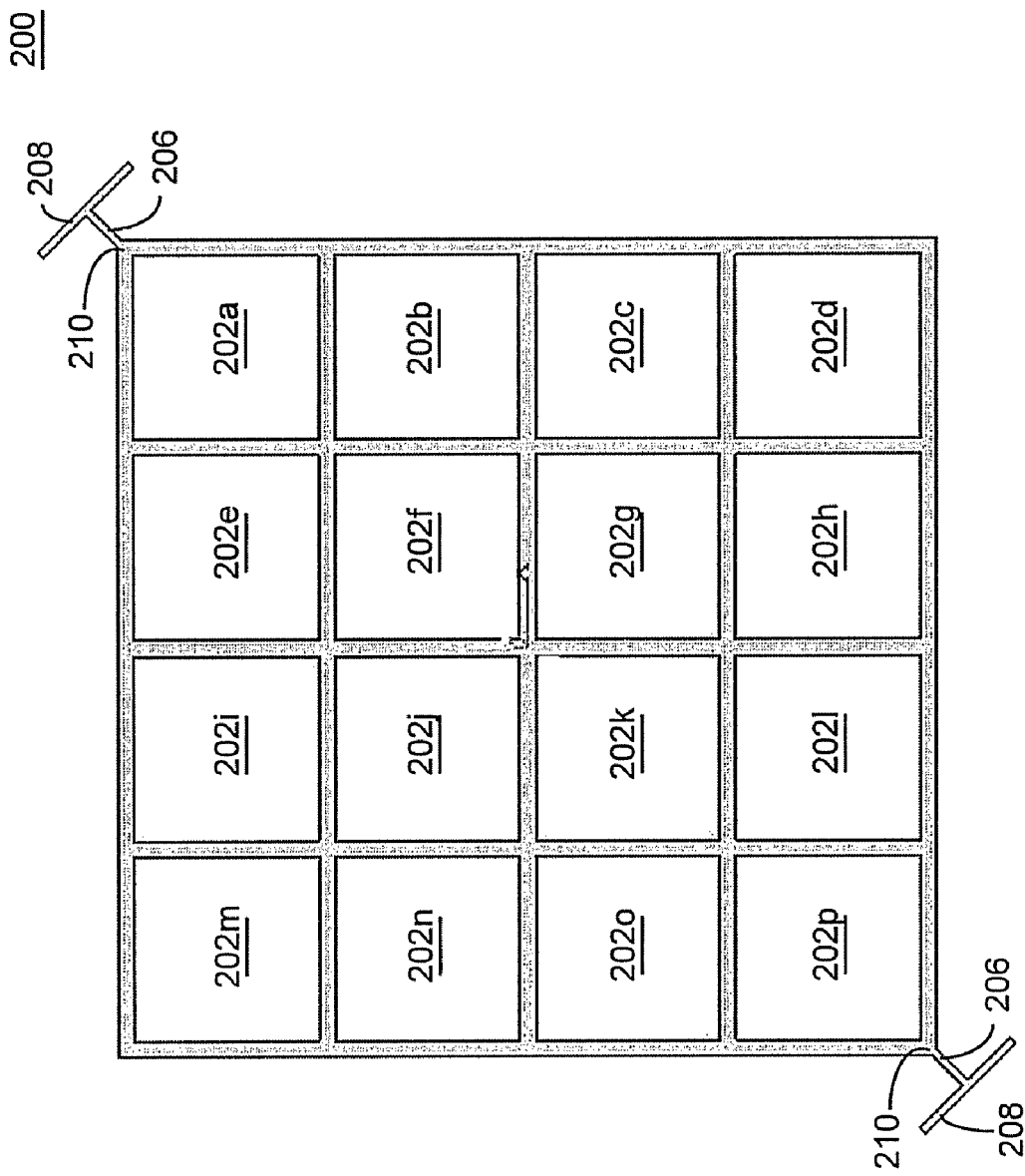
FIG. 61 is a top view of a MEMS frame array structure having a four by four array of square shaped MEMS resonators, wherein each square shaped MEMS resonator of the array is coupled to the adjacent square shaped MEMS resonator, according to one aspect of present invention.

In operation, each of square shaped MEMS resonators 202 of MEMS frame array structure 200 vibrate in-plane and at the same frequency. The phase difference of any two adjacent square shaped MEMS resonators 202 is or is approximately 180 degrees. In this regard, with reference to FIGS. 61 and 62, in one embodiment, when induced square shaped MEMS resonators 202 vibrate approximately 180 degrees out-of-phase relative to adjacent square shaped MEMS resonators 202. For example, square shaped MEMS resonators 202a vibrates approximately 180 degrees out-1 of-phase relative to square shaped MEMS resonators 202b and 202e. The vibration modes of square shaped MEMS resonators 202 may be the conventional flexural in place modes. As such, it is not necessary to place any sense or drive electrodes "underneath" or "above" square shaped MEMS resonators 202 in order to drive and sense MEMS frame array structure 200.

Figure 62:
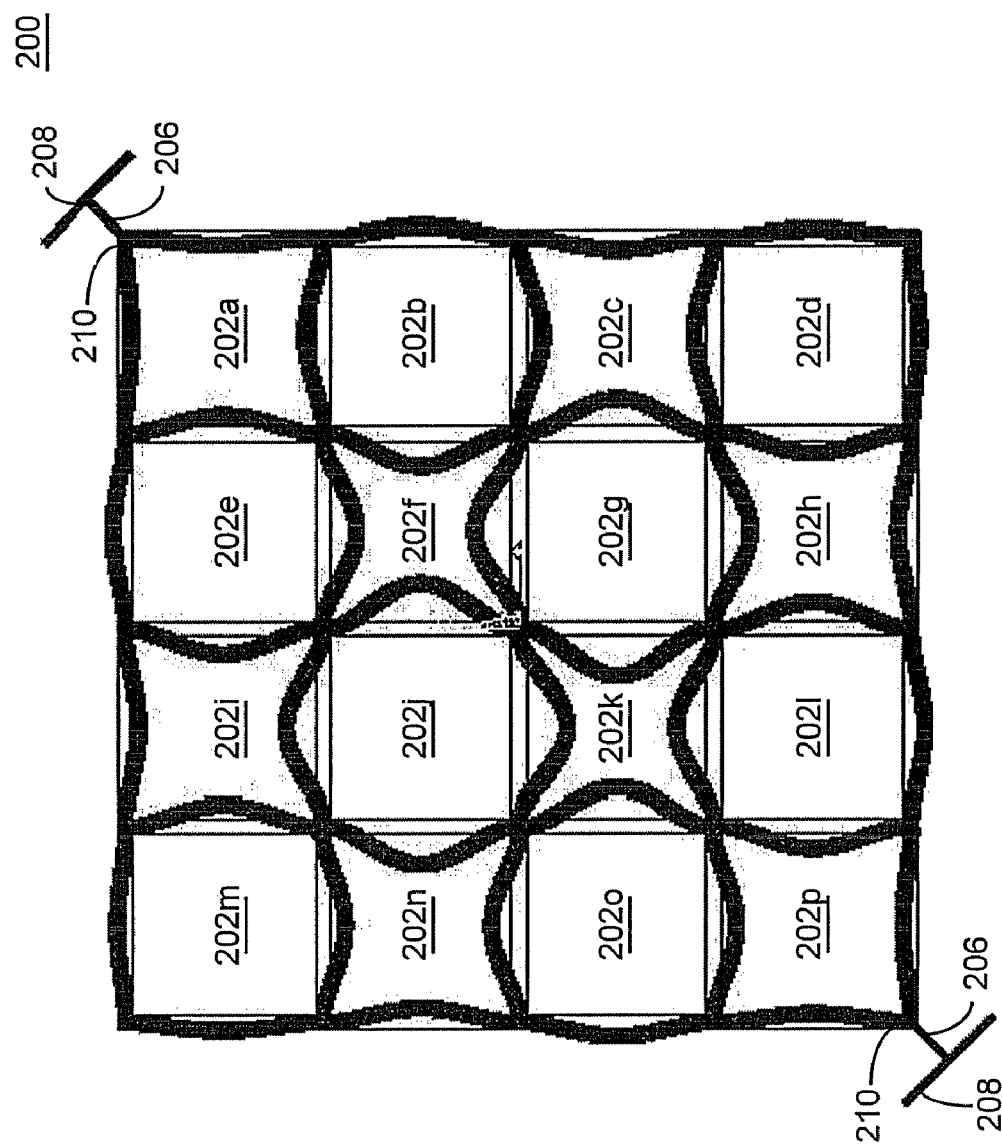
FIG. 62 is a top view of the MEMS frame array structure of FIG. 61 wherein the square shaped MEMS resonators oscillate between deflection states (only one illustrated herein) and wherein each deflected state is superimposed over (or illustrated relative to) the stationary state of MEMS resonator.

Notably, with continued reference to FIG. 62, nodal points 210 in or on the corners of square shaped MEMS resonators 202 experience little to no movement during operation. That is, as square shaped MEMS resonators 202 oscillate between the first deflected state and the second deflected state, the areas or portions of the corners, particularly those that are connect to anchor coupling sections 210, are relatively stationary.

Figures 63, 64:
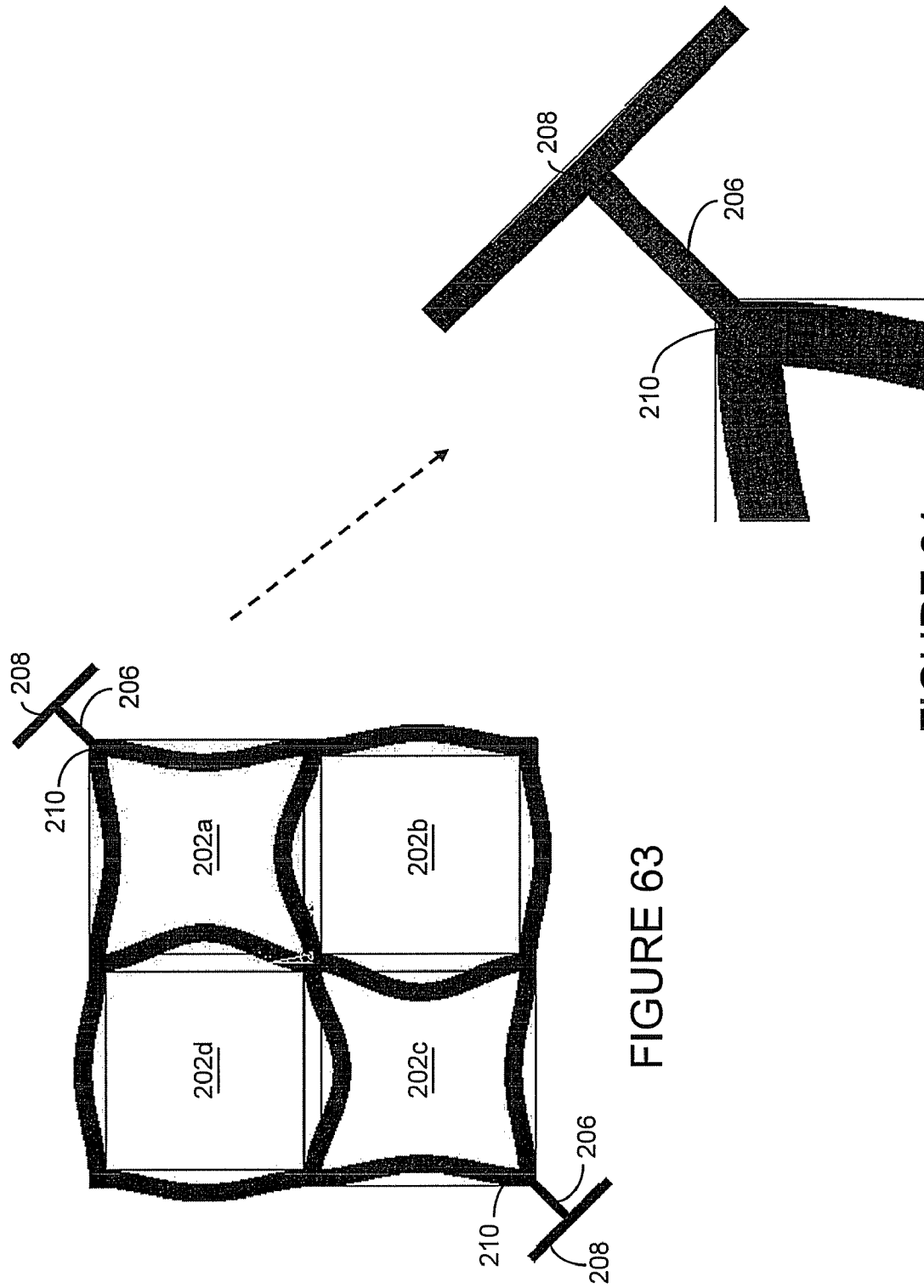
FIGS. 63 and 64 illustrate top views of an exemplary MEMS frame array structure (in oscillation) having a plurality of square shaped MEMS resonators wherein two rounded square shaped MEMS resonators are mechanically coupled to an associated substrate anchor using various anchoring techniques and/or configurations.

With reference to FIGS. 63 and 64, in operation, the exterior corner sections of square shaped MEMS resonators 202a and 202c are relatively motionless and stress-free nodes (i.e., nodal points). As such, in this embodiment, MEMS frame array structure 200 includes anchor coupling sections 206 that mechanically couple MEMS frame array structure 200 to anchors 208 thereby minimizing, reducing and/or limiting the vertical and horizontal energy losses due, for example, motional resistance at an anchoring point.

Figure 65:
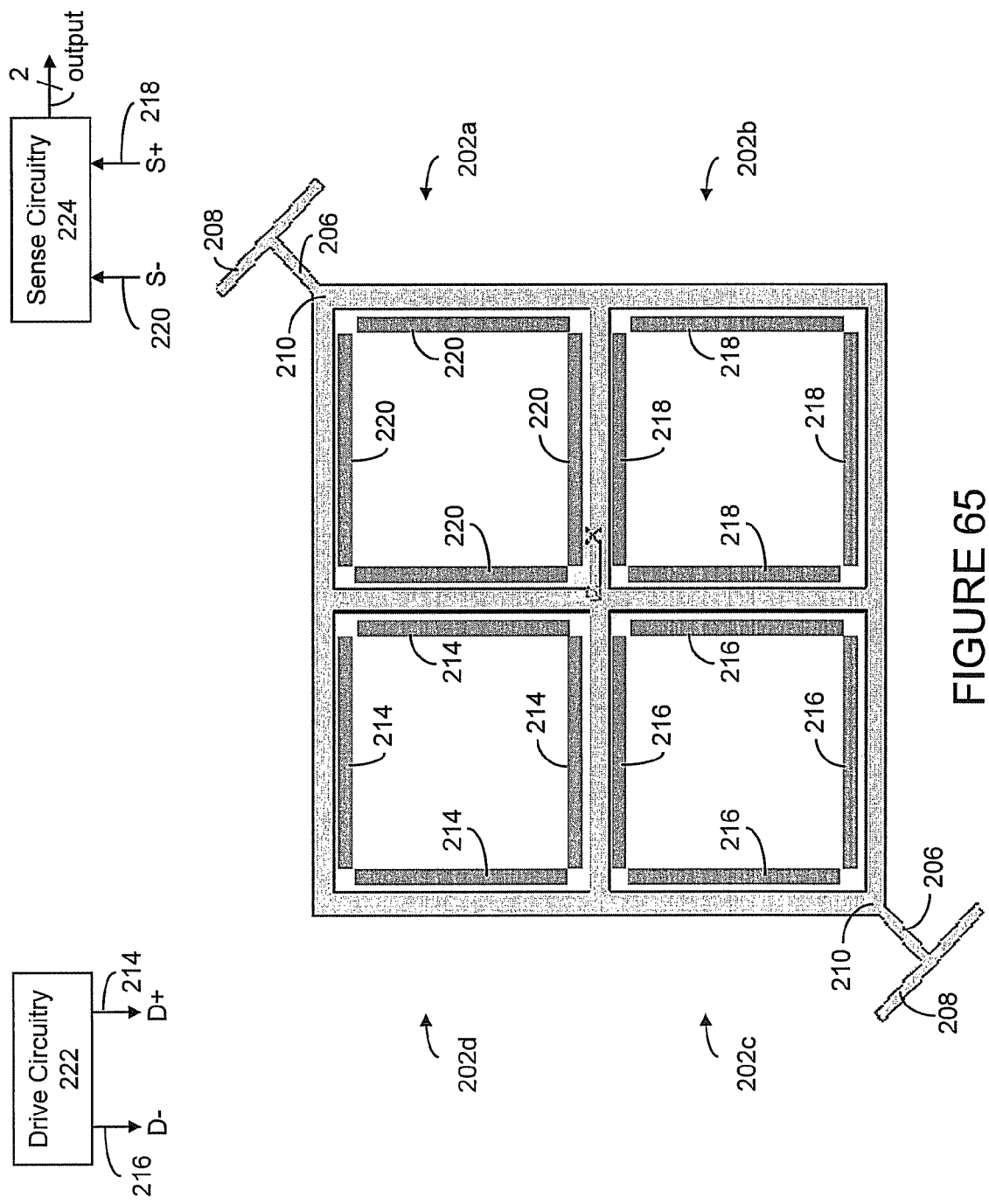
FIG. 65 illustrates an exemplary embodiment of a MEMS frame array structure including four square shaped MEMS resonators, in conjunction with a differential output signaling technique and embodiment, having drive and sense electrodes and differential drive and sense circuitry, according to one embodiment of the present invention.

The sense and drive electrodes and circuitry may be configured to provide a single-ended output signal or differential output signals. For example, With reference to FIG. 65, in one embodiment, MEMS frame array structure 200 is configured to provide a differential output signal. In this embodiment, the sense and drive electrodes and circuitry are configured to provide output signals that are (or are substantially) 180 degrees out of phase. In this way, MEMS frame array structure 200 provides a differential output signal pair which includes a relatively large signal to noise relationship due to the summing effects of oscillating beam sections 204 (for example, symmetrical oscillating beam sections) of the plurality of square shaped MEMS resonators 202.

The differential drive circuitry 222 and differential sense circuitry 224 may be conventional well-known circuitry. Indeed, differential drive circuitry 222 and differential sense circuitry 224 may be any type of circuitry (whether or not integrated (or fabricated) on the same substrate in which the MEMS frame array structure 200 resides), and all such circuitry, whether now known or later developed, are intended to fall within the scope of the present invention.

In addition, drive electrodes 214 and 216, and sense electrodes 218 and 220, may be of a conventional, well known type or may be any type and/or shaped electrode whether now known or later developed. Further, the physical electrode mechanisms may include, for example, capacitive, piezoresistive, piezoelectric, inductive, magnetorestrictive and thermal. Indeed, all physical electrode mechanisms whether now known or later developed are intended to fall within the scope of the present invention.

The drive electrodes 214/216 and sense electrodes 218/220 may be disposed or positioned relative to beam sections of square shaped MEMS resonators 202 in order to detect one or more selected or predetermined harmonics of beam sections. Moreover, the number and length of drive electrodes 214/216 and sense electrodes 218/220 may be selected in order to optimize, enhance and/or improve the operation of the MEMS resonator. Further, drive electrodes 214/216 and sense electrodes 218/220 may be fabricated without an additional or extra mask(s). That is, square shaped MEMS resonators 202a-d, drive electrodes 214/216 and sense electrodes 218/220 maybe fabricated contemporaneously.

The differential drive circuitry 222 and differential sense circuitry 224 may be integrated on the same substrate in which MEMS frame array structure 200 resides (or is fabricated in). In addition thereto, or in lieu thereof, differential drive circuitry 222 and differential sense circuitry 224 may be integrated on a substrate that is physically separate from (and electrically interconnected with) the substrate in which the MEMS resonator structure resides.

It should be noted that there are many other configurations and/or architectures of the sense and drive electrodes that cause or induce beam 204 to resonate and thereby generate and/or produce output signals that are (or are substantially) 180 degrees out of phase. All such configurations and/or architectures are intended to fall within the scope of the present invention.

The MEMS frame array structure of the present inventions may be fabricated from well-known materials using well-known techniques. For example, the MEMS frame array structure (including its constituent parts) may be fabricated from well-known semiconductors such as silicon, germanium, silicon-germanium or gallium-arsenide. Indeed, the MEMS frame array structure may be comprised of, for example, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, the MEMS frame array structure according to the present inventions may be formed in or on semiconductor on insulator (SOI) substrate using well-known lithographic, etching, deposition and/or doping techniques. For the sake of brevity, such fabrication techniques are not discussed herein. However, all techniques for forming or fabricating the resonator structure of the present invention, whether now known or later developed, are intended to fall within the scope of the present invention (for example, well-known formation, lithographic, etching and/or deposition techniques using a standard or over-sized ("thick") wafer (not illustrated) and/or bonding techniques (i.e., bonding two standard wafers together where the lower/bottom wafer includes a sacrificial layer (for example, silicon oxide) disposed thereon and the upper/top wafer is thereafter thinned (ground down or back) and polished to receive the mechanical structures in or on).

Notably, the SOI substrate may include a first substrate layer (for example, a semiconductor (such as silicon), glass or sapphire), a first sacrificial/insulation layer (for example, silicon dioxide or silicon nitride) and a first semiconductor layer (for example, silicon, gallium arsenide or germanium) disposed on or above the sacrificial/insulation layer. The mechanical structure maybe formed using well-known lithographic, etching, deposition and/or doping techniques in or on the first semiconductor layer (for example, semiconductors such as silicon, germanium, silicon-germanium or gallium-arsenide).

In one embodiment, the SOI substrate may be a SIMOX wafer which is fabricated using well-known techniques. In another embodiment, the SOI substrate may be a conventional SOI wafer having a first semiconductor layer. In this regard, SOI substrate, having a relatively thin first semiconductor layer, may be fabricated using a bulk silicon wafer which is implanted and oxidized by oxygen to thereby form a relatively thin $SiO_2$ beneath or underneath the single or mono crystalline wafer surface. In this embodiment, the first semiconductor layer (i.e., monocrystalline silicon) is disposed on the first sacrificial/insulation layer (i.e. silicon dioxide) which is disposed on a first substrate layer (i.e., monocrystalline silicon in this example).

In those instances where the plurality of square shaped MEMS resonators of the MEMS frame array structure are fabricated in or on polycrystalline silicon or monocrystalline silicon, certain geometric shaped MEMS resonator structures according to the present inventions, for example, the rounded square shaped MEMS resonator, may maintain structural and material symmetry with polycrystalline silicon or monocrystalline silicon. In particular, a rounded square shape MEMS resonator according to the present inventions may be inherently more compatible with the cubic structure of monocrystalline silicon. In each lateral orthogonal direction on a standard wafer (e.g. 100, 010, or 110), the properties of the monocrystalline silicon may be matched to one or more geometric shaped resonators. In this regard, the crystalline properties of monocrystalline silicon may have the same or suitable symmetry as the one or more geometric shaped resonator structure.

The MEMS frame array structure of the present invention maybe packaged using a variety of techniques and materials, for example, thin film techniques, substrate bonding techniques (for example, bonding semiconductor or glass-like substrates) and prefabricated package (for example, a TO-8 "can"). Indeed, any packaging and/or fabricating techniques may be employed, whether now known or later developed; as such, all such fabrication and/or packaging techniques are intended to fall within the scope of the present invention. For example, the systems, devices and/or techniques described and illustrated in the following non-provisional patent applications may be implemented:

(1) "Electromechanical System having a Controlled Atmosphere, and Method of Fabricating Same", which was filed on Mar. 20, 2003 and assigned Ser. No. 10/392,528;

(2) "Microelectromechanical Systems, and Method of Encapsulating and Fabricating Same", which was filed on Jun. 4, 2003 and assigned Ser. No. 10/454,867; and (3) "Microelectromechanical Systems Having Trench Isolated Contacts, and Methods of Fabricating Same", which was filed on Jun. 4, 2003 and assigned Ser. No. 10/455,555.

The inventions described and illustrated in the aforementioned patent applications may be employed to fabricate square shaped MEMS resonators and the MEMS frame array structure of the present inventions. For the sake of brevity, those discussions will not be repeated. It is expressly noted, however, that the entire contents of the aforementioned patent applications, including, for example, the features, attributes, alternatives, materials, techniques and/or advantages of all of the inventions/embodiments, are incorporated by reference herein.

Notably, the dimensions, characteristics and/or parameters of the square shaped MEMS resonator and the MEMS frame array structure according to the present inventions may be determined using a variety of techniques including finite element modeling and simulation techniques (for example, a finite element modeling via a computer driven analysis engine such as FemLab (from Consol), ANSYS (from ANSYS INC.), IDEAS and/or ABAKUS and/or empirical data/measurements. For example, a finite element modeling engine, using or based on a set of boundary conditions (for example, the size of the resonator structure), may be employed to design, determine and/or assess the dimensions, characteristics and/or parameters of (i) beam sections 204, (ii) anchor coupling section 206 (ii) nodal point(s) 210 (if any), and/or (vi) stress/strain mechanisms 212. Indeed, the impact and/or response of square shaped MEMS resonator 202, alone or incorporated into MEMS frame array structure 200, on or at the anchor and/or substrates may also be observed and/or determined using such a finite element modeling, simulation and analysis engine.

The above embodiments of the present inventions of MEMS frame array structure 200 are merely exemplary. They are not intended to be exhaustive or to limit the inventions to the precise forms, techniques, materials and/or configurations disclosed. Many modifications and variations are possible in light of the above teaching. It is to be understood that other embodiments maybe utilized and operational changes may be made without departing from the scope of the present invention. As such, the foregoing description of the exemplary embodiments of the invention has been presented for the purposes of illustration and description. Many modifications and variations are possible in light of the above teaching. It is intended that the scope of the invention not be limited solely to this detailed description.

The MEMS array structure and MEMS frame array structure of the present invention may be implemented in a wide variety of applications including, for example, timing or clock devices or clock alignment circuitry wherein a resonator or oscillator is employed. Indeed, MEMS array structure and MEMS frame array structure of the present invention may be implemented in any system or device where a clock signal or reference clock is employed, for example, in data, satellite and/or wireless communication systems/networks, mobile phone systems/networks, Bluetooth systems/networks, zig bee systems/networks, watches, real time clocks, set top boxes and systems/networks therefor, computer systems (for example, laptops, PCs and/or handheld devices), televisions and systems/networks therefor, consumer electronics (such as DVD player/recorder, MP3, MP2, DIVX or similar audio/video systems).

What is claimed is:

1. A MEMS array structure, comprising:
a plurality of MEMS resonators forming an array, each MEMS resonator including a plurality of beam sections, wherein at least one of the beam sections is a shared beam section that is also included in another of the plurality of MEMS resonators which is adjacent to the respective MEMS resonator.

2. The MEMS array structure of claim 1, wherein each MEMS resonator includes at least two shared beam sections.

3. The MEMS array structure of claim 1, wherein each MEMS resonator is square shaped and includes four beam sections.

4. The MEMS array structure of claim 3, where the shared beam mechanically couples the respective MEMS resonator to its adjacent MEMS resonator, the mechanical couplings of array causing the all of the plurality of MEMS resonators to vibrate in-plane and at a same frequency during operation of the array.

5. The MEMS array structure of claim 3, further comprising:
a substrate, wherein at least one corner section of at least one of the plurality of MEMS resonators includes a corresponding nodal point at which the array is anchored to the substrate.

6. The MEMS array structure of claim 5, further comprising:
an anchor configured to anchor the array to the substrate; and
an anchor coupling section connected one of at and near a corresponding one of the at least one nodal point and mechanically coupling the array to the anchor.

7. The MEMS array structure of claim 6, wherein the structure includes fewer anchors than nodal points.

8. The MEMS array structure of claim 6, further comprising:
a relief mechanism arranged to manage one of stress and strain on the substrate at a location of the anchor.

9. The MEMS array structure of claim 8, wherein the relief mechanism is a spring.

10. The MEMS array structure of claim 8, wherein the relief mechanism is disposed within the anchor coupling section and between the anchor and the corresponding one of the at least one nodal point.

11. The MEMS array structure of claim 6, wherein the corresponding one of the at least one nodal point is of an external corner section of the array.

12. The MEMS array structure of claim 5, further comprising:
an anchor located under a corresponding one of the at least one nodal point and configured to anchor the array to the substrate, wherein the corresponding one of the at least one nodal point is of an internal corner section of the array.

13. The MEMS array structure of claim 1, wherein the plurality of MEMS resonators are arranged so that, during operation, any two adjacent ones of the plurality of MEMS resonators vibrate 180 degrees out-of-phase relative to each other.

14. The MEMS array structure of claim 1, further including:
at least one sense electrode;
at least one drive electrode;
sense circuitry coupled to the at least one sense electrode; and
drive circuitry coupled to the at least one drive electrode;
wherein the at least one sense electrode and at least one drive electrode are located one of underneath and above the array.

15. The MEMS array structure of claim 14, wherein the at least one sense electrode provides at least one signal to the sense circuitry which, in response, provides a differential output signal.

16. The MEMS array structure of claim 14, wherein the at least one sense electrode provides at least one signal to the sense circuitry which, in response, provides a single ended output signal.

17. The MEMS array structure of claim 14, wherein the at least one sense electrode, the at least one drive electrode, the sense circuitry, and the drive circuitry provide output signals that are 180 degrees out-of-phase.

18. The MEMS array structure of claim 14, wherein the at least one drive electrode induces the plurality of beam sections to resonate.

19. The MEMS array structure of claim 14, wherein the at least one sense electrode and the at least one drive electrode are positioned relative to the plurality of beam sections so that at least one harmonic of the plurality of beam sections is detected.

* * * * *